US007332762B2

(12) United States Patent
Watanabe et al.

(10) Patent No.: US 7,332,762 B2
(45) Date of Patent: Feb. 19, 2008

(54) NONVOLATILE SEMICONDUCTOR MEMORY

(75) Inventors: Hiroshi Watanabe, Yokohama (JP); Hiroshi Nakamura, Kawasaki (JP); Kazuhiro Shimizu, Yokohama (JP); Seiichi Aritome, Yokohama (JP); Toshitake Yaegashi, Yokohama (JP); Yuji Takeuchi, Kawasaki (JP); Kenichi Imamiya, Kawasaki (JP); Ken Takeuchi, Tokyo (JP); Hideko Oodaira, Kuroishi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/617,425

(22) Filed: Dec. 28, 2006

(65) Prior Publication Data

US 2007/0103983 A1 May 10, 2007

Related U.S. Application Data

(60) Continuation of application No. 11/197,552, filed on Aug. 5, 2005, which is a continuation of application No. 10/303,818, filed on Nov. 26, 2002, now Pat. No. 6,974,979, which is a continuation of application No. 09/976,317, filed on Oct. 15, 2001, now Pat. No. 6,512,253, which is a division of application No. 09/274,481, filed on Mar. 23, 1999, now Pat. No. 6,353,242.

(30) Foreign Application Priority Data

Mar. 30, 1998 (JP) ................................ 10-084379
Sep. 11, 1998 (JP) ................................ 10-258778

(51) Int. Cl.
*H01L 27/108* (2006.01)
*H01L 29/73* (2006.01)

(52) U.S. Cl. ...................................... 257/296; 257/208

(58) Field of Classification Search ..................... None
See application file for complete search history.

(56) References Cited

U.S. PATENT DOCUMENTS 5,289,037 A 2/1994 Savignac (Continued)

FOREIGN PATENT DOCUMENTS

EP 663695 7/1995

(Continued)

OTHER PUBLICATIONS

JP Office Action mailed Jun. 7, 2005, JP Appln. No. 10-258778.

(Continued)

*Primary Examiner*—Kiesha L. Rose
(74) *Attorney, Agent, or Firm*—Banner & Witcoff, Ltd.

(57) ABSTRACT

A select gate transistor has a select gate electrode composed of a first-level conductive layer and a second-level conductive layer. The first-level conductive layer has contact areas. The second-level conductive layer has its portions removed that are located above the contact areas. Two adjacent select gate electrodes that are adjacent to each other in the column direction are arranged such that the contact areas of one select gate electrode are not opposed to the contact areas of the other select gate electrode. One select gate electrode has its first- and second-level conductive layers removed in their portions that are opposed to the contact areas of the other select gate electrode.

15 Claims, 180 Drawing Sheets

U.S. PATENT DOCUMENTS

| | | | | |
|---|---|---|---|---|
| 5,326,999 | A | | 7/1994 | Kim et al. |
| 5,416,350 | A | * | 5/1995 | Watanabe .................. 257/330 |
| 5,541,879 | A | | 7/1996 | Suh et al. |
| 5,637,895 | A | | 6/1997 | Iwata et al. |
| 5,659,505 | A | | 8/1997 | Kobayashi et al. |
| 5,708,621 | A | | 1/1998 | Tanoi |
| 5,745,417 | A | | 4/1998 | Kobayashi et al. |
| 5,776,810 | A | | 7/1998 | Guterman et al. |
| 5,844,842 | A | | 12/1998 | Seki et al. |
| 6,080,624 | A | | 6/2000 | Kamiya et al. |
| 6,114,724 | A | | 9/2000 | Ratnakumar |
| 6,191,975 | B1 | | 2/2001 | Shimizu et al. |

FOREIGN PATENT DOCUMENTS

| | | | |
|---|---|---|---|
| JP | 4-352469 | A | 12/1992 |
| JP | 5-175337 | A | 7/1993 |
| JP | 6-061458 | A | 3/1994 |
| JP | 7-326684 | A | 12/1995 |
| JP | 8-064701 | | 3/1996 |
| JP | 8-064701 | A | 3/1996 |
| JP | 8-078643 | A | 3/1996 |
| JP | 9-17974 | A | 1/1997 |
| JP | 10-223867 | A | 8/1998 |

OTHER PUBLICATIONS

JP Office Action mailed May 15, 2007, JP appln. 10-084379.

* cited by examiner

NONVOLATILE SEMICONDUCTOR MEMORY

CROSS-REFERENCE TO RELATED APPLICATIONS

This application is a continuation of U.S. Ser. No. 11/197,552, filed Aug. 5, 2005, which is a continuation of U.S. Ser. No. 10/308,818, filed Nov. 26, 2002 (now U.S. Pat. No. 6,974,979, which is a continuation of U.S. Ser. No. 09/976,317, filed Oct. 15, 2001 (now U.S. Pat. No. 6,512,253), which is a divisional of U.S. Ser. No. 09/274,481, filed Mar. 23, 1999 (now U.S. Pat. No. 6,353,242) which claims priority under 35 U.S.C. § 119 to Japanese Patent Application Nos. 10-258778, filed Sep. 11, 1998 and 10-084379, filed Mar. 30, 1998, the entire contents of which are incorporated herein by reference.

BACKGROUND OF THE INVENTION

The present invention relates to nonvolatile semiconductor memories.

A NAND type of flash EEPROM having such a memory cell array as shown in FIG. 1 has been hitherto known as one of nonvolatile semiconductor memories.

The memory cell array of the NAND flash EEPROM is composed of a number of NAND cell units. Each of the NAND cell units has a NAND series of memory cells (e.g., 16 memory cells), a source-side select gate transistor connected between one end of the NAND series of memory cells and a source line, and a drain-side select gate transistor connected between the other end of the NAND string and a bit line BLi.

The memory cell array is composed of a plurality of blocks BLkj. Control gate electrodes (word lines) CG0 to CG15, source-side select gate electrodes SGS, and drain-side select gate electrodes SGD extend in the row direction, while bit lines BLi extend in the column direction. A plurality of memory cells M0 to Mi connected to one word line forms a unit called PAGE.

Usually a page of data is read out in a single read operation. The read page of data is latched by a latch circuit and then output serially to the outside of the memory chip.

For such a NAND flash EEPROM it is important to obtain a large storage capacity and reduce the area of the memory cell array for small chip sizes. To this end, it is required to reduce the size of memory cells and the spacing between two adjacent select gate lines (electrodes).

Usually the select gate line is provided with contact areas, which are large in area and prevent the spacing between two adjacent select gate lines from being reduced. When, in patterning the contact areas, misalignment occurs between the select gate line and the contact area due to resist misalignment, the resistance of the select gate line increases.

To the contact areas of the select gate line is connected a select gate bypass line, which is formed on an interlayer insulator on the word line (control gate line). In this case, in a read operation, capacitive coupling between the select gate bypass line and the word line may cause the potential on the selected word line in a selected block to rise in error.

BRIEF SUMMARY OF THE INVENTION

It is an object of the present invention to reduce the spacing between two adjacent select gate lines (electrodes) independently of the size of contact areas and prevent the resistance of the select gate lines from increasing even if misalignment occurs between a select gate line and its associated contact areas in patterning the contact areas.

It is the other object of the present invention to prevent the potential on the selected word line in a selected block from varying in a read operation by devising a novel layout for select gate bypass lines on an interlayer insulator on word lines.

A nonvolatile semiconductor memory of the present invention has first and second select gate electrodes formed above the surface of a semiconductor substrate to be adjacent to each other in the column direction and extend in the row direction and a diffused layer formed in a region of the semiconductor substrate between regions of the semiconductor substrate that are located below the first and second select gate electrodes. Each of the first ad second select gate electrodes is composed of a first conductive layer and a second conductive layer located above the first conductive layer. The first conductive layer of the first select gate electrode has a plurality of first contact areas therefor, and the second conductive layer of the first select gate electrode has its portions removed that are located over the first contact areas. The first conductive layer of the second select gate electrode has a plurality of second contact areas therefor, and the second conductive layer of the second select gate electrode has its portions removed that are located over the second contact areas. The first contact areas and the second contact areas are located so that they are not opposed to each other. The second select gate electrode has its first and second conductive layers removed in portions that are opposed to the first contact areas, and the first select gate electrode has its first and second conductive layers removed in portions that are opposed to the second contact areas.

A nonvolatile semiconductor memory of the present invention has first and second select gate electrodes formed above the surface of a semiconductor substrate to be adjacent to each other in the column direction and extend in the row direction and a diffused layer formed in a region of the semiconductor substrate between regions of the semiconductor substrate that are located below the first and second select gate electrodes. Each of the first and second select gate electrodes is composed of a first conductive layer and a second conductive layer located above the first conductive layer. The first conductive layer of the first select gate electrode has a plurality of contact areas therefor and the second conductive layer of the first select gate electrode has its portions disconnected that are located above the contact areas so that the contact areas are exposed. The length in the column direction of each of the contact areas is larger than the gate electrode of the first select gate electrode. The length in the column direction of portions of the second conductive layer of the first select gate electrode that are in contact with the contact areas is larger than the gate length of the first select gate electrode.

The second conductive layer of the first select gate electrode has a pattern such that it bends in the column direction in its portions that are in contact with the contact areas of the first conductive layer.

A nonvolatile semiconductor memory of the present invention has first and second select gate electrodes formed above the surface of a semiconductor substrate to be adjacent to each other in the column direction and extend in the row direction and a diffused layer formed in a region of the semiconductor substrate between regions of the semiconductor substrate that are located below the first and second select gate electrodes. Each of the first ad second select gate electrodes is composed of a first conductive layer and a second conductive layer located above the first conductive layer. The first conductive layer of the first select gate electrode has a plurality of first contact areas therefor, and the second conductive layer of the first select gate electrode has its portions disconnected that are located above the first contact areas so that the first contact areas are exposed. The first conductive layer of the second select gate electrode has a plurality of contact areas therefor, and the second conductive layer of the second select gate electrode has its portions disconnected that are located above the second contact areas so that the second contact areas are exposed. The first contact areas and the second contact areas are located so that they are not opposed to each other.

A non-volatile semiconductor memory of the present invention comprises: a cell unit composed of a memory cell and a select gate transistor; and a select gate bypass line which is connected to the select gate line of the select gate transistor in the cell unit, and which is formed at an upper level of the select gate line. The select gate bypass line is located in an area other than right above the control gate line of the memory cell in the cell unit.

A non-volatile semiconductor memory of the present invention comprises: a first cell unit, which is located in a first block, and which is composed of a plurality of memory cells serially or in parallel connected therebetween and a select gate transistor which is connected to the plurality of memory cells; a second cell unit, which is located in a second block adjacent to the first block, and which is composed of a plurality of memory cells serially or in parallel connected therebetween and a select gate transistor which is connected to the plurality of memory cells; and a first select gate bypass line which is connected to the select gate line of the select gate transistor in the first cell unit, and which is formed at an upper level of the select gate line. The first select gate bypass line is located in an area other than right above a control gate line of the plurality of memory cells in the first cell unit.

A non-volatile semiconductor memory of the present invention comprises: a cell unit composed of a plurality of memory cells which are serially or in parallel connected therebetween, and first and second select gate transistors which are respectively connected to both ends of the plurality of memory cells; a select gate bypass line, which is connected to the select gate line of the first select gate transistor in the cell unit, and which not only is formed at an upper level of the select gate line, but located in an area other than right above a control gate line of the plurality of memory cells in the cell unit; and a circuit whereby in a data read operation, the select gate line of the first select gate transistor in the cell unit is charged after the select gate line of the second select gate transistor in the cell unit is charged.

A non-volatile semiconductor memory of the present invention comprises: a memory cell array composed of a plurality of memory cells located in a matrix; a word line extending in the row direction on the memory cell array; a bit line extending in the column direction on the memory cell array; a shunt area which is located in the memory cell and extends in the column direction, and where arrangement of any of the plurality of memory cells is forbidden; a first interconnection, which is located in the shunt area, and which applies a potential to an area where the plurality of memory cells are formed; and a second interconnection, which is located at an upper level of the first interconnection in the shunt area, and which is connected to the plurality of memory cells.

A non-volatile semiconductor memory of the present invention comprises: a memory cell array including a cell unit composed of a memory cell and a select gate transistor; a word line which is connected to the memory cell and extends in the row direction on the memory cell array; a select gate line which is connected to the select gate transistor and extends in the row direction on the memory cell array; a select gate bypass line which is formed at an upper level of the select gate line and extends in the row direction on the memory cell array; a shunt area which is located in the memory cell array and extends in the column direction, and where arrangement of any of memory cells is forbidden; a contact area, which is located in the shunt area, for connecting the select gate bypass line to the select gate line; a first interconnection, which is located in the shunt area, and which applies a potential to an area where the memory cell is formed; and a second interconnection which is located at an upper level of the first interconnection in the shunt area, and which is connected to the memory cell.

A non-volatile semiconductor memory of the present invention comprises: a memory cell array including a cell unit composed of a memory cell and a select gate transistor; a word line which is connected to the memory cell and extends in the row direction on the memory cell array; a select gate line which is connected to the select gate transistor and extends in the row direction on the memory cell array; a select gate bypass line which is formed at an upper level of the select gate line and extends in the row direction on the memory cell array; a plurality of shunt areas, which are located in the memory cell array and extends in the column direction, and where arrangement of any memory cell is forbidden; a first contact section for connecting the select gate bypass line to the select gate line; and a second contact section for applying a potential to an area where the memory cell is formed. The first and second contact sections are alternatively located in the plurality of shunt areas.

A non-volatile semiconductor memory of the present invention comprises: a memory cell array including first and second cell units, which are respectively located in blocks different from each other, and each of which composed of a memory cell and a select gate transistor; a first select gate line connected to the select gate transistor in the first cell unit; a second select gate line connected to the select gate transistor in the second cell unit; a select gate bypass line which is formed at an upper level of the first and second select gate lines; a shunt area, which is located in the memory cell array, and where arrangement of any of memory cells is forbidden; and a contact section, which is located in the shunt area, for connecting the select gate bypass line to the first select gate line. The second select gate line is disconnected in the shunt area where the contact area is located.

A non-volatile semiconductor memory of the present invention comprises: a memory cell array including a cell unit composed of a memory cell and a select gate transistor; a select gate bypass line which is formed at an upper level of the select gate line of the select gate transistor; first and second shunt areas, which are located in the memory cell array, and in either of which arrangement of any of memory cells is forbidden; a first contact section which is located in the first shunt area for connecting the select gate bypass line to the select gate line; and a second contact section, which is located in the second shunt area, for applying a potential to an area where the memory cell is formed. The select gate line is disconnected in the second shunt area where the second contact section is located.

A non-volatile semiconductor memory of the present invention comprises: a BLOCK block including a cell unit composed of a plurality of memory cells which are serially or in parallel connected therebetween and a select gate transistor connected to the plurality of memory cells; a first row decoder, which is located on one end side of the block, for producing a block select signal showing whether or not the BLOCK block is selected; and a second row decoder, which is located on the other end side of the block, for receiving the block select signal. The number of control gate lines of memory cells which are connected to the first row decoder in the cell unit is smaller than that of control gate lines of memory cells which are connected to the second row decoder in the cell unit.

A non-volatile semiconductor memory of the present invention comprises: a BLOCK block including a cell unit composed of n memory cells which are serially or in parallel connected therebetween and a select gate transistor connected to the n memory cells; a first row decoder, which is located on one end side of the block, for producing a block select signal showing whether or not the BLOCK block is selected; and a second row decoder, which is located on the other end side of the block, for receiving the block select signal. The first row decoder is connected to the select gate line of the select gate transistor in the cell unit and the control gate lines of j memory cells in the cell unit and the second row decoder is connected to the control gate lines of k (k>j, j+k=n) memory cells in the cell unit.

A non-volatile semiconductor memory of the present invention comprises: a memory cell array composed of a plurality of memory cells. A non-volatile semiconductor memory of the present invention comprises: a first isolation region which is constructed of a device isolation insulating layer of a STI structure and regularly located at virtually constant widths and pitches in the memory cell array; an active region which is isolated by the first isolation region and in which a plurality of memory cells are located; and a second isolation region which is constructed of a device isolation insulating layer of a STI structure and regularly located at larger widths and pitches than those of the first isolation insulating layer in the memory cell array.

A non-volatile semiconductor memory of the present invention comprises: a memory cell array composed of a plurality of memory cells. A non-volatile semiconductor memory of the present invention comprises: a device isolation region which is constructed of a device isolation insulating layer of a STI structure and regularly located at virtually constant widths and pitches in the memory cell array; an active region which is isolated by the isolation region and in which a plurality of memory cells are located; and a shunt area s which is located in the memory cell array, and in which arrangement of a memory cell is forbidden. The shunt area s is constructed of a device isolation insulating layer of a STI structure and regularly located in the memory cell array at larger widths and pitches than those of the isolation region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 119 is a view showing an area corresponding to the area A1 of FIG. 104 in a fifth embodiment of the present invention;

FIG. 120 is a plan view showing a sixth example of an EEPROM of the present invention;

FIG. 121 is a view in detail showing the area A1 of FIG. 120;

FIG. 122 is a view in detail showing the area A2 of FIG. 120;

FIG. 123 is a waveform diagram showing an operation example of the EEPROM of FIGS. 121 and 122;

FIG. 124 is a view showing an area corresponding to the area A1 of FIG. 120 in a seventh example of the present invention;

FIG. 125 is a view showing an area corresponding to the area A2 of FIG. 120 in the seventh example of the present invention;

FIG. 126 is a plan view showing an eighth example of an EEPROM of the present invention;

FIG. 127 is a view in detail showing the area A1 of FIG. 126;

FIG. 128 is a view in detail showing the area A2 of FIG. 126;

FIG. 129 is a plan view showing a NAND cell unit;

FIG. 130 is a diagram showing an equivalent circuit to the device of FIG. 129;

Figure 129:
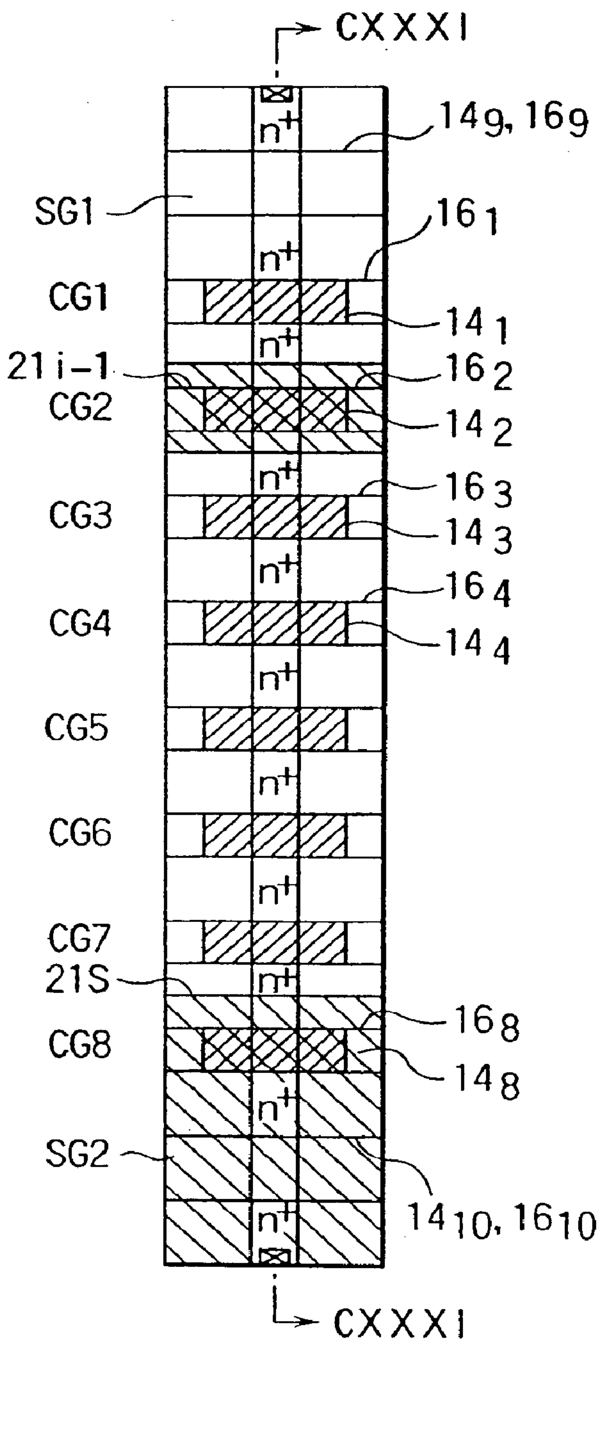
Figure 131:
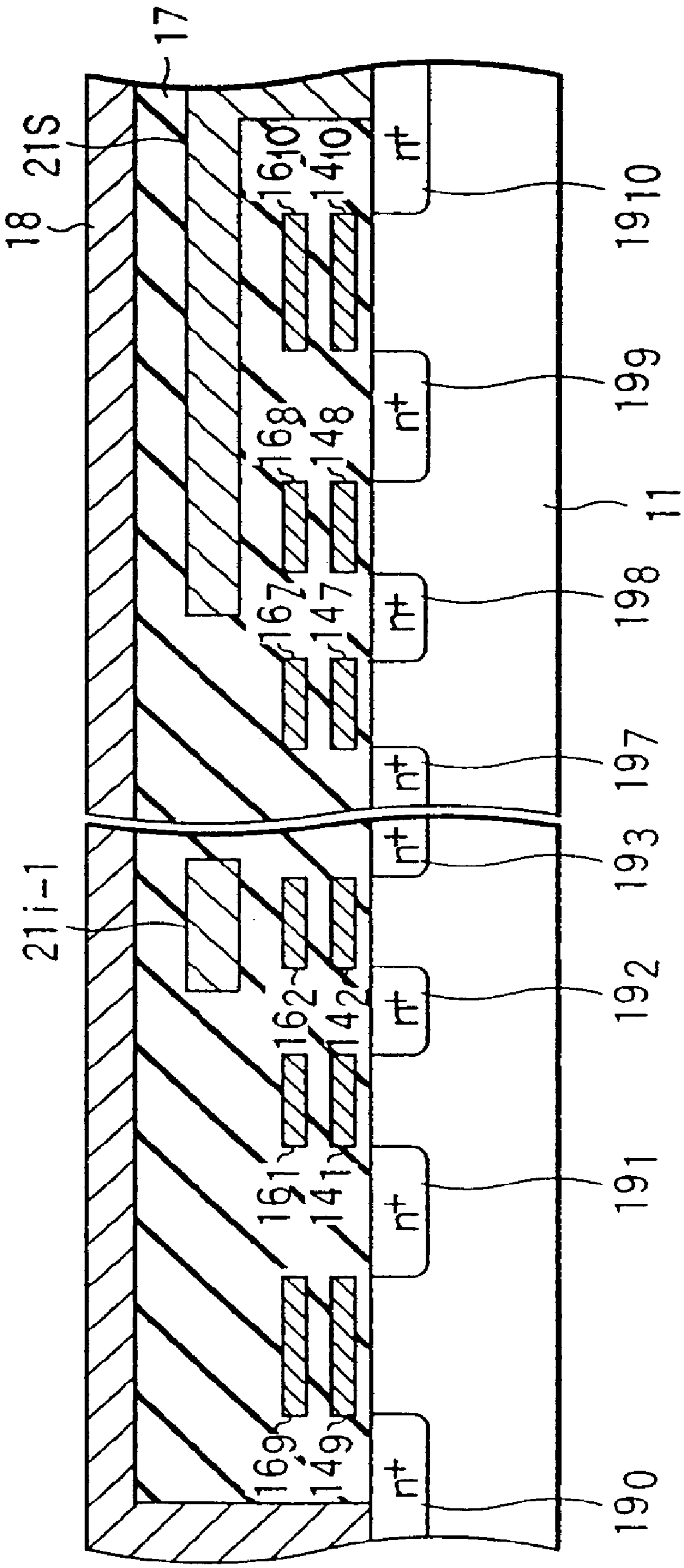
Figure 132:
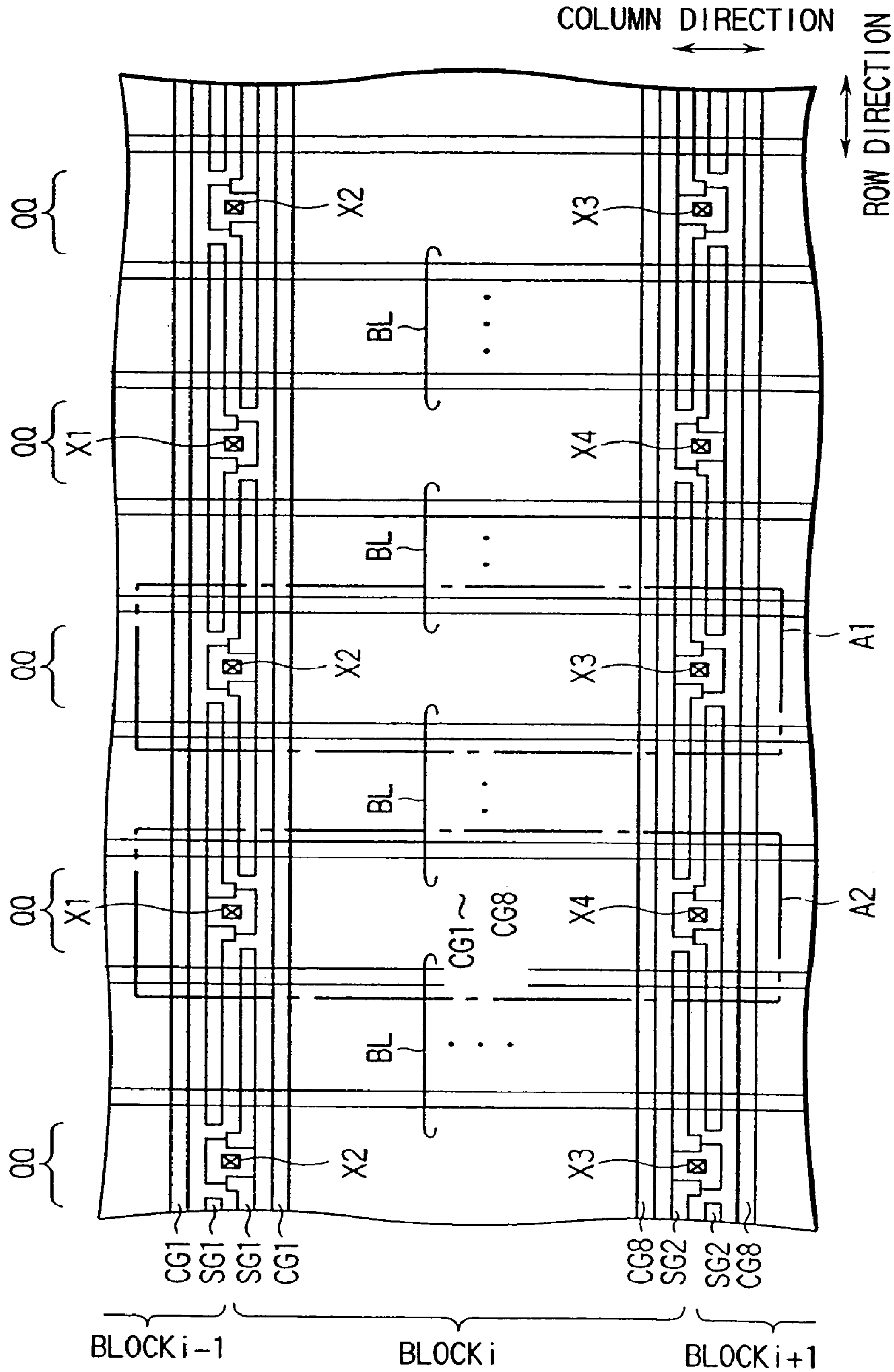
Figure 133:
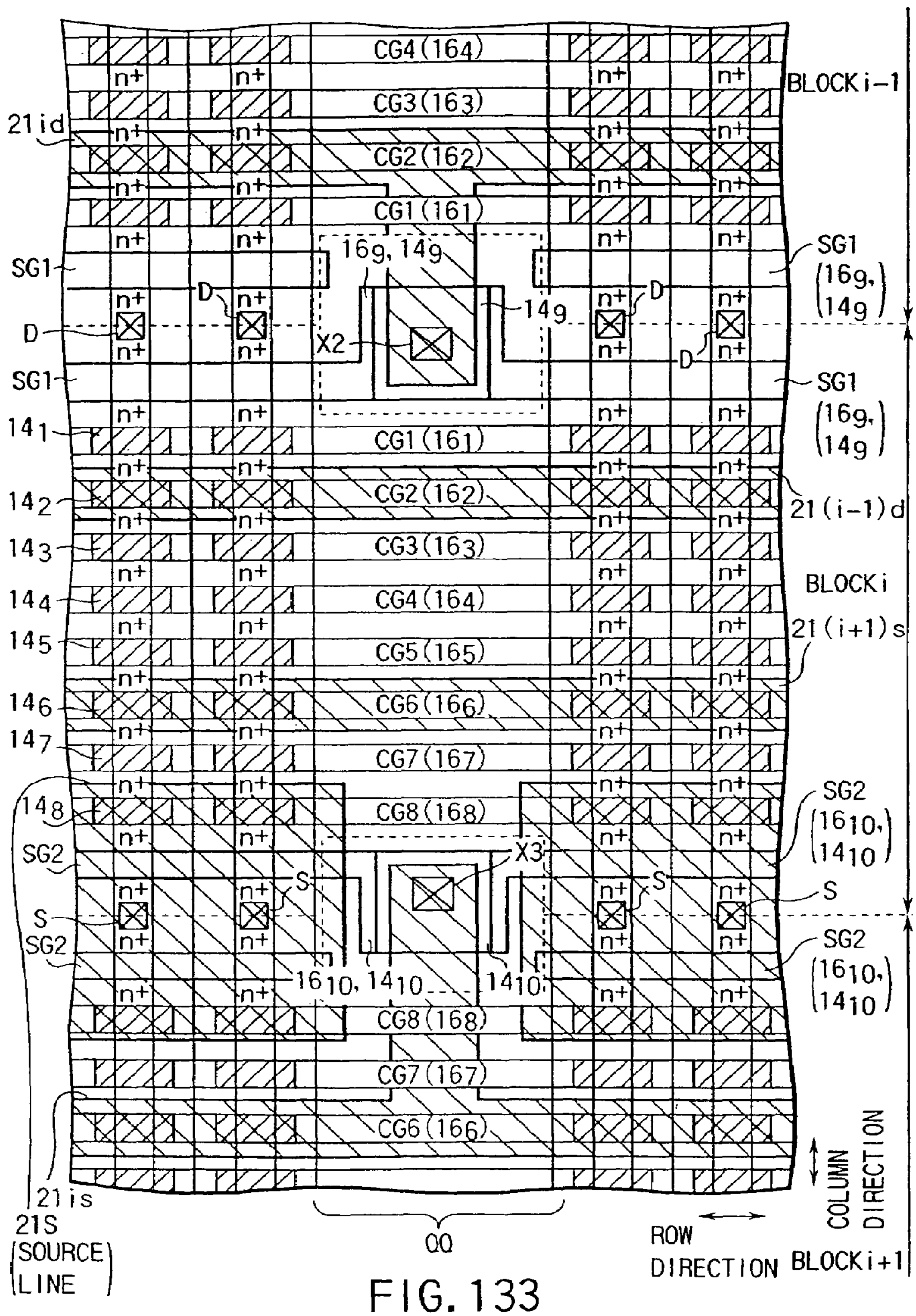
Figure 134:
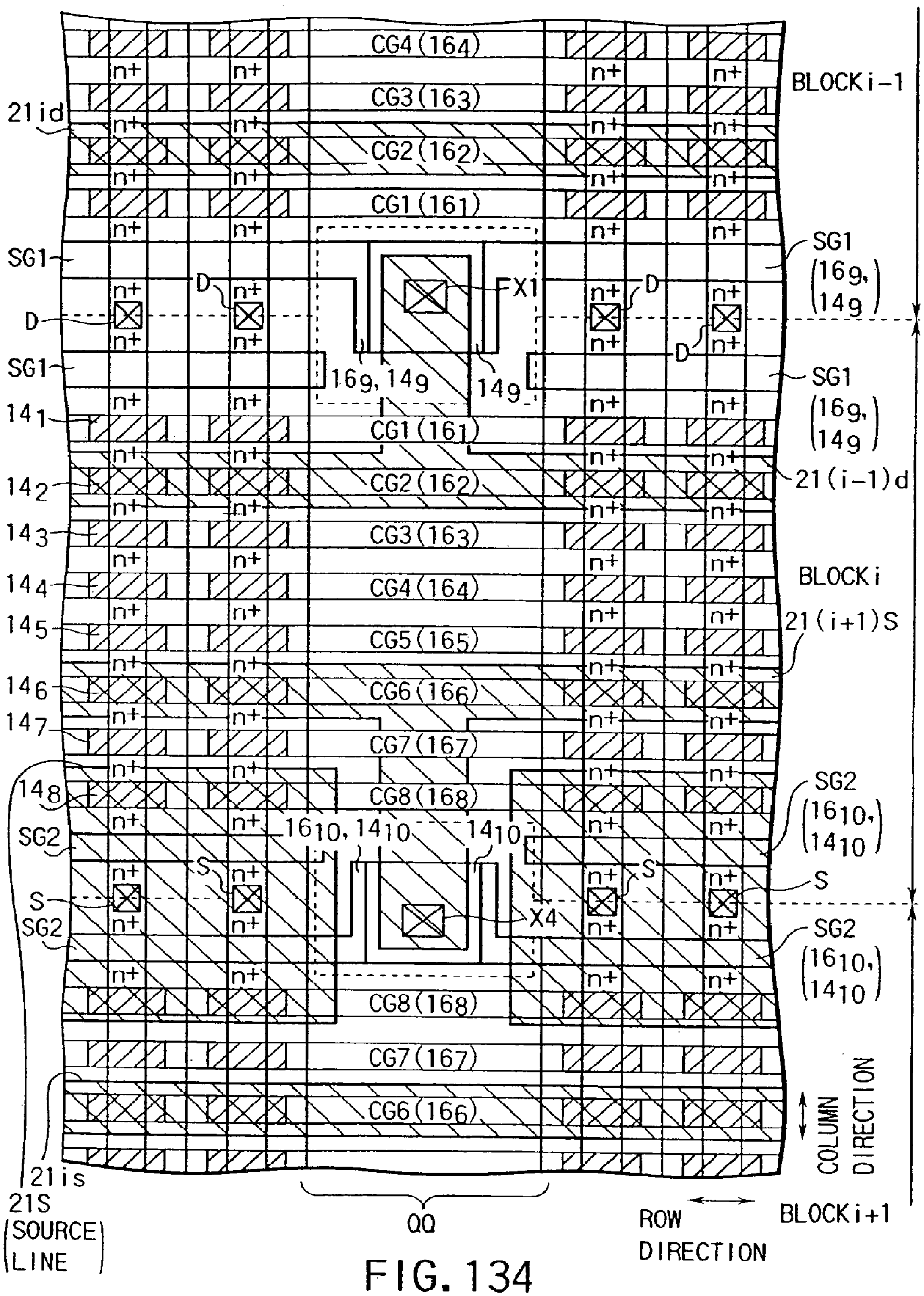
Figure 135:
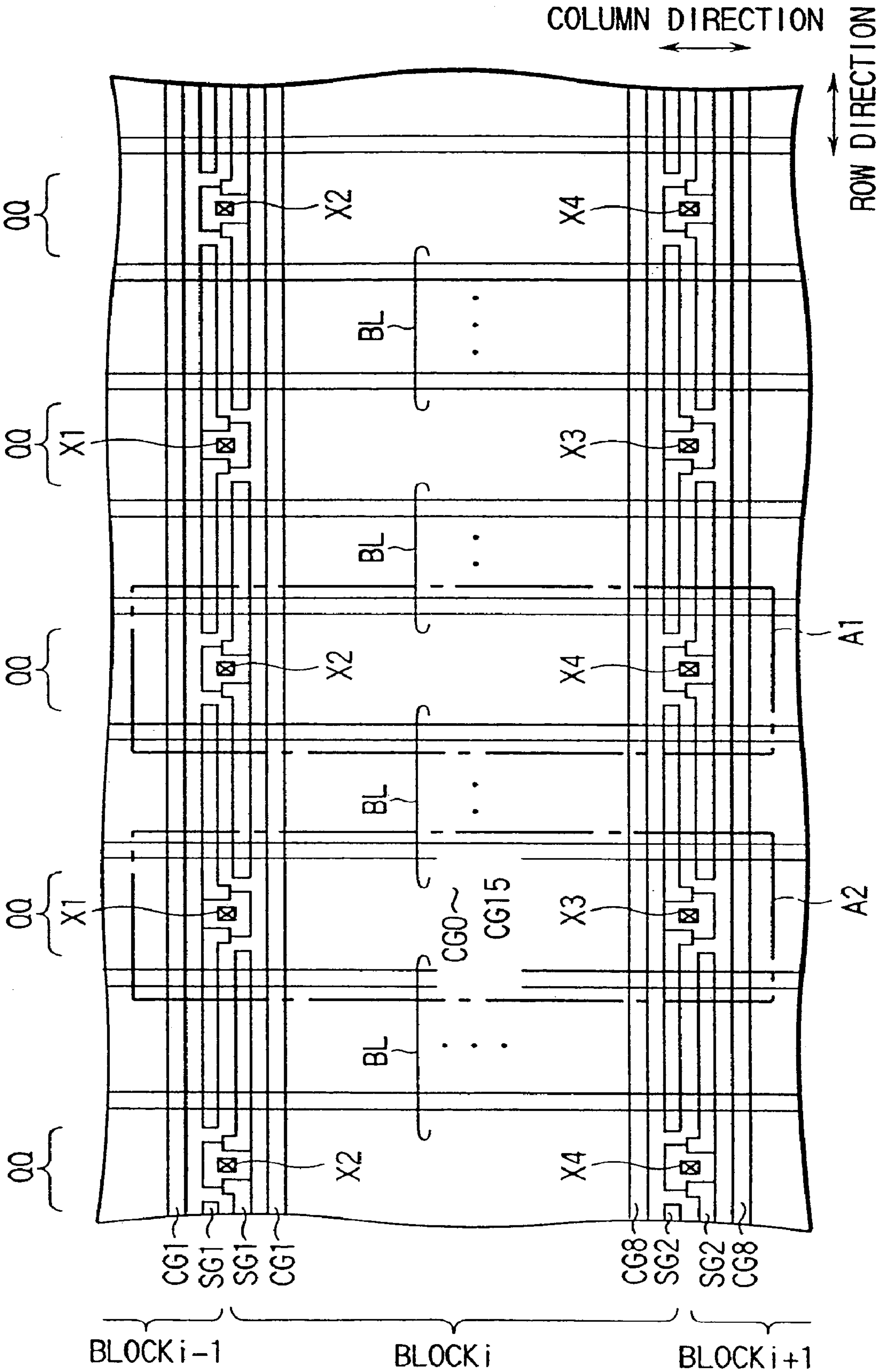
Figure 136:
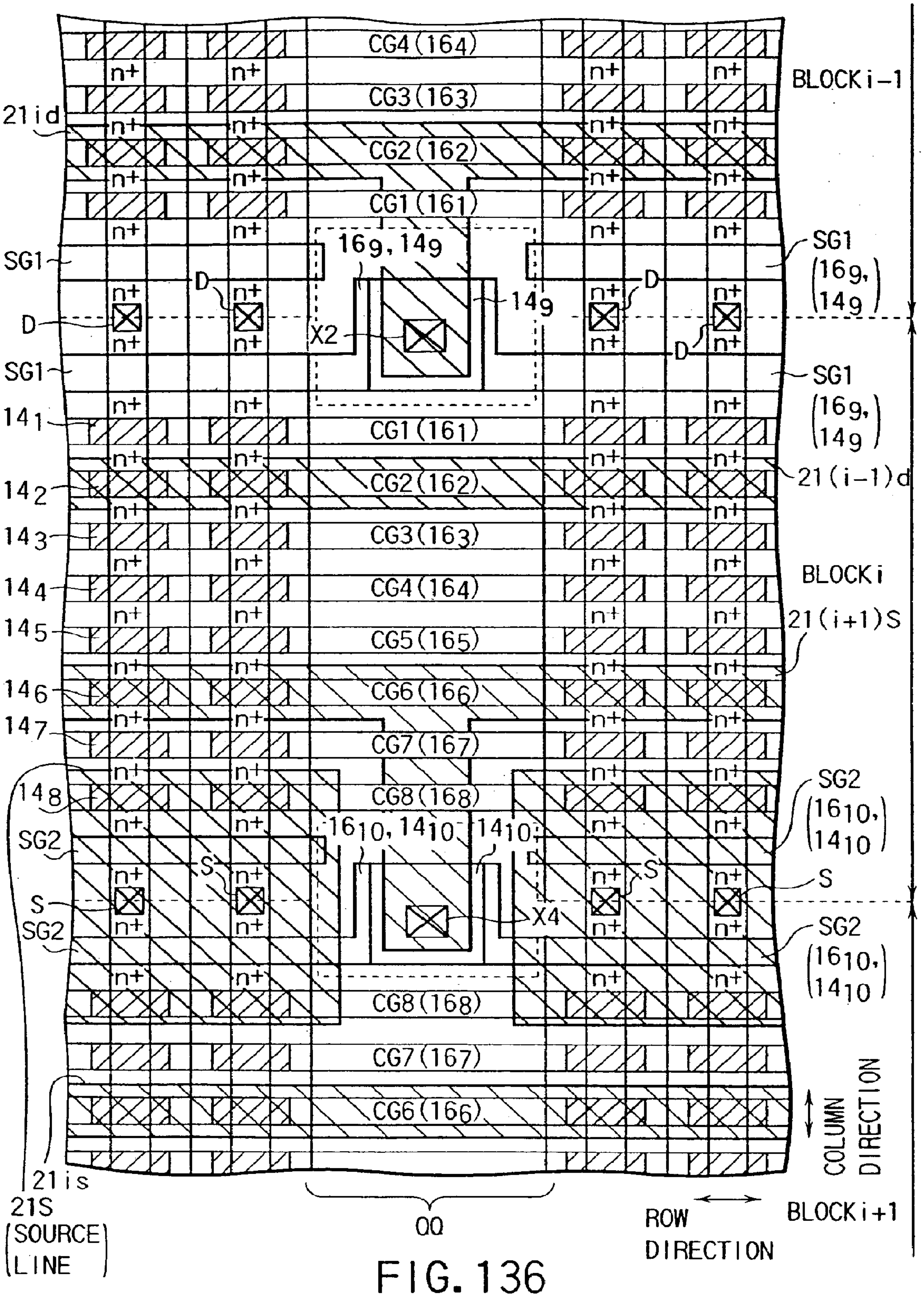
Figure 137:
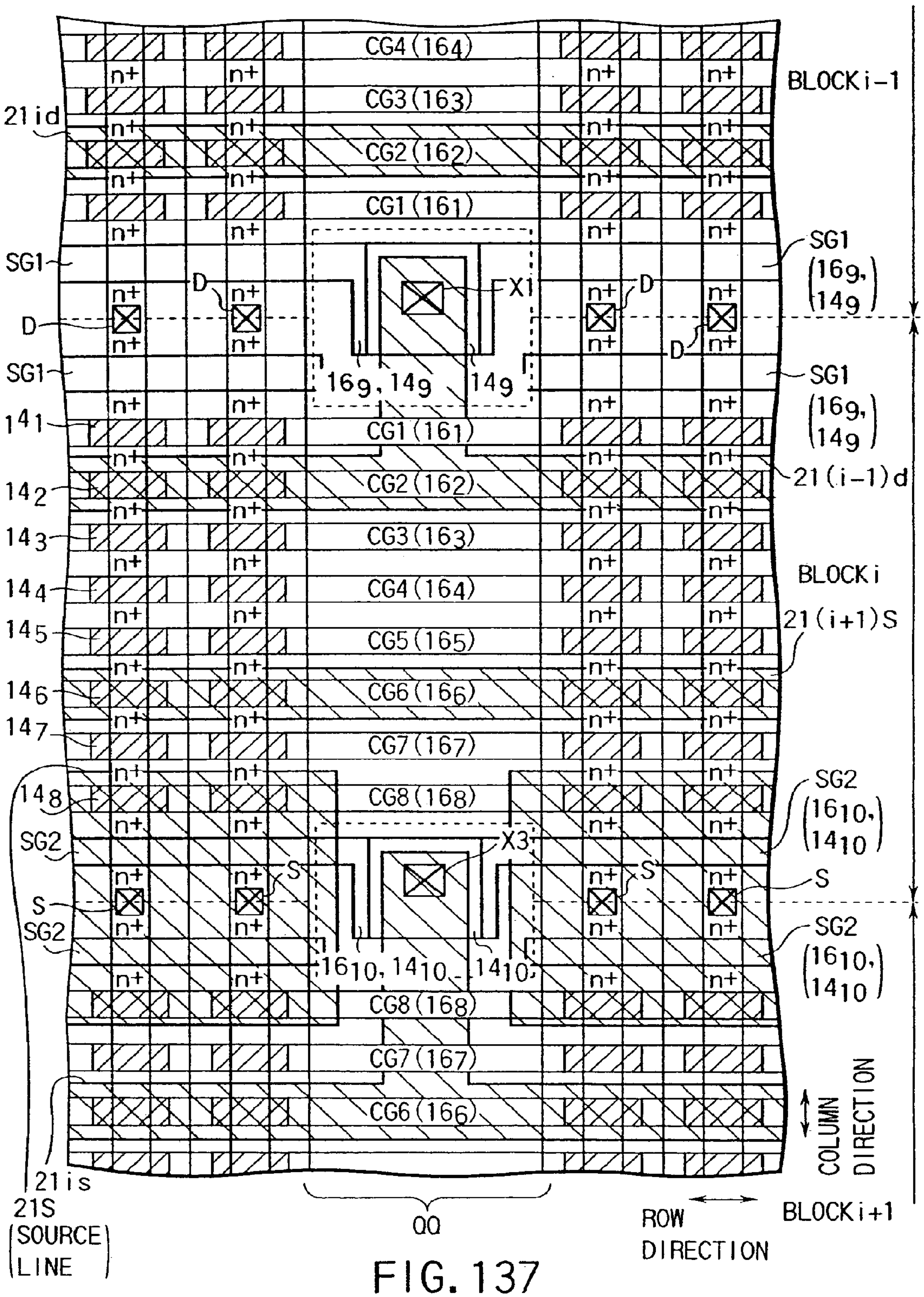
Figure 138:
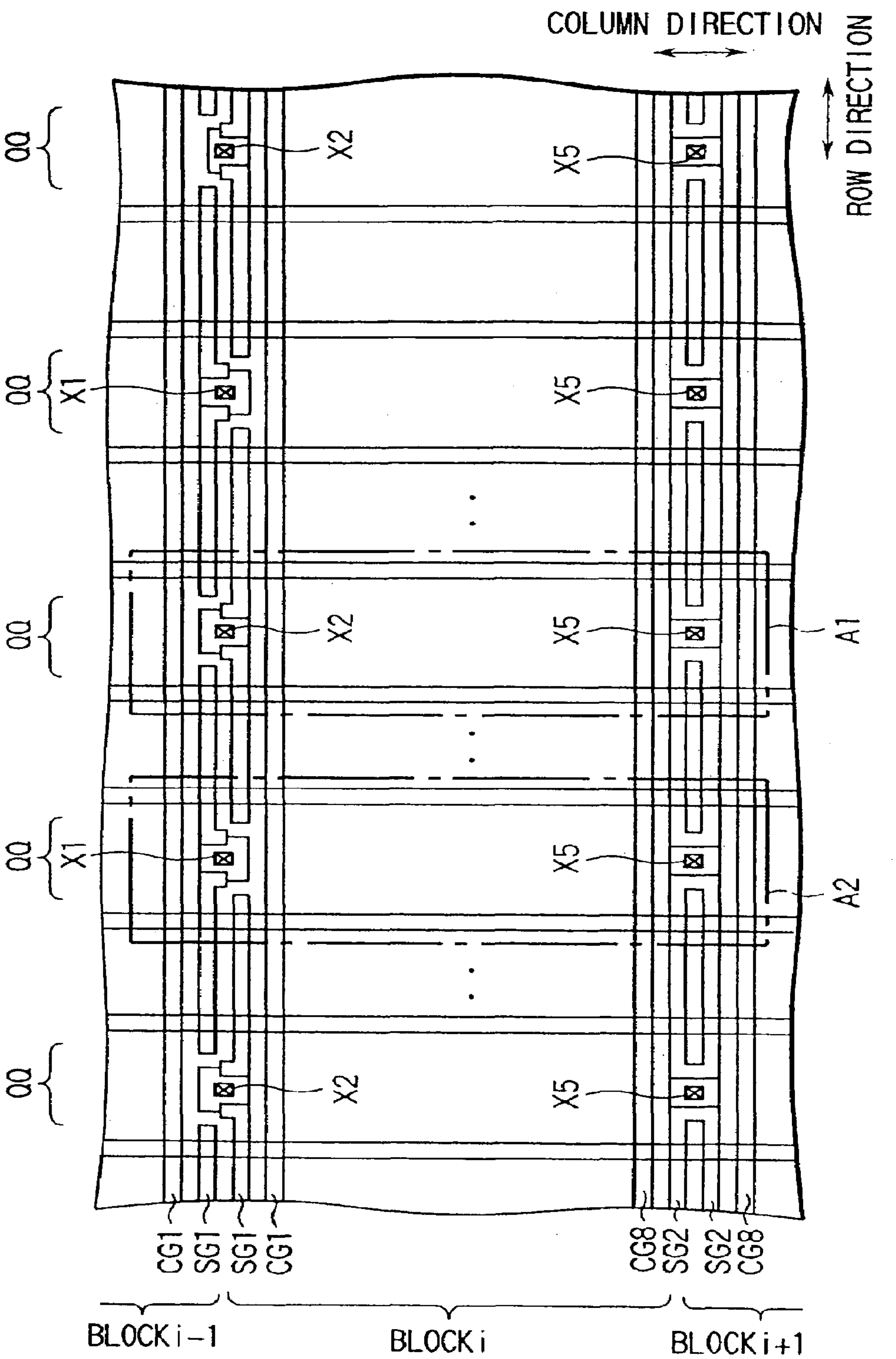
Figure 139:
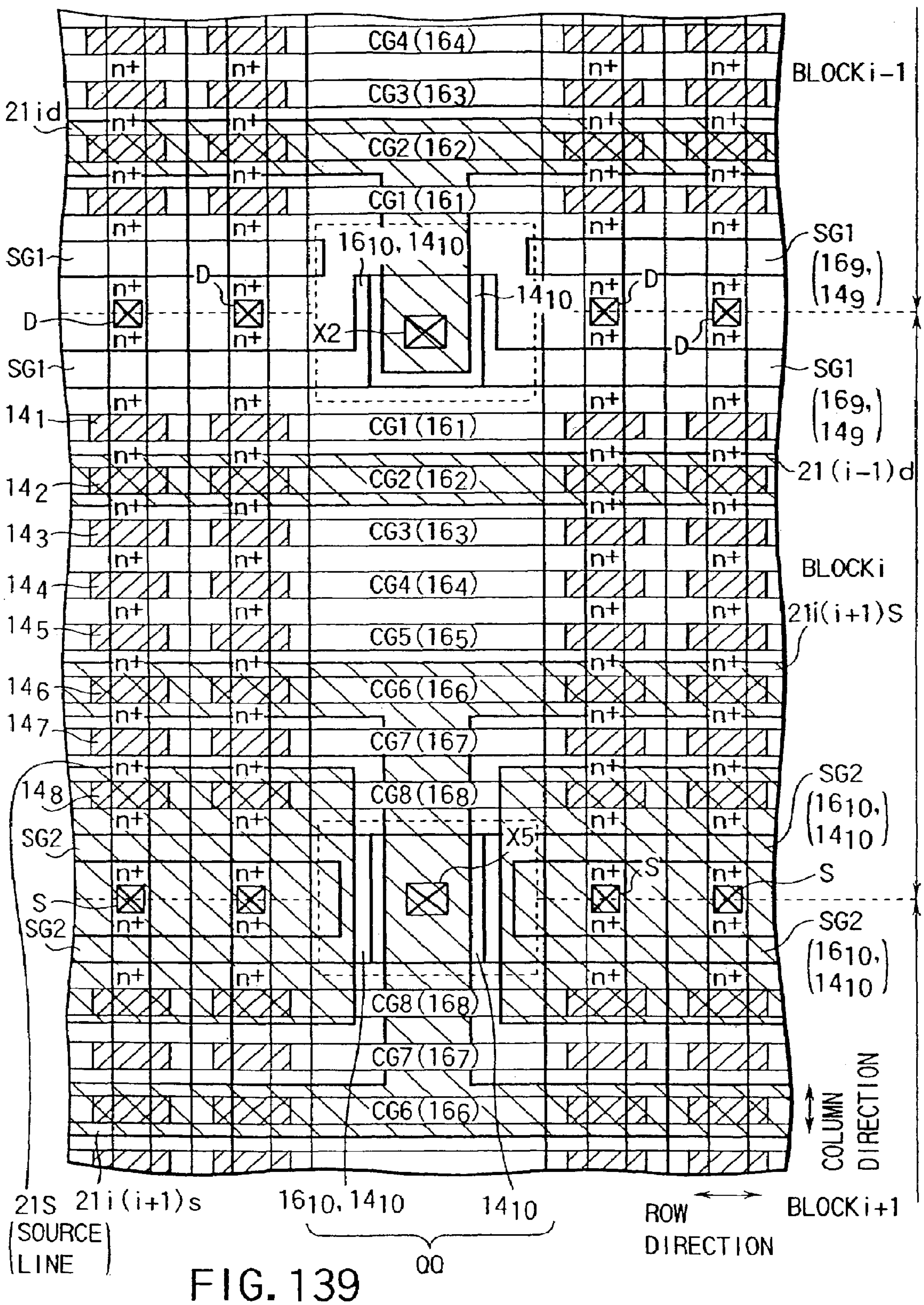
Figure 140:
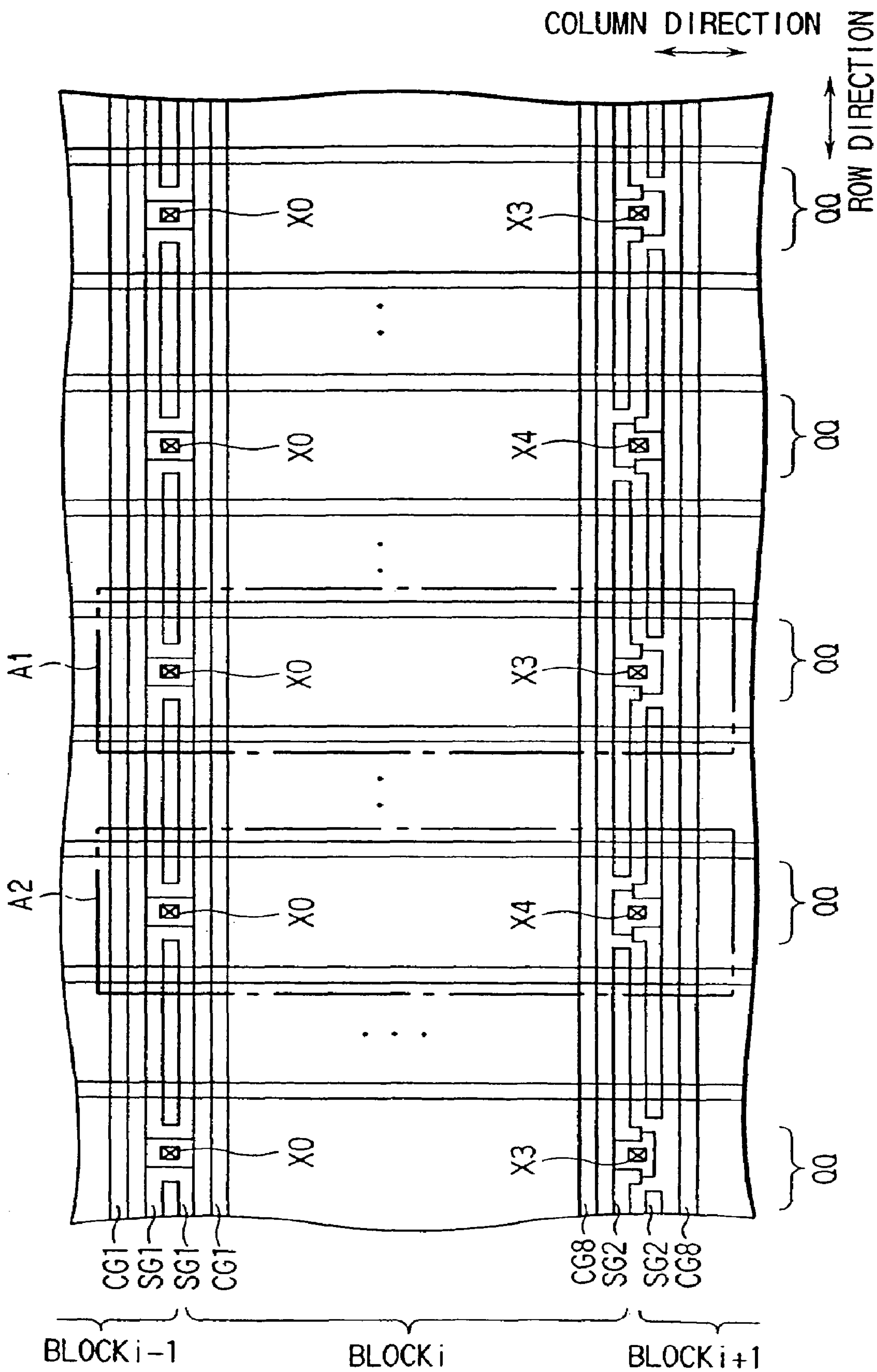
Figure 141:
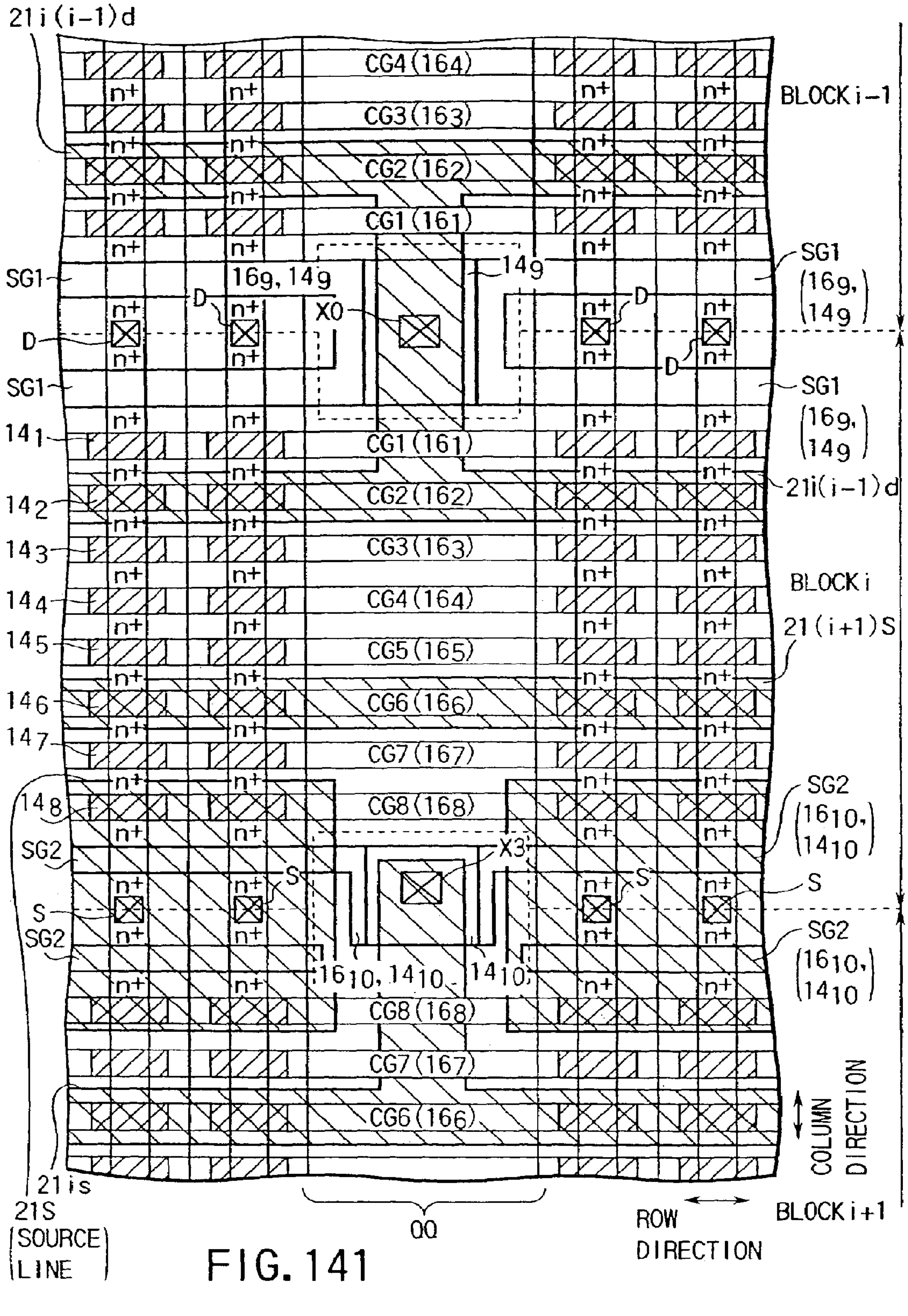
Figure 142:
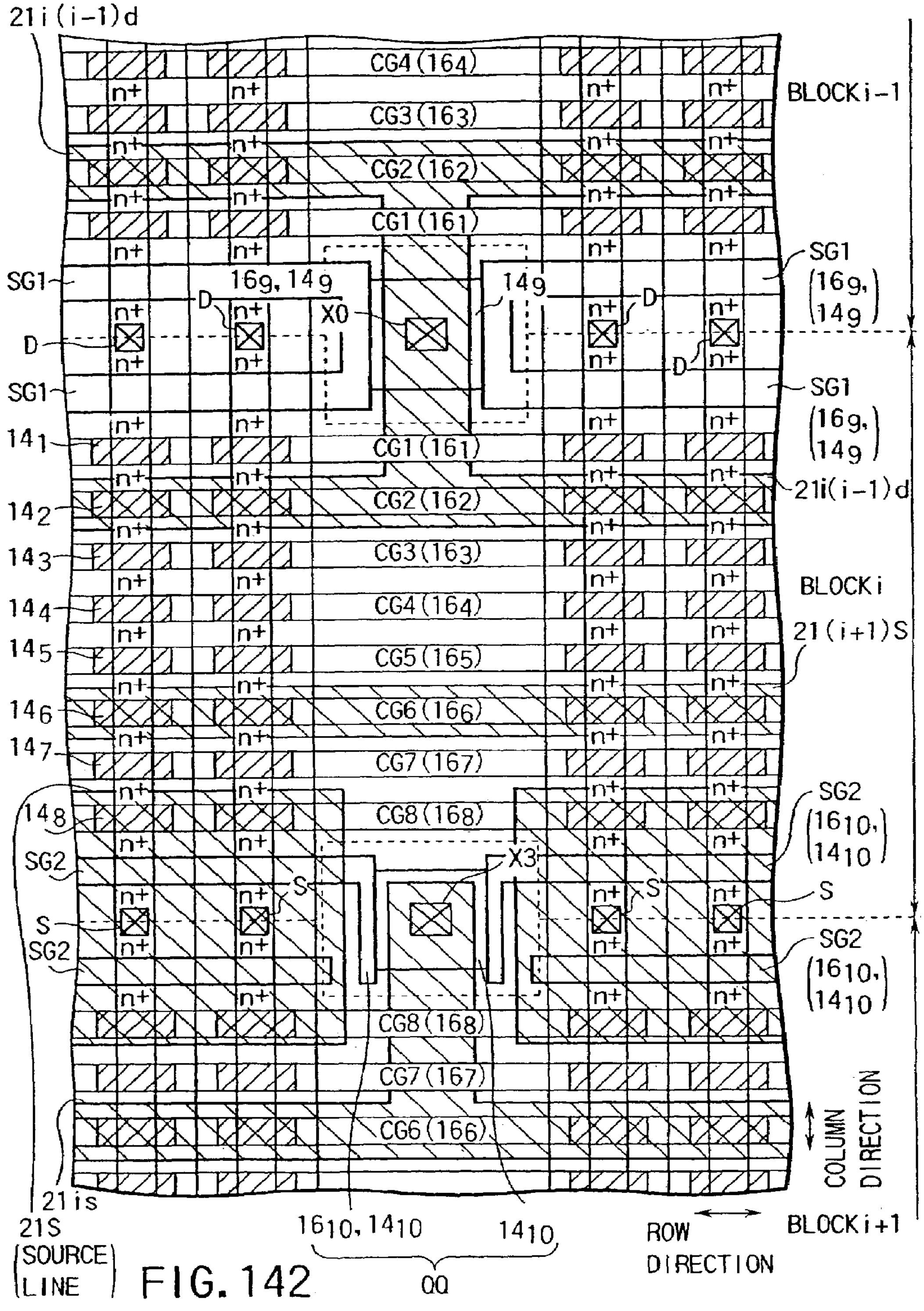
Figure 143:
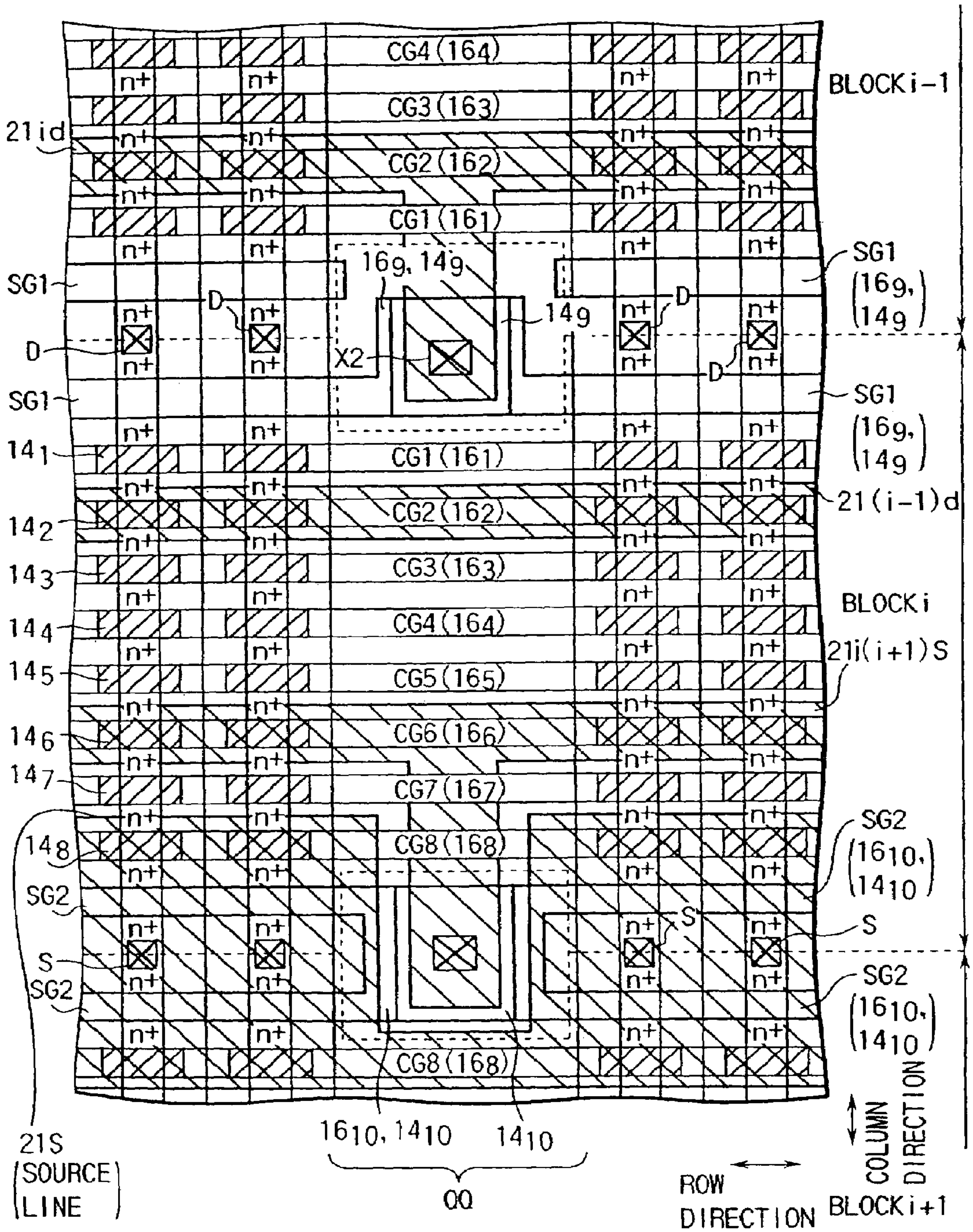
Figure 144:
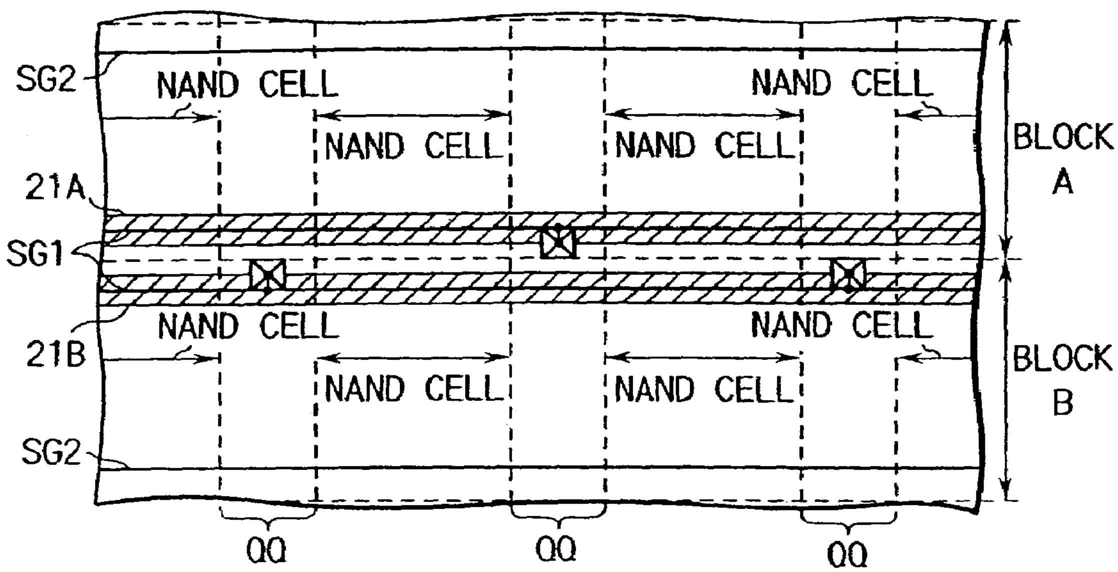
Figure 145:
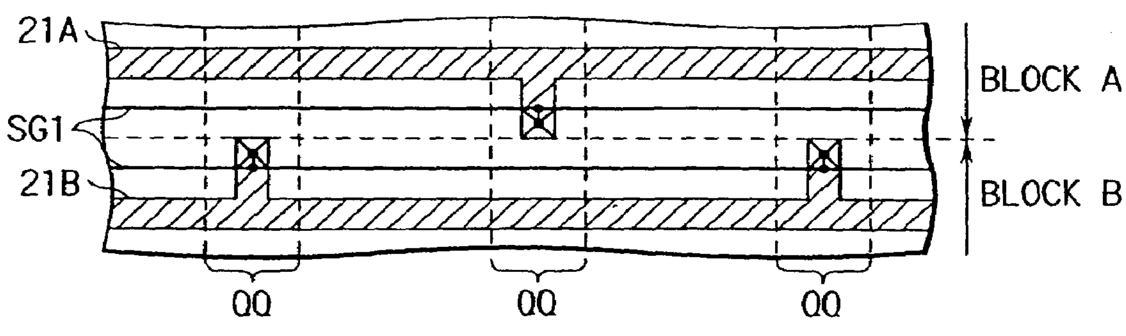
Figure 146:
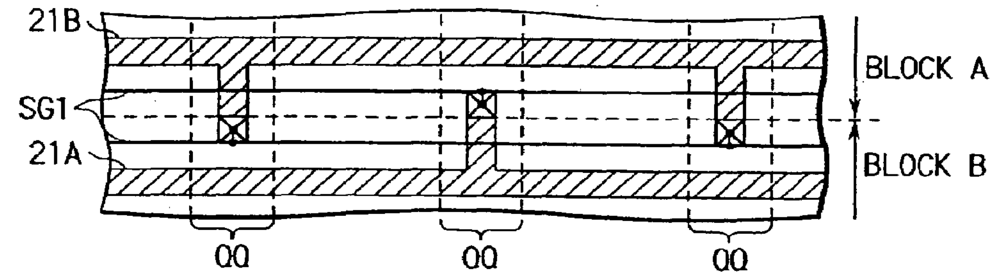
Figure 147:
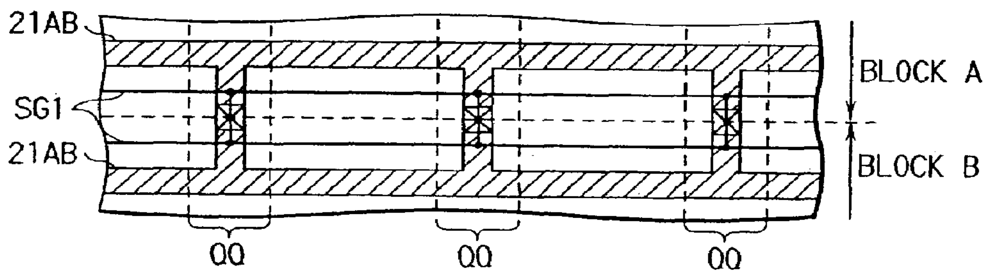
Figure 148:
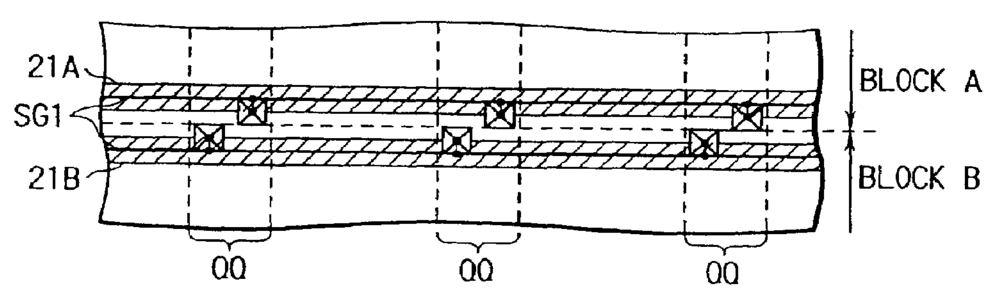
Figure 149:
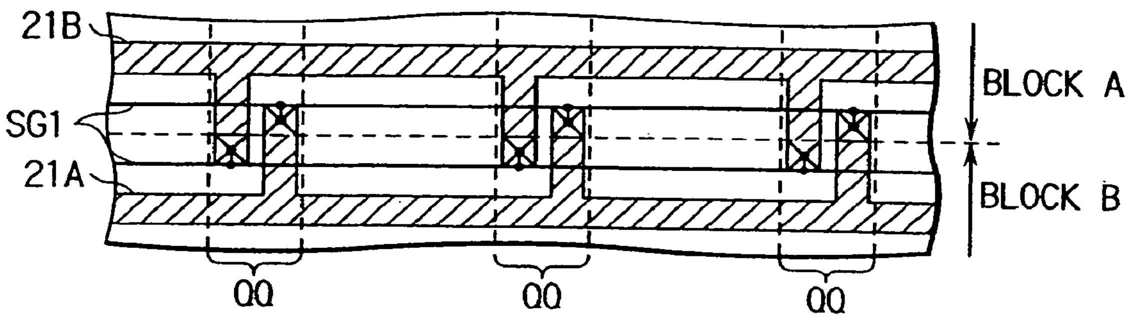
Figure 150:
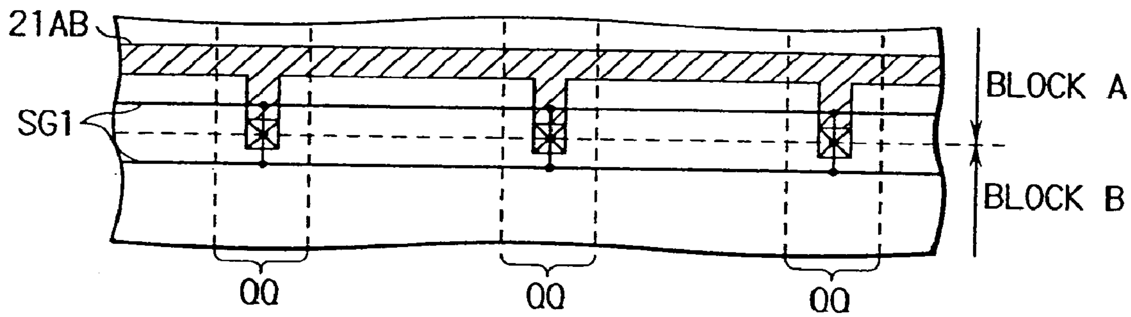
Figure 151:
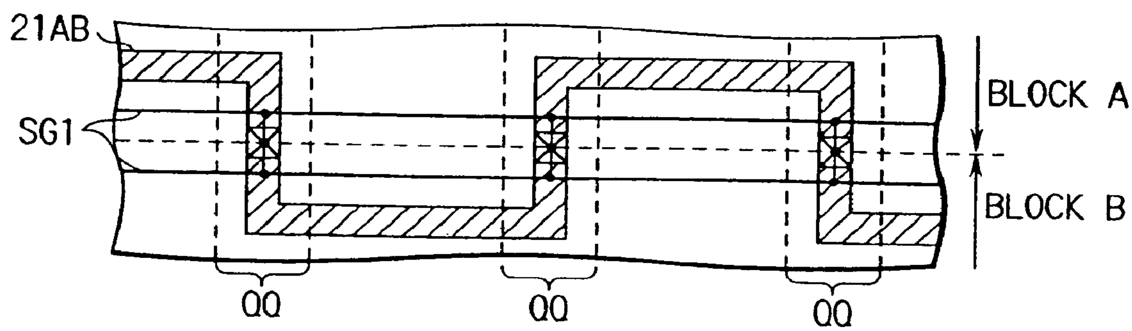
Figure 152:
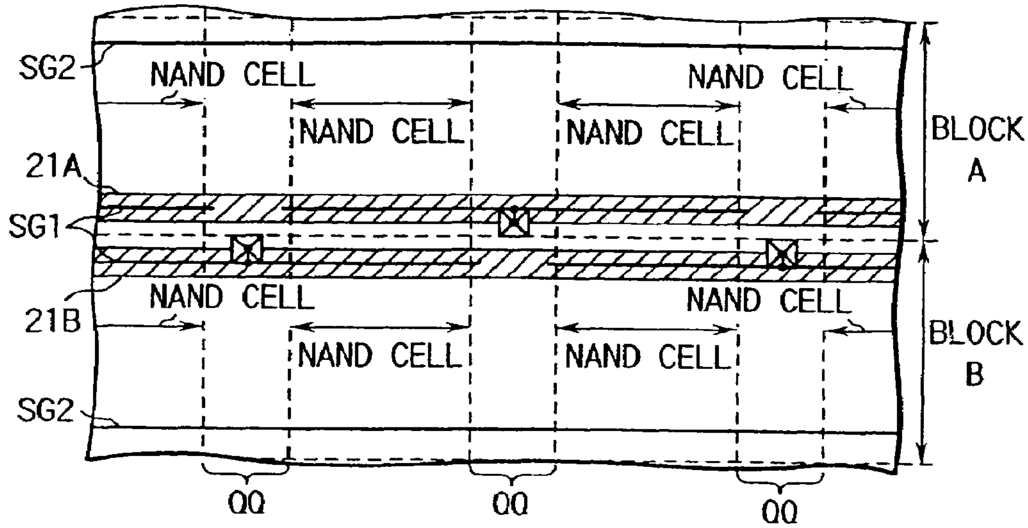
Figure 153:
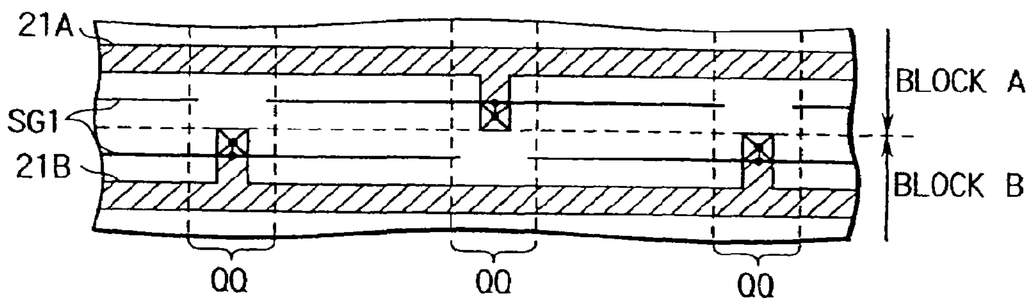
Figure 154:
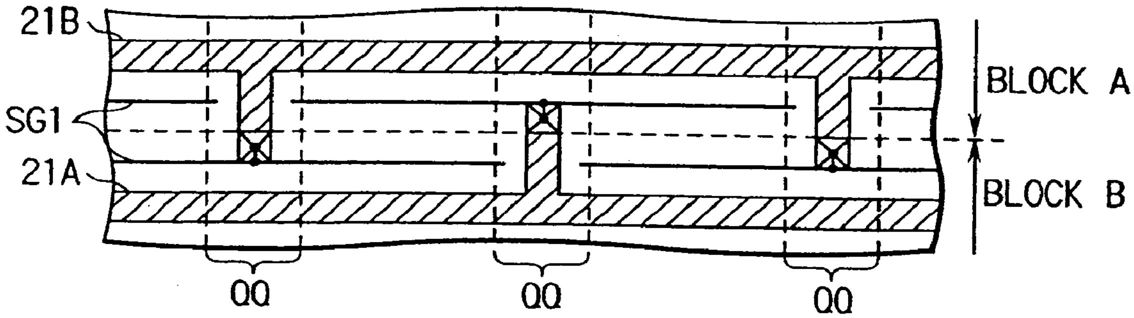
Figure 155:
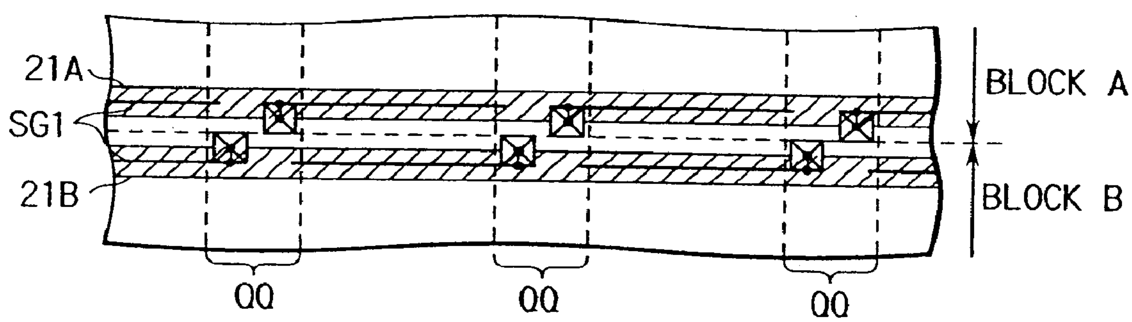
Figure 156:
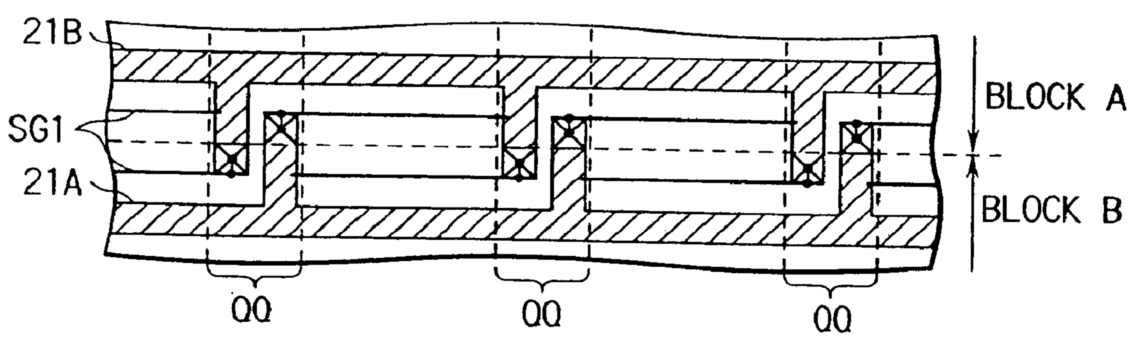
Figure 157:
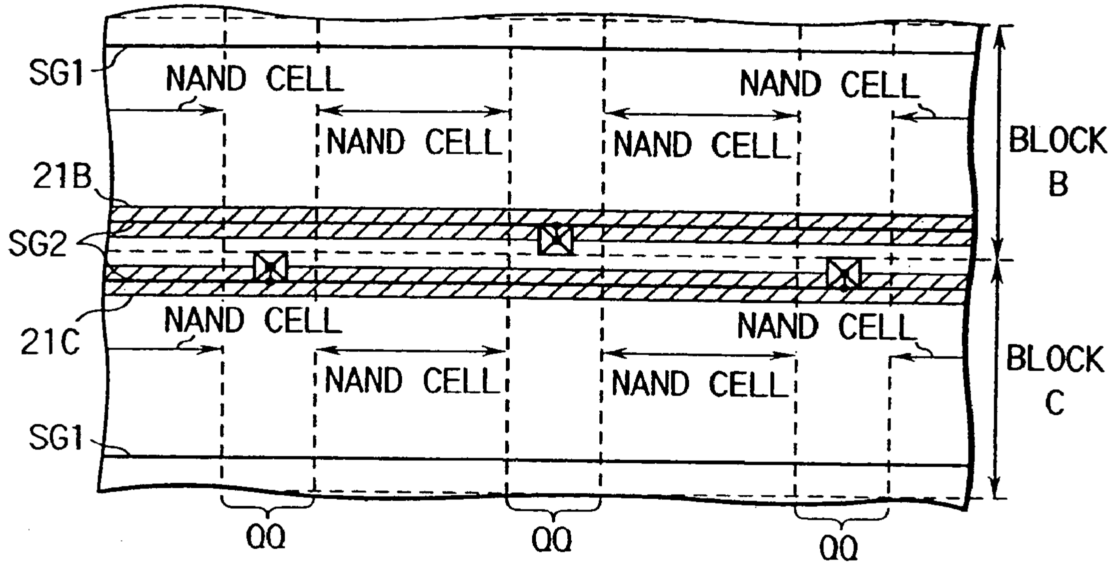
Figure 158:
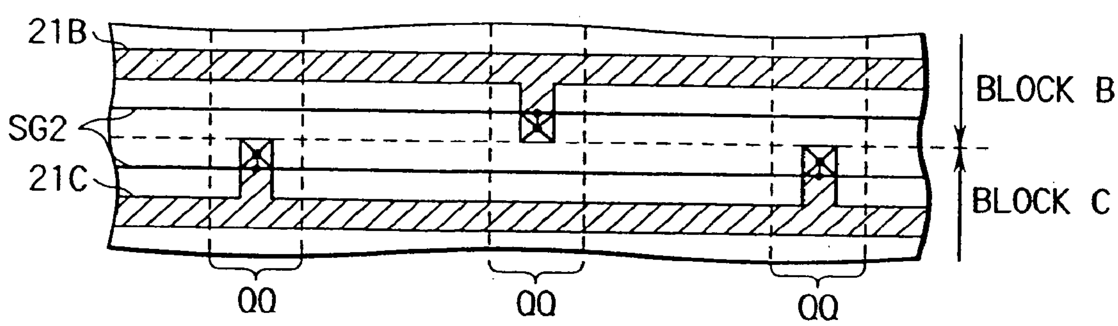
Figure 159:
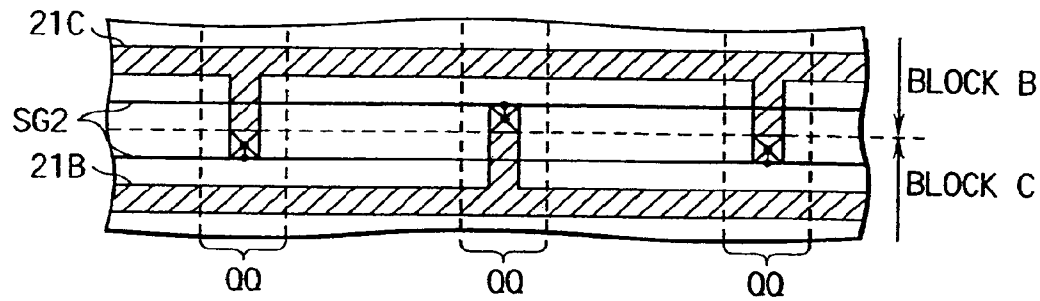
Figure 160:
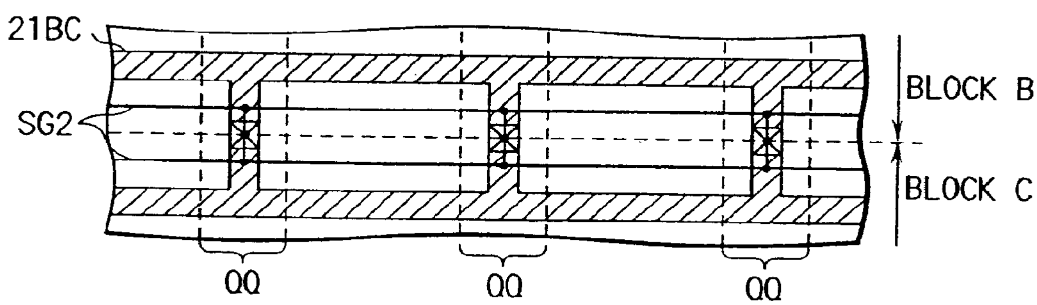
Figure 161:
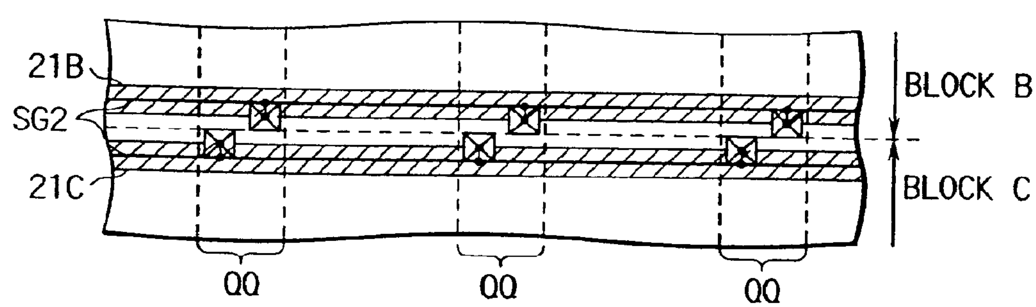
Figure 162:
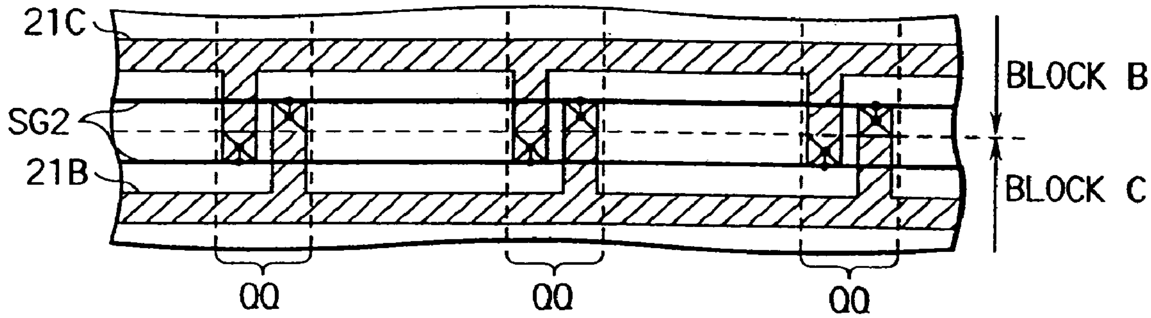
Figure 163:
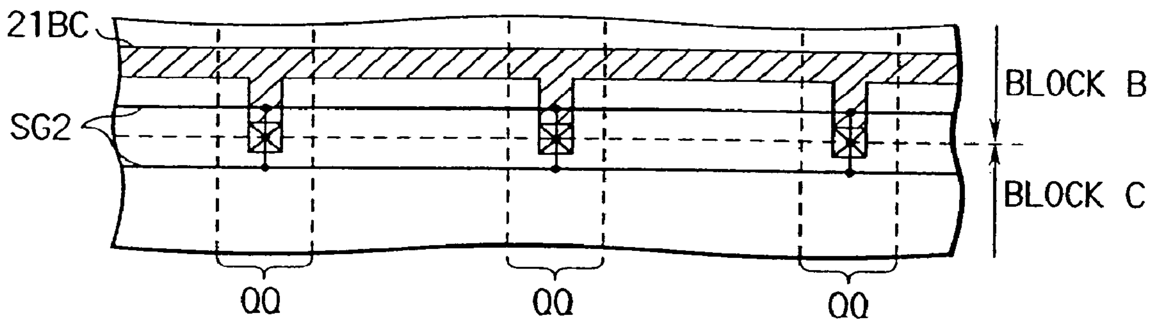
Figure 164:
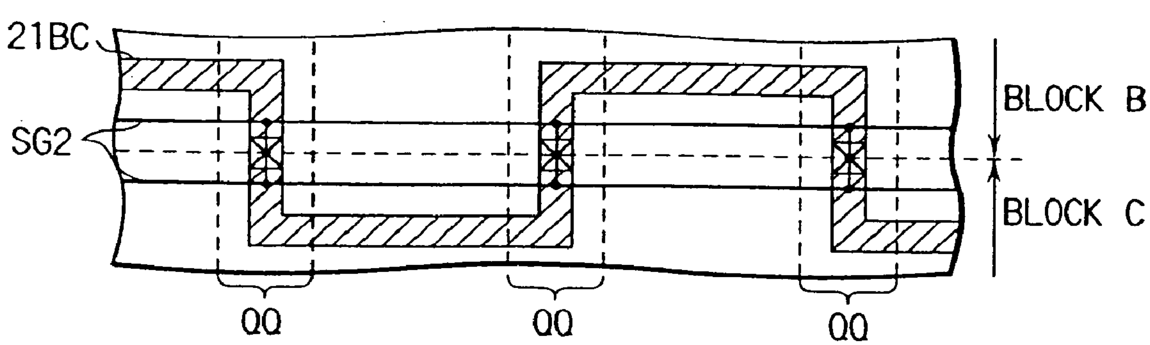
Figure 165:
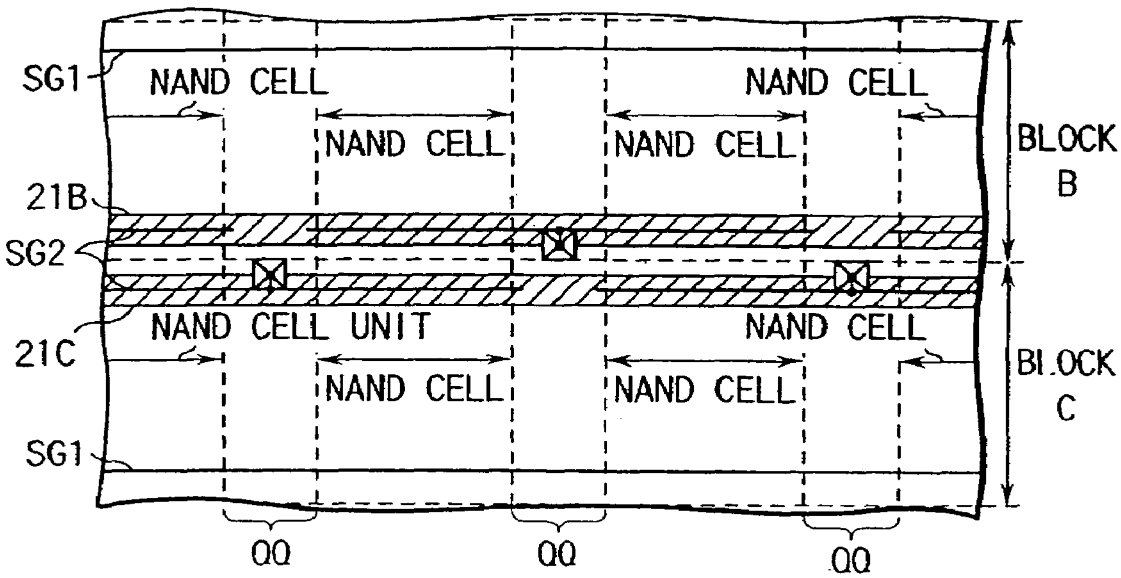
Figure 166:
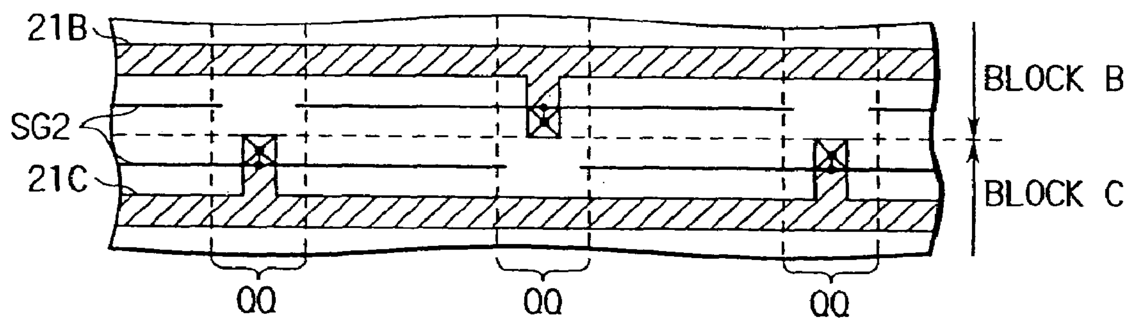
Figure 167:
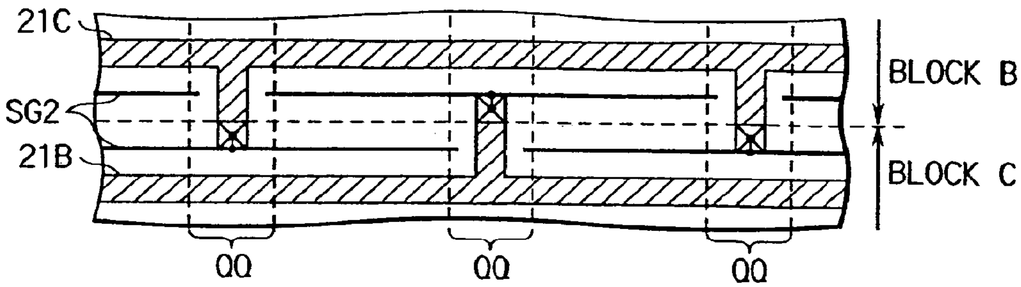
Figure 168:
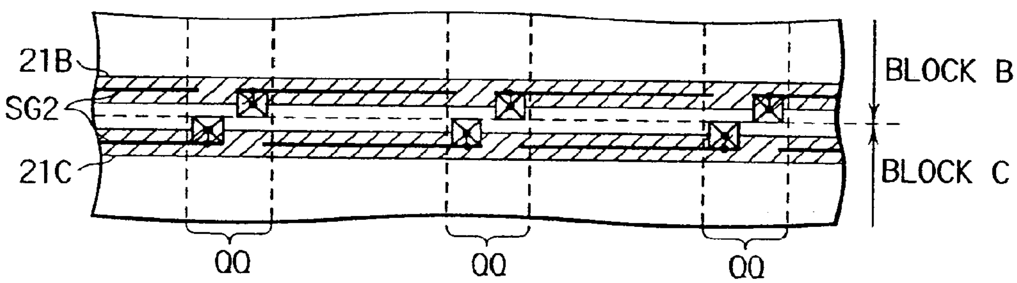
Figure 169:
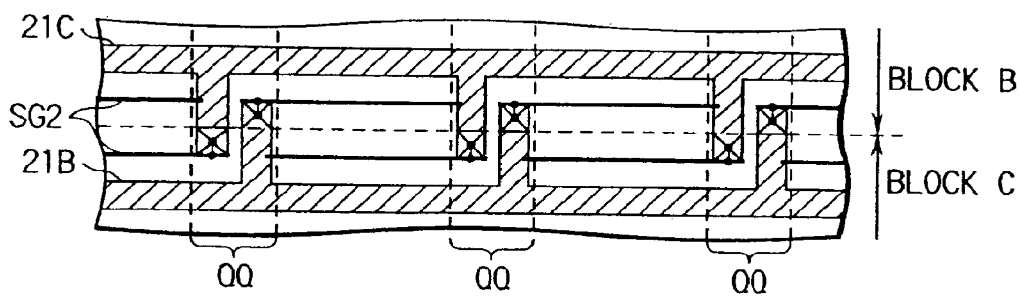
Figure 170:
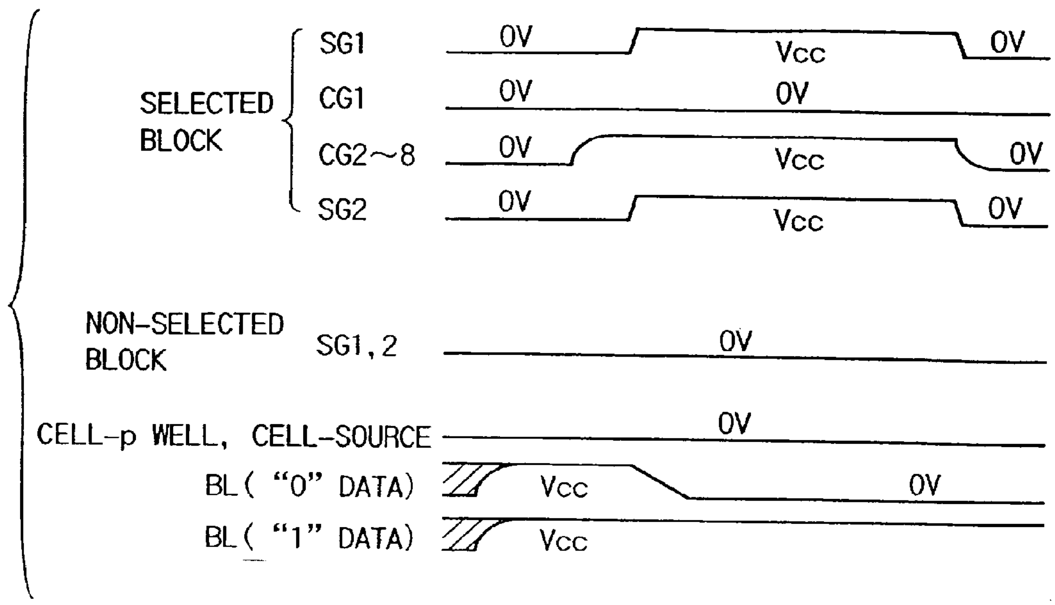
Figure 171:
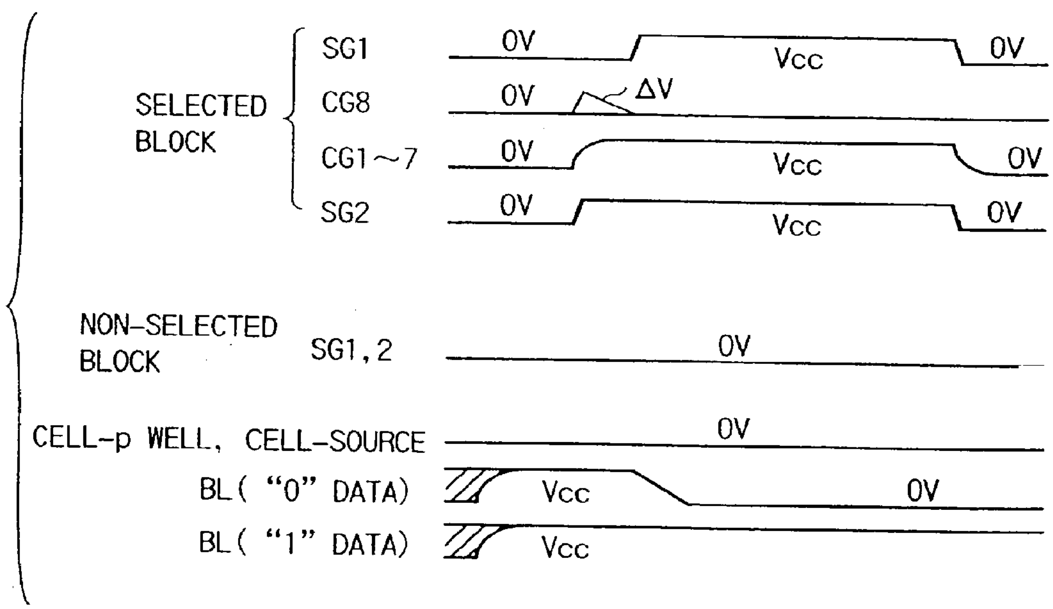
Figure 172:
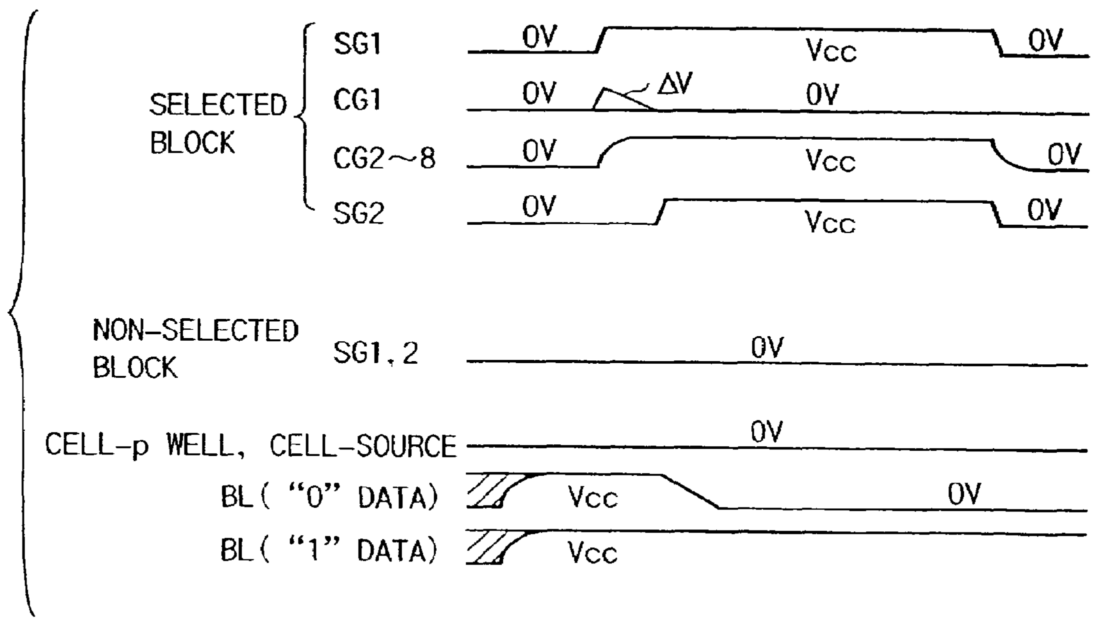
Figure 173:
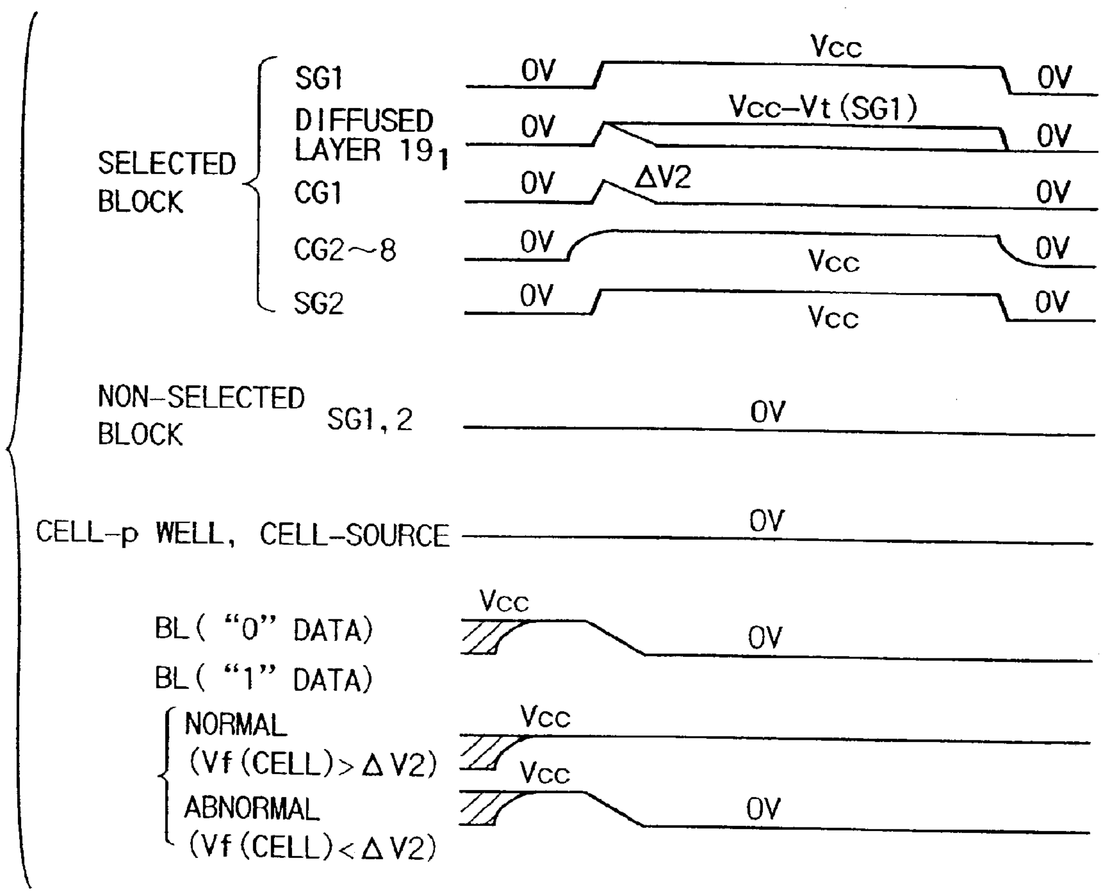
Figure 174:
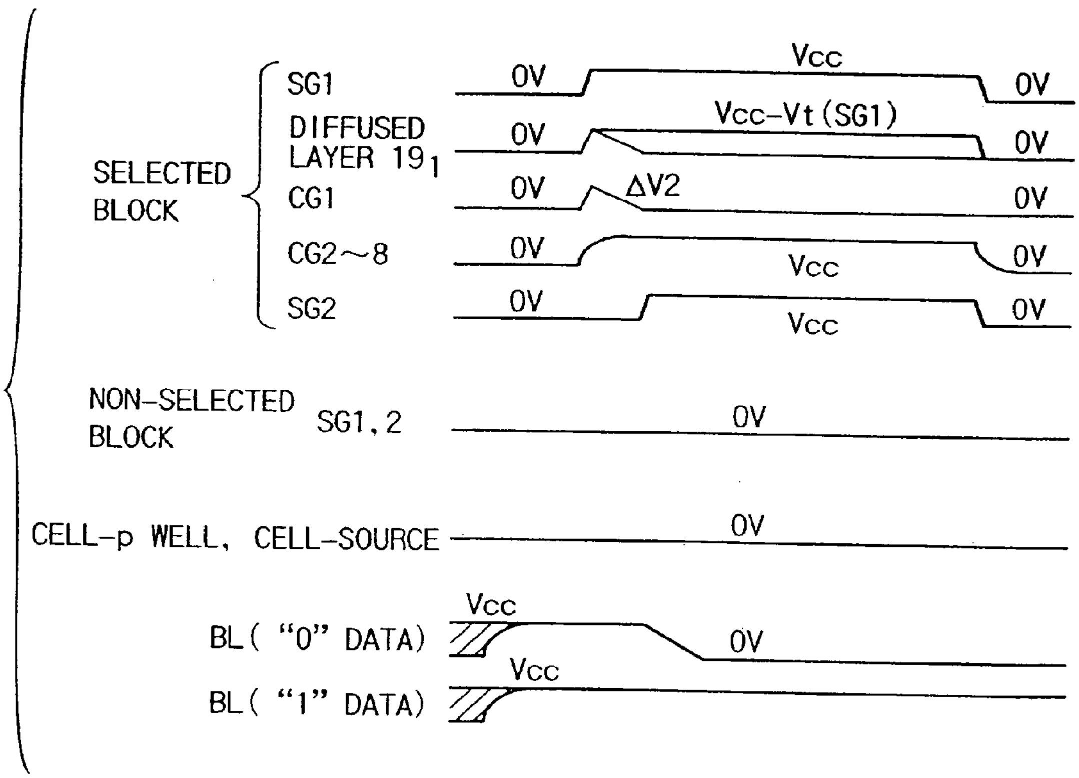
Figure 175:
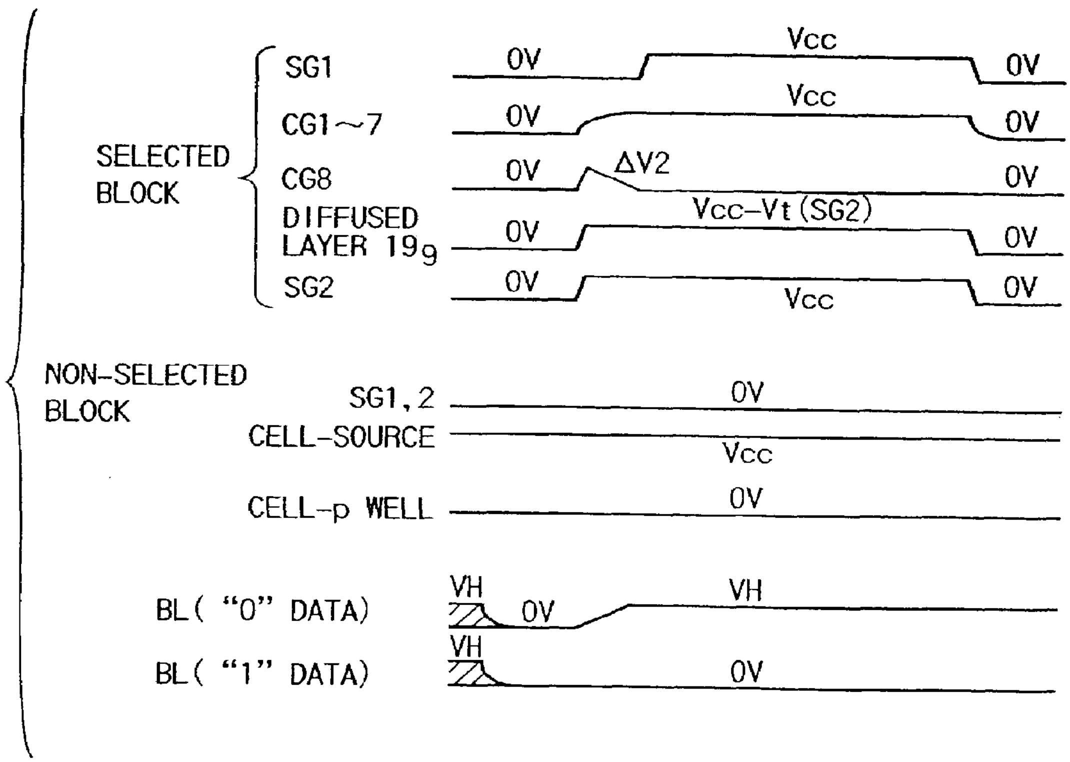
Figure 176:
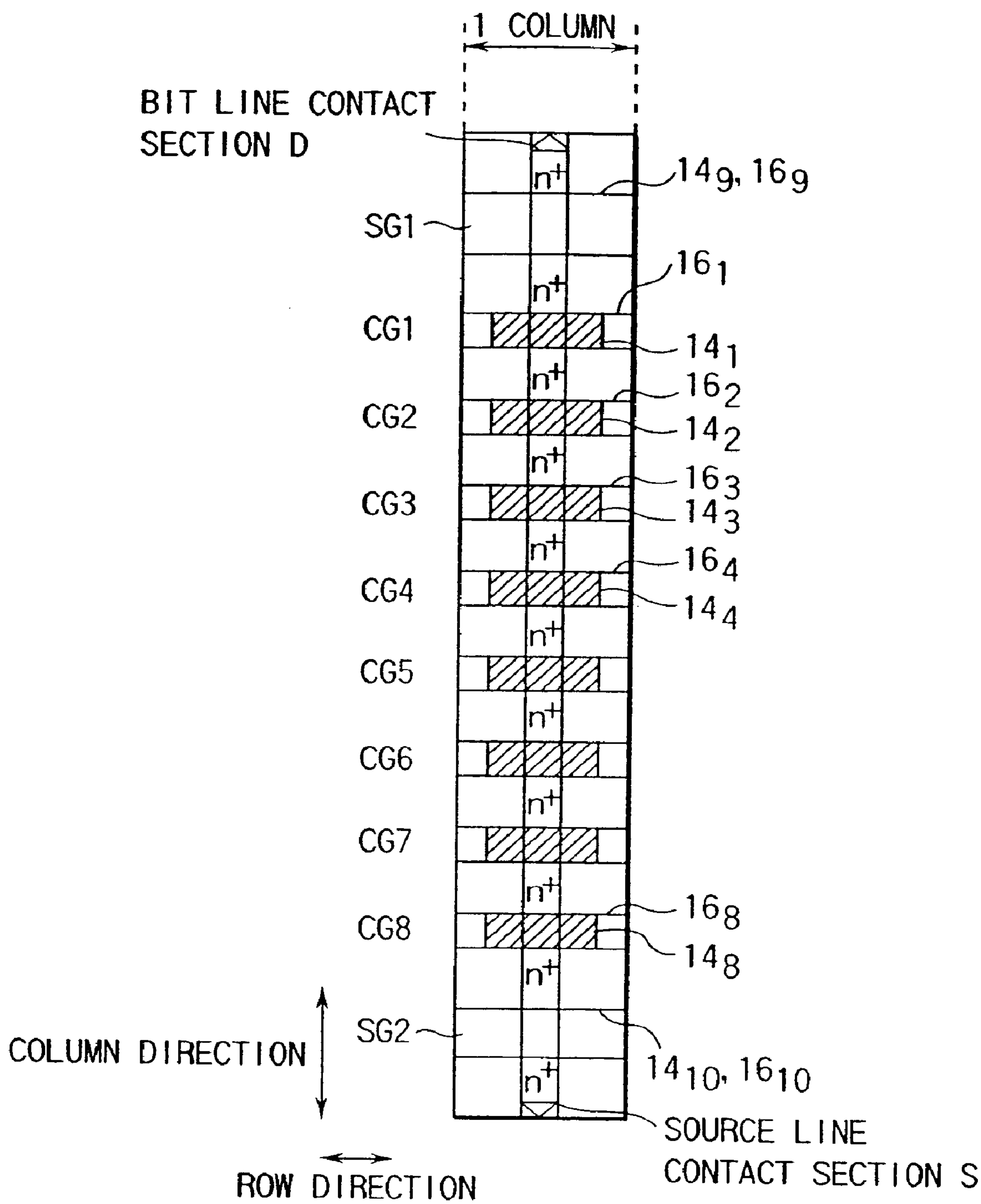
Figure 177:
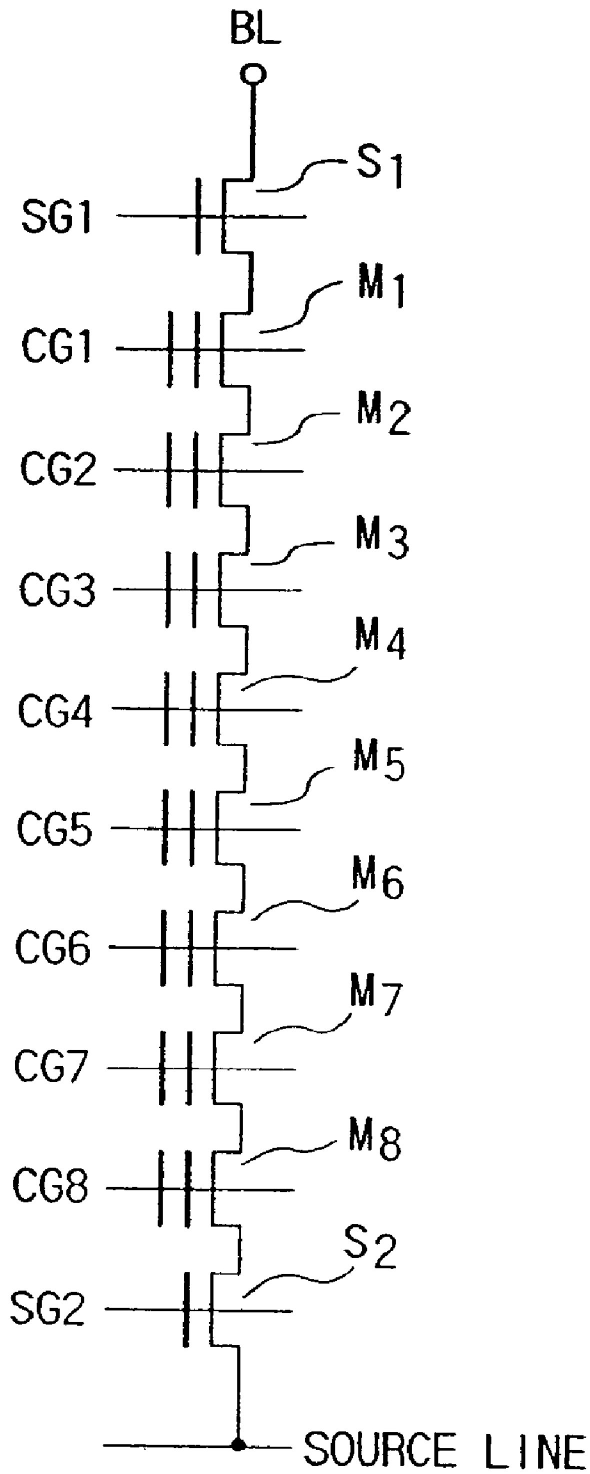
Figure 178:
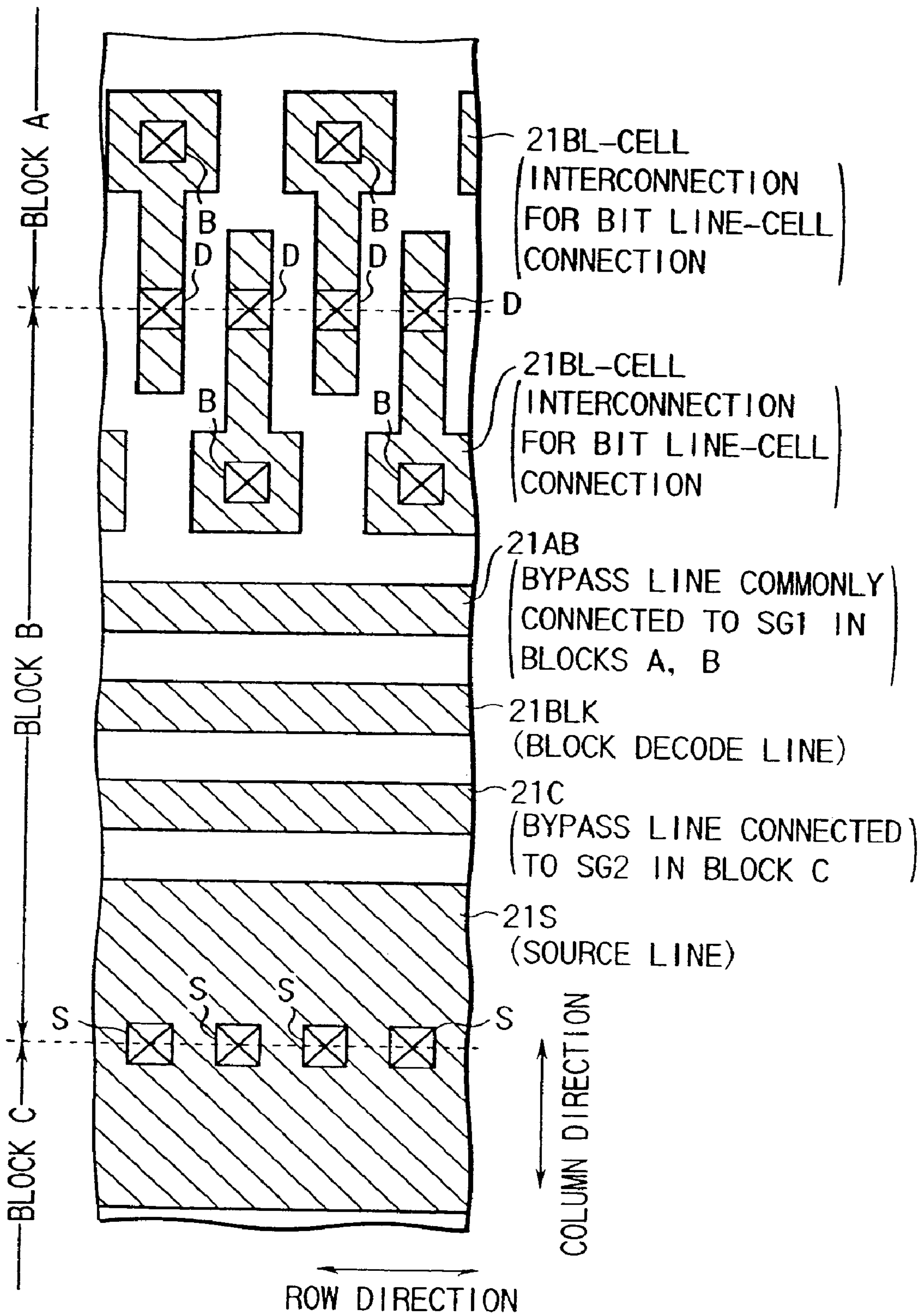
Figure 179:
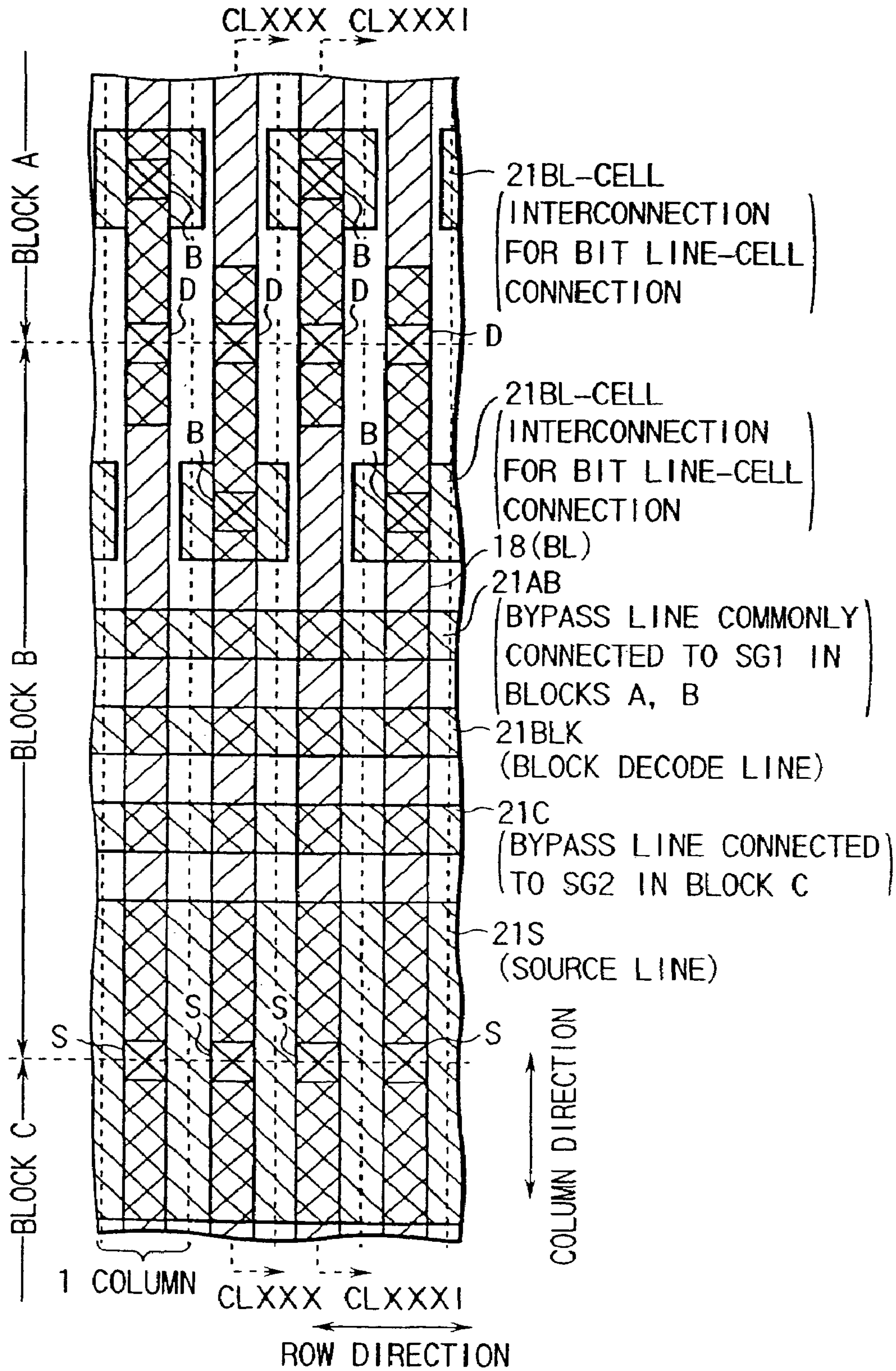
Figure 180:
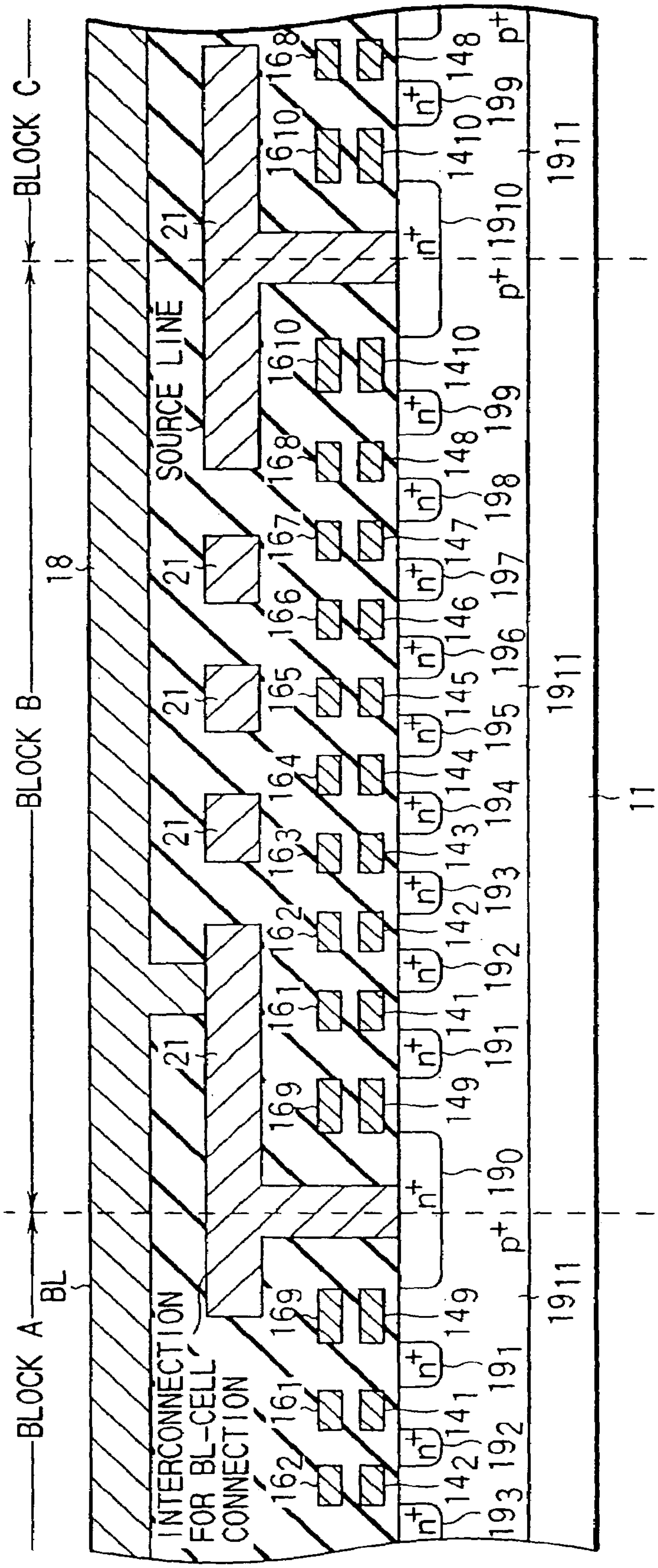
Figure 181:
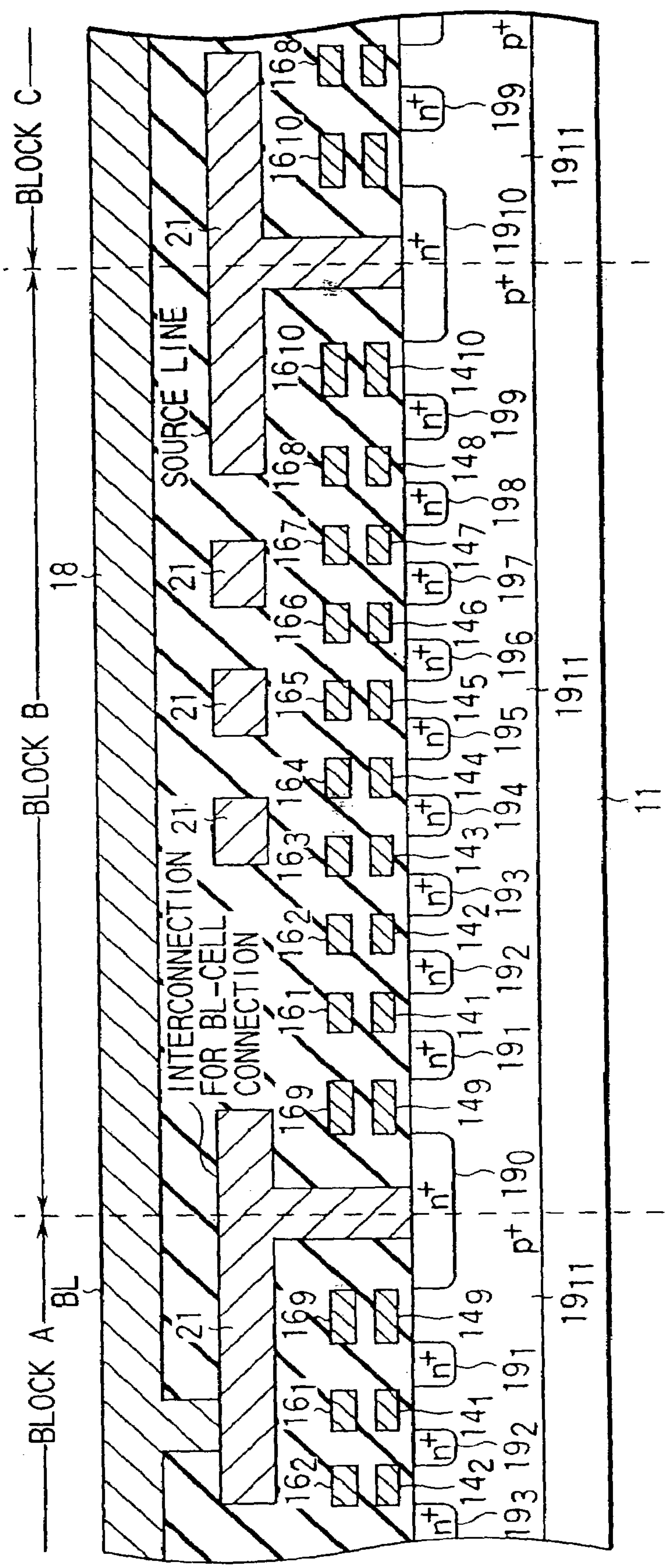
Figure 182:
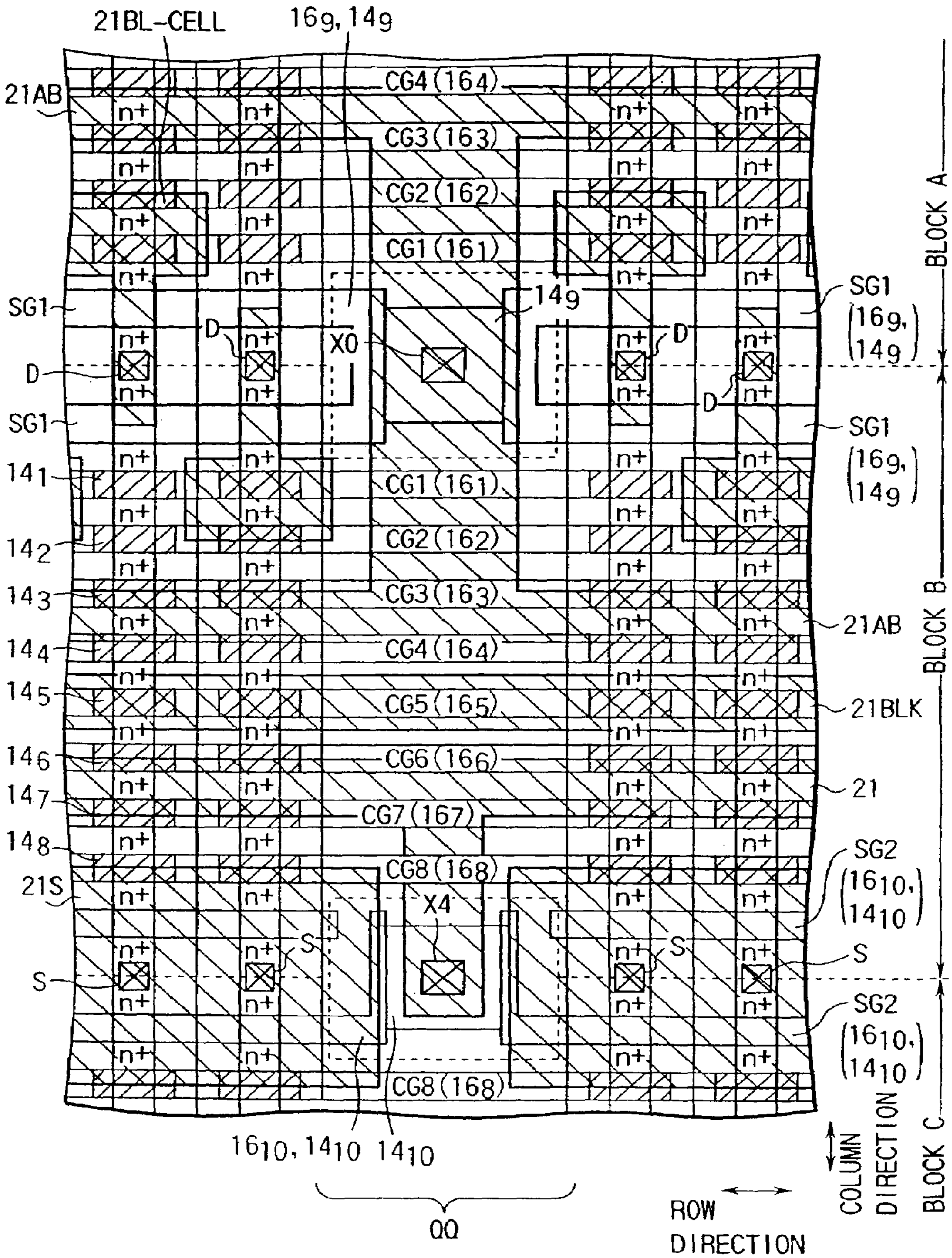
Figure 183:
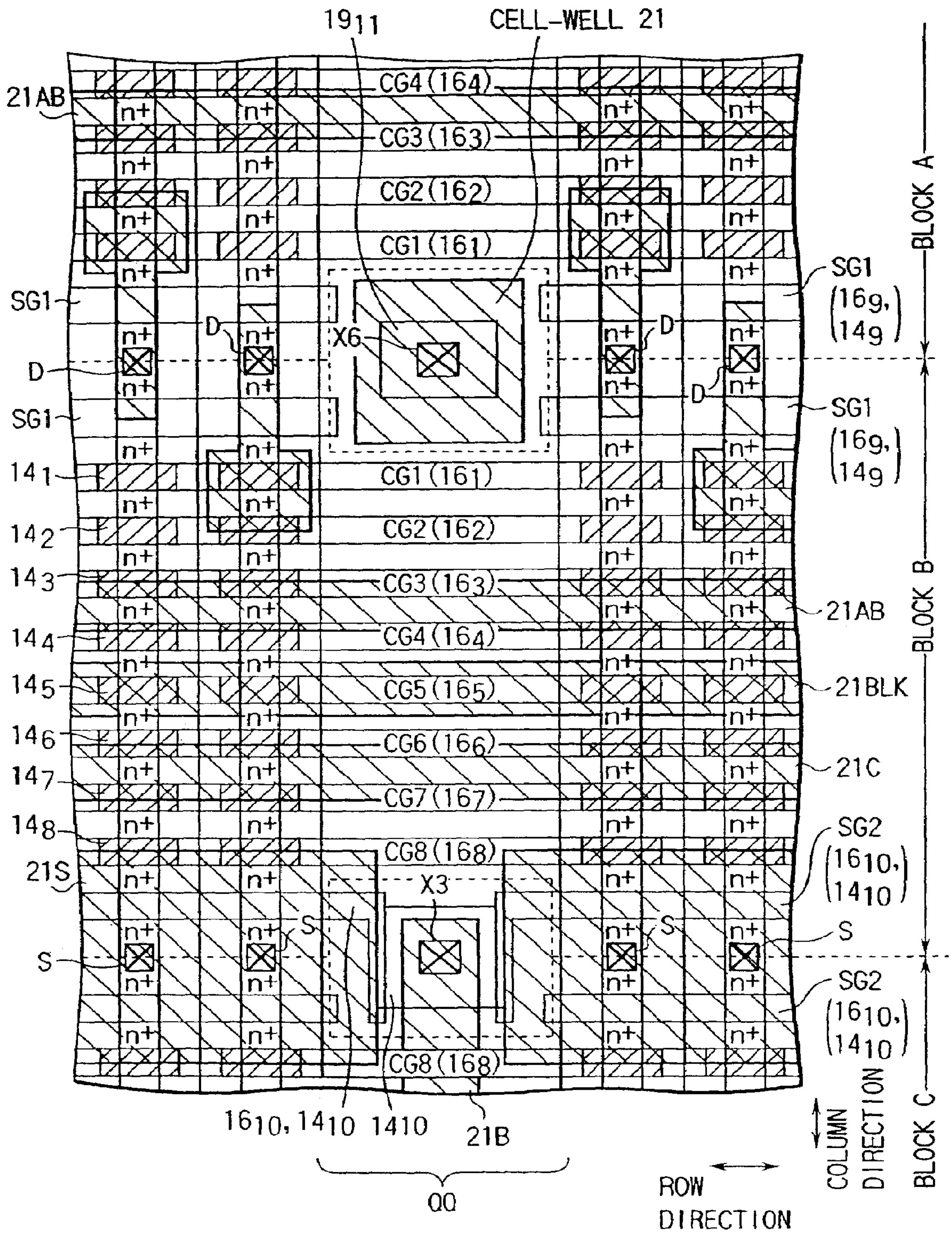
Figure 184:
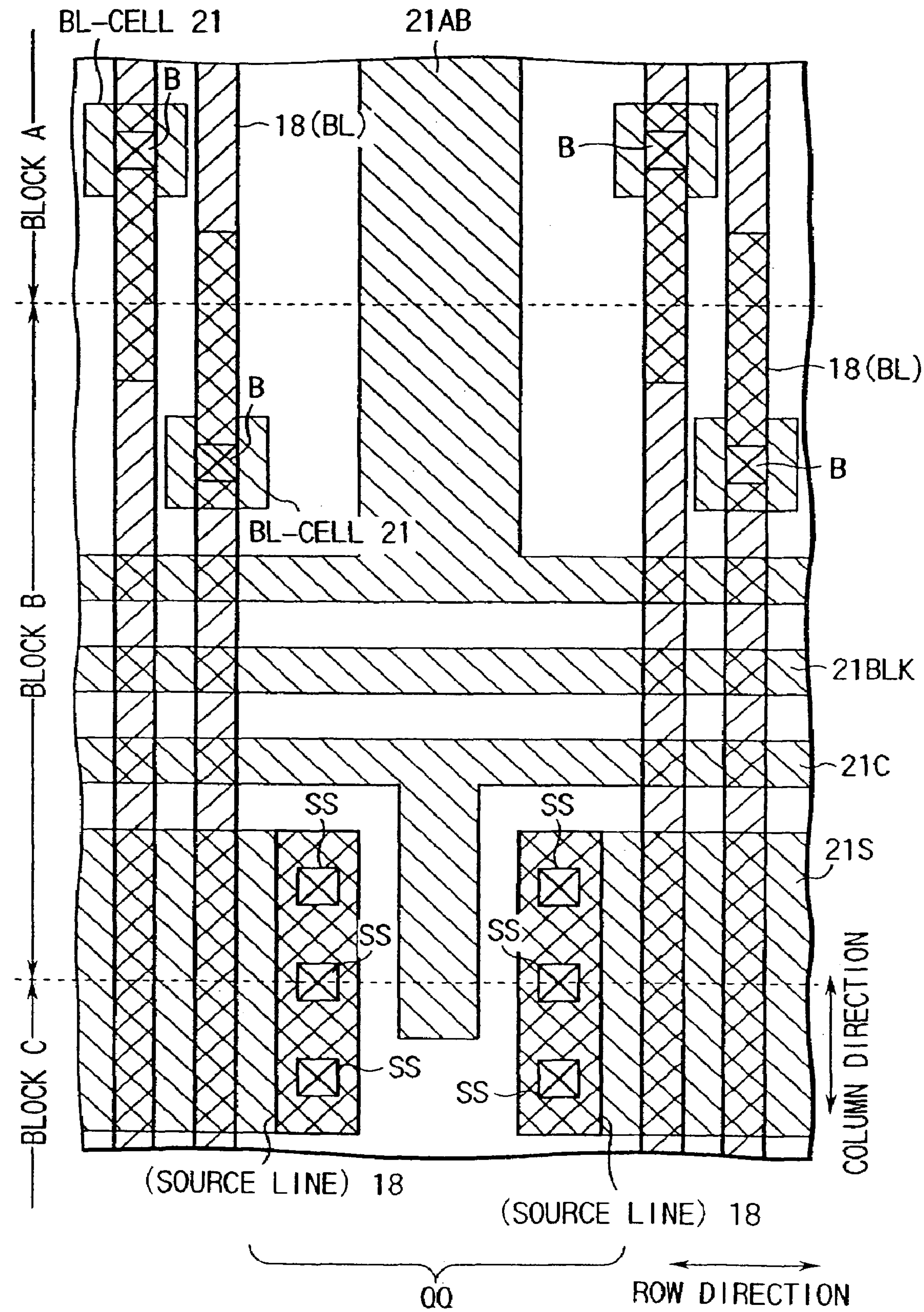
Figure 185:
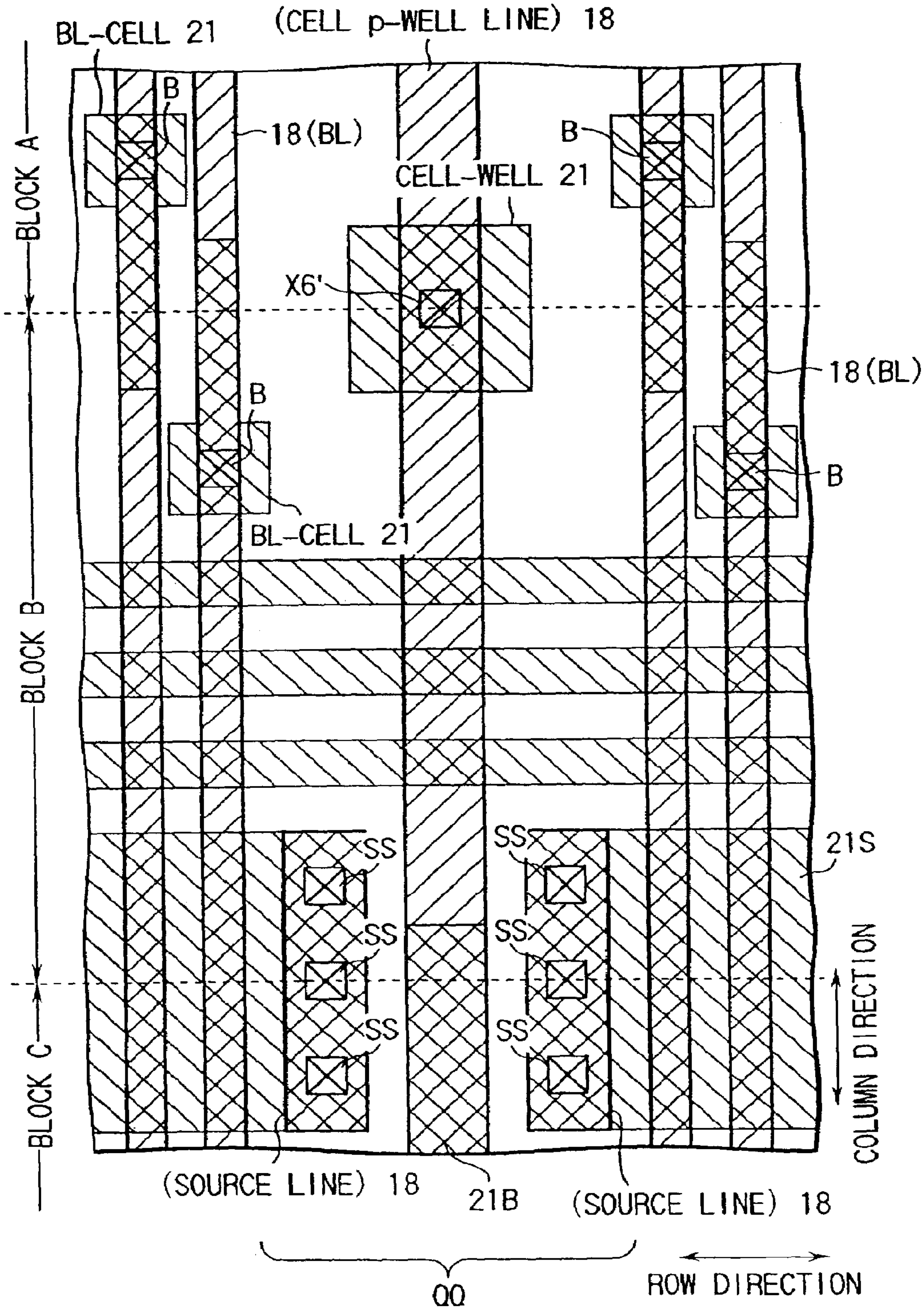
Figure 186:
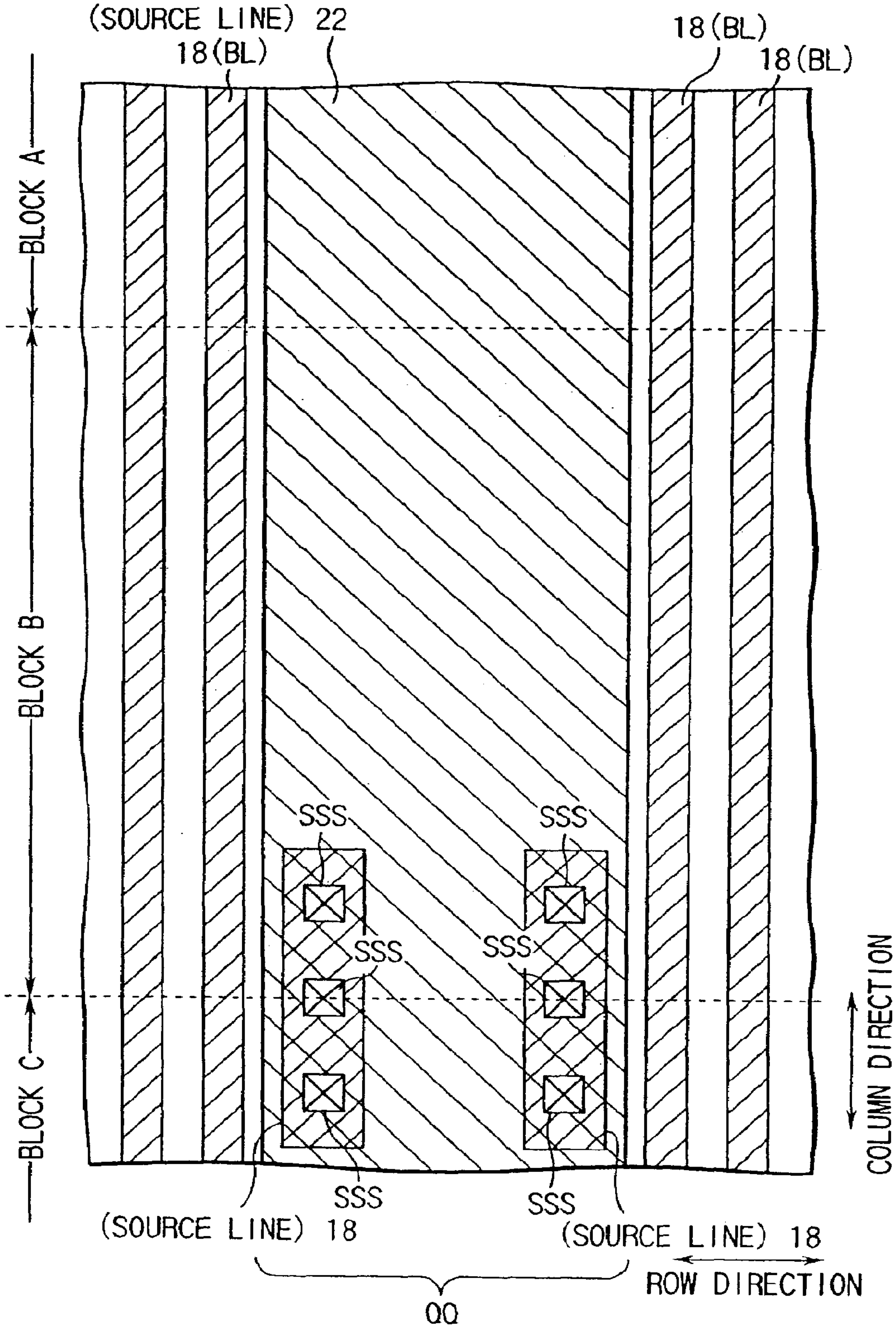
Figure 187:
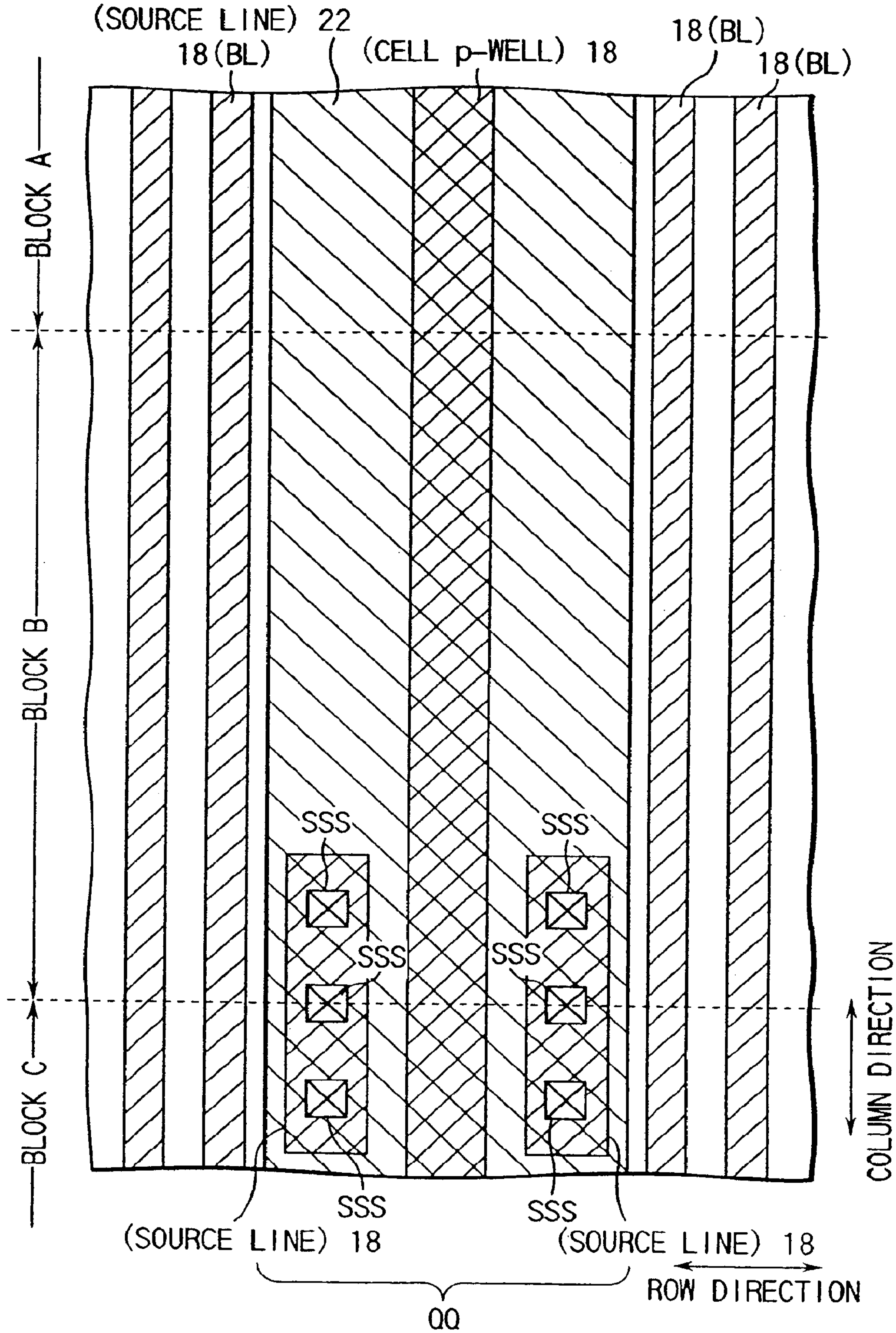
Figure 188:
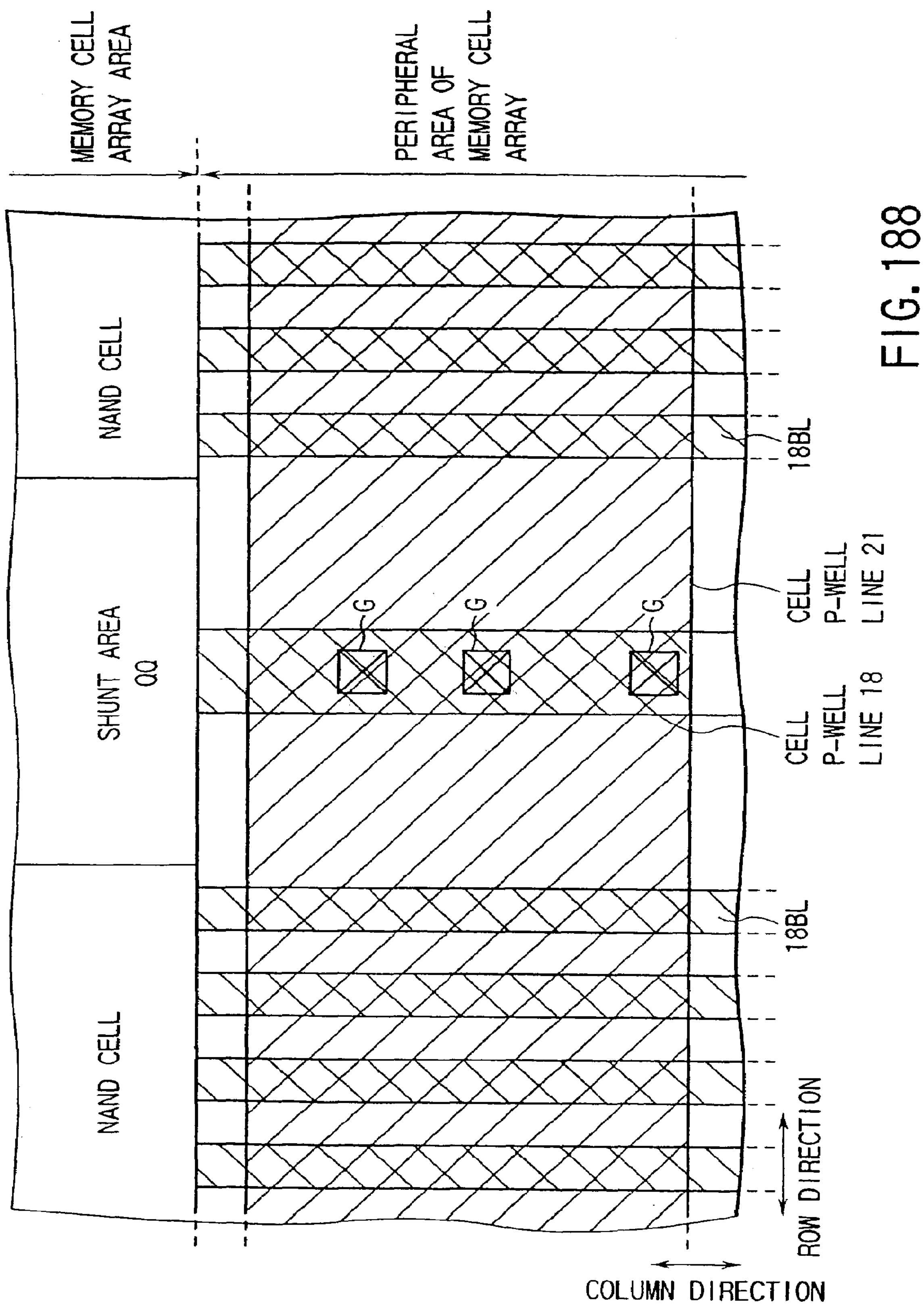
Figure 189:
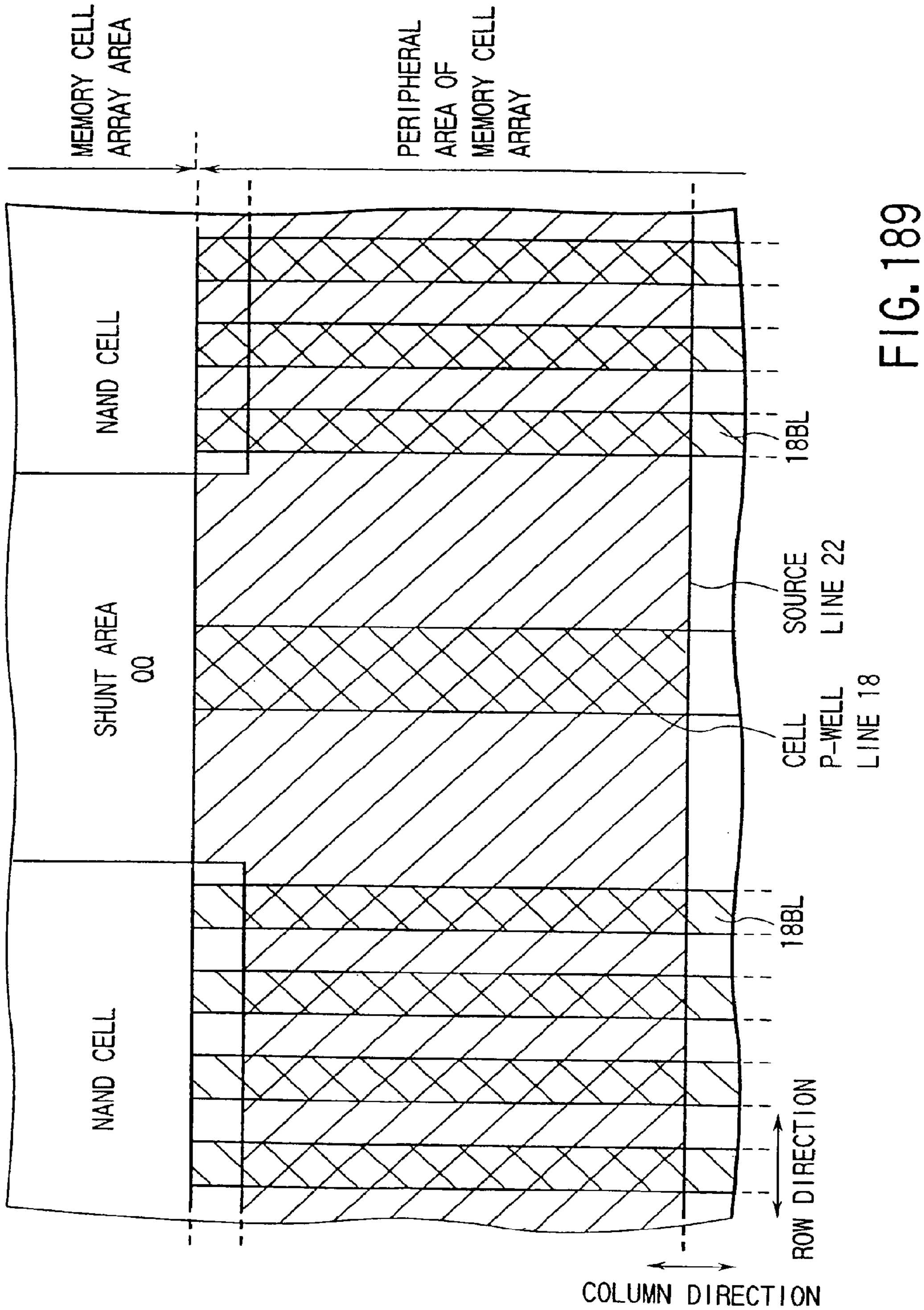
Figure 190:
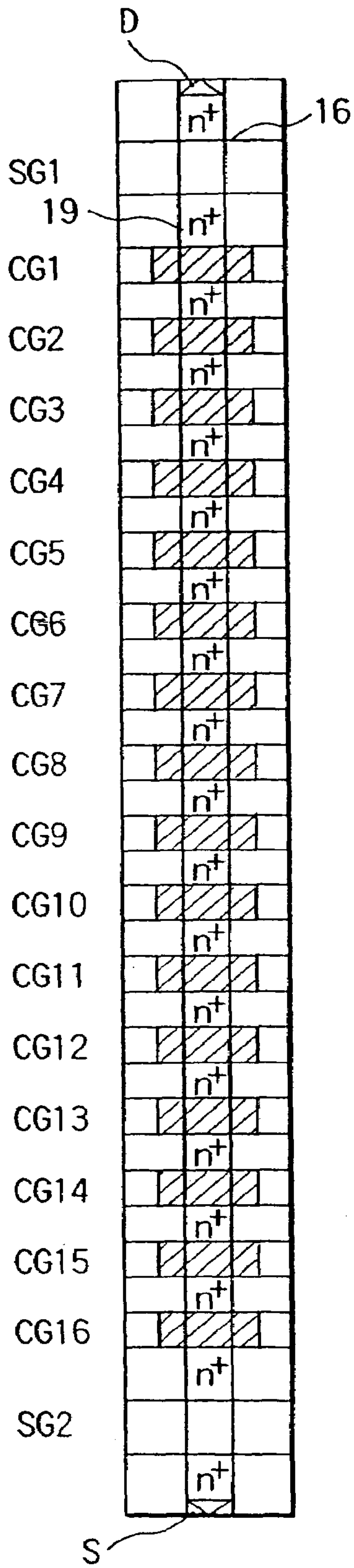
Figure 191:
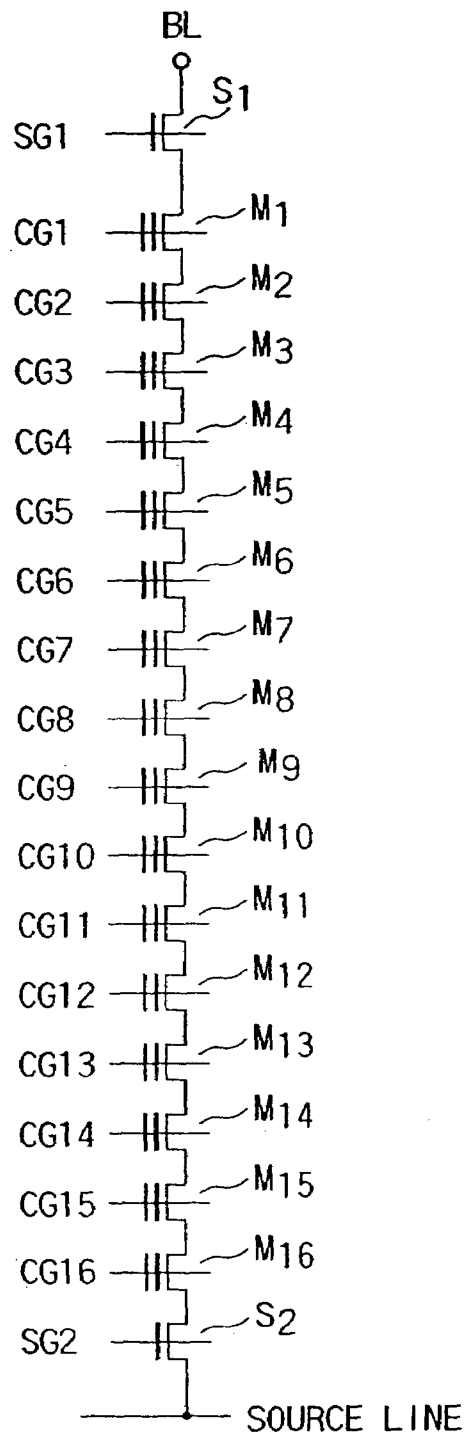
Figure 192:
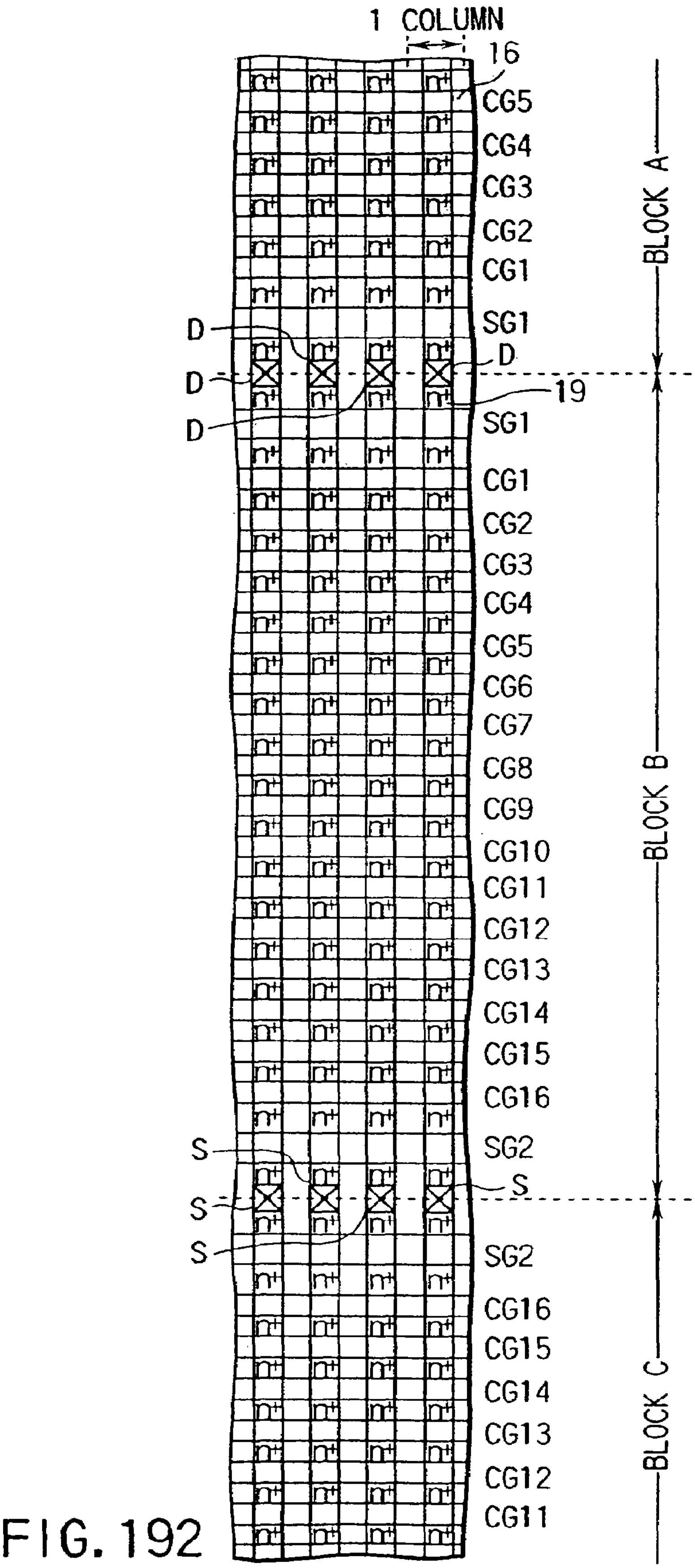
Figure 193:
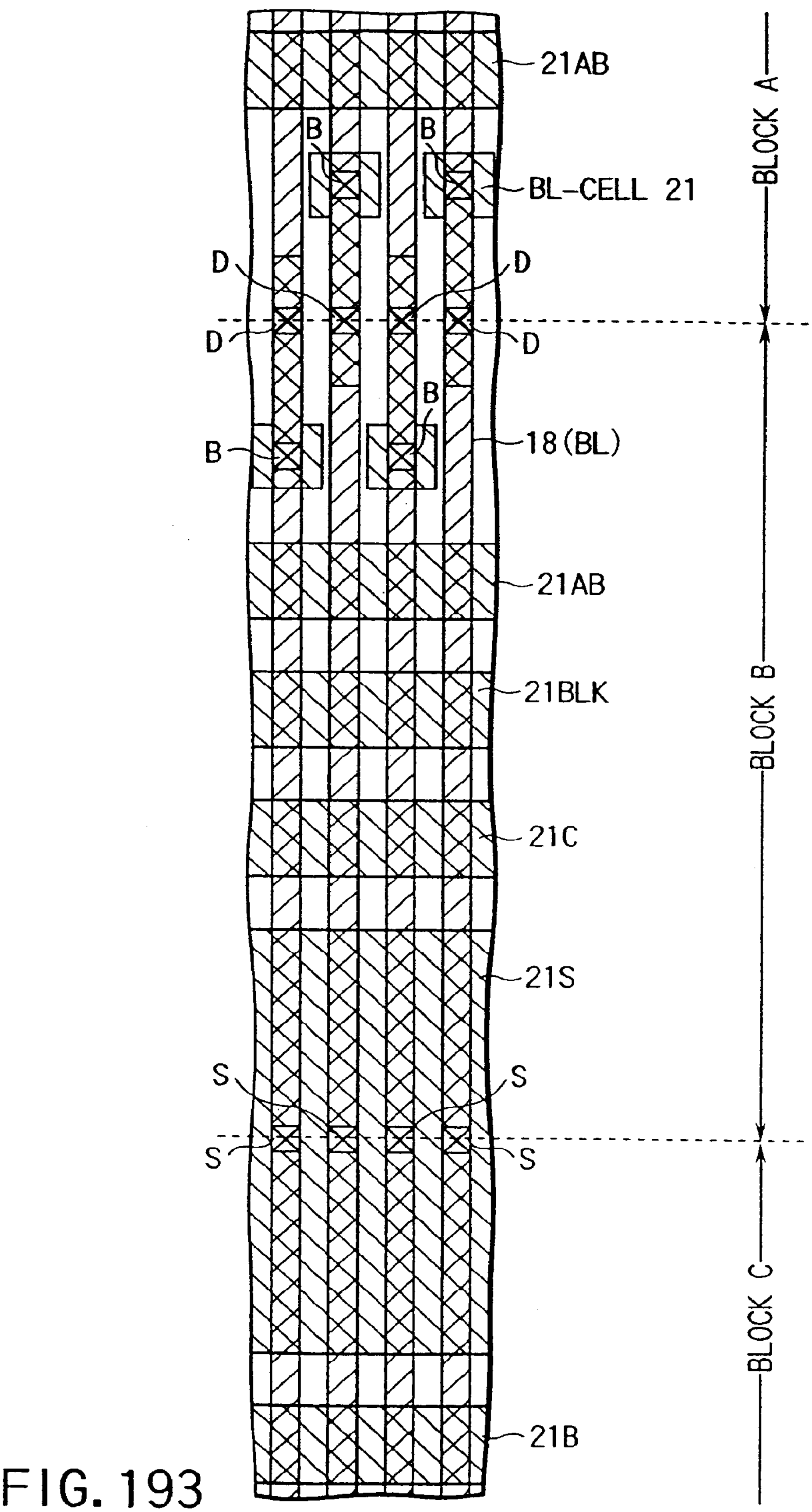
Figure 194:
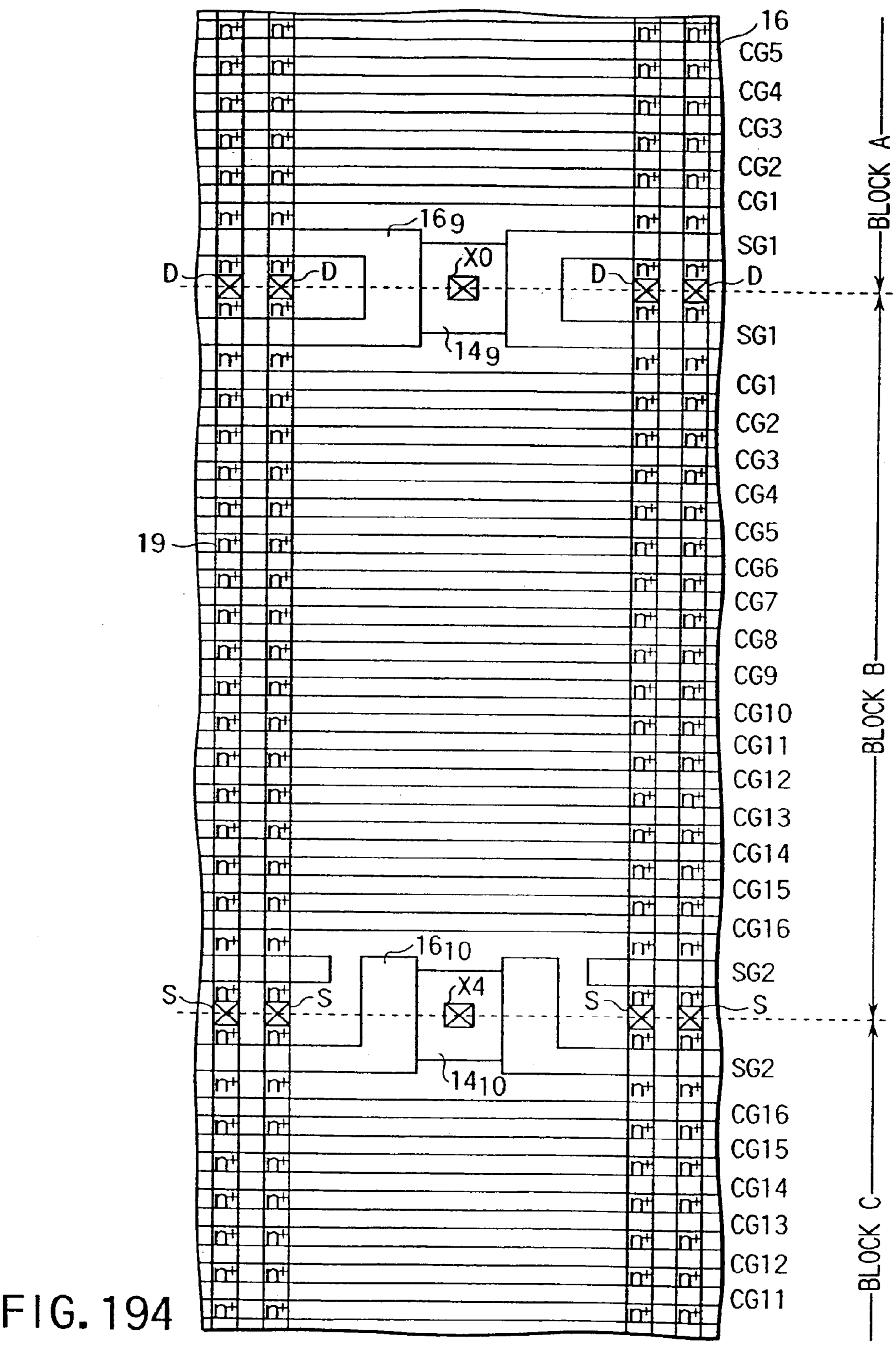
Figure 195:
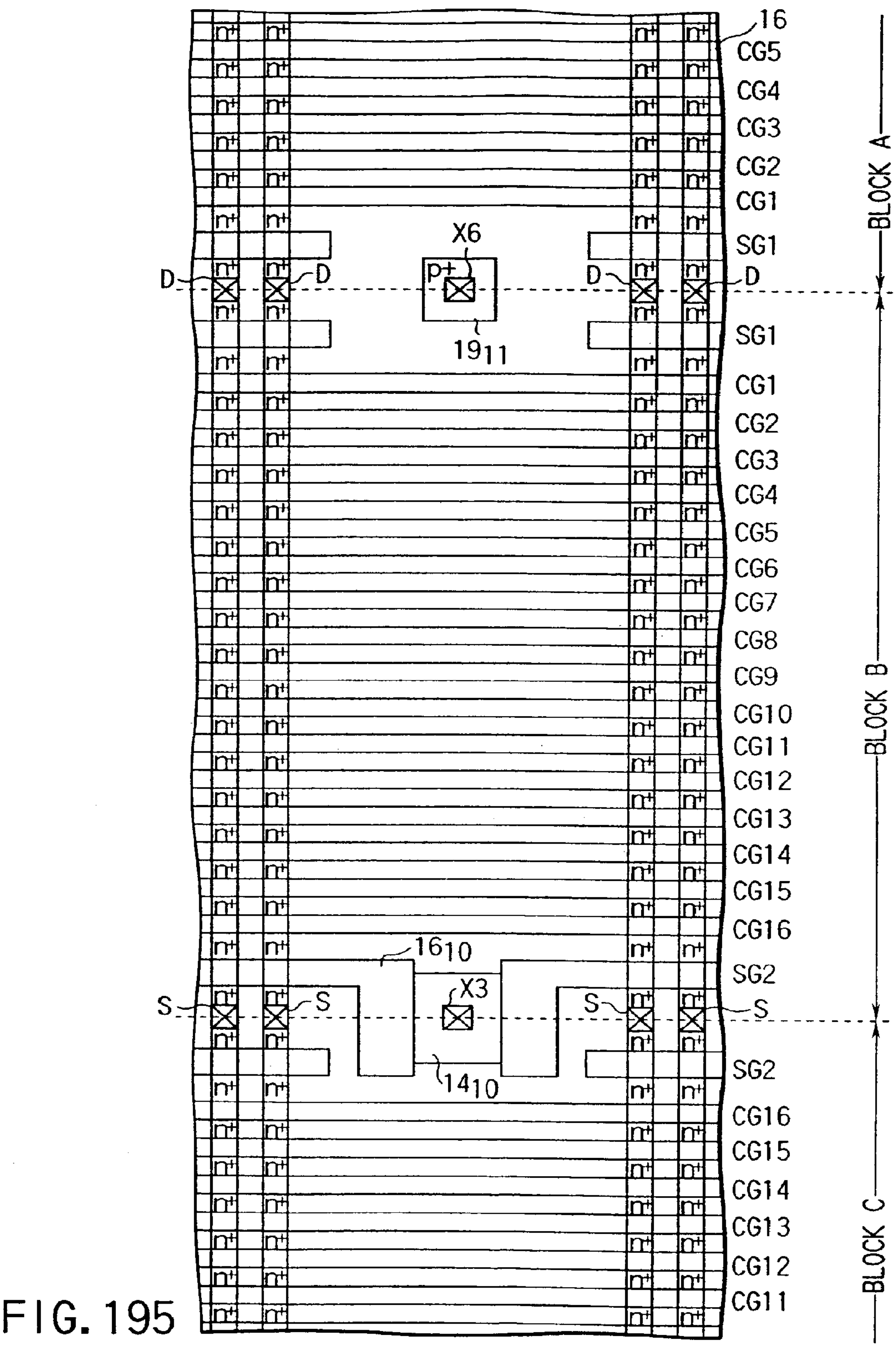
Figure 196:
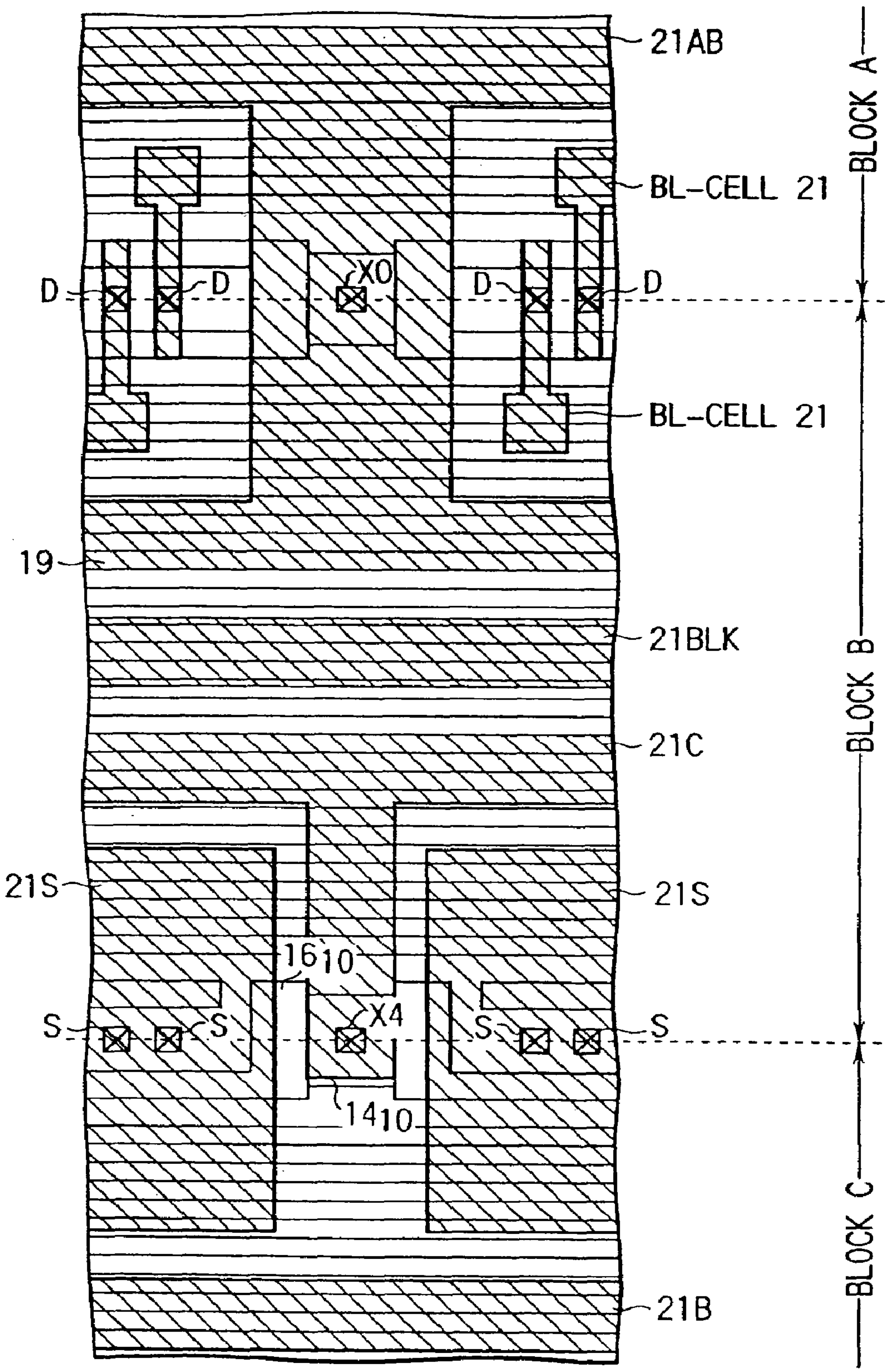
Figure 197:
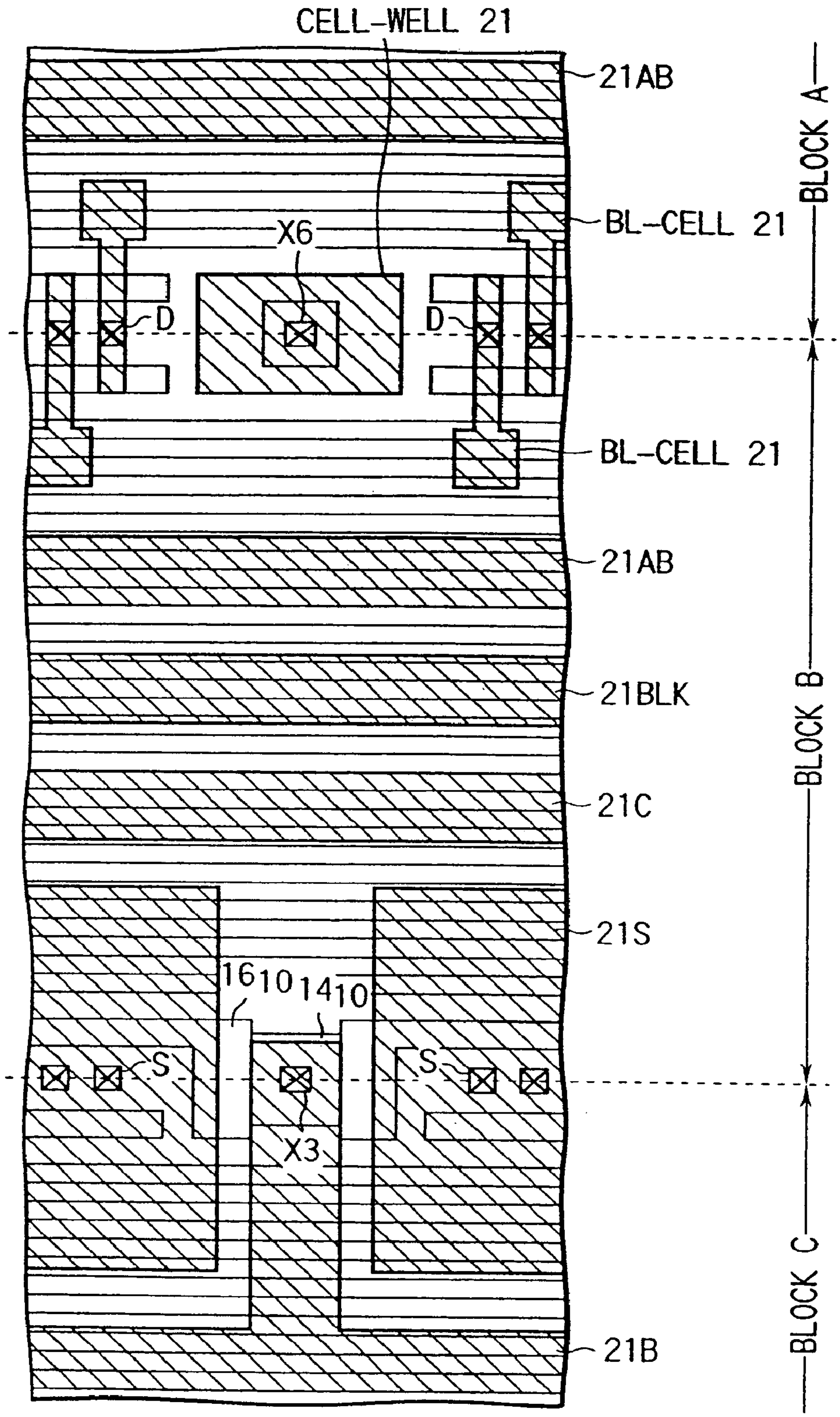
Figure 198:
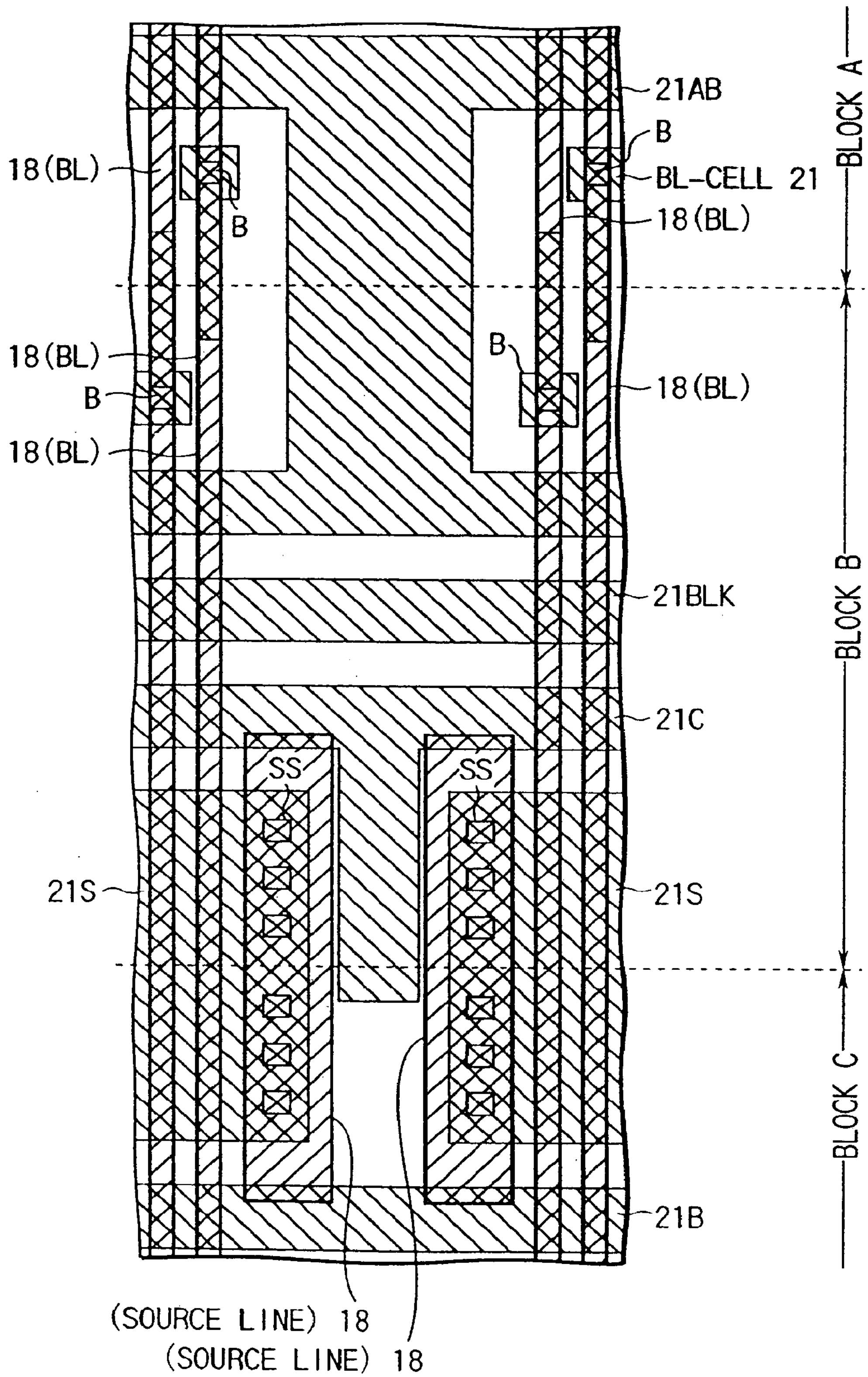
Figure 199:
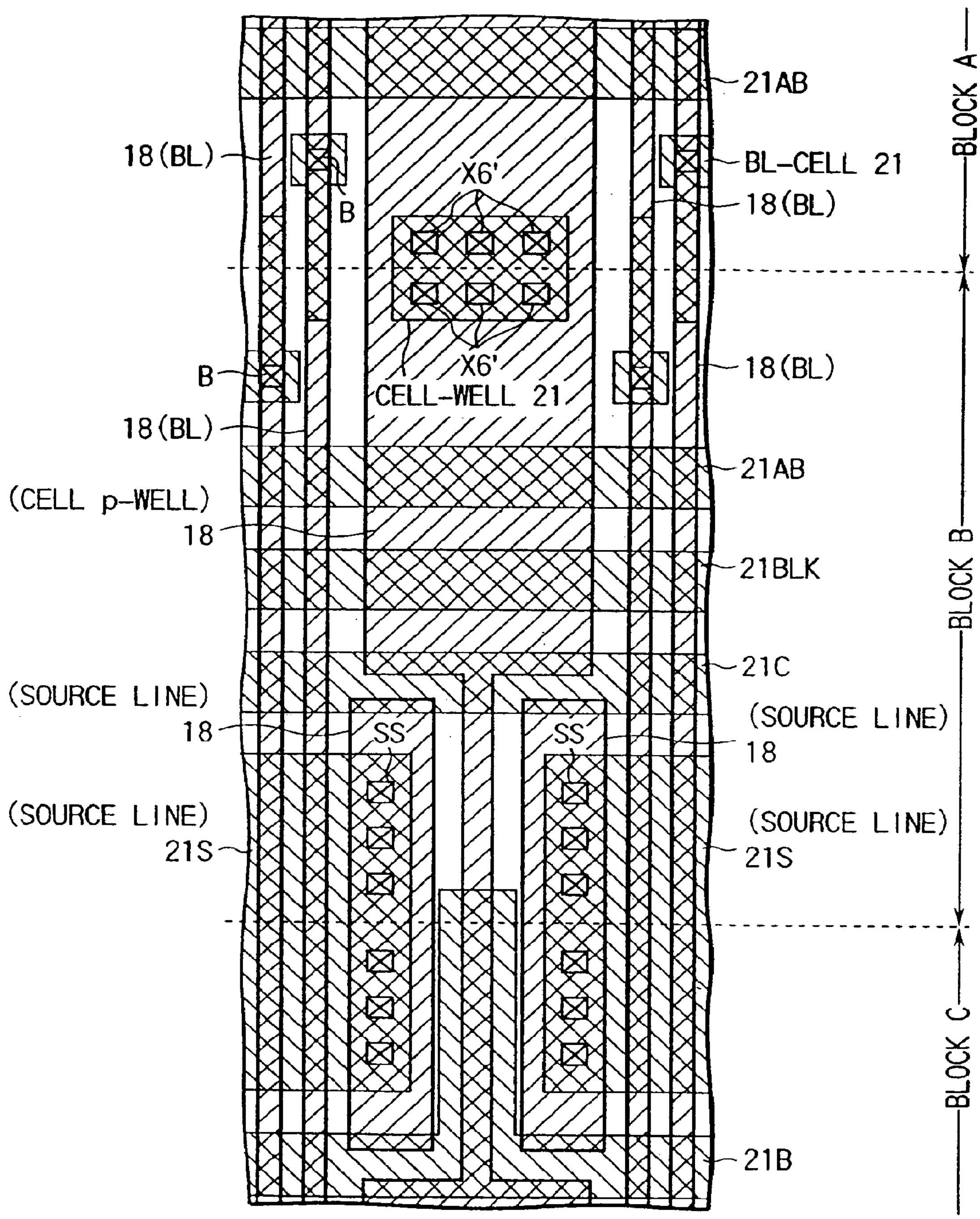
Figure 200:
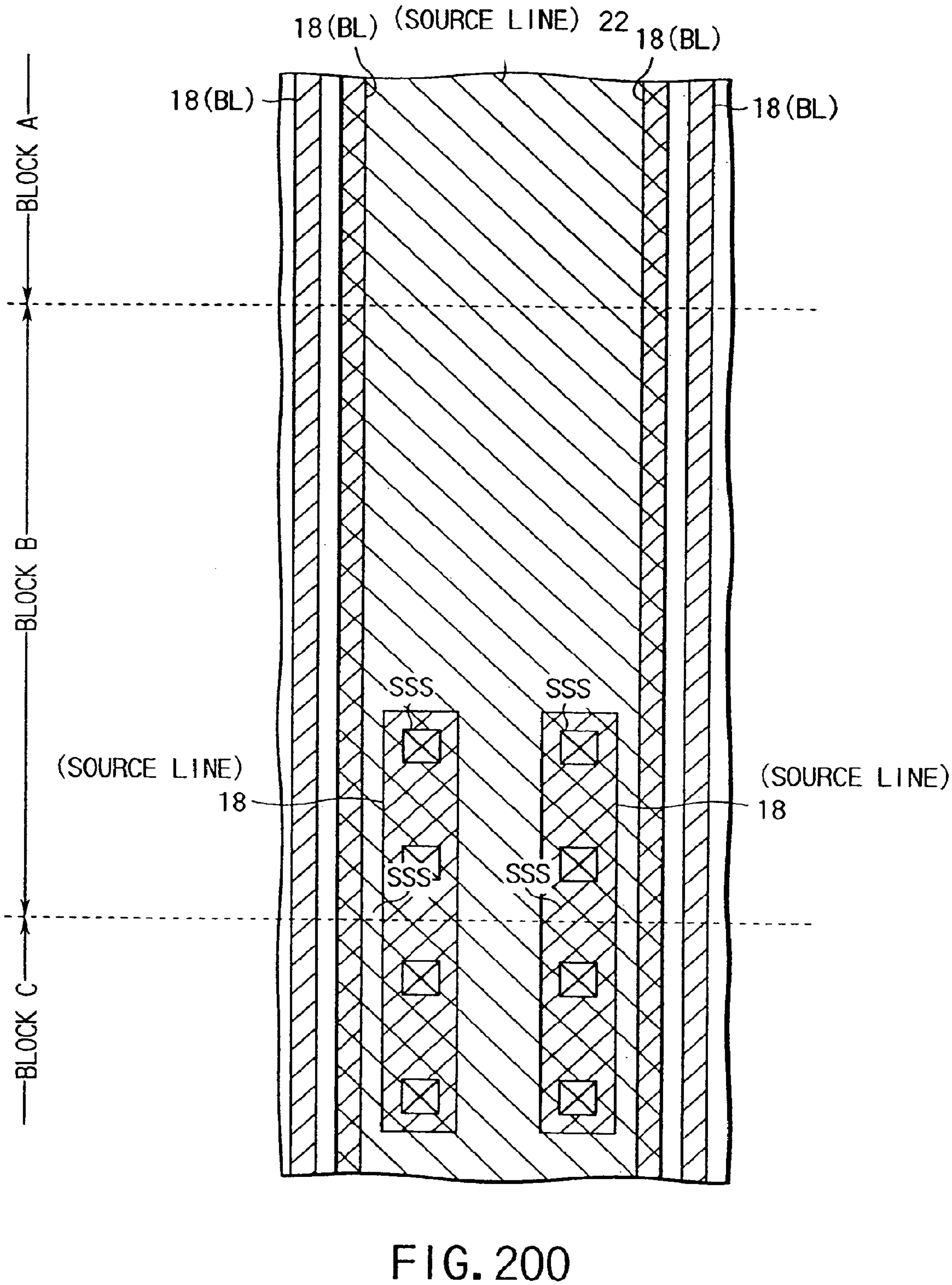
Figure 201:
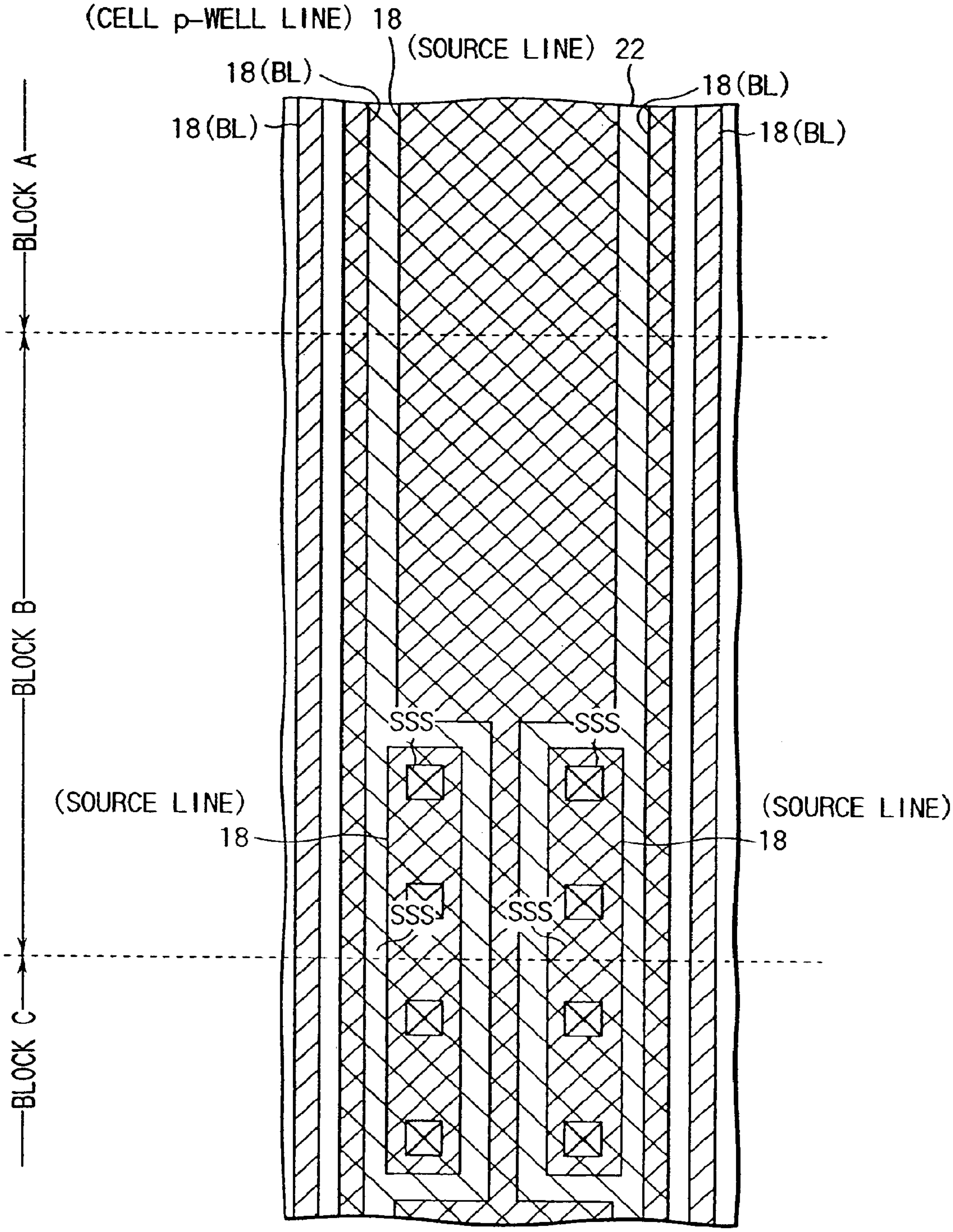
Figure 202:
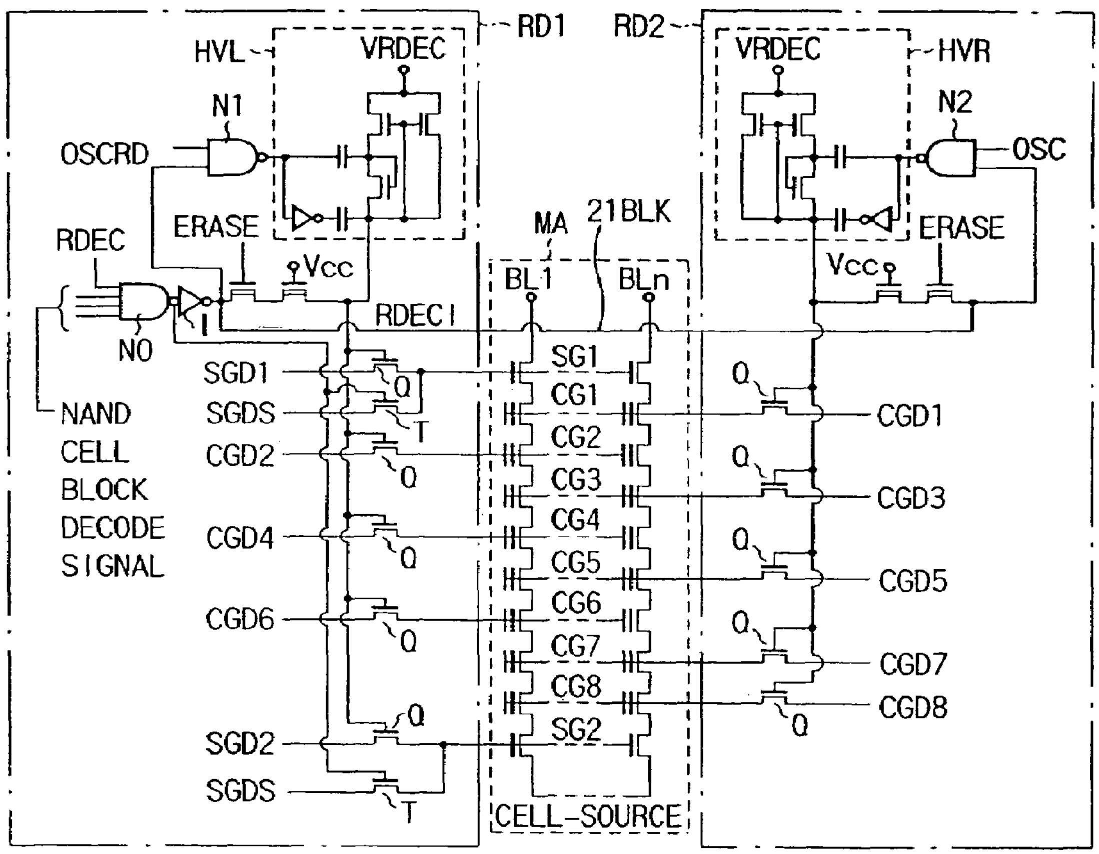
Figure 203:
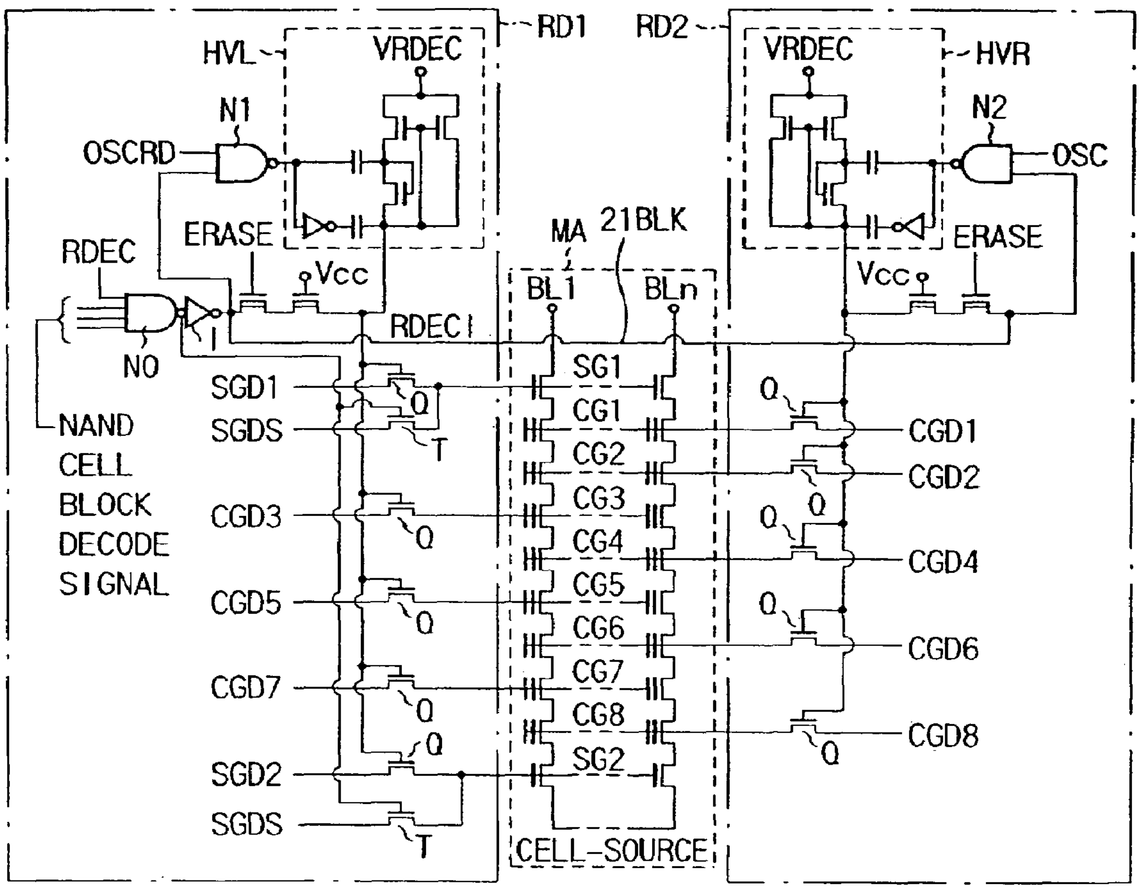
Figure 204:
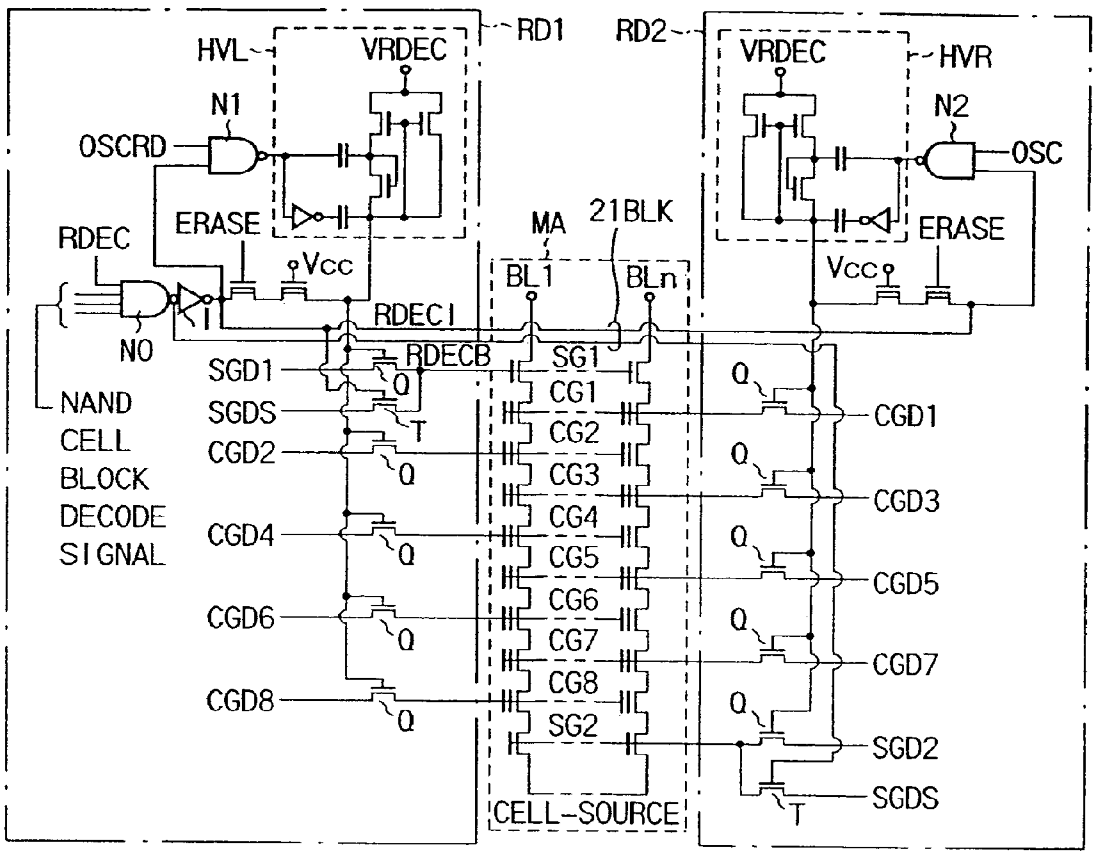
Figure 205:
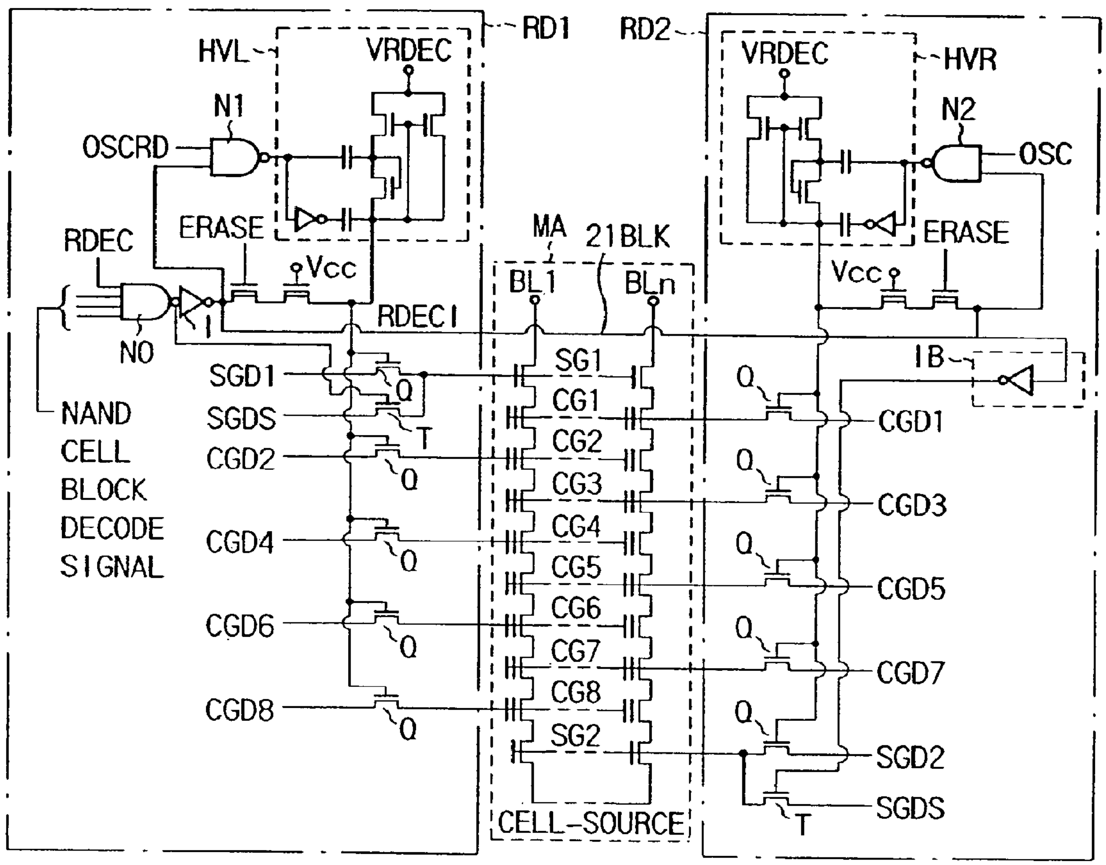
Figure 206:
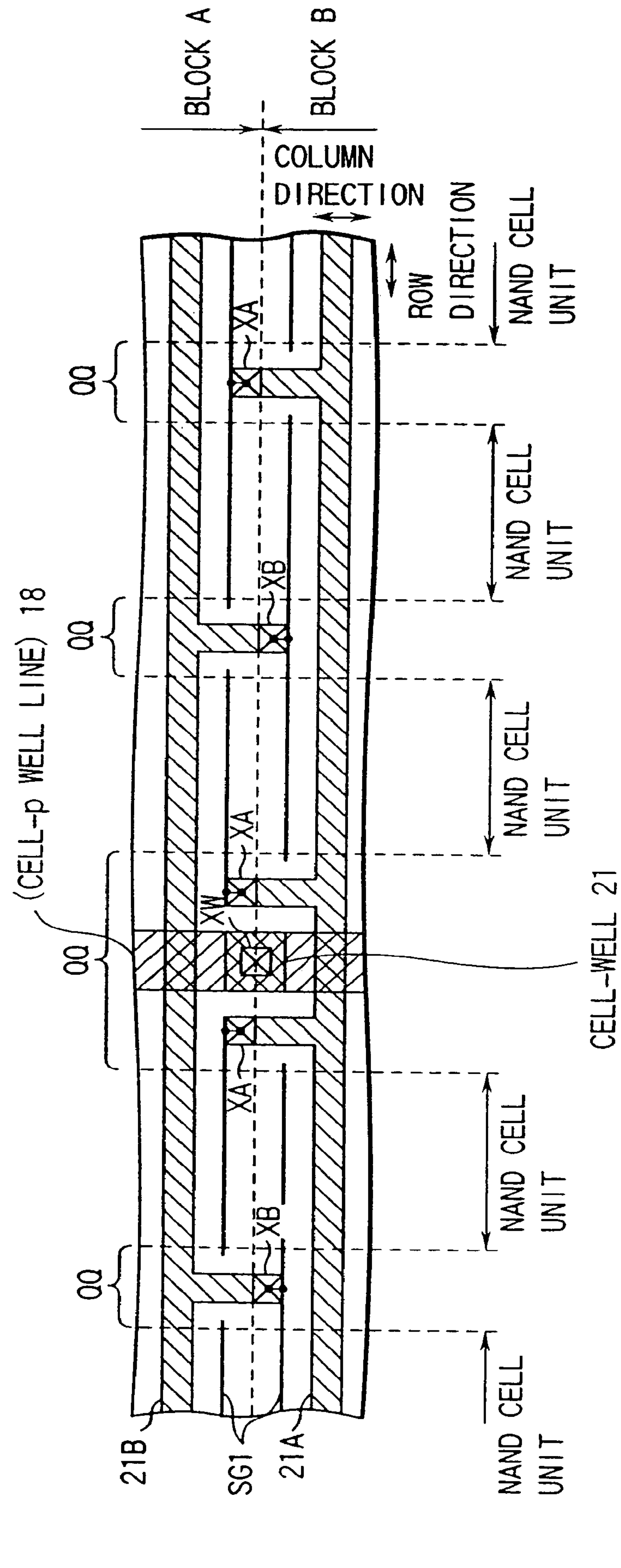
Figure 207:
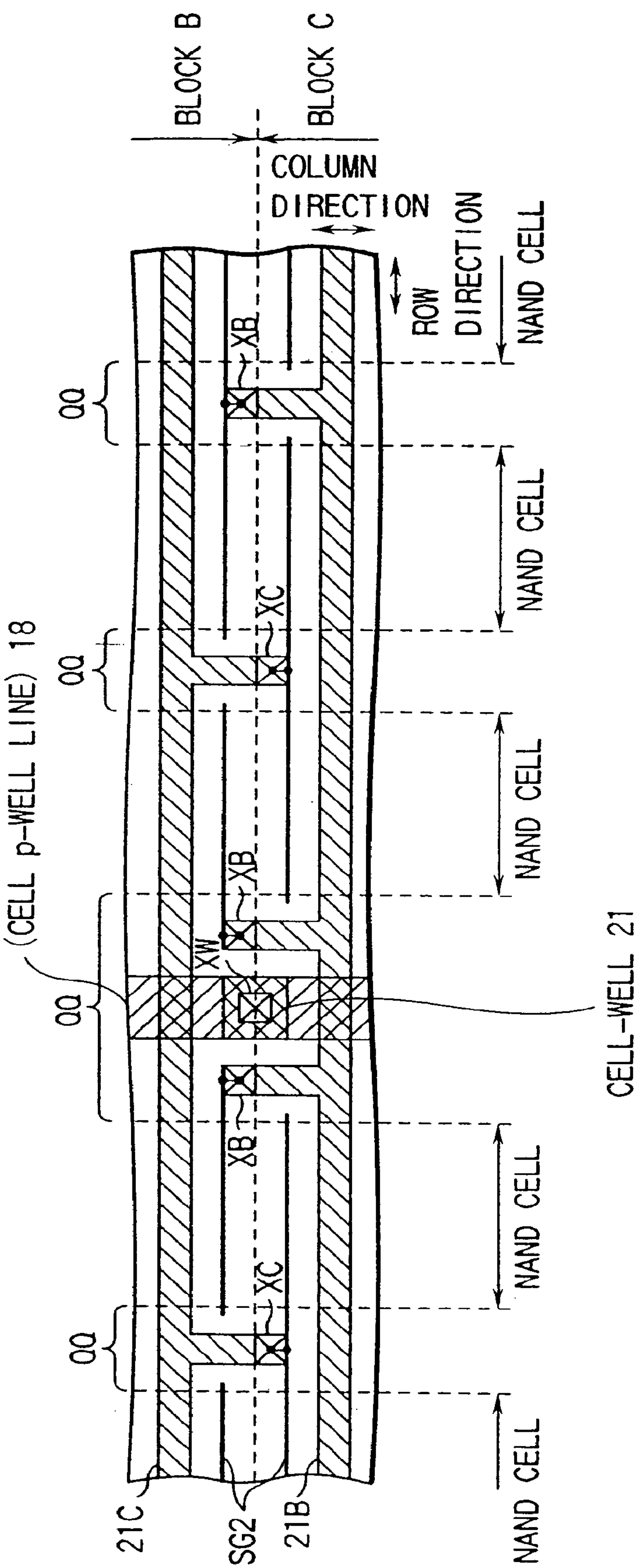
Figure 208:
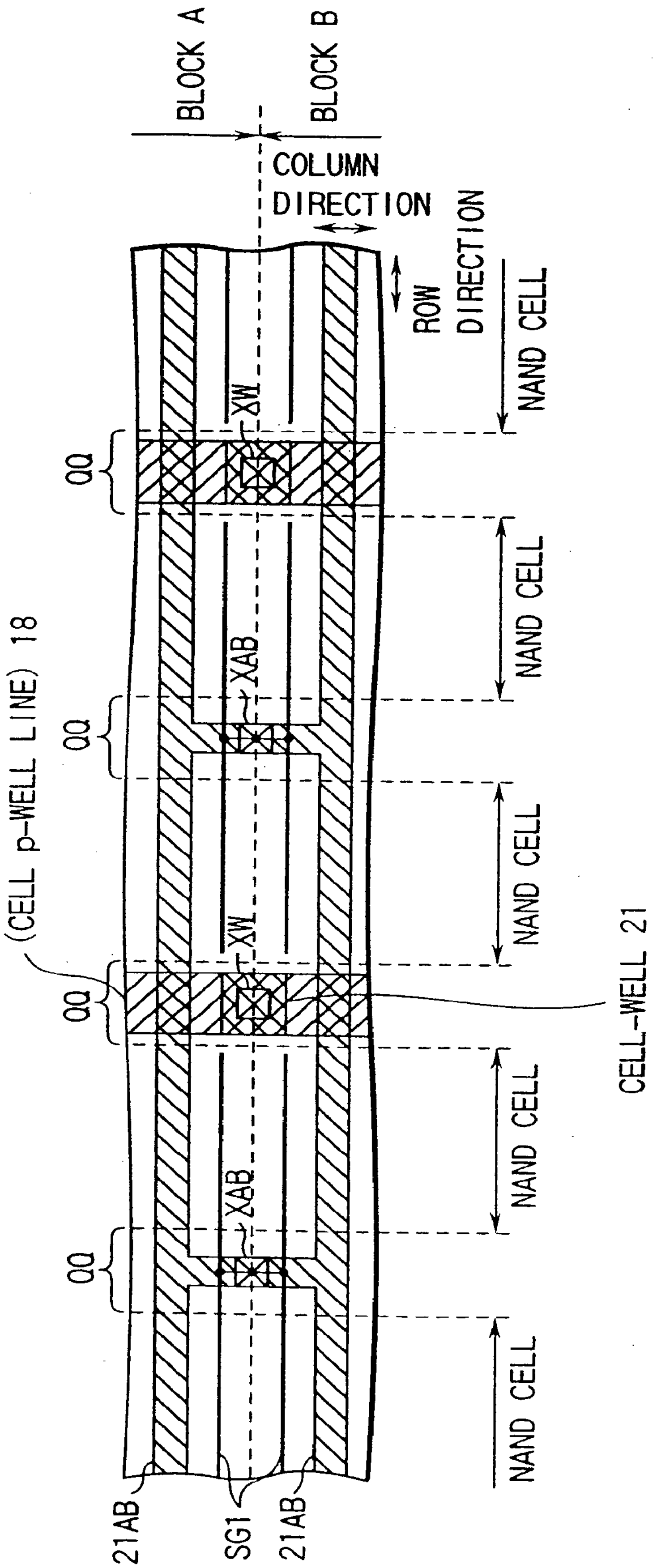
Figure 209:
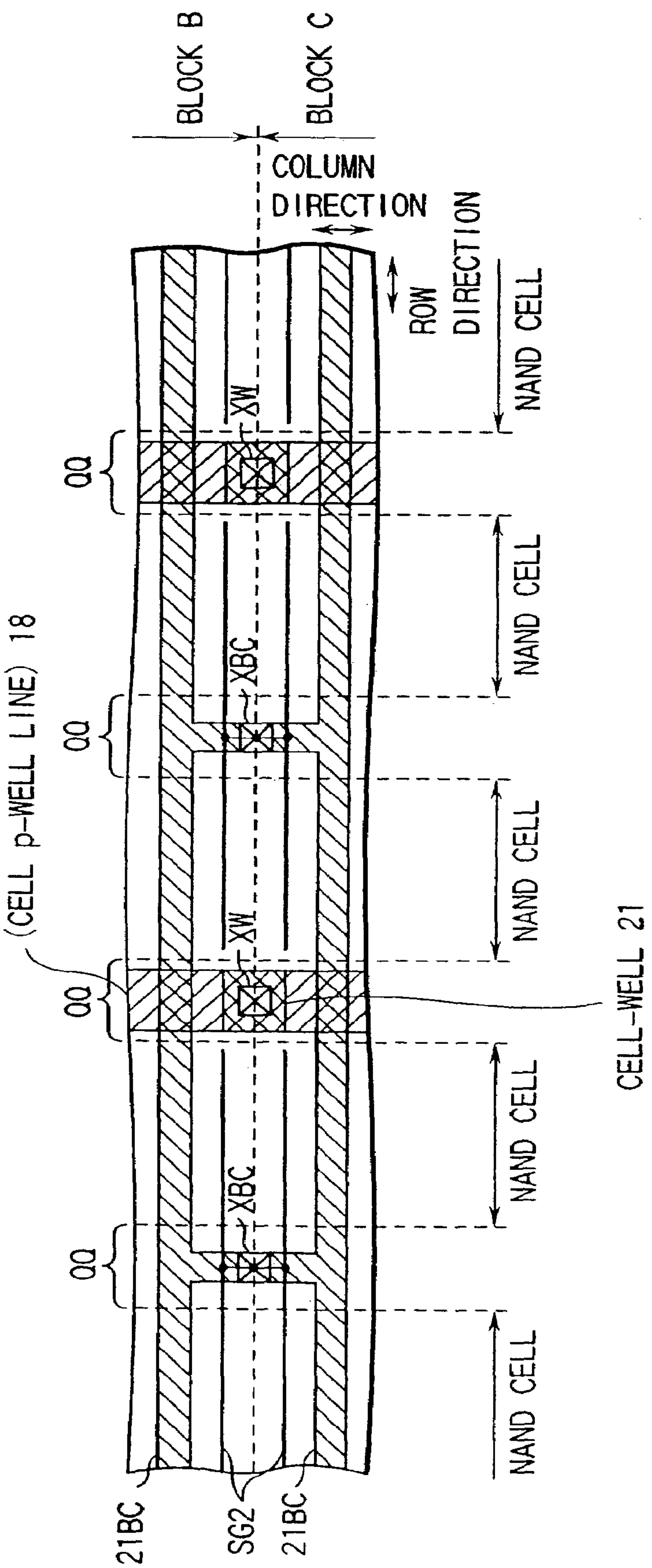
Figure 210:
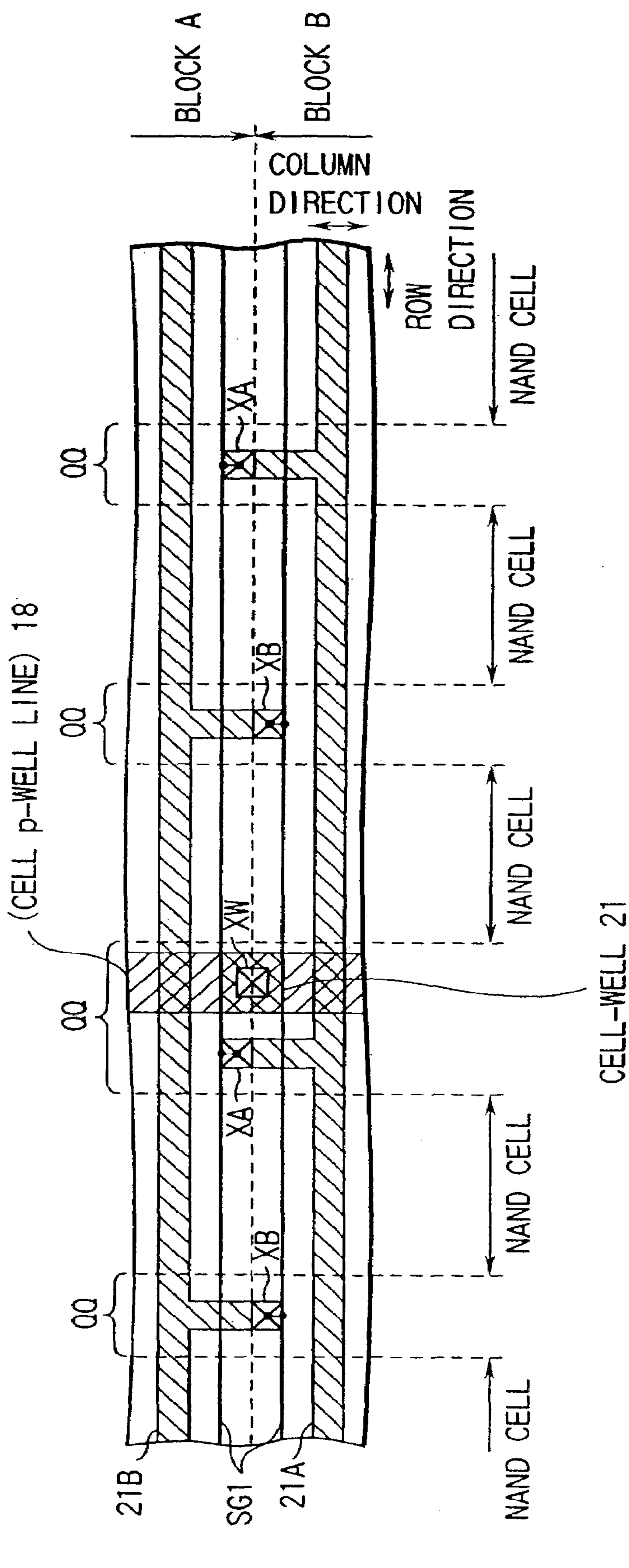
Figure 211:
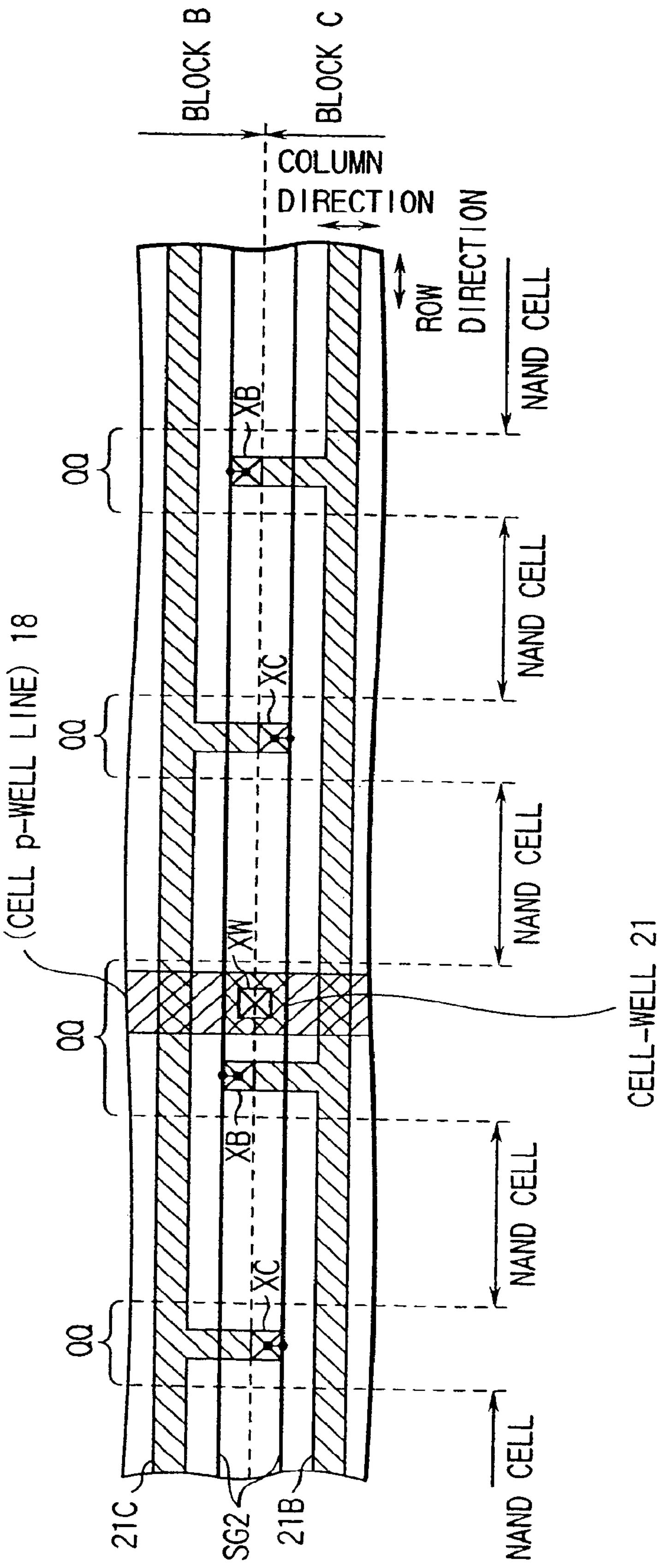
Figure 212:
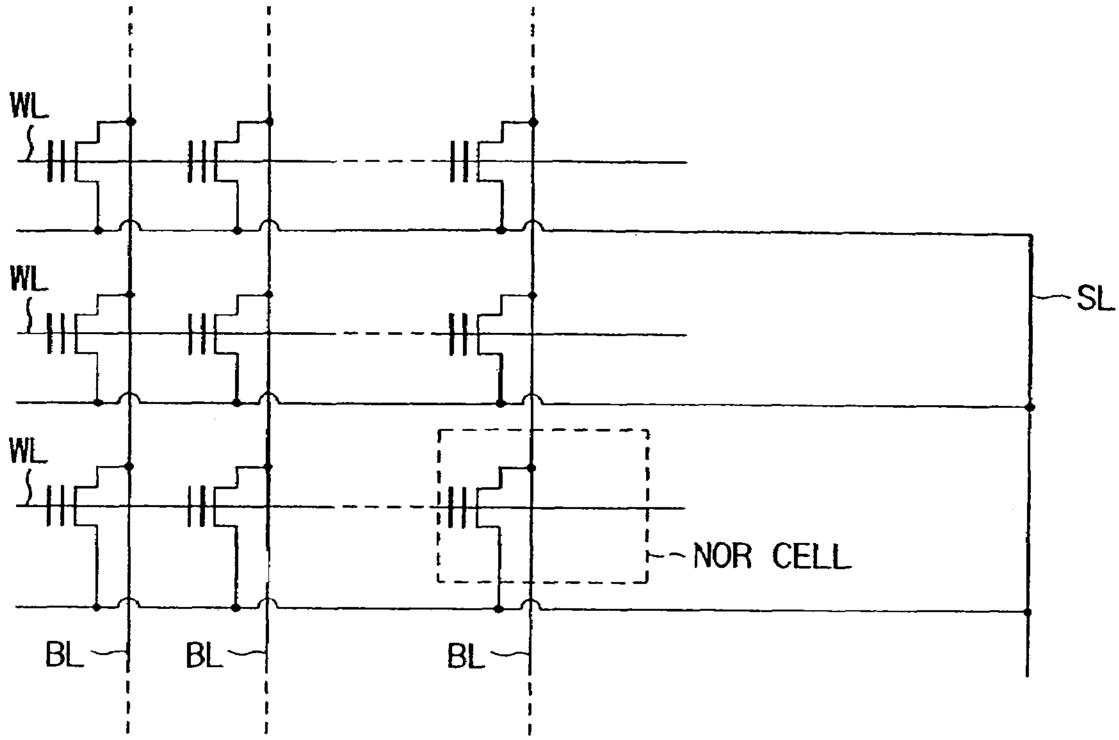
Figure 213:
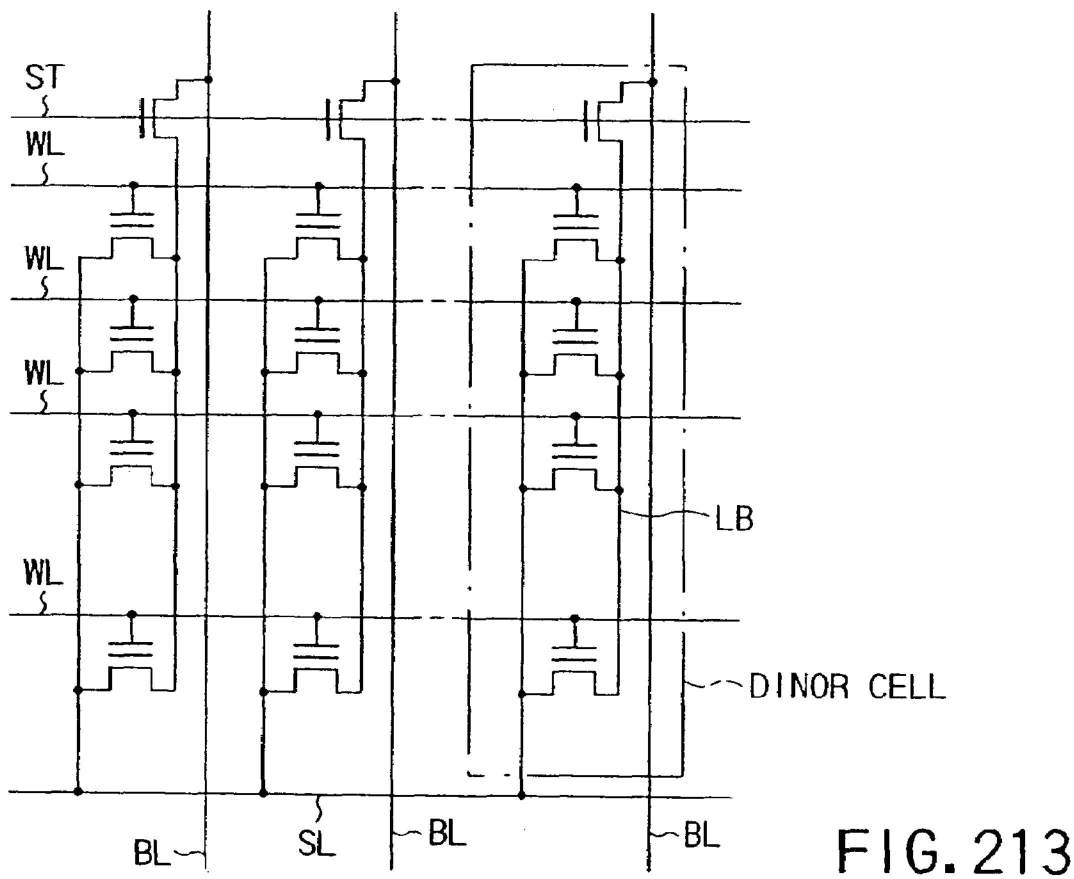
Figure 214:
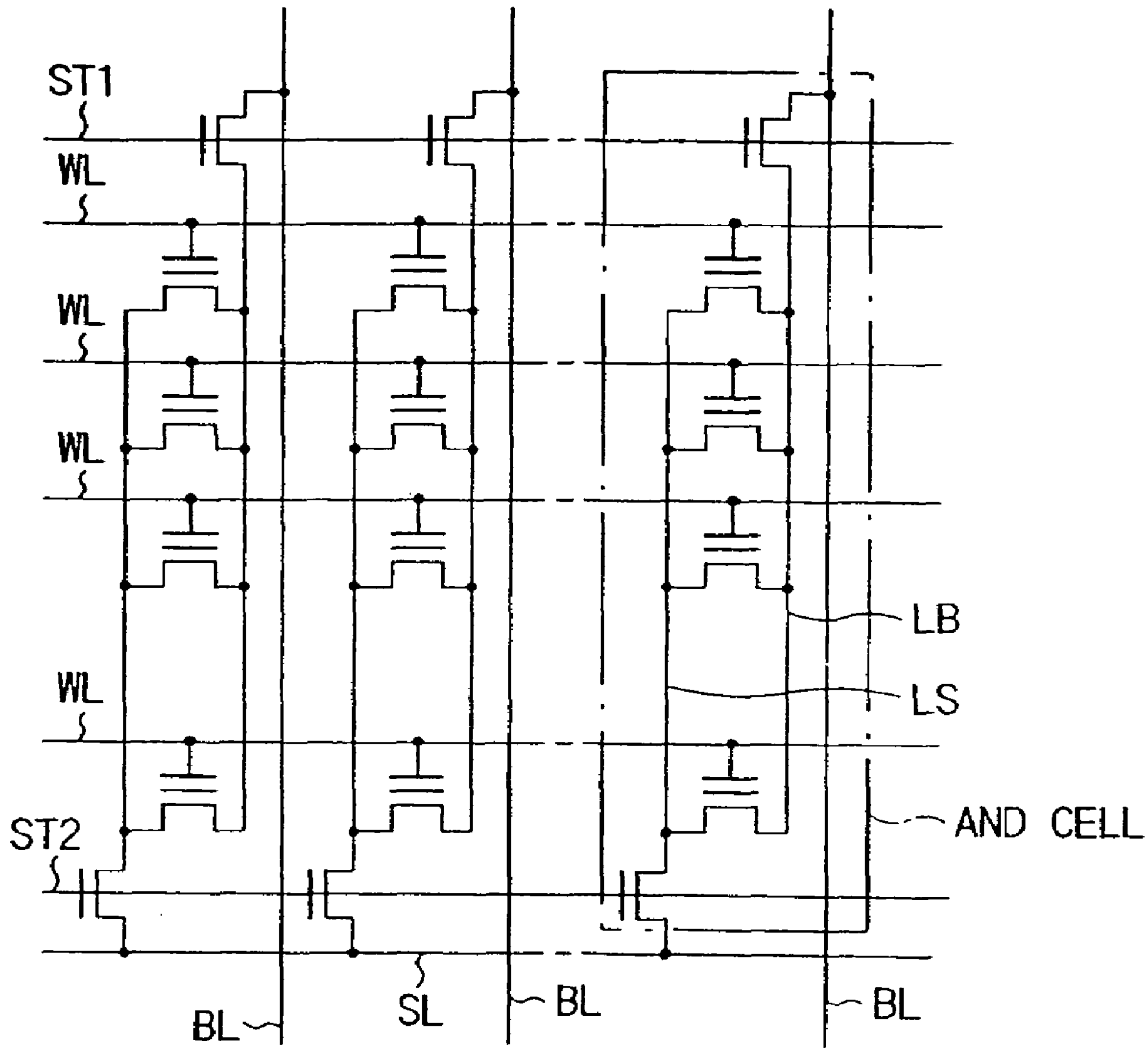
Figure 215:
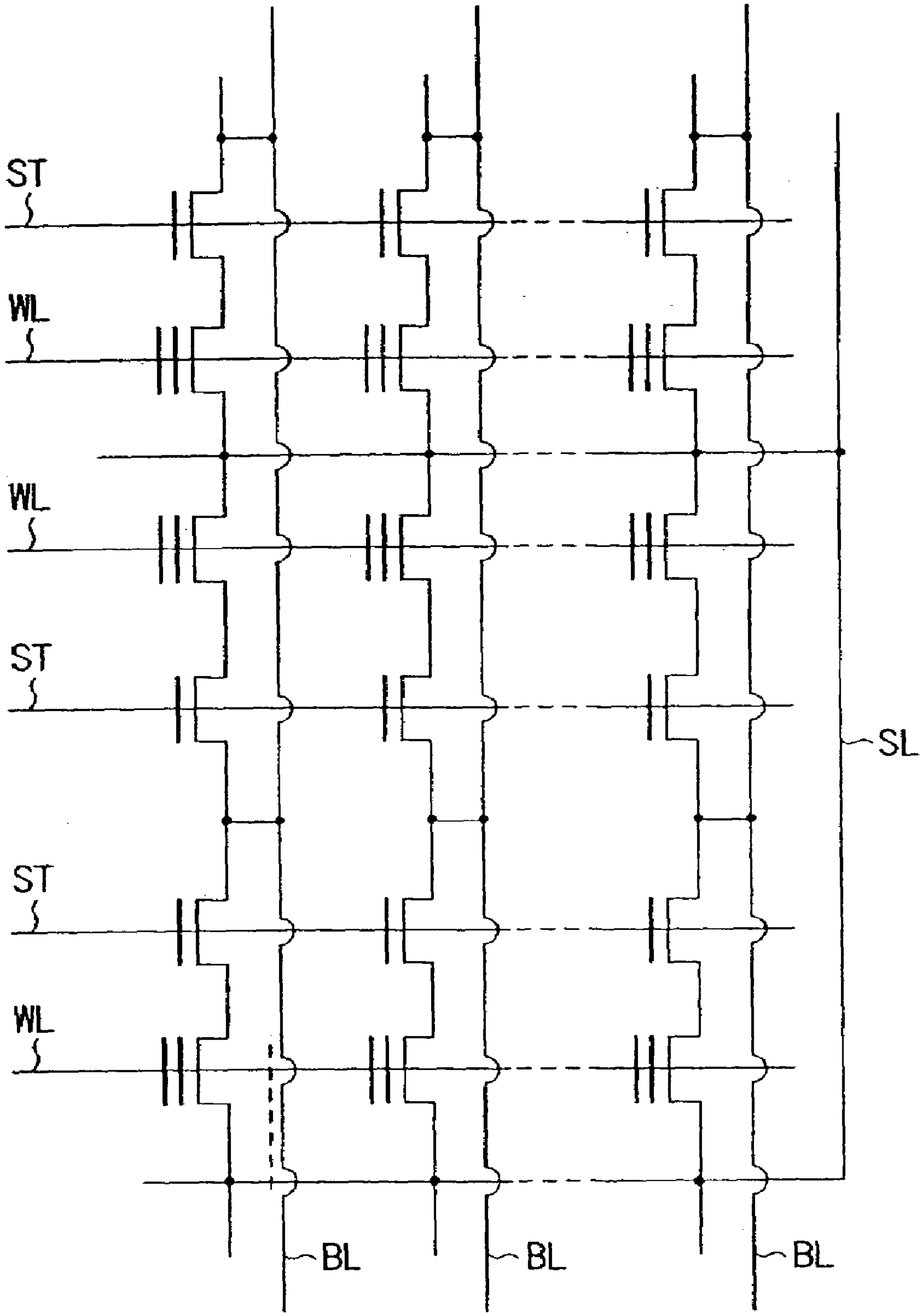
Figure 216:
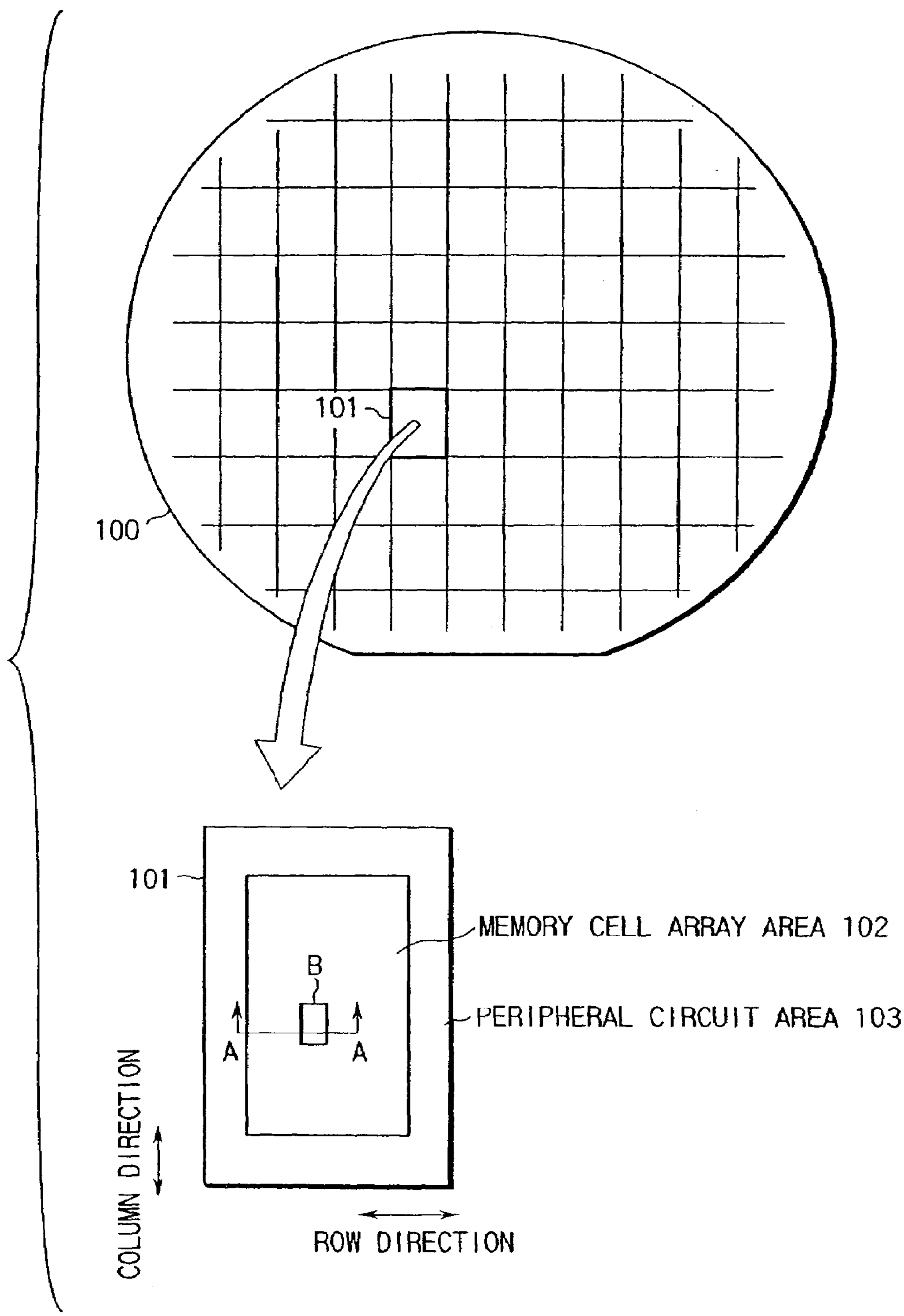
Figure 217:
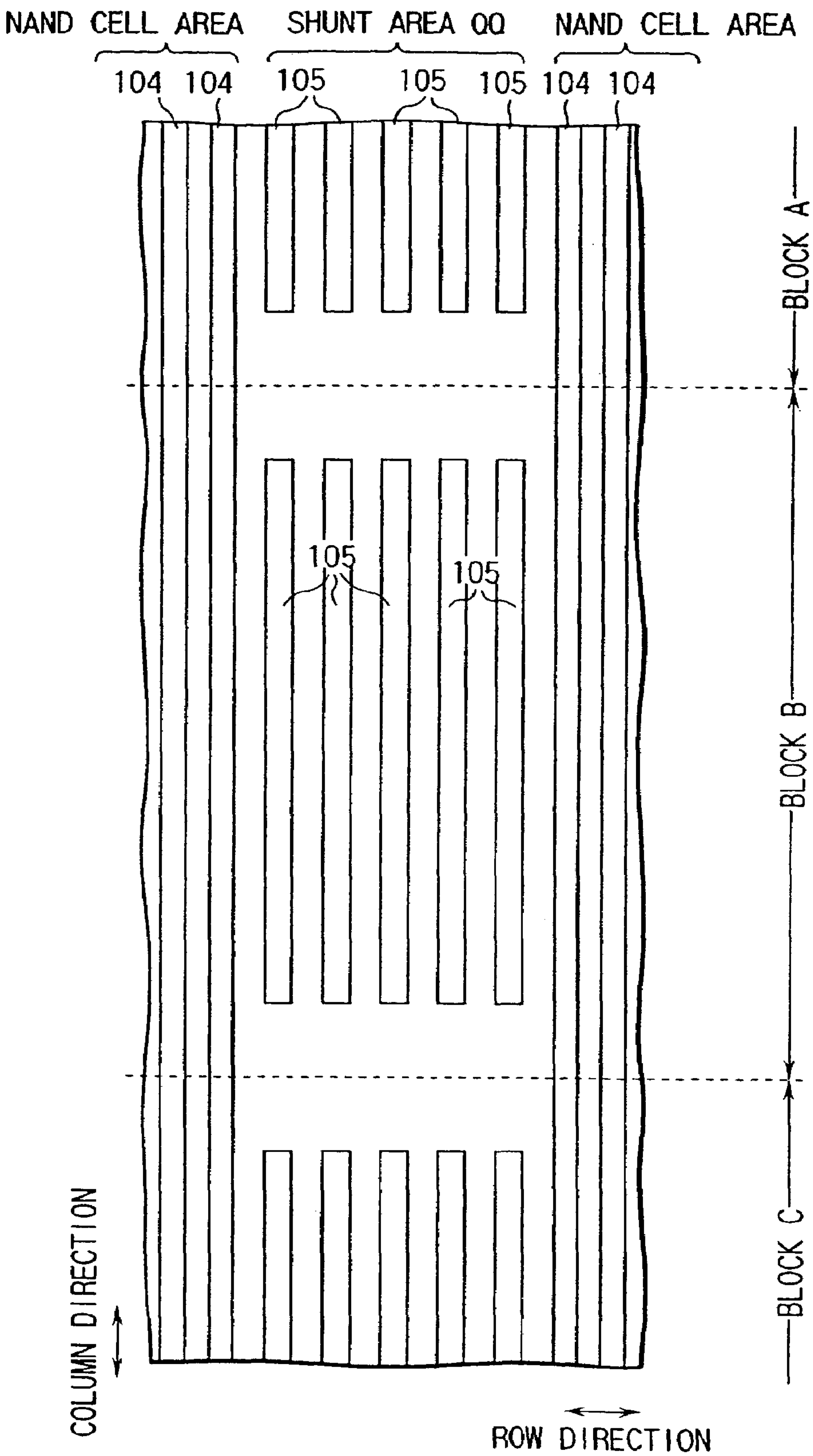
Figure 218:
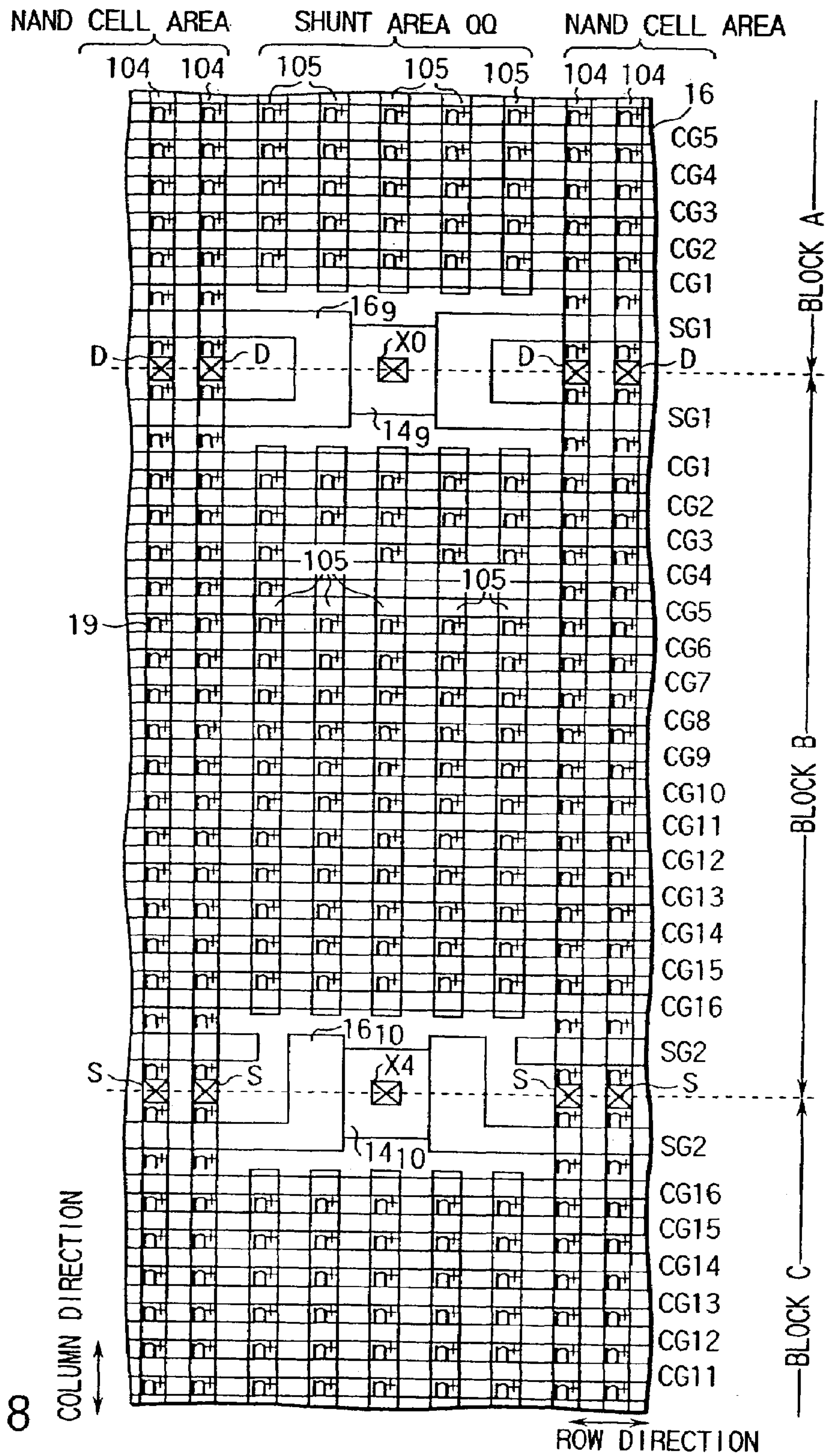
Figure 219:
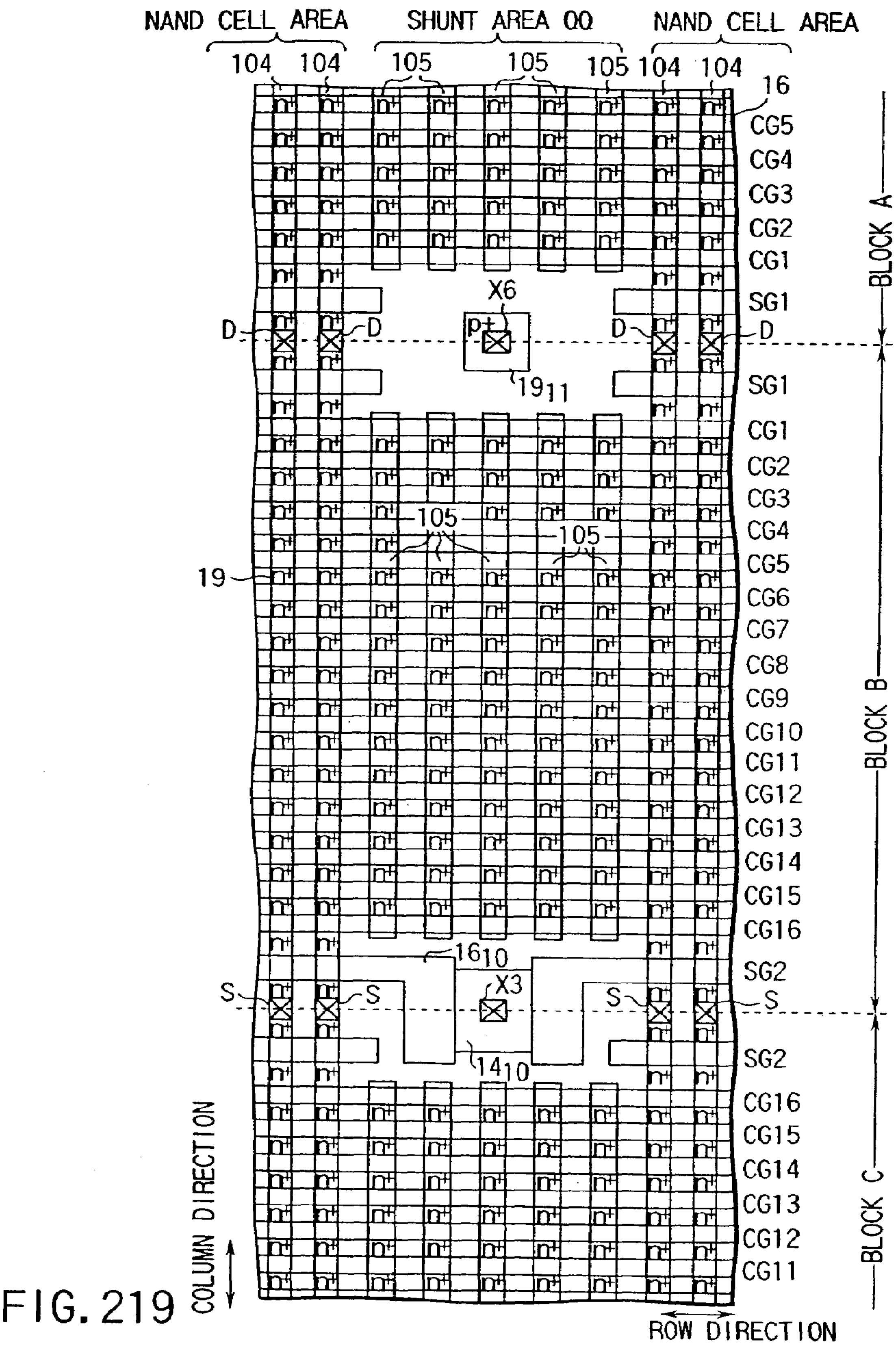
Figure 220:
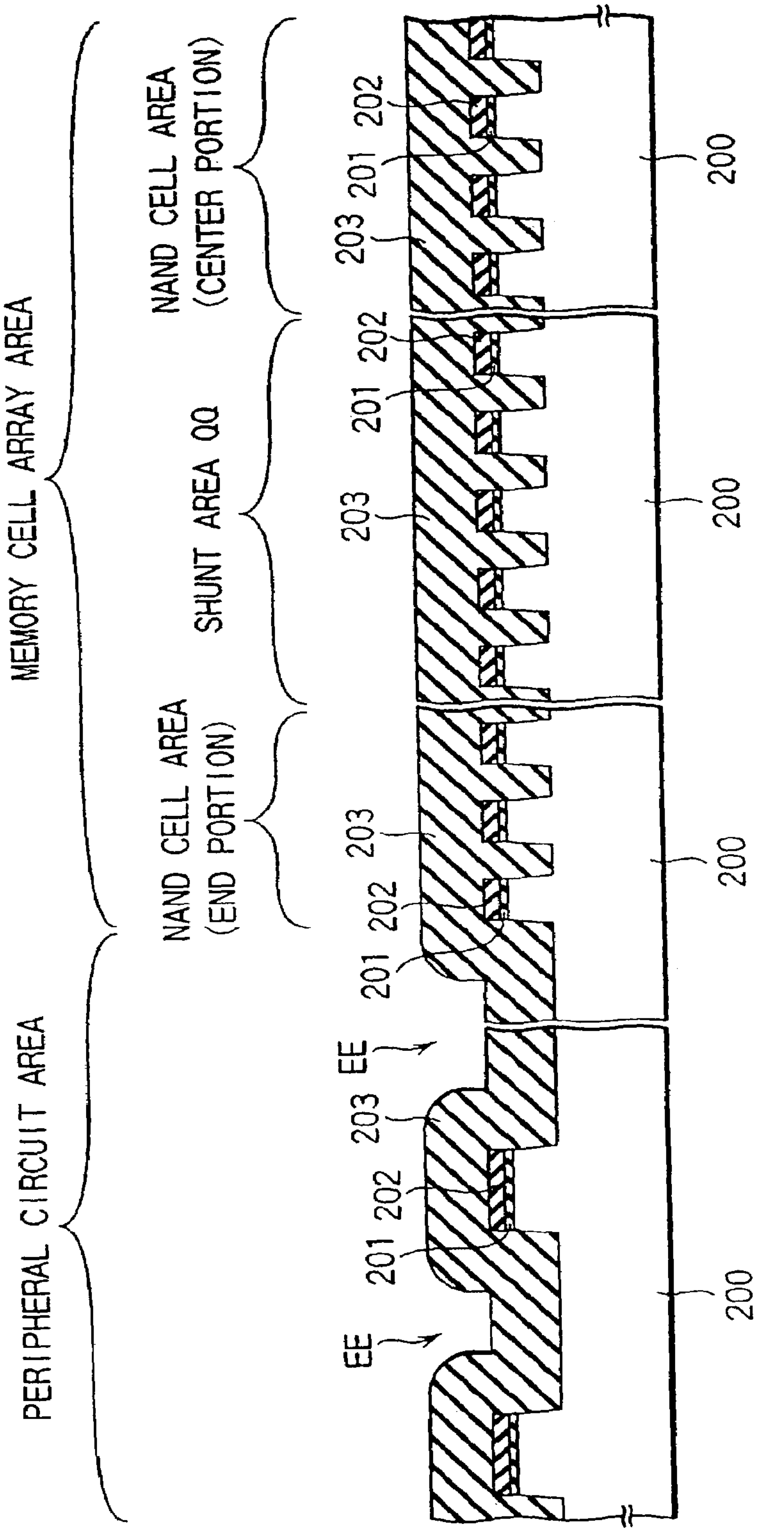
Figure 221:
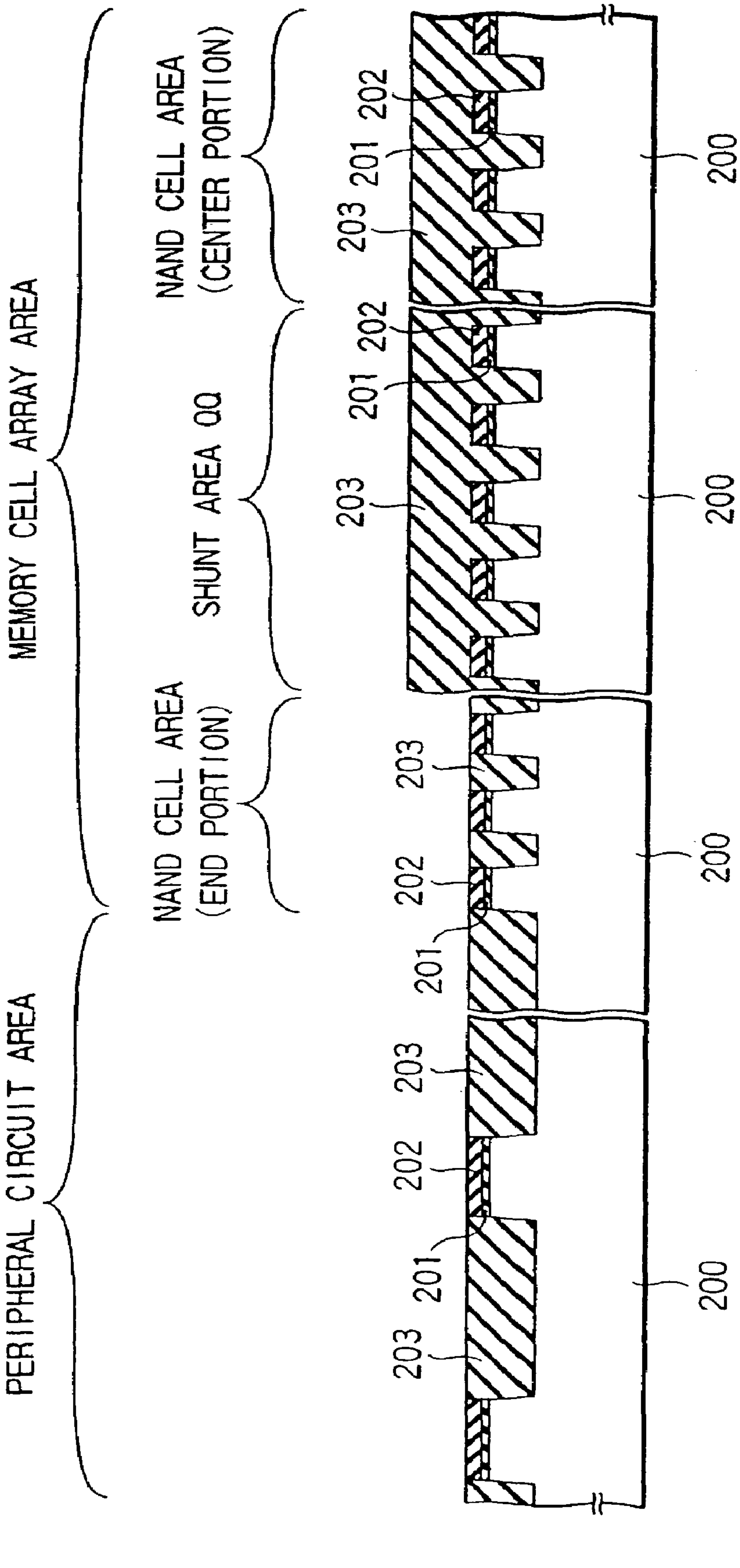
Figure 222:
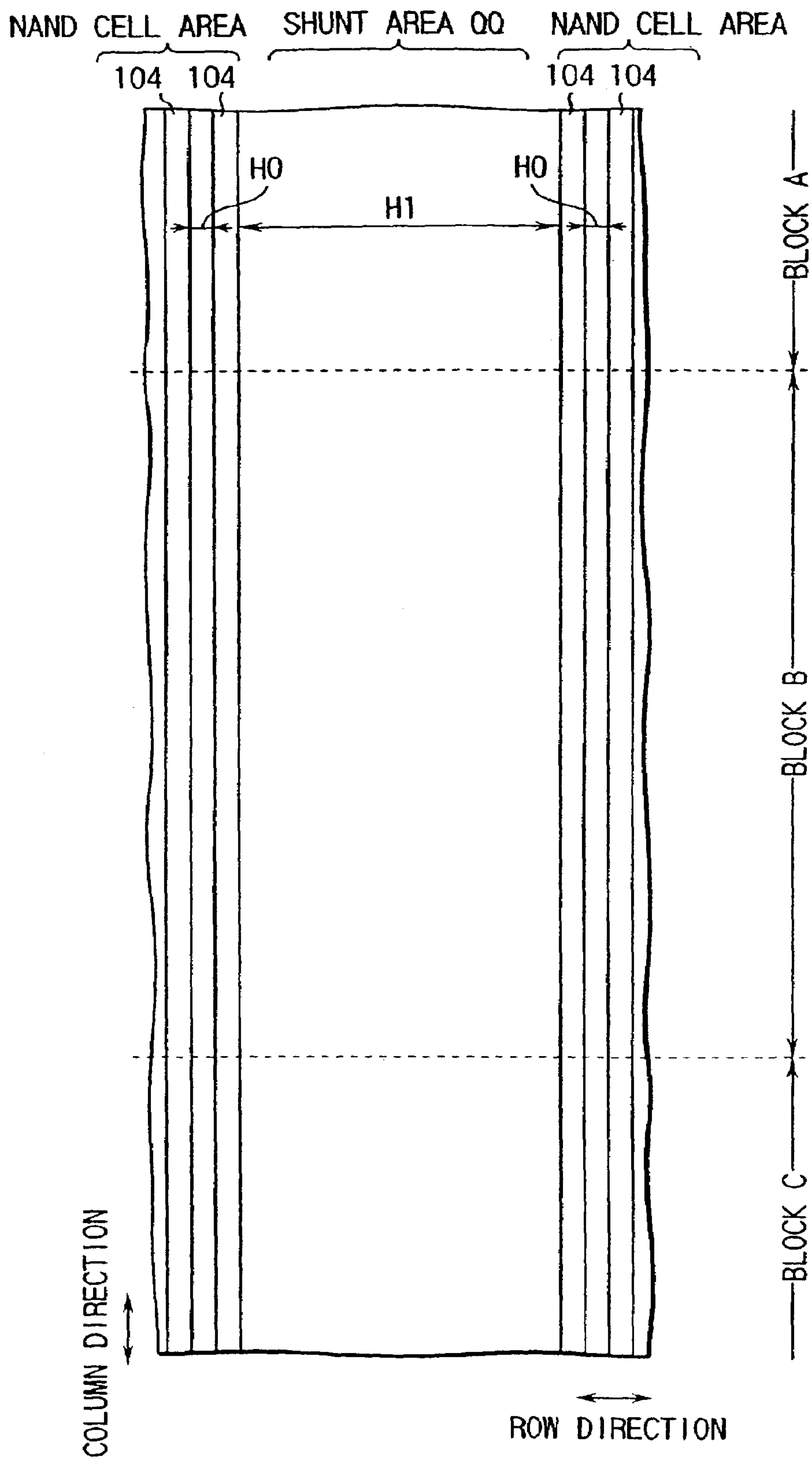
Figure 223:
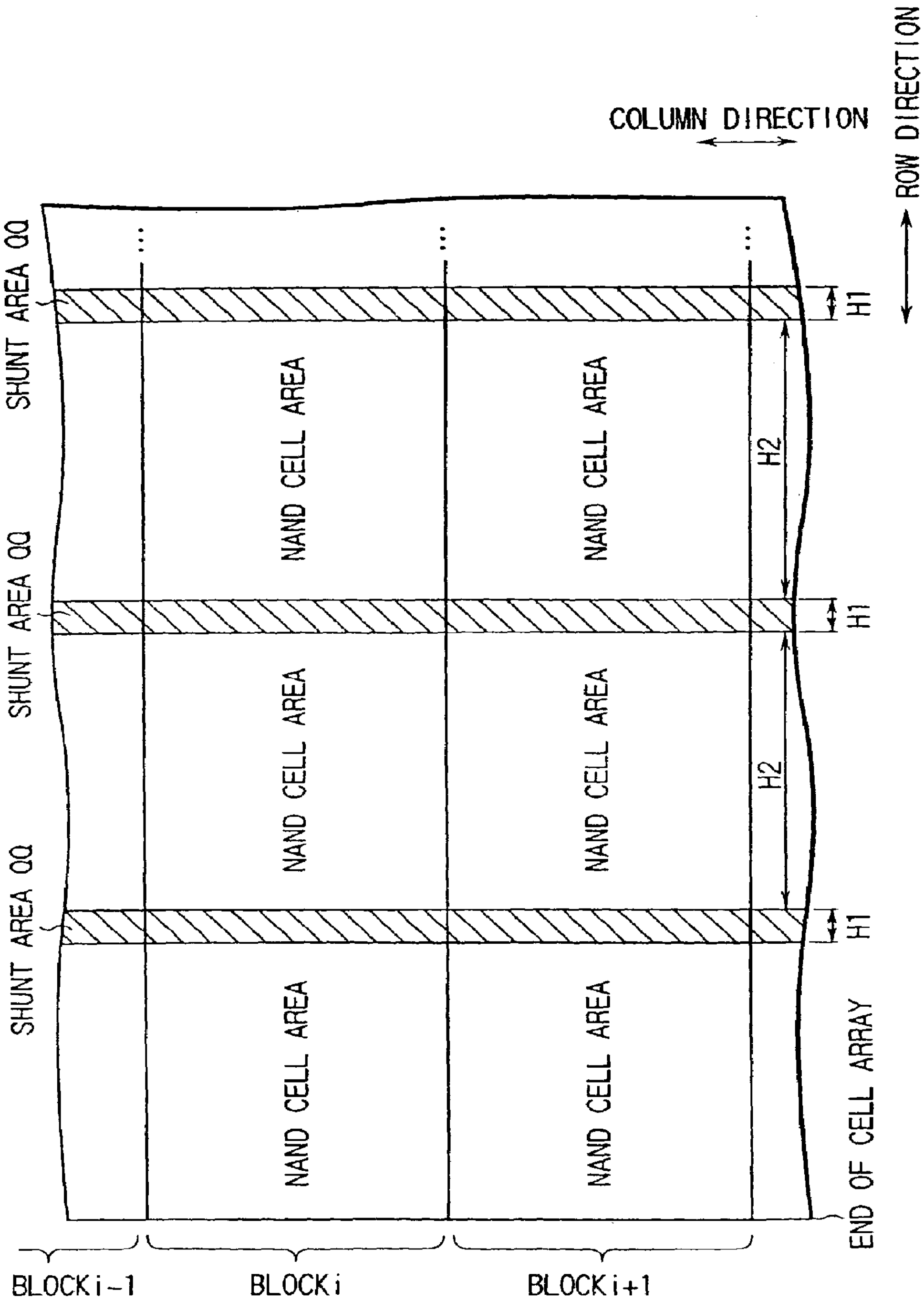
Figure 224:
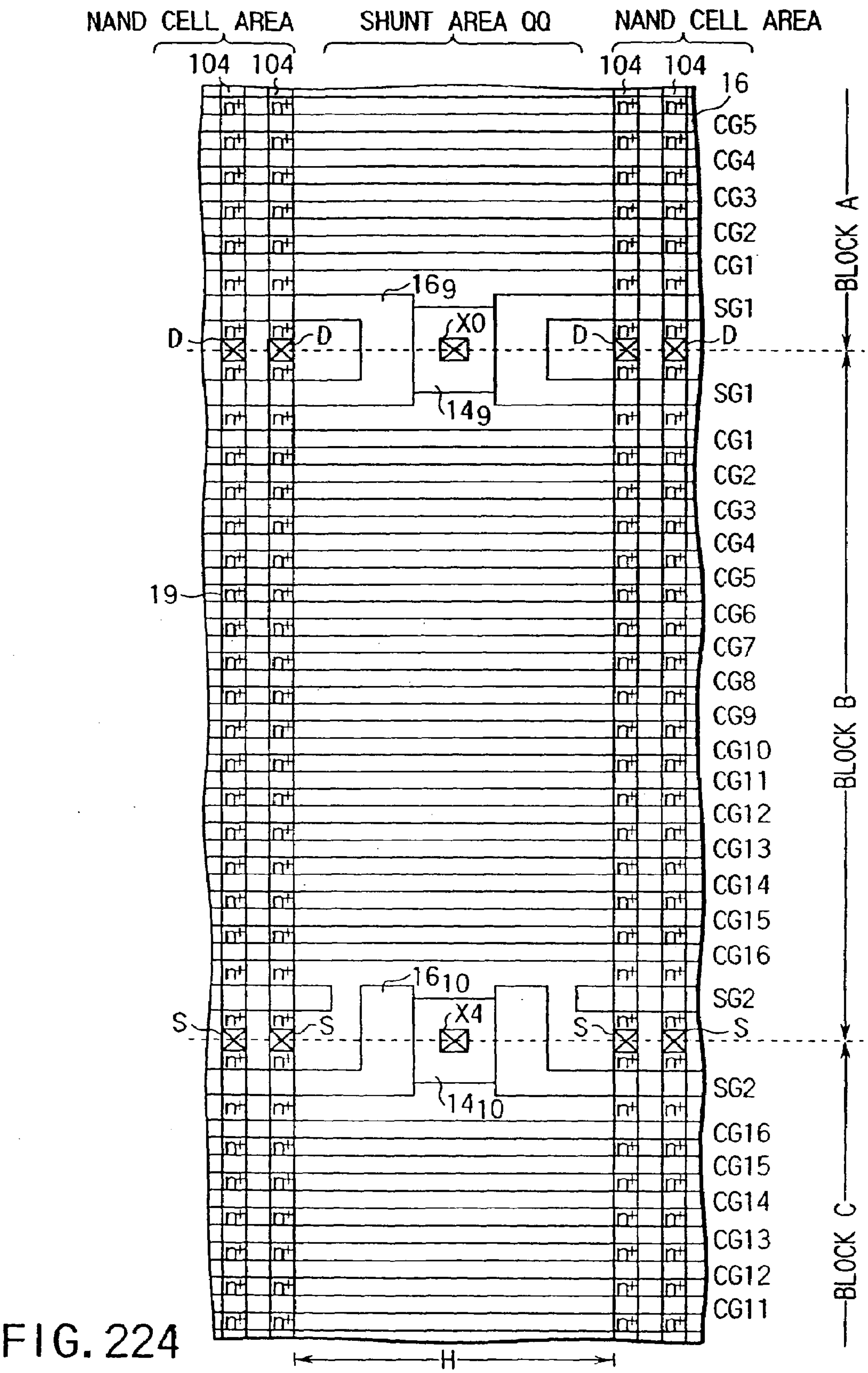
Figure 225:
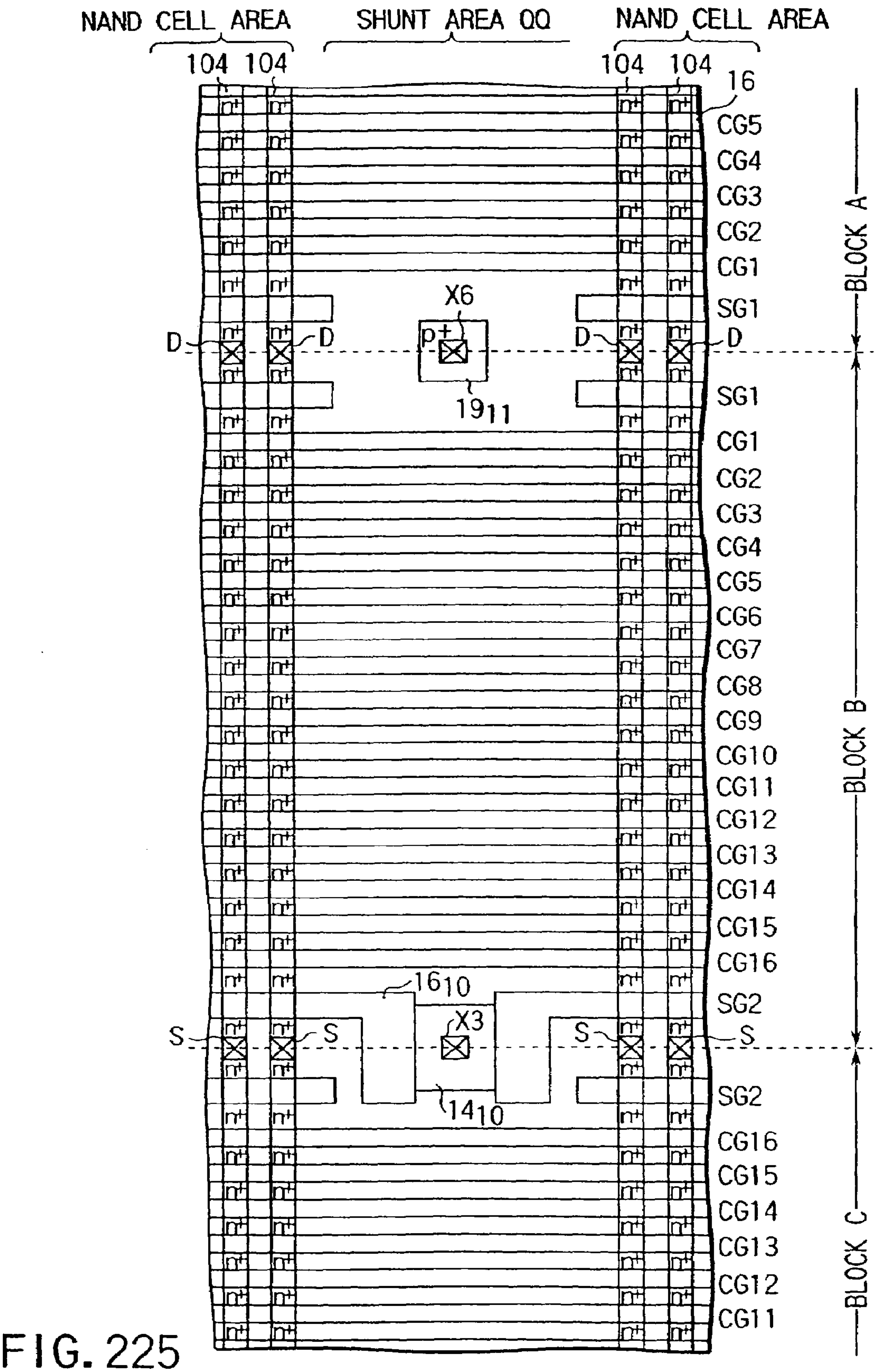
Figure 226:
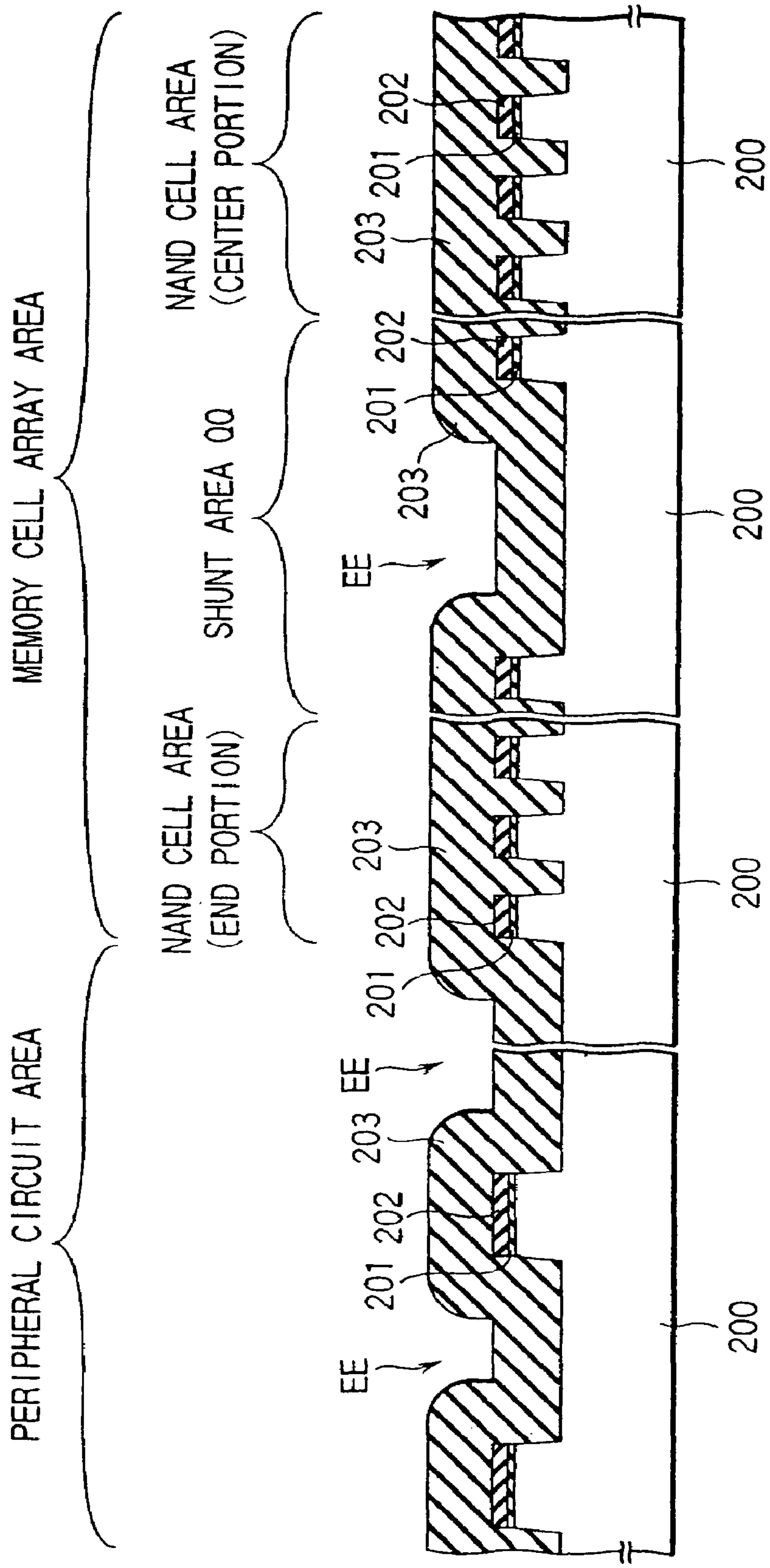
Figure 227:
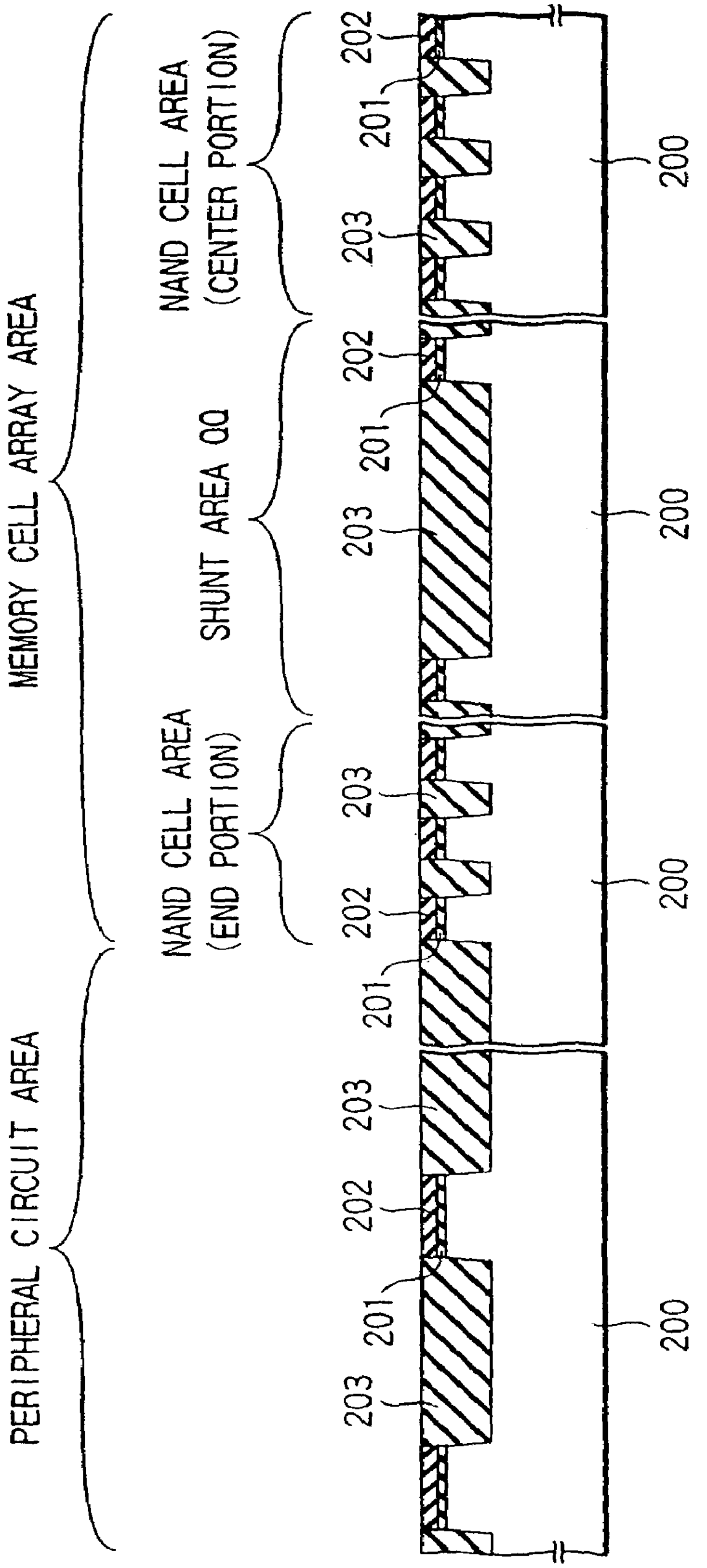

FIG. 131 is a sectional view taken along the line CXXXI-CXXXI of FIG. 129;

FIG. 132 is a plan view showing a ninth example of an EEPROM of the present invention;

FIG. 133 is a view in detail showing the area A1 of FIG. 132;

FIG. 134 is a view in detail showing the area A2 of FIG. 132;

FIG. 135 is a plan view showing a tenth example of an EEPROM of the present invention;

FIG. 136 is a view in detail showing the area A1 of FIG. 135;

FIG. 137 is a view in detail showing the area A2 of FIG. 135;

FIG. 138 is a plan view showing an eleventh example of an EEPROM of the present invention;

FIG. 139 is a view in detail showing the area A1 of FIG. 138;

FIG. 140 is a plan view showing a twelfth example of an EEPROM of the present invention;

FIG. 141 is a view in detail showing the area A1 of FIG. 140;

FIG. 142 is a plan view showing a thirteenth example of an EEPROM of the present invention;

FIG. 143 is a plan view showing a fourteenth example of an EEPROM of the present invention;

FIG. 144 is a view showing an arrangement example of a select gate line and a select gate bypass line;

FIG. 145 is a view showing an arrangement example of a select gate line and a select gate bypass line;

FIG. 146 is a view showing an arrangement example of a select gate line and a select gate bypass line;

FIG. 147 is a view showing an arrangement example of a select gate line and a select gate bypass line;

FIG. 148 is a view showing an arrangement example of a select gate line and a select gate bypass line;

FIG. 149 is a view showing an arrangement example of a select gate line and a select gate bypass line;

FIG. 150 is a view showing an arrangement example of a select gate line and a select gate bypass line;

FIG. 151 is a view showing an arrangement example of a select gate line and a select gate bypass line;

FIG. 152 is a view showing an arrangement example of a select gate line and a select gate bypass line;

FIG. 153 is a view showing an arrangement example of a select gate line and a select gate bypass line;

FIG. 154 is a view showing an arrangement example of a select gate line and a select gate bypass line;

FIG. 155 is a view showing an arrangement example of a select gate line and a select gate bypass line;

FIG. 156 is a view showing an arrangement example of a select gate line and a select gate bypass line;

FIG. 157 is a view showing an arrangement example of a select gate line and a select gate bypass line;

FIG. 158 is a view showing an arrangement example of a select gate line and a select gate bypass line;

FIG. 159 is a view showing an arrangement example of a select gate line and a select gate bypass line;

FIG. 160 is a view showing an arrangement example of a select gate line and a select gate bypass line;

FIG. 161 is a view showing an arrangement example of a select gate line and a select gate bypass line;

FIG. 162 is a view showing an arrangement example of a select gate line and a select gate bypass line;

FIG. 163 is a view showing an arrangement example of a select gate line and a select gate bypass line;

FIG. 164 is a view showing an arrangement example of a select gate line and a select gate bypass line;

FIG. 165 is a view showing an arrangement example of a select gate line and a select gate bypass line;

FIG. 166 is a view showing an arrangement example of a select gate line and a select gate bypass line;

FIG. 167 is a view showing an arrangement example of a select gate line and a select gate bypass line;

FIG. 168 is a view showing an arrangement example of a select gate line and a select gate bypass line;

FIG. 169 is a view showing an arrangement example of a select gate line and a select gate bypass line;

FIG. 170 is a diagram showing an operation example of an EEPROM of the present invention;

FIG. 171 is a diagram showing an operation example of an EEPROM of the present invention;

FIG. 172 is a diagram showing an operation example of an EEPROM of the present invention;

FIG. 173 is a diagram showing an operation example of an EEPROM of the present invention;

FIG. 174 is a diagram showing an operation example of an EEPROM of the present invention;

FIG. 175 is a diagram showing an operation example of an EEPROM of the present invention;

FIG. 176 is a plan view showing a NAND cell unit;

FIG. 177 is a diagram showing an equivalent circuit to the device of FIG. 176;

FIG. 178 is a plan view showing a fifteenth example of an EEPROM of the present invention;

FIG. 179 is a plan view showing the fifteenth example of an EEPROM of the present invention;

FIG. 180 is a sectional view taken along the line CLXXX-CLXXX of FIG. 179;

FIG. 181 is a sectional view taken along the line CLXXXI-CLXXXI of FIG. 179;

FIG. 182 is a view showing a configuration example of a shunt area of the EEPROM of FIG. 179;

FIG. 183 is a view showing a configuration example of a shunt area of the EEPROM of FIG. 179;

FIG. 184 is a view showing a configuration example of a shunt area of the EEPROM of FIG. 179;

FIG. 185 is a view showing a configuration example of a shunt area of the EEPROM of FIG. 179;

FIG. 186 is a view showing a configuration example of a shunt area of the EEPROM of FIG. 179;

FIG. 187 is a view showing a configuration example of a shunt area of the EEPROM of FIG. 179;

FIG. 188 is a view showing a configuration example of a peripheral area of a memory array of the EEPROM of FIG. 179;

FIG. 189 is a view showing a configuration example of a peripheral area of a memory array of the EEPROM of FIG. 179;

FIG. 190 is a plan view showing a NAND cell unit;

FIG. 191 is a diagram showing an equivalent circuit to the device of FIG. 190;

FIG. 192 is a plan view showing a sixteenth example of an EEPROM of the present invention;

FIG. 193 is a plan view showing the sixteenth example of an EEPROM of the present invention;

FIG. 194 is a view showing a configuration example of a shunt area of the EEPROM of FIG. 192;

FIG. 195 is a view showing a configuration example of a shunt area of the EEPROM of FIG. 192;

FIG. 196 is a view showing a configuration example of a shunt area of the EEPROM of FIG. 193;

FIG. 197 is a view showing a configuration example of a shunt area of the EEPROM of FIG. 193;

FIG. 198 is a view showing a configuration example of a shunt area of the EEPROM of FIG. 193;

FIG. 199 is a view showing a configuration example of a shunt area of the EEPROM of FIG. 193;

FIG. 200 is a view showing a configuration example of a shunt area of the EEPROM of FIG. 193;

FIG. 201 is a view showing a configuration example of a shunt area of the EEPROM of FIG. 193;

FIG. 202 is a view showing an arrangement example of a row decoder and a memory cell array;

FIG. 203 is a view showing an arrangement example of a row decoder and a memory cell array;

FIG. 204 is a view showing an arrangement example of a row decoder and a memory cell array;

FIG. 205 is a view showing an arrangement example of a row decoder and a memory cell array;

FIG. 206 is a view showing a configuration example of a shunt area of an EEPROM of the present invention;

FIG. 207 is a view showing a configuration example of a shunt area of an EEPROM of the present invention;

FIG. 208 is a view showing a configuration example of a shunt area of an EEPROM of the present invention;

FIG. 209 is a view showing a configuration example of a shunt area of an EEPROM of the present invention;

FIG. 210 is a view showing a configuration example of a shunt area of an EEPROM of the present invention;

FIG. 211 is a view showing a configuration example of a shunt area of an EEPROM of the present invention;

FIG. 212 is a circuit diagram of a memory cell array area of a NOR cell EEPROM;

FIG. 213 is a circuit diagram of a memory cell array area of a DINOR cell EEPROM;

FIG. 214 is a circuit diagram of a memory cell array area of a AND cell EEPROM;

FIG. 215 is a circuit diagram of a NOR cell EEPROM with a select transistor;

FIG. 216 is a view schematically showing a wafer and a memory chip;

FIG. 217 is a plan view showing a first layout example of a device isolation region and an active region;

FIG. 218 is a view showing FIG. 217 with additional select gate lines and word lines;

FIG. 219 is a view showing FIG. 217 with additional select gate lines and word lines;

FIG. 220 is a sectional view showing a condition before CMP in the layout of FIG. 217;

FIG. 221 is a sectional view showing a condition after CMP in the layout of FIG. 217;

FIG. 222 is a plan view showing a second layout example of a device isolation region and an active region;

FIG. 223 is a view showing widths H1 of STI portions in a shunt area QQ and a space H2 therebetween;

FIG. 224 is a view showing FIG. 222 with additional select gate lines and word lines;

FIG. 225 is a view showing FIG. 222 with additional select gate lines and word lines;

FIG. 226 is a sectional view showing a condition before CMP in the layout of FIG. 222; and FIG. 227 is a sectional view showing a condition after CMP in the layout of FIG. 222.

DETAILED DESCRIPTION OF THE INVENTION

Figure 1:
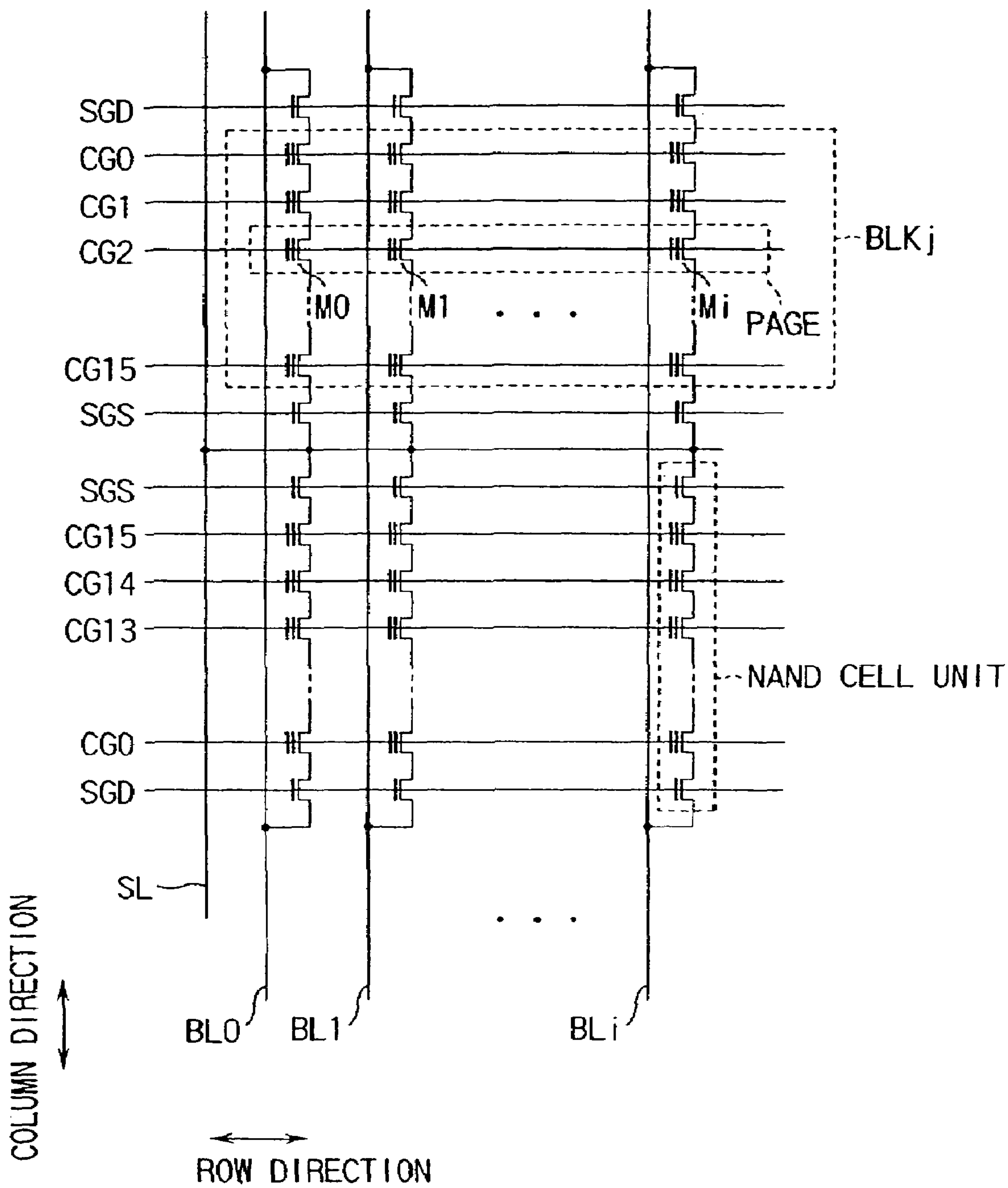
FIG. 1 is a circuit diagram of the memory cell array of a conventional NAND type of EEPROM.
Figure 2:
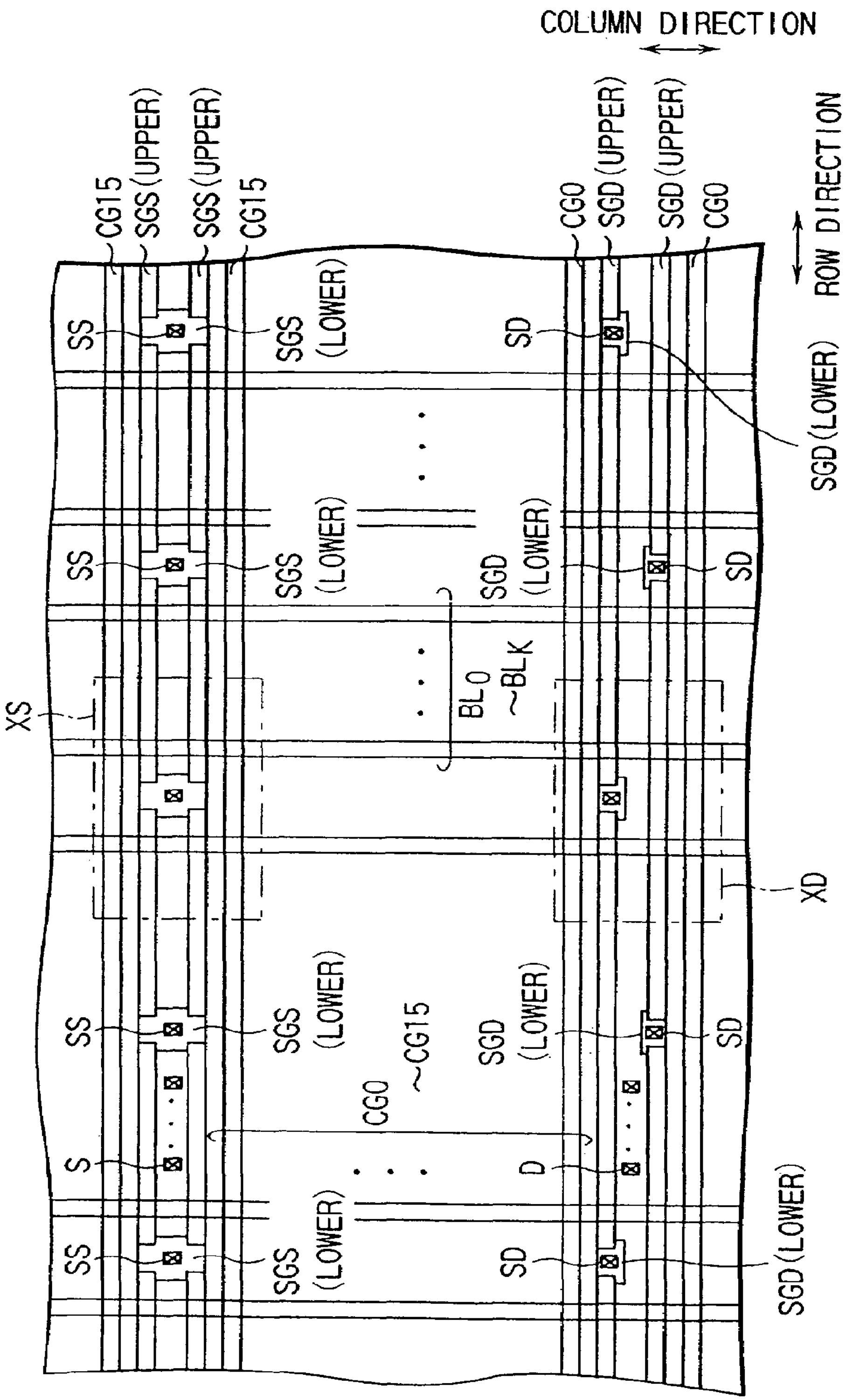
FIG. 2 shows a plan pattern of a NAND type of EEPROM.
Figure 3:
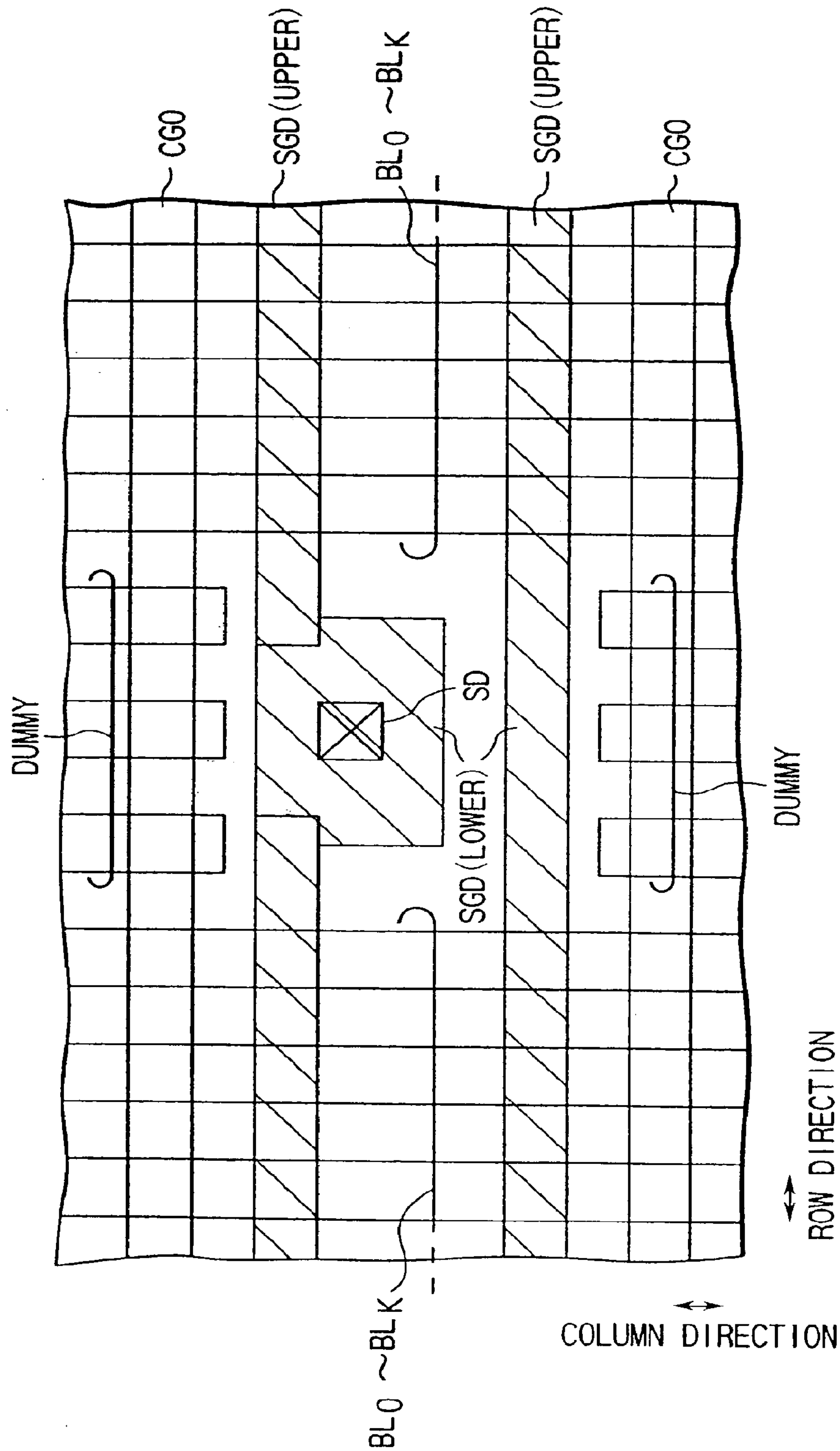
FIG. 3 is an enlarged view of the area XD of FIG. 2.
Figure 4:
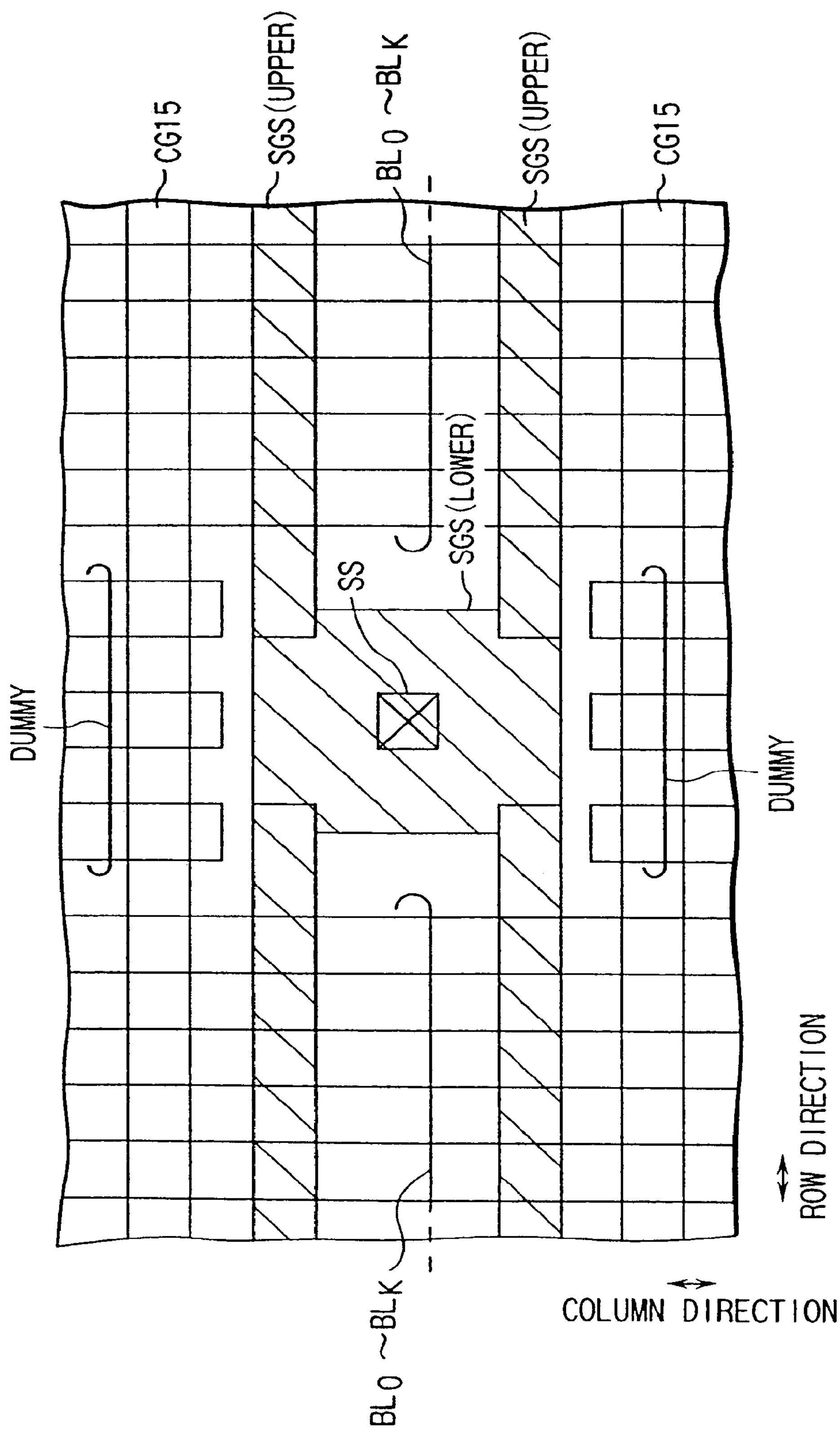
FIG. 4 is an enlarged view of the area XS of FIG. 2.
Figure 5:
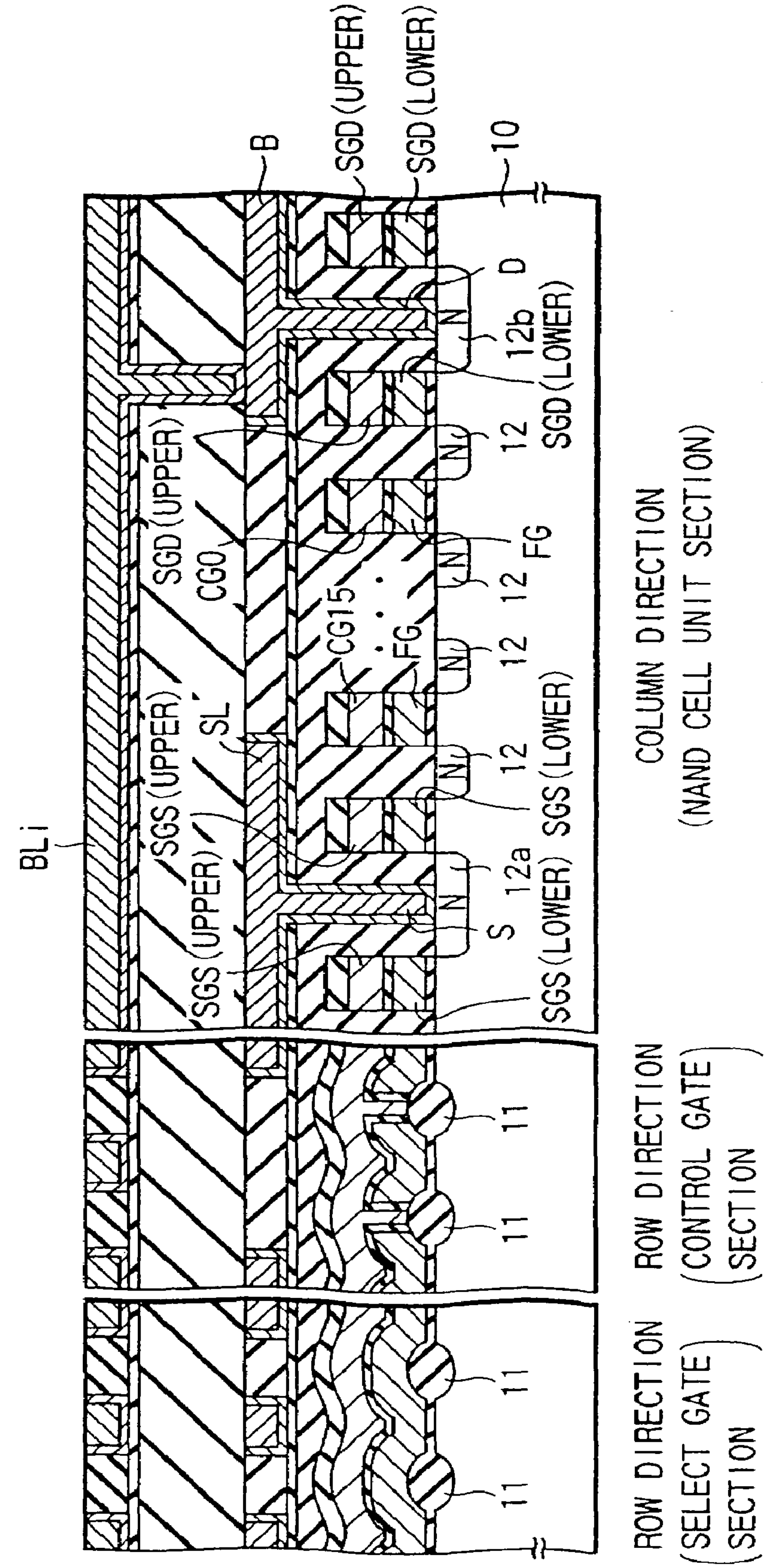
FIG. 5 is a sectional view of the NAND type of EEPROM of FIG. 2.

[I] FIG. 2 shows a first example of a pattern of a memory cell array section of a NAND flash EEPROM which forms the basis of the present invention. In FIG. 3, an area XD of FIG. 2 is shown enlarged. In FIG. 4, an area XS of FIG. 2 is shown enlarged. In FIG. 5, the memory cell array section of the NAND flash EEPROM is shown in section.

On a silicon substrate 10 a field oxide layer 11 is formed. In a device region surrounded with the field oxide layer 11 a NAND cell unit is formed which is composed of 16 memory cells and two select gate transistors by way of example.

Each memory cell comprises a floating gate electrode FG, a control gate electrode (word line: CG0 to CG15), and N-type diffused layers 12. The select gate transistor on the source side is composed of upper (second-level) and lower (first-level) select gate electrodes SGS and N-type diffused layers 12*a* and 12. The select gate transistor on the drain side is composed of first- and second-level select gate electrodes SGD and N-type diffused layers 12*b* and 12.

The control gate electrodes CG0 to CG15, the source-side first- and second-level select gate electrodes SGS, and the drain-side first- and second-level select gate electrodes SGD extend in the row direction, while bit lines BLi extend in the column direction. Each of the bit lines BLi is connected through an interconnection B to the corresponding diffused layer 12*b*.

The source- and drain-side select gate transistors are provided in order to select a memory cell to be written into or erased. Thus, unlike the memory cells, each of these transistors is designed to perform a switching operation at a fixed threshold.

In each of the select gate transistors, therefore, a control signal is directly applied to the first-level (lower) select gate electrodes SGS and SGD. Specifically, portions of the second-level (upper) select gate electrodes SGS and SGD are removed to form contact areas for the first-level select gate electrodes. Contact holes SS and SD are formed in these contact areas.

The hatched areas in FIGS. 3 and 4 indicate portions where the first-level select gate electrodes SGS and SGD are existent.

In view of the resistance of the first-level select gate electrodes SGS and SGD, the contact areas (i.e., contact holes SS and SD) are each formed for every several hundreds of bit lines across which the select gate electrodes extend. Further, the contact areas (SS) for the first-level select gate electrodes SGS of the source-side select gate transistors are each common to two first-level select gate electrodes SGS which are adjacent to each other in the column direction. On the other hand, the contact areas (SD) for the first-level select gate electrodes SGS of the drain-side select gate transistors are each not common to two first-level select gate electrodes SGS adjacent to each other in the column direction.

Figure 6:
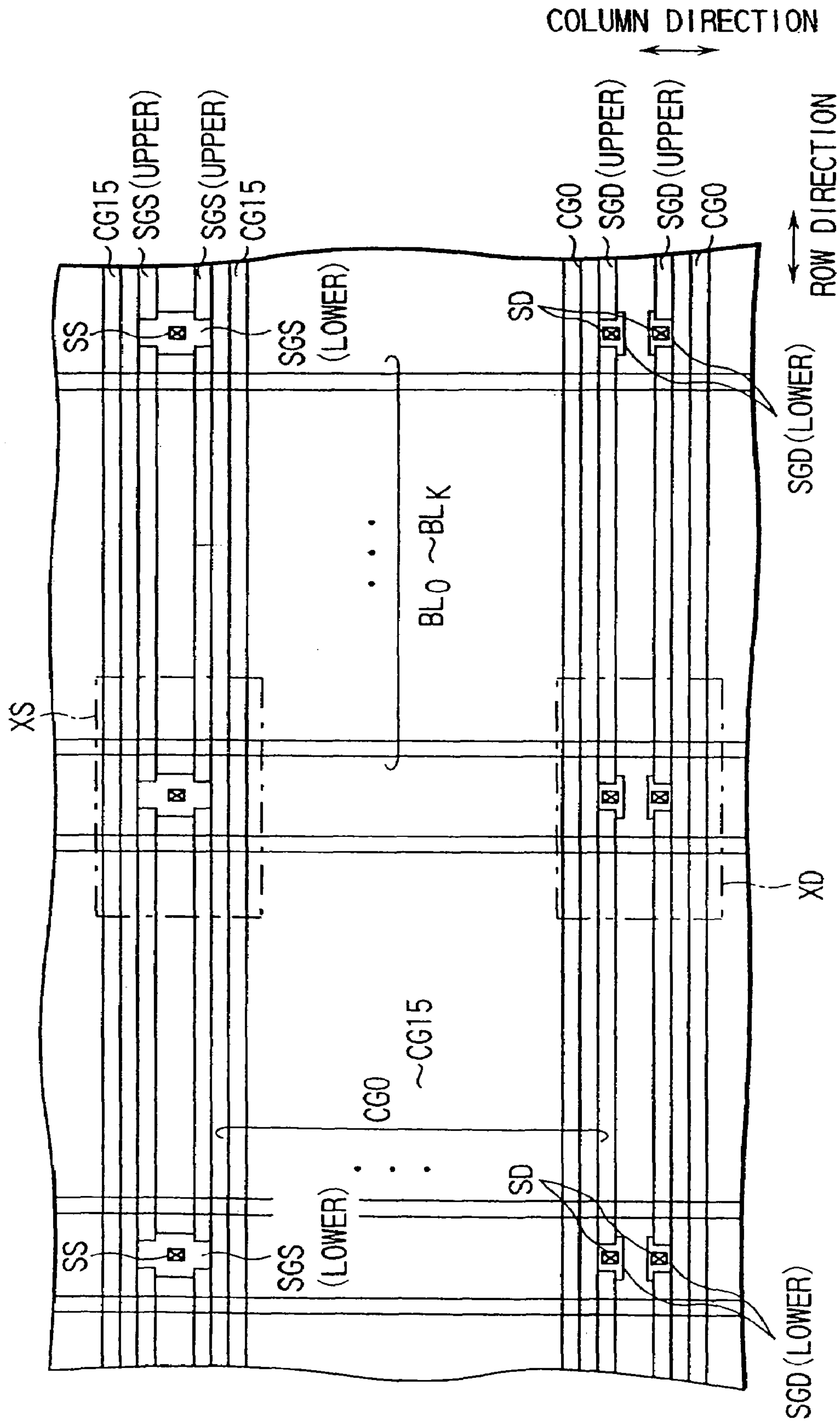
FIG. 6 shows a plan pattern of a NAND type of EEPROM.
Figure 7:
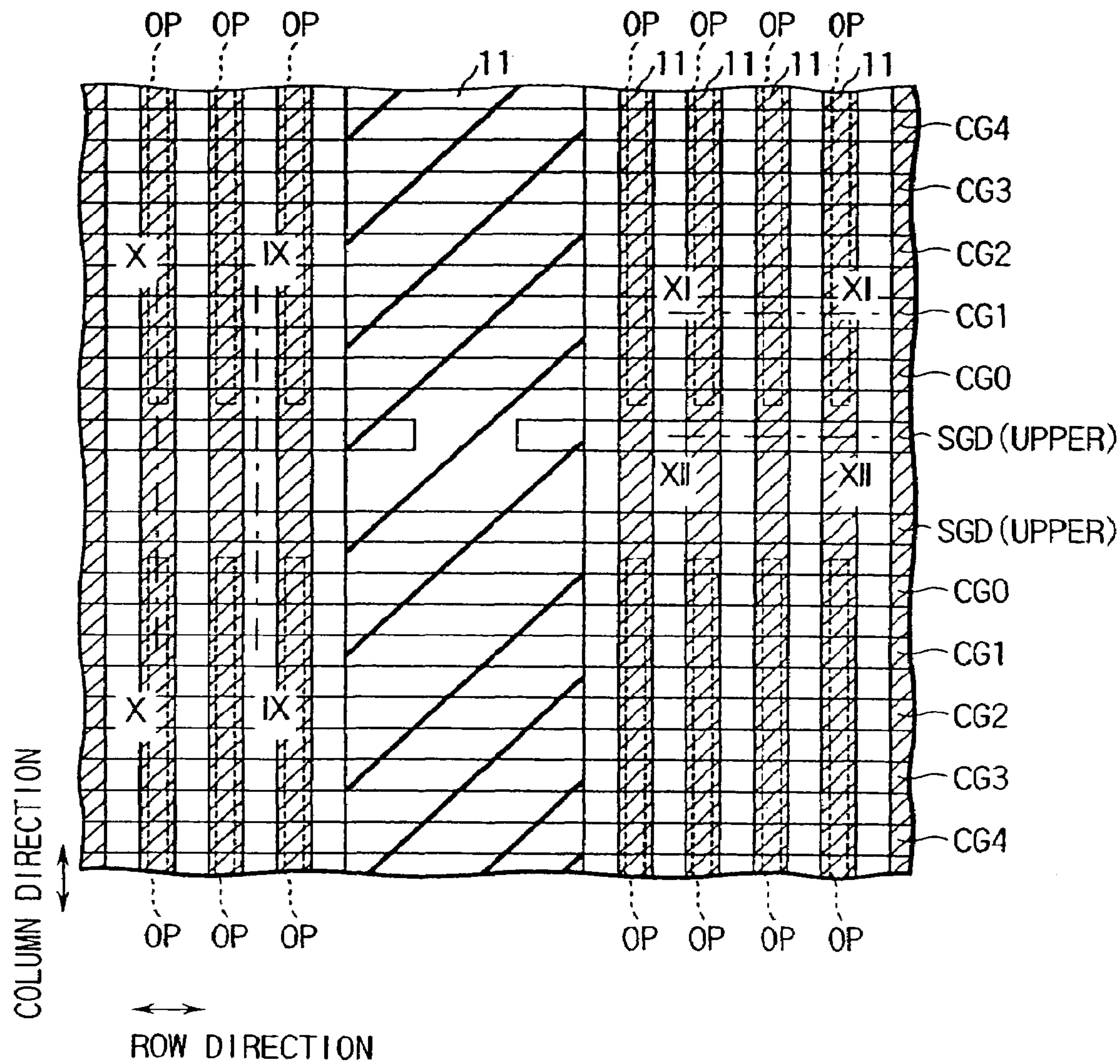
FIG. 7 is a plan view illustrating a step of an EEPROM manufacturing method.
Figure 8:
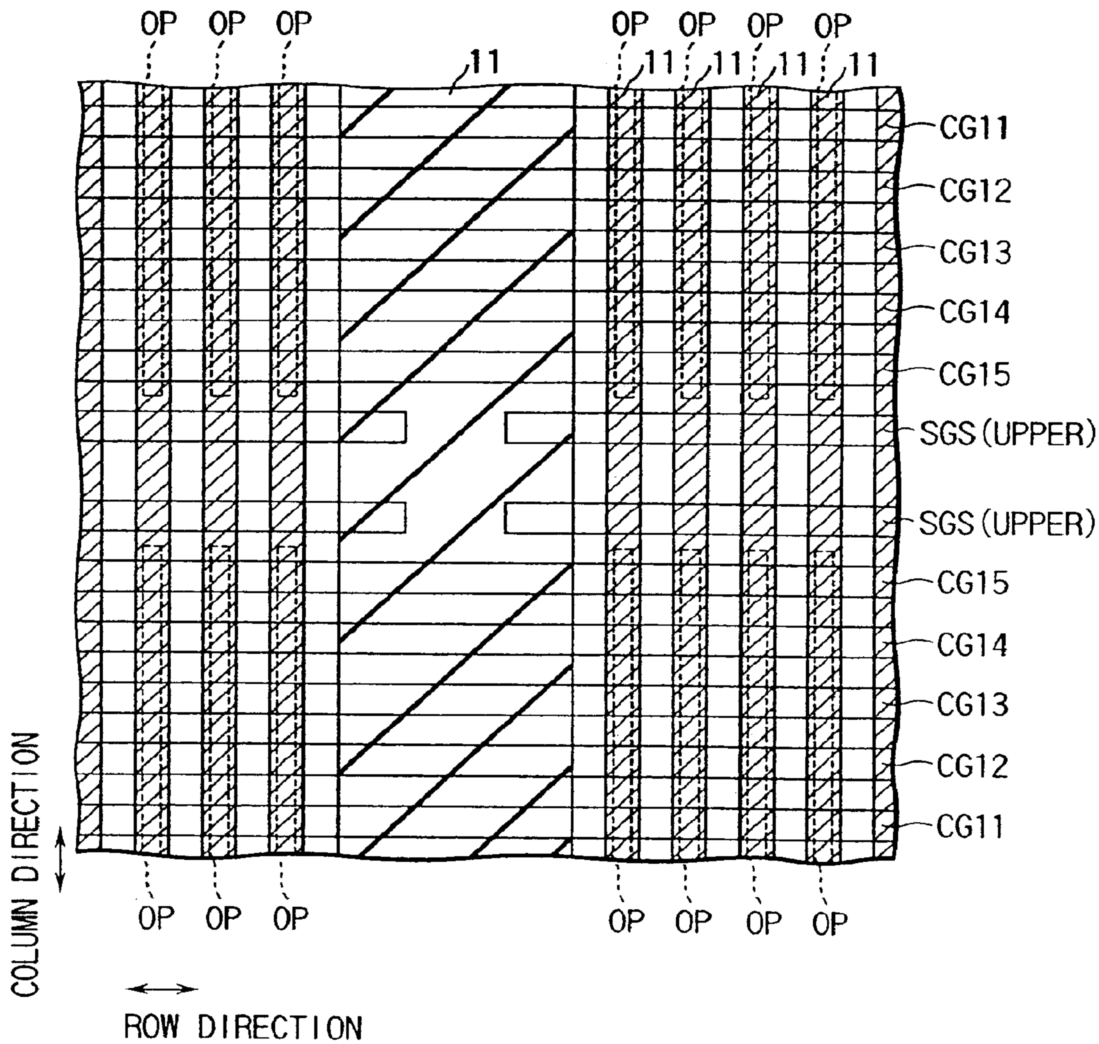
FIG. 8 is a plan view illustrating a step of an EEPROM manufacturing method.
Figure 9:
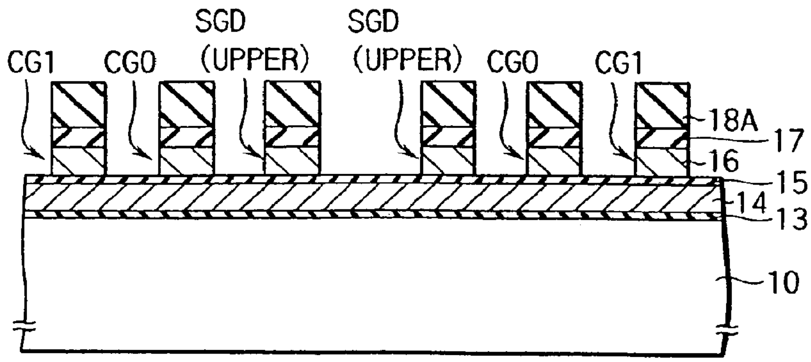
FIG. 9 is a sectional view taken along line IX-IX of FIG. 7.
Figure 10:
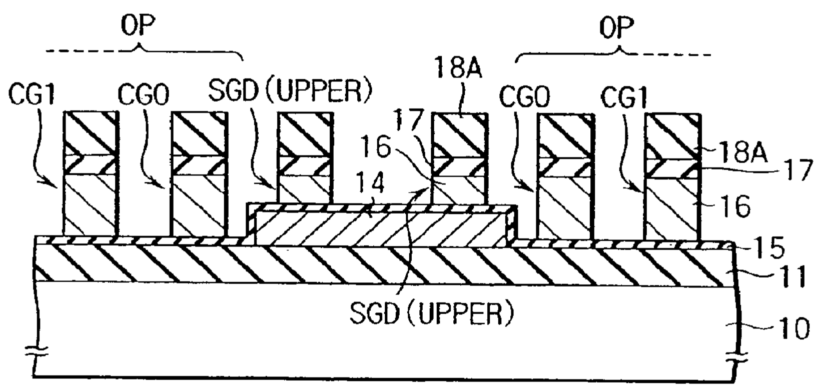
FIG. 10 is a sectional view taken along line X-X of FIG. 7.
Figure 11:
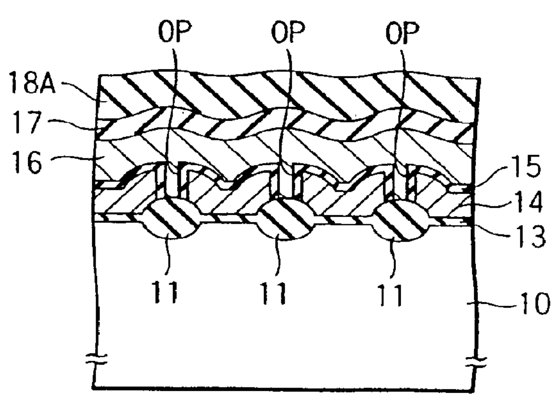
FIG. 11 is a sectional view taken along line XI-XI of FIG. 7.
Figure 12:
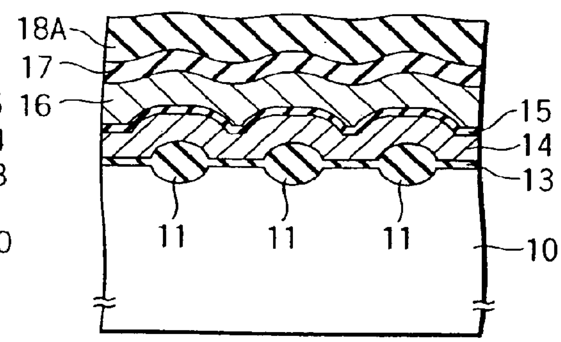
FIG. 12 is a sectional view taken along line XII-XII of FIG. 7.
Figure 13:
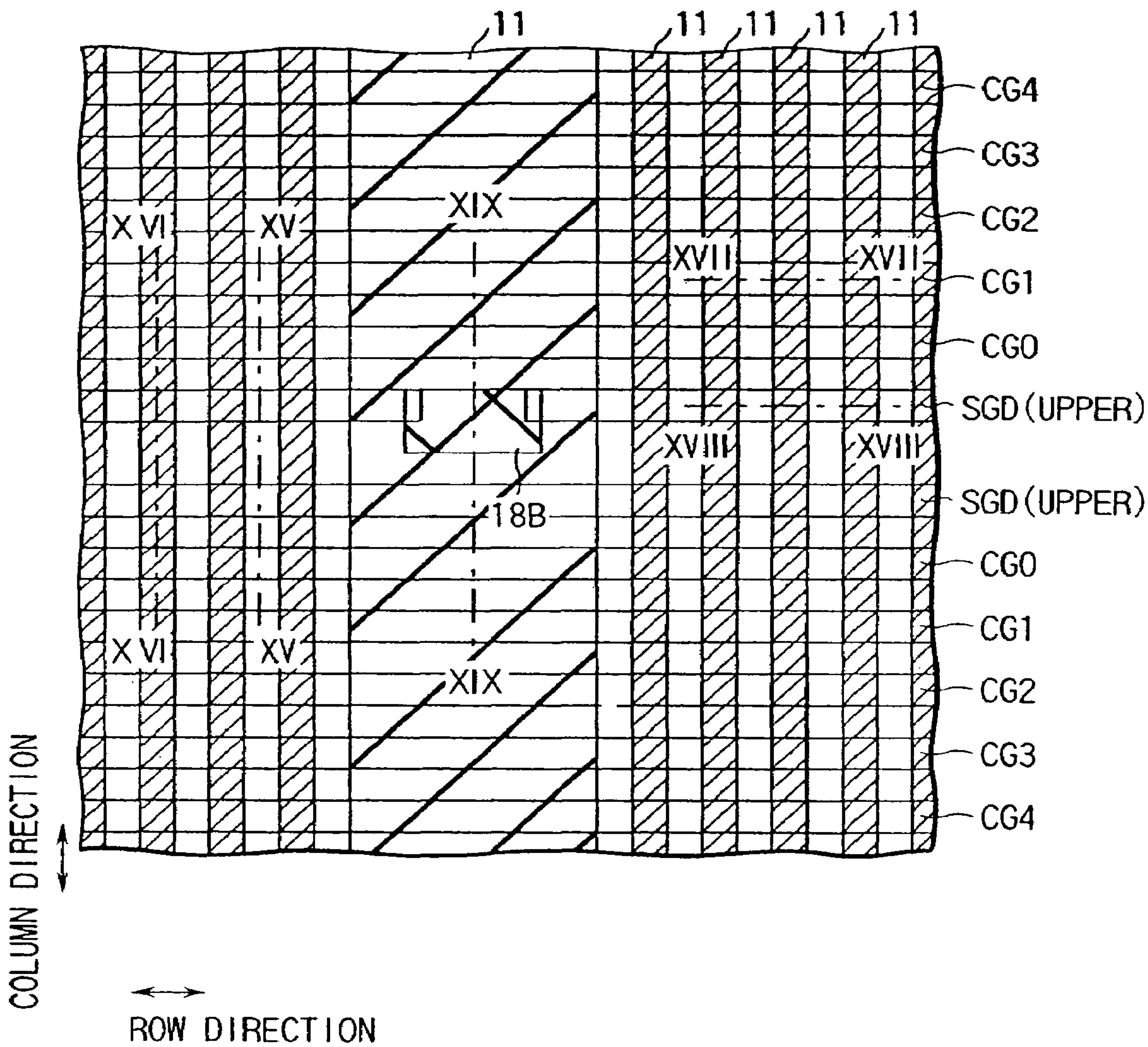
FIG. 13 is a plan view illustrating a step of an EEPROM manufacturing method.
Figure 14:
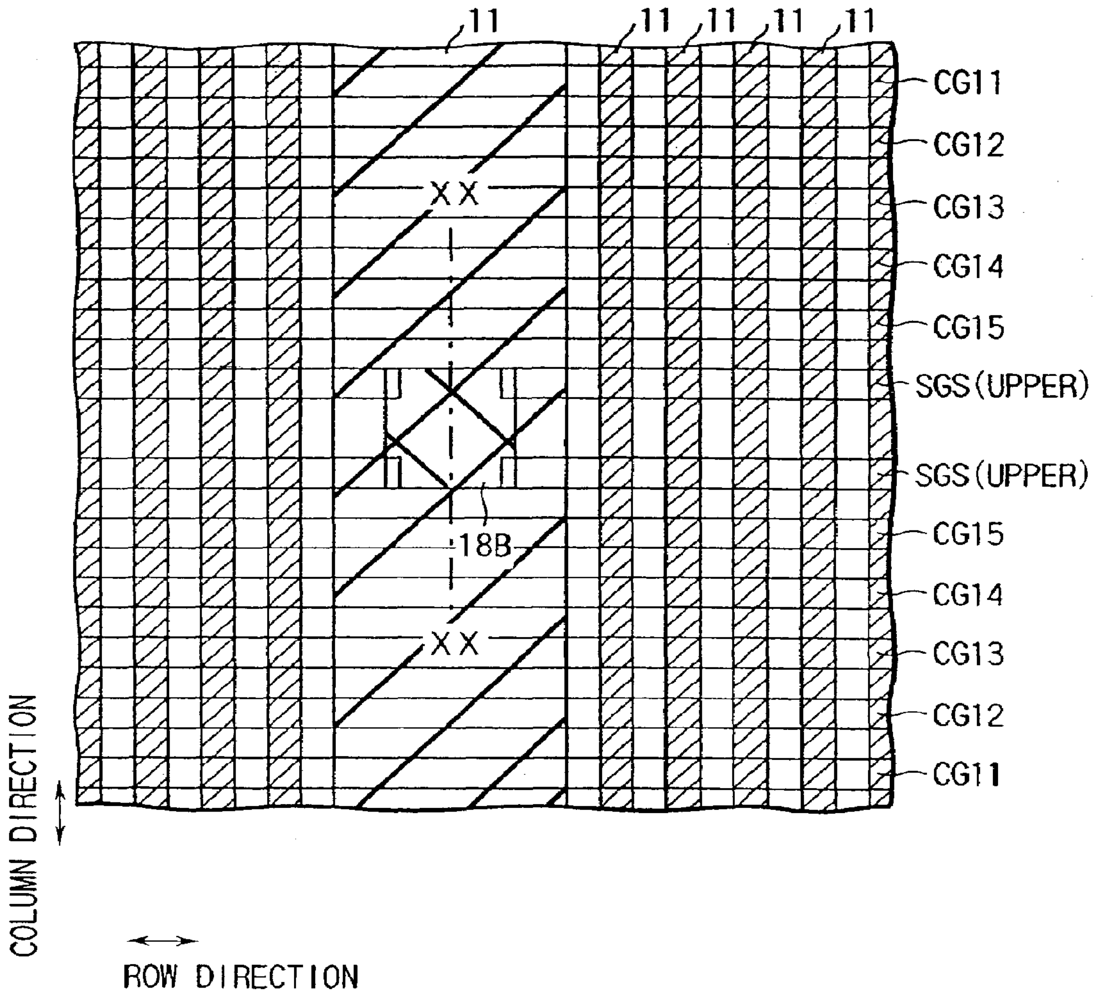
FIG. 14 is a plan view illustrating a step of an EEPROM manufacturing method.
Figure 15:
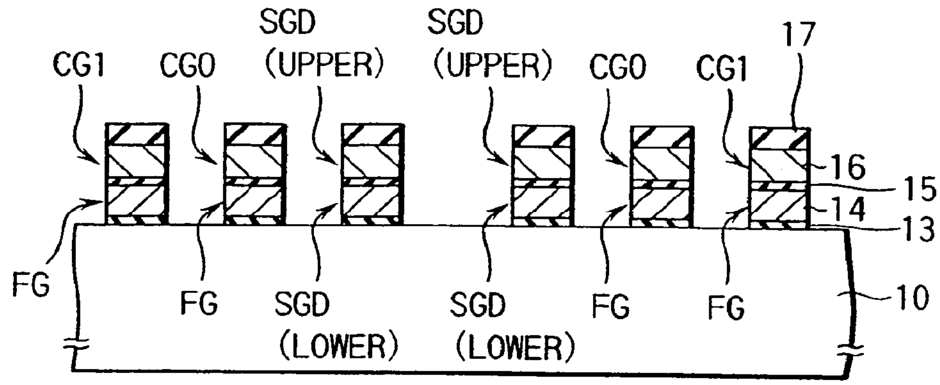
FIG. 15 is a sectional view taken along line XV-XV of FIG. 13.
Figure 16:
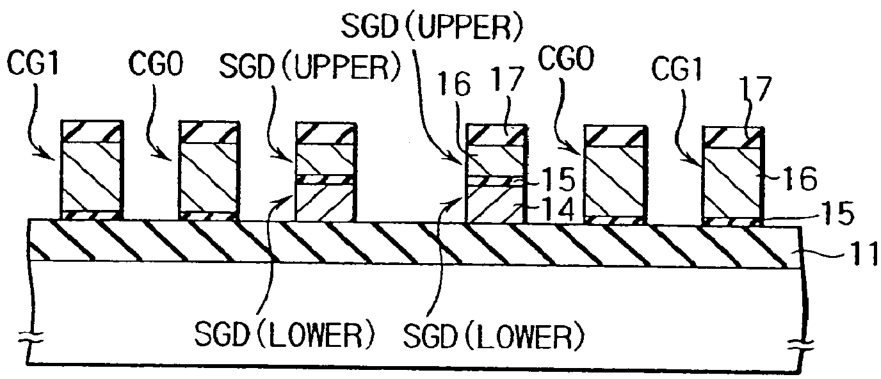
FIG. 16 is a sectional view taken along line XVI-XVI of FIG. 13.
Figure 17:
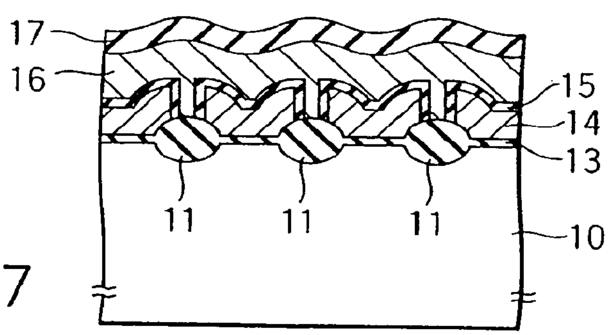
FIG. 17 is a sectional view taken along line XVII-XVII of FIG. 13.
Figure 18:
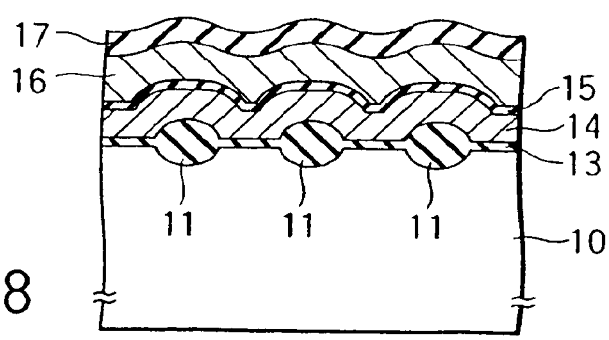
FIG. 18 is a sectional view taken along line XVIII-XVIII of FIG. 13.
Figure 19:
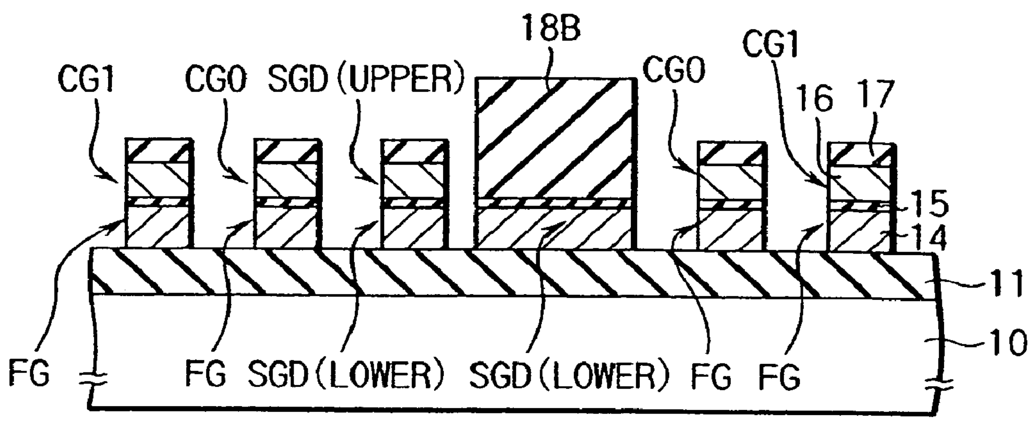
FIG. 19 is a sectional view taken along line XIX-XIX of FIG. 13.
Figure 20:
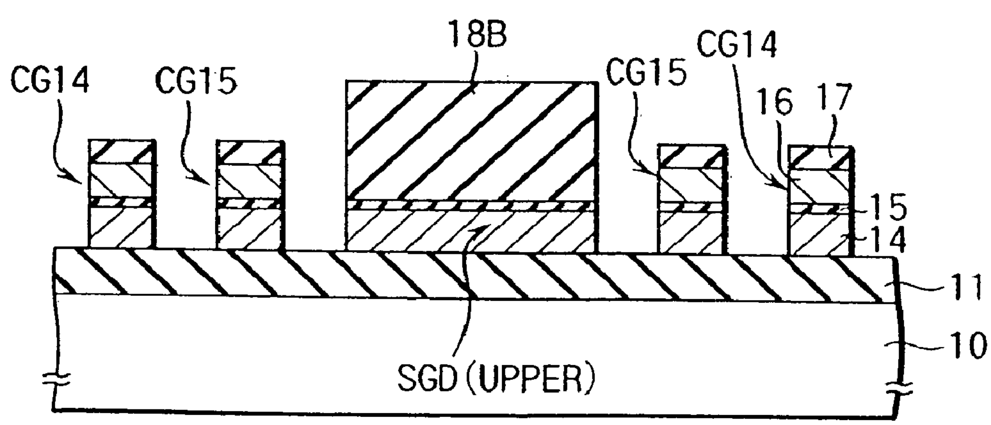
FIG. 20 is a sectional view taken along line XX-XX of FIG. 14.
Figure 21:
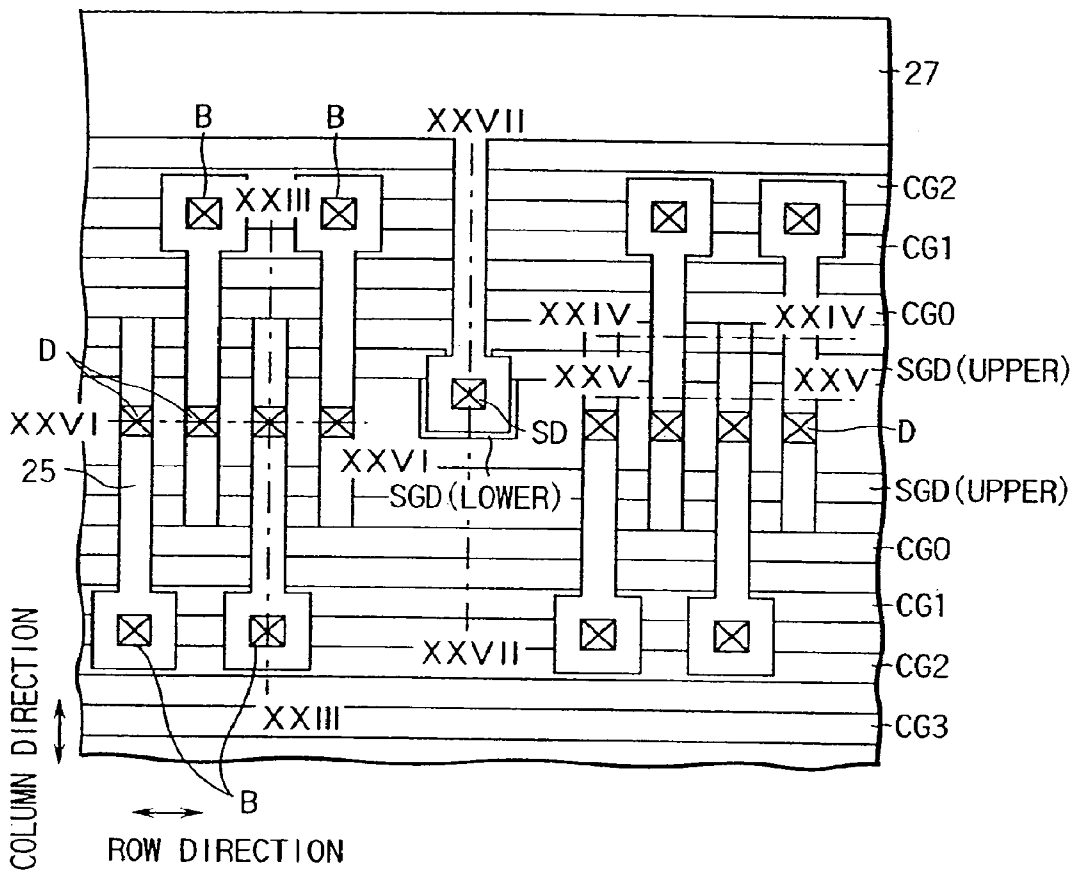
FIG. 21 is a plan view illustrating a step of an EEPROM manufacturing method.
Figure 22:
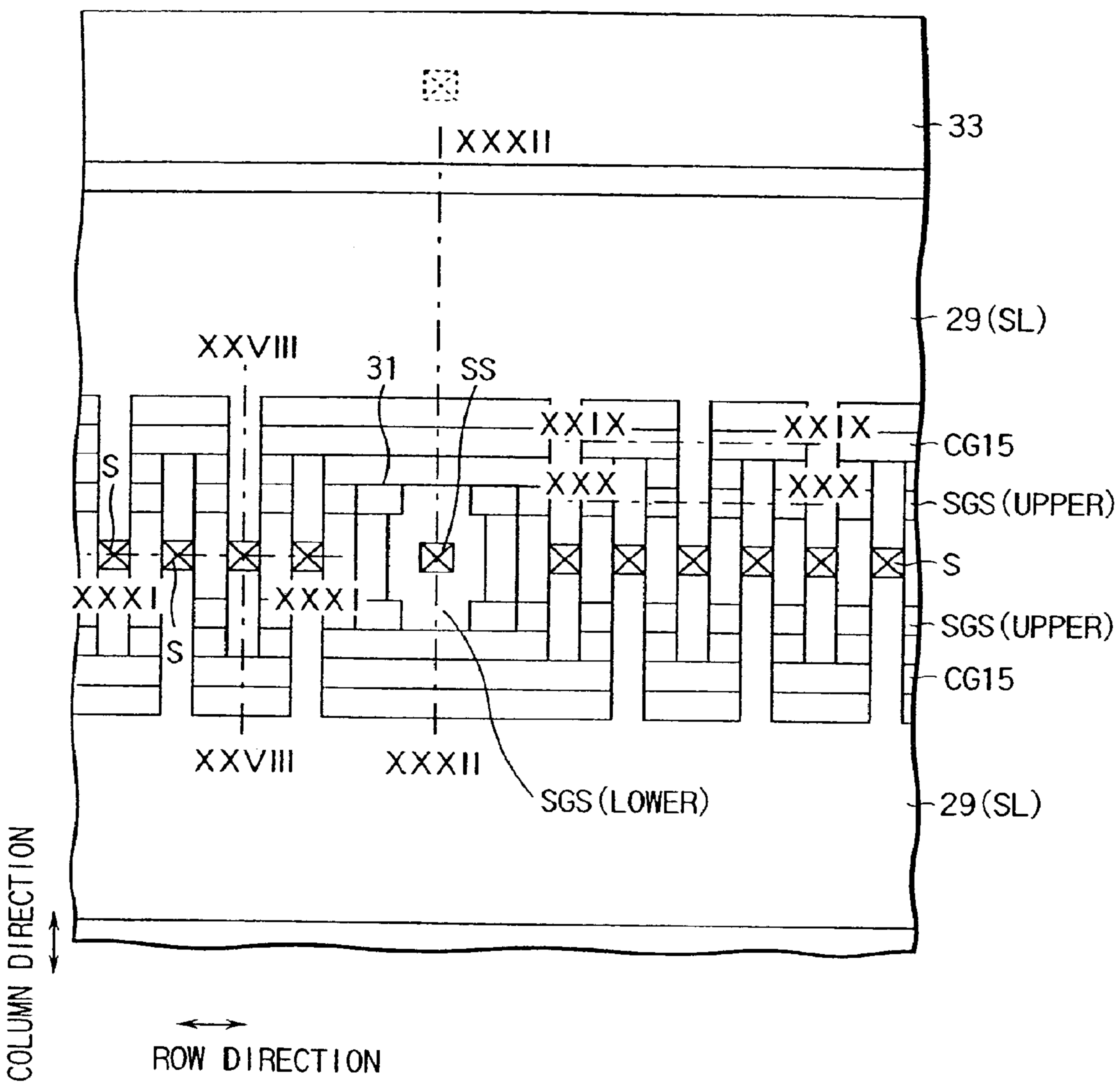
FIG. 22 is a plan view illustrating a step of an EEPROM manufacturing method.
Figure 23:
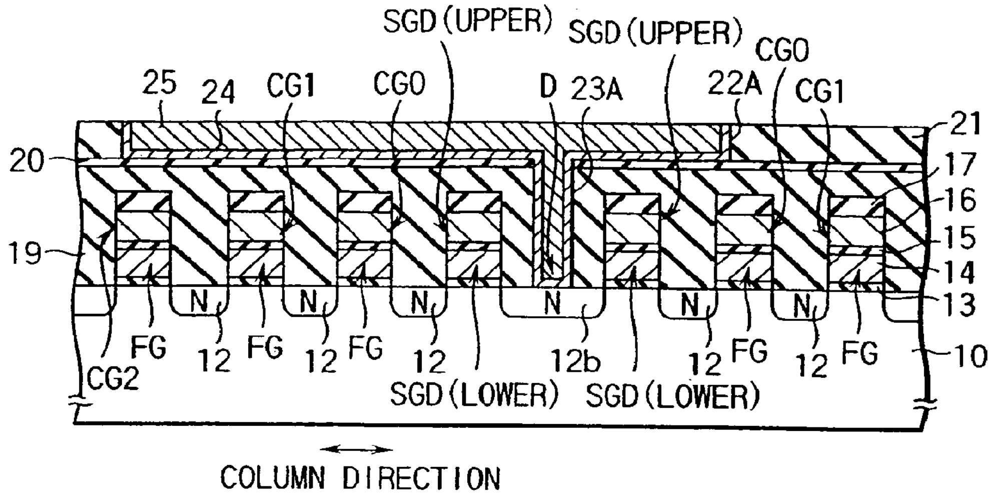
FIG. 23 is a sectional view taken along line XXIII-XXIII of FIG. 21.
Figure 24:
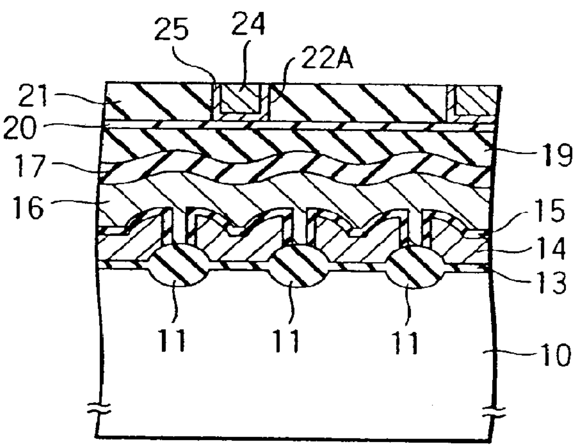
FIG. 24 is a sectional view taken along line XXIV-XXIV of FIG. 21.
Figure 25:
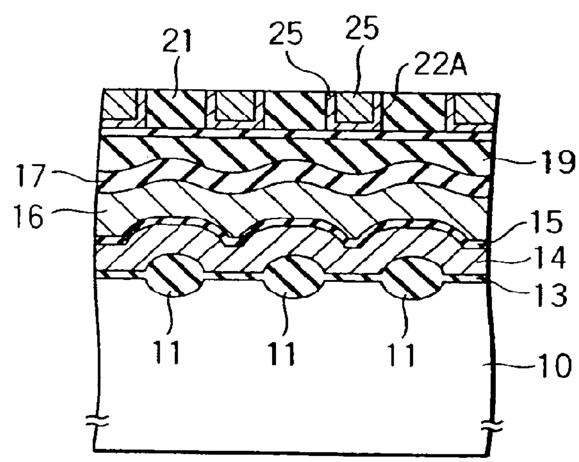
FIG. 25 is a sectional view taken along line XXV-XXV of FIG. 21.
Figure 26:
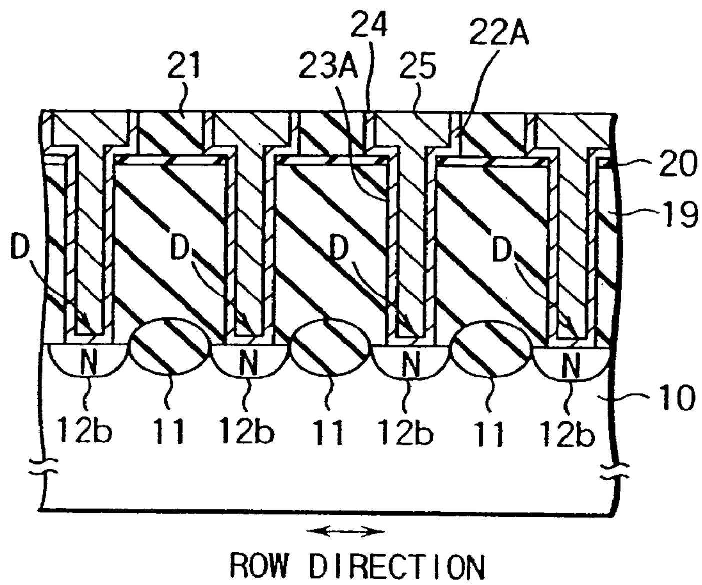
FIG. 26 is a sectional view taken along line XXVI-XXVI of FIG. 21.
Figure 27:
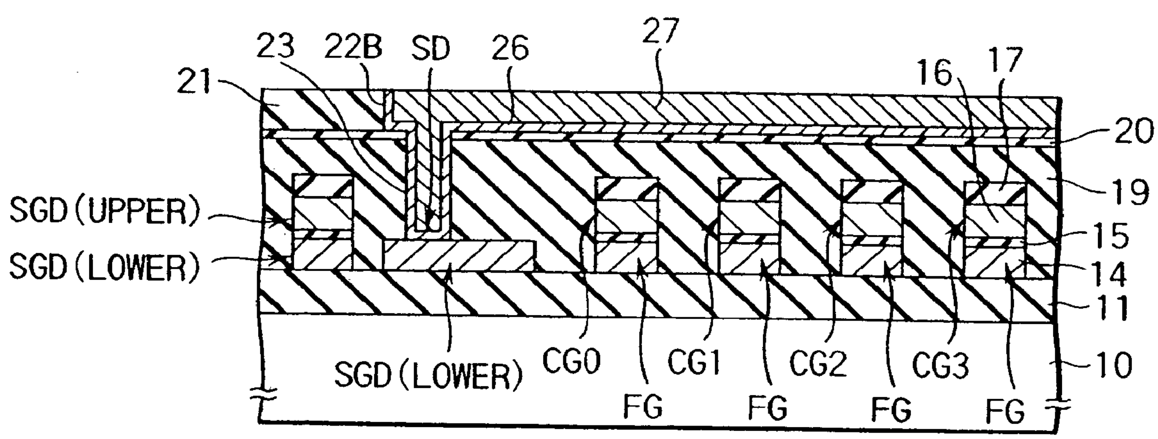
FIG. 27 is a sectional view taken along line XXVII-XXVII of FIG. 21.
Figure 28:
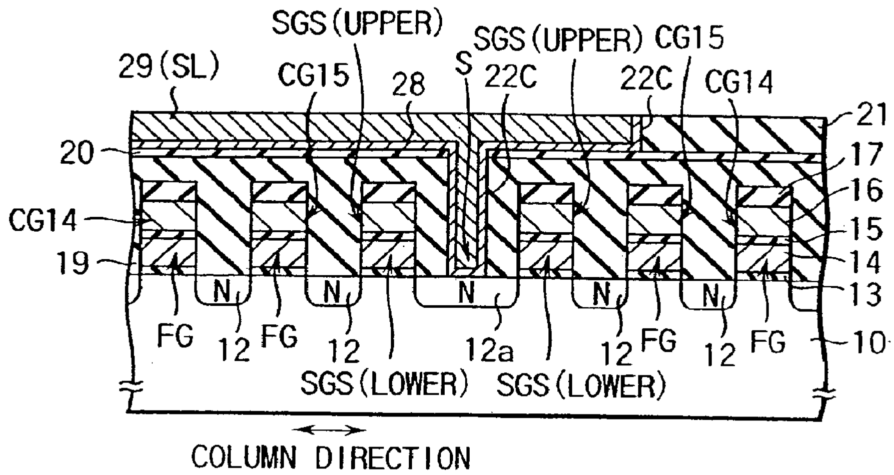
FIG. 28 is a sectional view taken along line XXVIII-XXVIII of FIG. 22.
Figure 29:
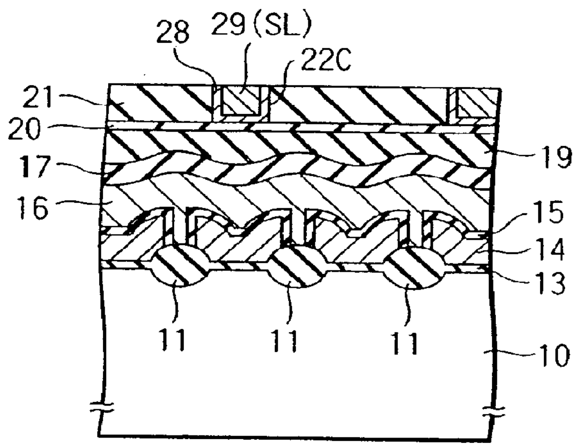
FIG. 29 is a sectional view taken along line XXIX-XXIX of FIG. 22.
Figure 30:
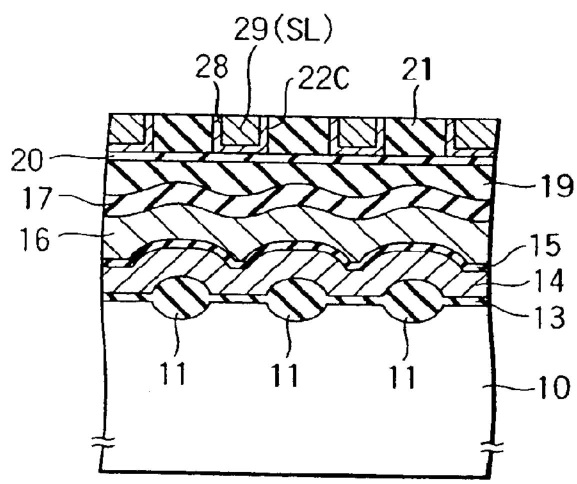
FIG. 30 is a sectional view taken along line XXX-XXX of FIG. 22.
Figure 31:
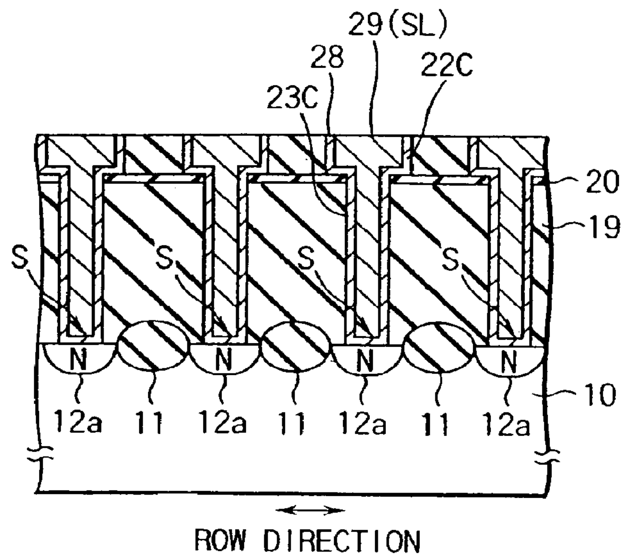
FIG. 31 is a sectional view taken along line XXXI-XXXI of FIG. 22.
Figure 32:
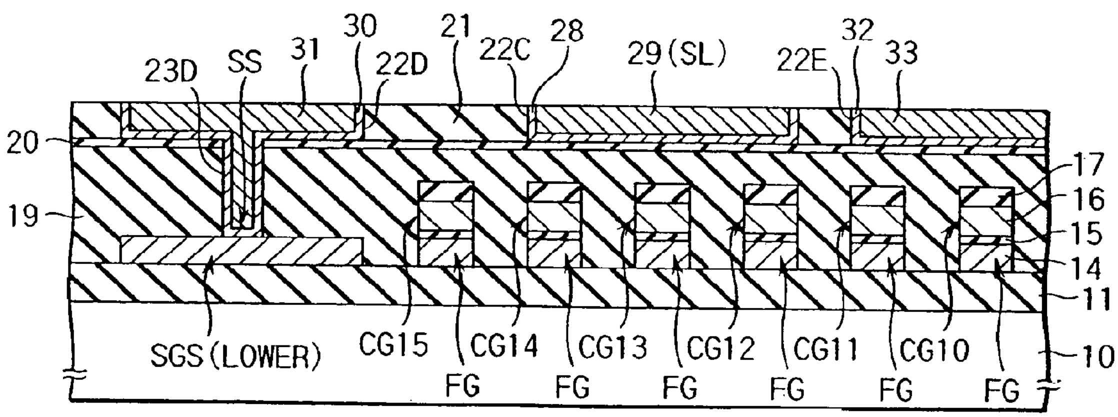
FIG. 32 is a sectional view taken along line XXXII-XXXII of FIG. 22.
Figure 33:
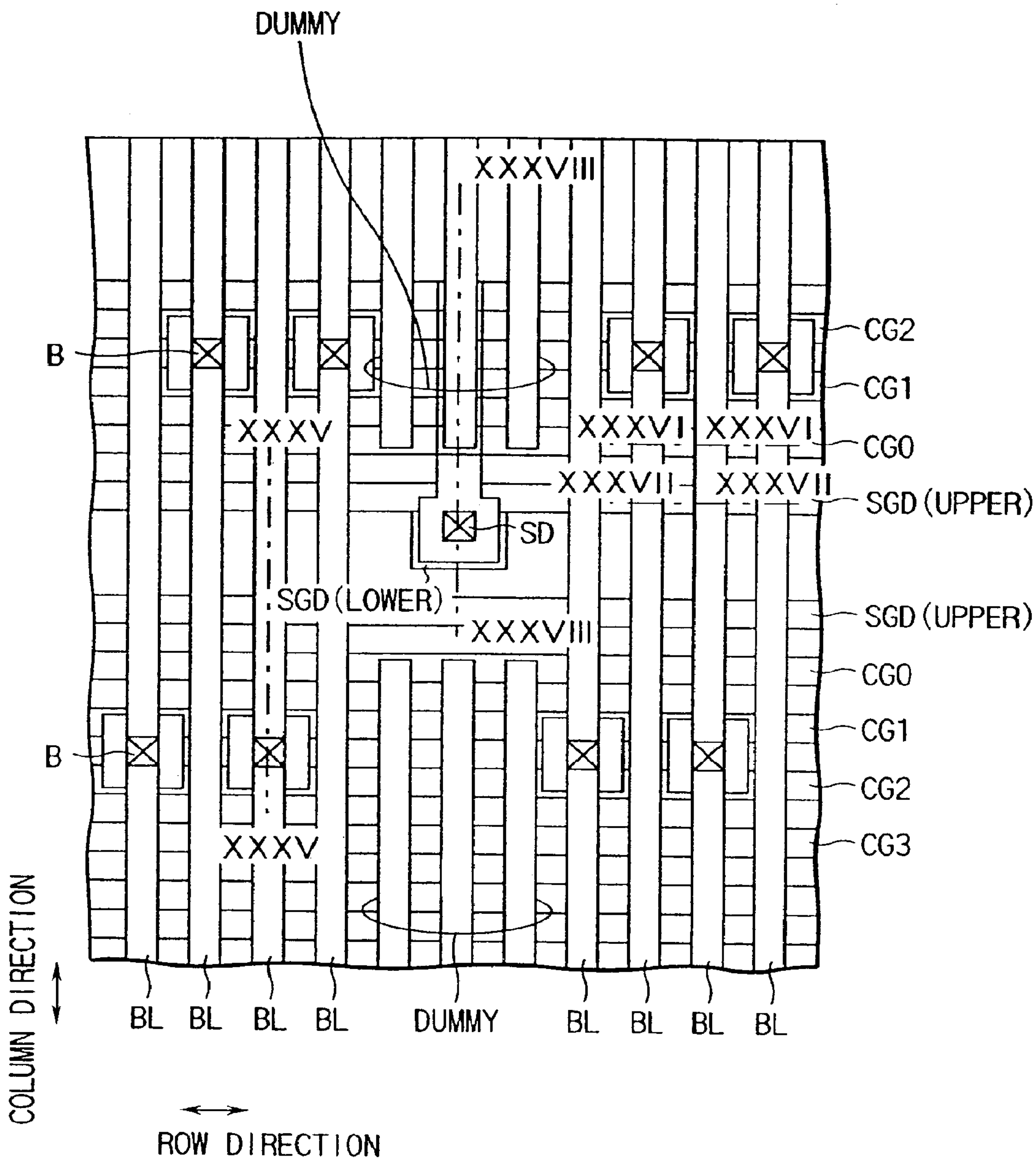
FIG. 33 is a plan view illustrating a step of an EEPROM manufacturing method.
Figure 34:
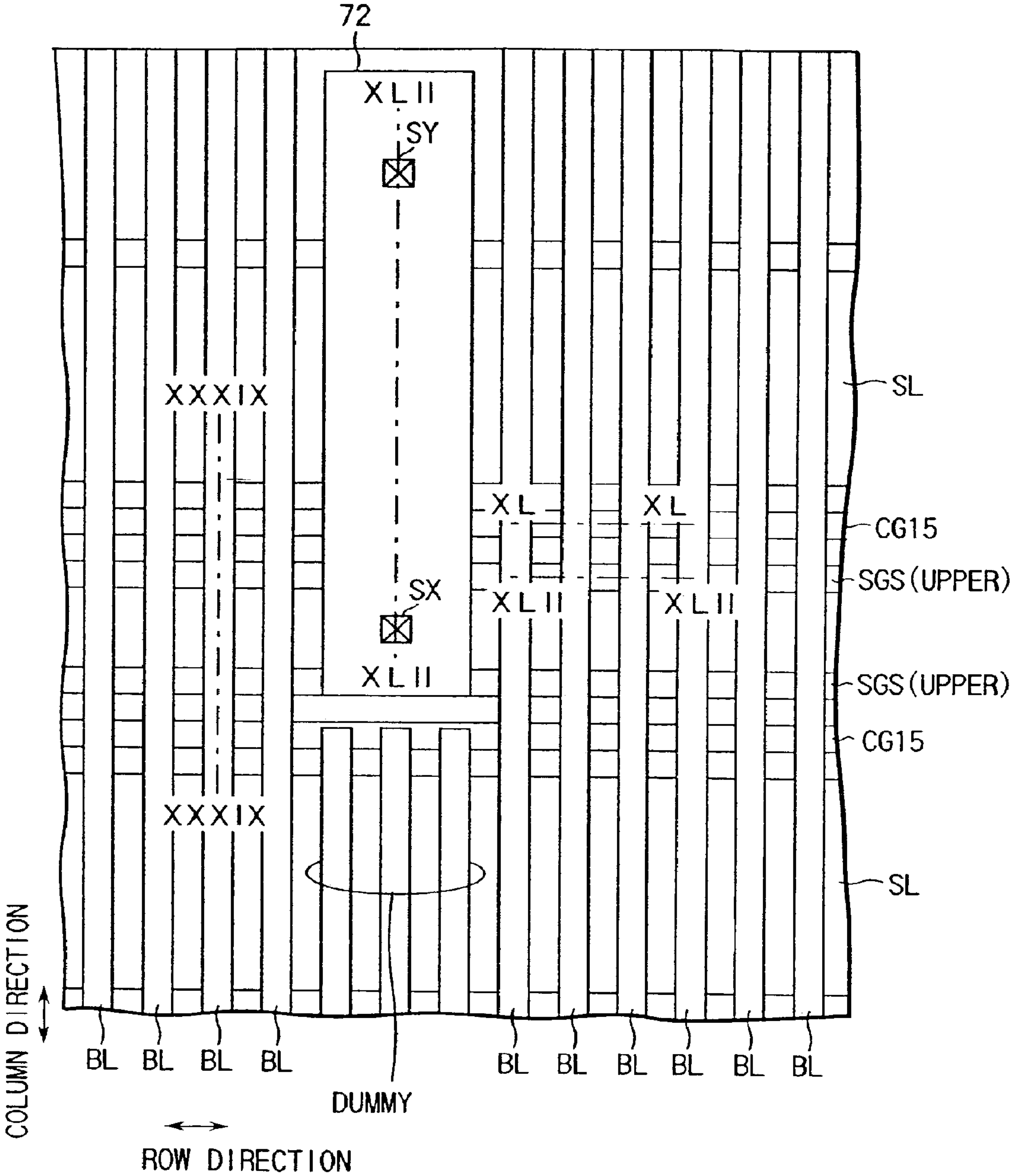
FIG. 34 is a plan view illustrating a step of an EEPROM manufacturing method.
Figure 35:
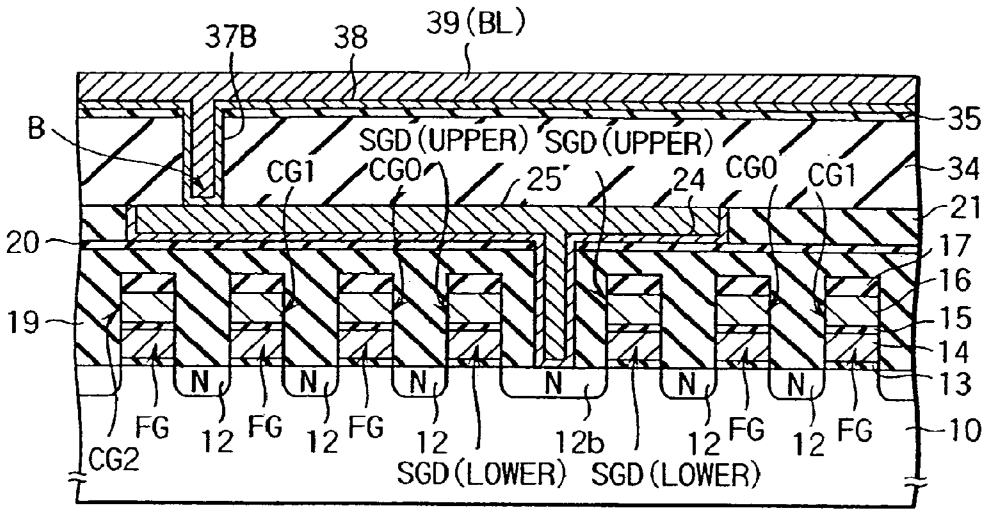
FIG. 35 is a sectional view taken along line XXXV-XXXV of FIG. 33.
Figure 36:
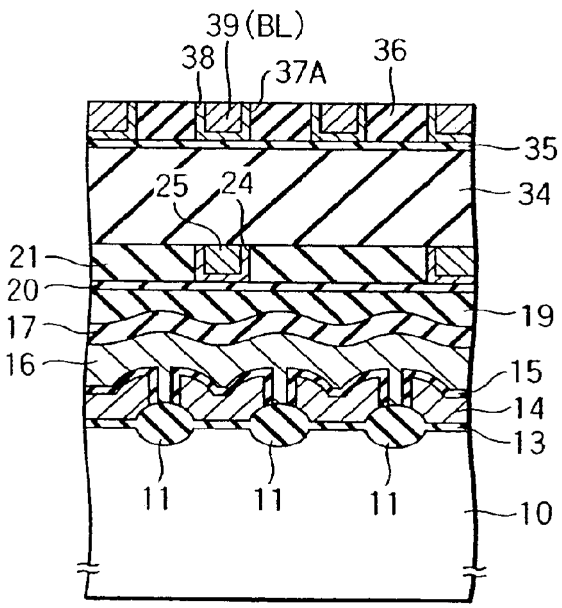
FIG. 36 is a sectional view taken along line XXXVI-XXXVI of FIG. 33.
Figure 37:
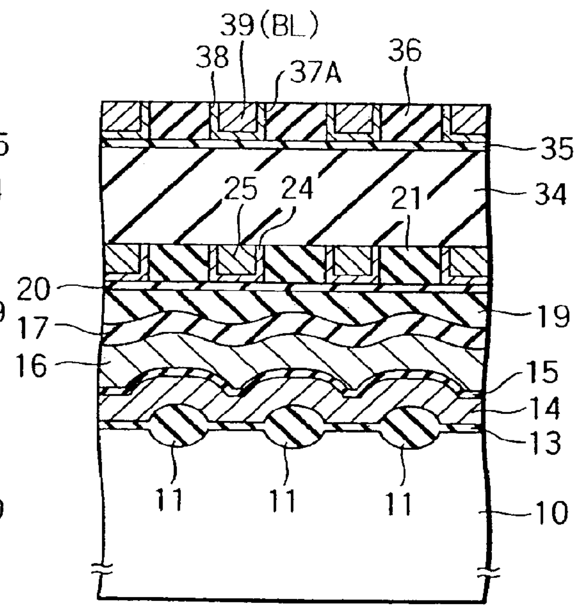
FIG. 37 is a sectional view taken along line XXXVII-XXXVII of FIG. 33.
Figure 38:
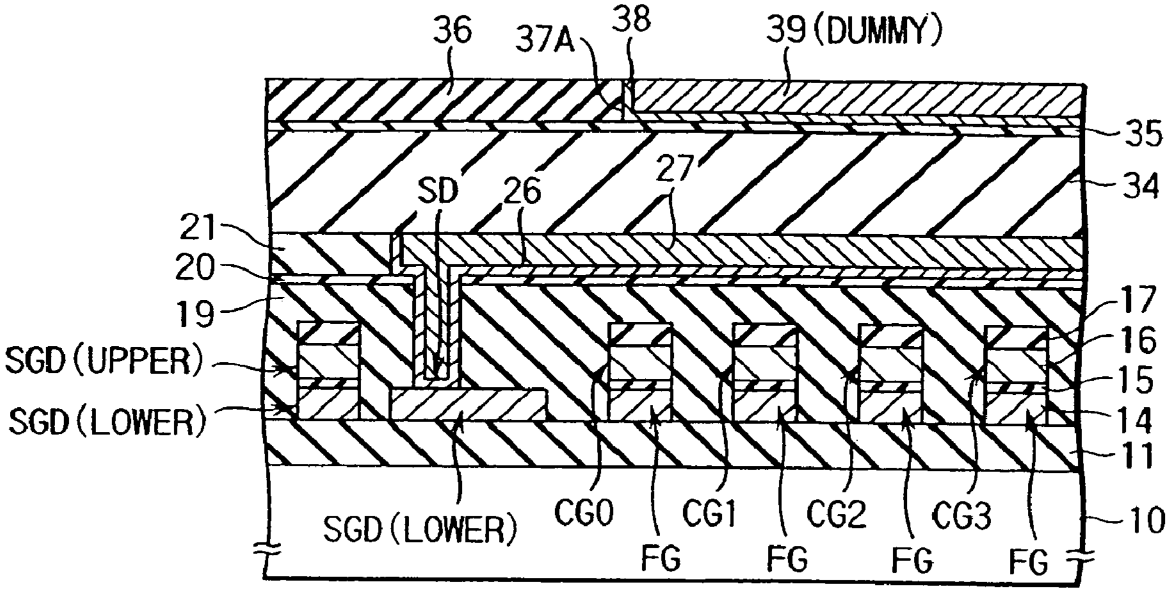
FIG. 38 is a sectional view taken along line XXXVIII-XXXVIII of FIG. 33.
Figure 39:
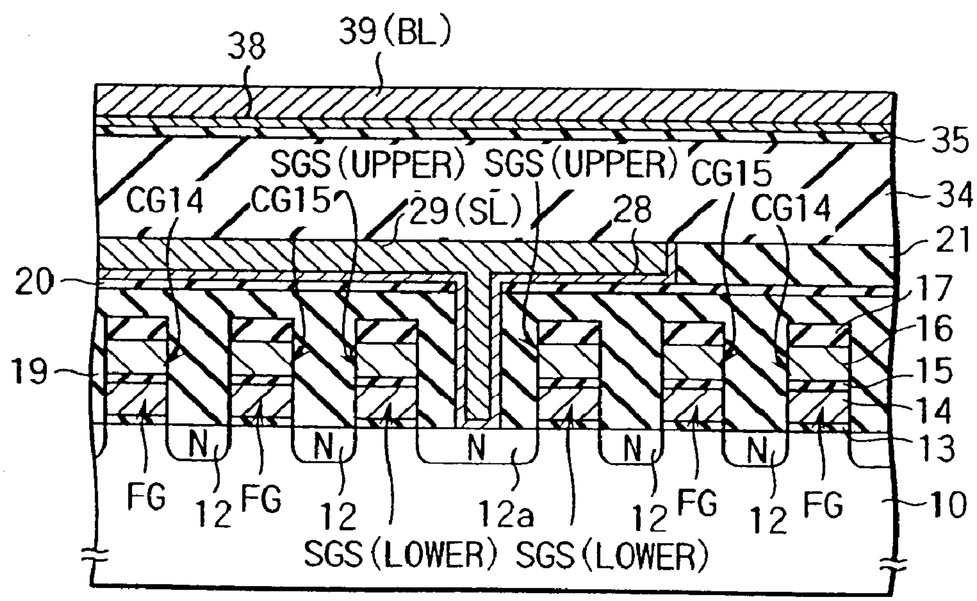
FIG. 39 is a sectional view taken along line XXXIX-XXXIX of FIG. 34.
Figure 40:
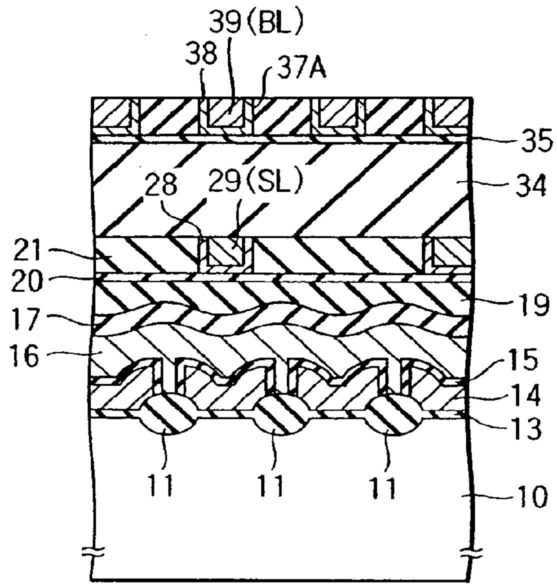
FIG. 40 is a sectional view taken along line XL-XL of FIG. 34.
Figure 41:
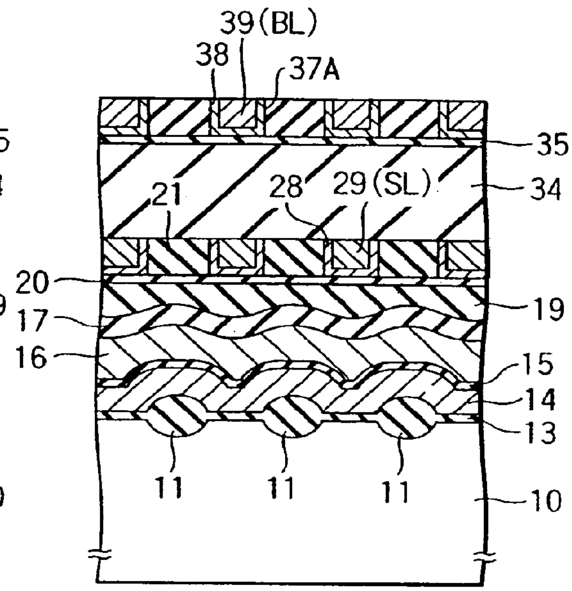
FIG. 41 is a sectional view taken along line XLI-XLI of FIG. 34.
Figure 42:
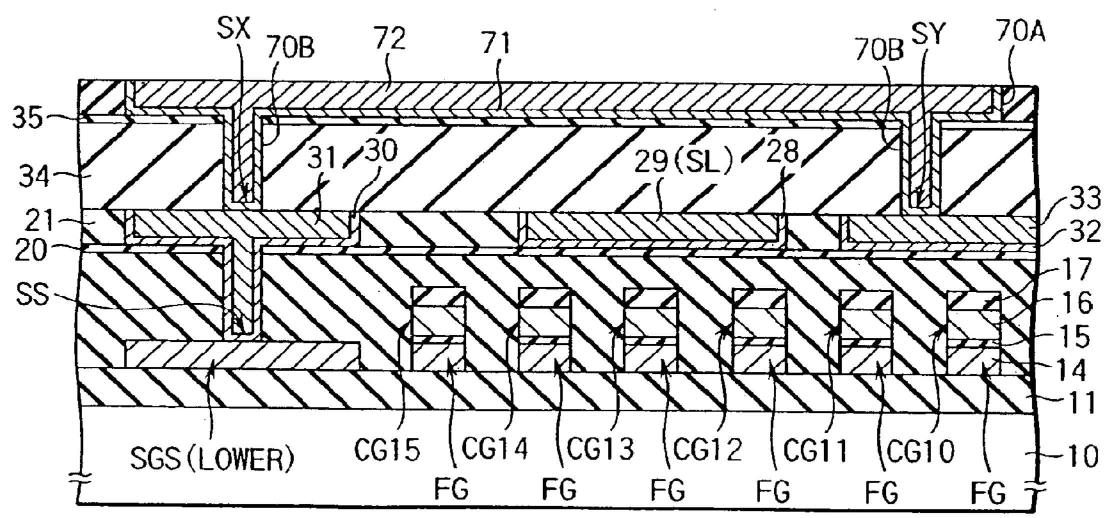
FIG. 42 is a sectional view taken along line XLII-XLII of FIG. 34.

For the drain-side select gate transistors, the contact areas (SD) for two first-level select gate electrodes SGD adjacent to each other in the column direction may be staggered as shown in FIG. 2 or may be opposed to each other as shown in FIG. 6.

Next, a method of manufacturing the memory cell array section of the NAND flash EEPROM which forms the basis of the invention will be described.

First, as shown in FIGS. 7 to 12, using LOCOS a field oxide layer (shown hatched) 11 is formed on the silicon substrate 10. A gate oxide layer 13 is then formed on the device area surrounded with the field oxide layer by means of thermal oxidation techniques. Using CVD, a layer 14 of polysilicon containing n-type impurities (e.g., phosphorous) at a concentration of about $2\times10^{20}$ $cm^{-3}$ is formed on the field oxide layer 11 and the gate oxide layer 13.

Slit-like openings OP extending in the column direction are formed in the polysilicon layer 14. The width of the openings in the row direction is set narrower than the width of the field oxide layers 11 in the row direction.

An insulating layer 15 is formed over the polysilicon layer 14. For example, this insulating layer is formed of silicon oxide of about 5 nm in thickness, silicon nitride of about 8 nm in thickness, and silicon oxide of about 5 nm in thickness (this type of layer is referred to as the ONO layer).

For example, using CVD, a layer 16 of polysilicon containing n-type impurities (e.g., phosphorous) at a concentration of about $3.6\times10^{20}$ $cm^{-3}$ is formed over the insulating layer 15. Subsequently, a silicon nitride layer (mask material) 17 is formed over the polysilicon layer 16 by means of CVD.

By means of photoetching processes (PEP), a resist patter 18A is formed over the silicon nitride layer 17. Using this resist pattern as a mask, the silicon nitride layer 17 and the polysilicon layer 16 are etched by means of RIE. As a result, the polysilicon layer 16 is left in the form of lines extending in the row direction, so that the control gate electrodes (word lines CG0 to CG15) and the second-level select gate electrodes SGS and SGD are formed.

At this point, those portions of the select gate electrodes SGS and SGD which correspond to the contact areas for the first-level select gate electrodes have been removed. After that, the resist pattern 18A is removed.

Next, as shown in FIGS. 13 through 20, a resist pattern 18B is formed on areas corresponding to the contact areas for the first-level select gate electrodes by means of PEP. Using this resist pattern as a mask, the insulating layer 15 and the silicon layer 14 are etched by means of RIE.

At this point, the silicon nitride layer 17 existent on the control gate electrodes CG0 to CG15 and the second-level select gate electrodes SGS and SGD also function as a mask. Thus, the floating gate electrodes made of the polysilicon layer 14 are formed immediately below the control gate electrodes CG0 to CG15, the first-level select gate electrodes SGS and SGD formed of the polysilicon layer 14 are formed immediately below the second-level select gate electrodes SGS and SGD, and the contact areas for the first-level select gate electrodes SGS and SGD made of the polysilicon layer 14 are formed immediately below the resist pattern 18B.

After that, the resist pattern 18B is removed. Although the silicon nitride layer 17 is not removed in this example, it may be removed.

Next, as shown in FIGS. 21 to 32, using the control gate electrodes CG0 to CG15 and the second-level select gate electrodes SGD and SGS as a mask, n-type impurities (e.g., phosphorous or arsenic) are ion implanted into the silicon substrate 10 using a self-aligned process, thereby forming the n-type diffused layers 12, 12*a* and 12*b*. The diffused layer 12*a* serves as the source of the NAND cell unit, while the diffused layer 12*b* serves as the drain.

A BPSG layer 19 of, say, about 1.45 μm in thickness is formed over the entire surface of the silicon substrate 10 so as to cover fully the control gate electrodes CG0 to CG15 and the second-level select gate electrodes SGD and SGS. After that, using CMP the BPSG layer 19 is polished by about 0.4 μm to planarize its surface.

A silicon nitride layer 20, serving as an etching stopper, is formed over the BPSG layer 1 by means of CVD. Subsequently, a TEOS layer 21 is formed over the silicon nitride layer 20 by means of CVD.

Using PEP and RIE interconnection trenches 22A to 22E are formed in the TEOS layer 21. At the time of RIE, the silicon nitride layer 20 functions as an etching stopper. Using PEP and RIE are formed in the silicon nitride layer 20 and the BPSG layer 19 contact holes 23A and 23C, contact holes 23A and 23C to reach the diffused layers (drains) 12*b* and the diffused layers (sources) 12*a* and contact holes 23B and 23D to reach the contact areas for the first-level select gate electrodes SGD and SGS.

After that, a layer of barrier metal is formed as indicated at 24, 26, 28, 30, and 32 on the TEOS layer 21 and the inner surfaces of the interconnection trenches 22A to 22E and the contact holes 23A to 23D, respectively. The barrier metal layer consists of titanium nitride and titanium. A layer of tungsten is formed as indicated at 25, 27, 29, 31, and 33 on the barrier metal layer (24, 26, 28, 30 and 31) to fill up the interconnection trenches 22A to 22E and the contact holes 23A to 23D and then polished by means of CMP so that the tungsten layer remains only within the interconnection trenches 22A to 22E and the contact holes 23A to 23D.

Next, as shown in FIGS. 33 through 42, a TEOS layer 34 is formed over the entire surface by means of CVD. Subsequently, a silicon nitride layer 35, serving as an etching stopper, is formed over the TEOS layer 34 by means of CVD. A TEOS layer 36 is then formed over the silicon nitride layer 35 by CVD.

Using PEP and RIE interconnection trenches 37A and 70A are formed on the TEOS layer 36. At the time of RIE, the silicon nitride layer 35 functions as an etching stopper. Using PEP and RIE contact holes 37B and 70B are formed in the silicon nitride layer 35 and the TEOS layer 34.

After that, a layer of barrier metal is formed as indicated at 38 and 71 on the TEOS layer 36 and on the inside surfaces of the interconnection trenches 37A and 70A and the contact holes 37B and 70B. For example, the barrier metal consists of titanium nitride and titanium. A layer of metal, such as aluminum, is formed as indicated at 39 and 72 on the metal barrier layer (38 and 71) to fill up the interconnection trenches 37A and 70A and the contact holes 37B and 70B.

The metal layer (39 and 72) is polished by means of CMP so that it is left only in the interconnection trenches 37A and 70A and the contact holes 37B and 70B. As a result, the bit lines BL and other interconnections are formed. The bit lines and other interconnections are then covered with a passivation layer of silicon nitride.

As described previously, the source- and drain-side select gate transistors in the NAND cell units have the first-level gate electrodes SGS and SGD and the second-level gate electrodes SGS and SGD, respectively. Portions of each of the second-level gate electrodes are removed to form the contact areas for a corresponding one of the first-level gate electrodes.

That is, it is the first-level select gate electrodes that actually function as the select gate electrodes of the select gate transistors. In view of the resistance of the first-level select gate electrodes, the contact areas are set up at a plurality of places (one place for every several hundreds of bit lines).

The size of the contact area is determined taking into account misalignment of the contact hole formed by a photolithographic process with the contact area. If the contact hole misalignment margin is included in the contact hole size, then the length of the contact area in the column direction usually become larger than the gate length g of the first-level select gate electrodes.

Figure 43:
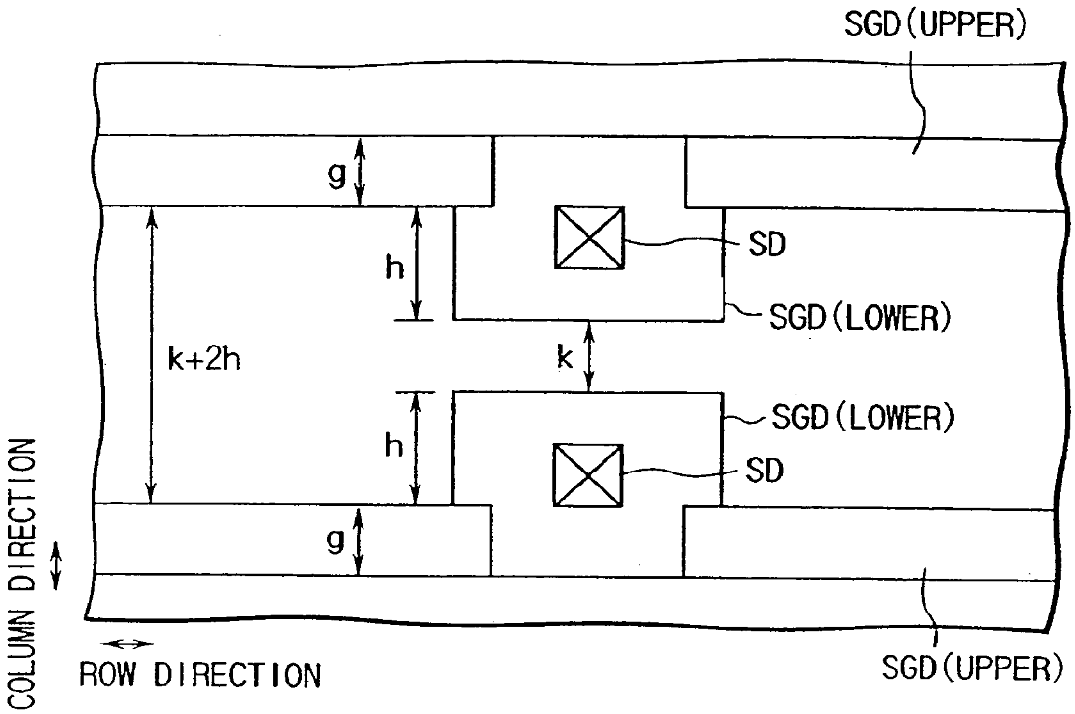
FIG. 43 illustrates the spacing between two adjacent select gate lines.
Figure 44:
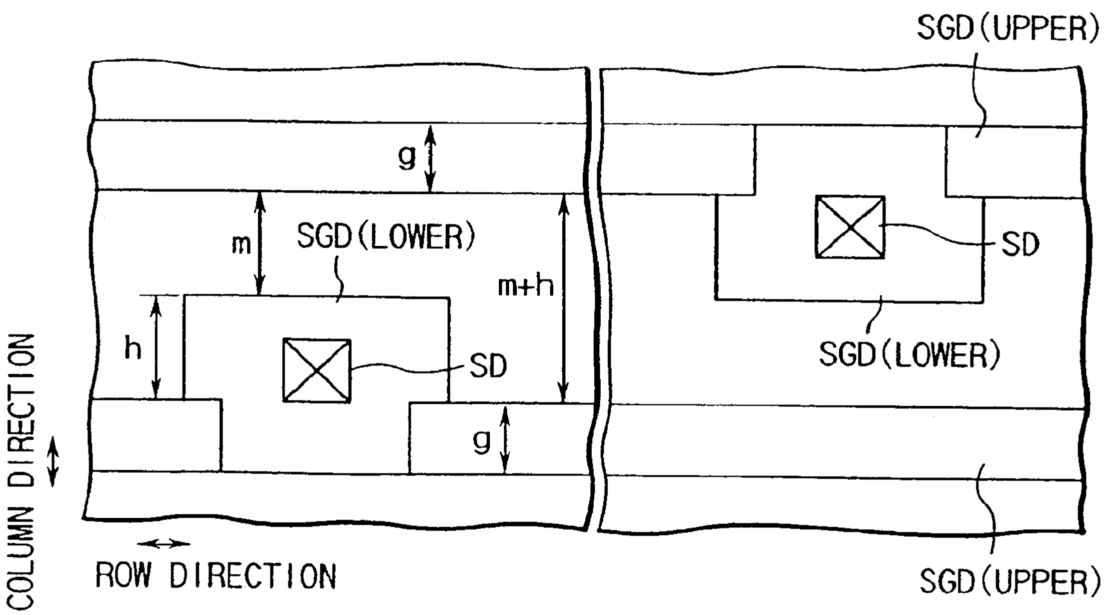
FIG. 44 illustrates the spacing between two adjacent select gate lines.

FIGS. 43 and 44 show two examples of the location of the contact areas with respect to the first-level select gate electrode on the drain side. It is supposed herein that the minimum width possible with photolithographic processes is n (for example, the spacing between control gates is set to n).

In the case of FIG. 43, assuming that the length of that portion of the contact area which protrudes from the gate area of the first-level select gate electrode SGD (the linear area other than the contact area) is h, and the spacing between the contact areas of two first-level select gate electrodes SGD adjacent to each other in the column direction is k, then k=n and the spacing between the gate areas of the two first-level select gate electrodes SGD adjacent to each other in the column direction is k+2h.

In the case of FIG. 44, assuming that the length of that portion of the contact area which protrudes from the gate area of the first-level select gate electrode SGD is h, and the spacing between the contact areas of two first-level select gate electrodes SGD adjacent to each other in the column direction is m, then h<m and the spacing between the gate areas of the two first-level select gate electrodes SGD adjacent to each other in the column direction is m+h.

The reason why m is larger than h is that misalignment of the second-level select gate electrode and misalignment of the contact area of the first-level select gate electrode and the adjacent second-level select gate electrode must be allowed for.

In either case, the spacing between the select gate electrodes (portions other than the contact areas) adjacent to each other in the column direction becomes larger than the minimum width n possible with photolithographic processes. This causes difficulty in increasing the storage capacity of the memory cell array section (with the area fixed) or reducing the area of the memory cell array section (with the storage capacity fixed).

Figure 45:
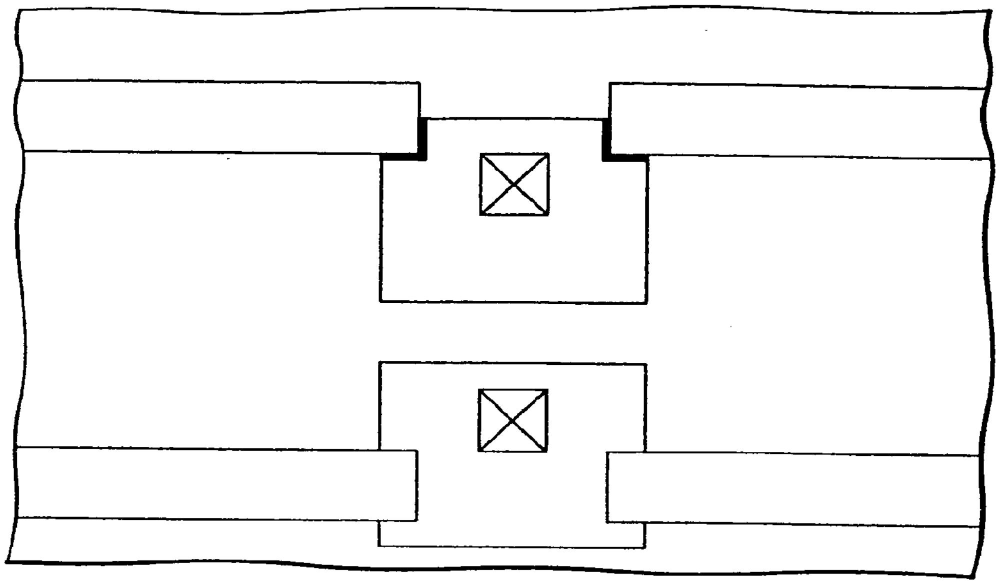
FIG. 45 illustrates misalignment of a contact area.
Figure 46:
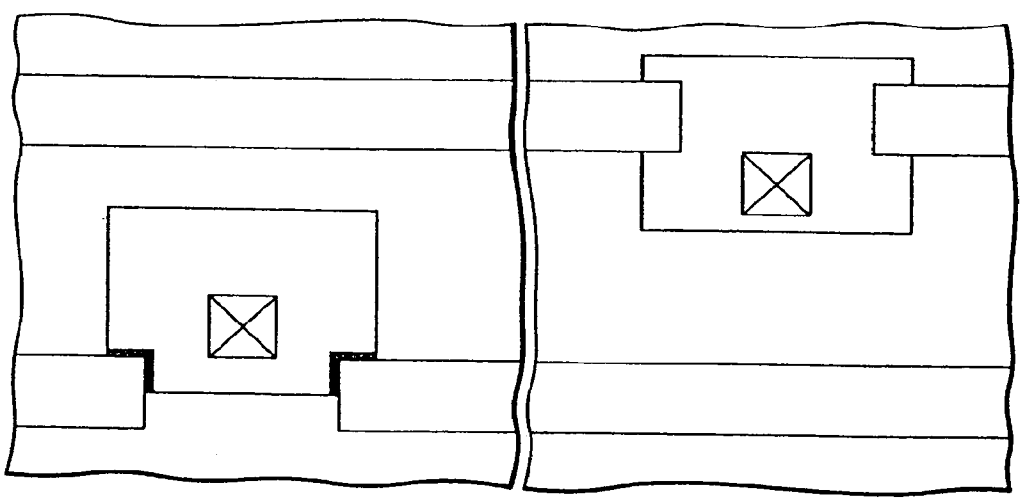
FIG. 46 illustrates misalignment of a contact area.

If, as shown in FIGS. 45 and 46, resist misalignment occurs during the lithographic process for patterning the contact area of the first-level select gate electrode SGD, then the length of contact (shown in bold lines) of the contact area and the gate area will become reduced, resulting in an increase in the resistance of the first-level select gate electrode SGD.

However, in the EEPROM of FIG. 43, the spacing between the two adjacent select gate lines (select gate electrodes) can be made smaller than in the EEPROM of FIG. 44. In the examples of FIGS. 43 and 44, the contact area is formed only in the first-level select gate electrode SGD and that portion of the second-level select gate electrode SGD which is located above the contact area is fully removed. This makes it easy to form the contact hole SD for the contact area.

In a semiconductor memory, disclosed in Japanese Patent Application No. 6-195787 which was published prior to this application, each of first- and second-level select gate electrodes is formed with a contact areas and those portions of the second-level select gate electrode which are located above the contact area of the first-level select gate electrode are not removed fully. As a result, it is difficult to form the contact hole SD for the contact areas of the first-level select gate electrode.

Figure 47:
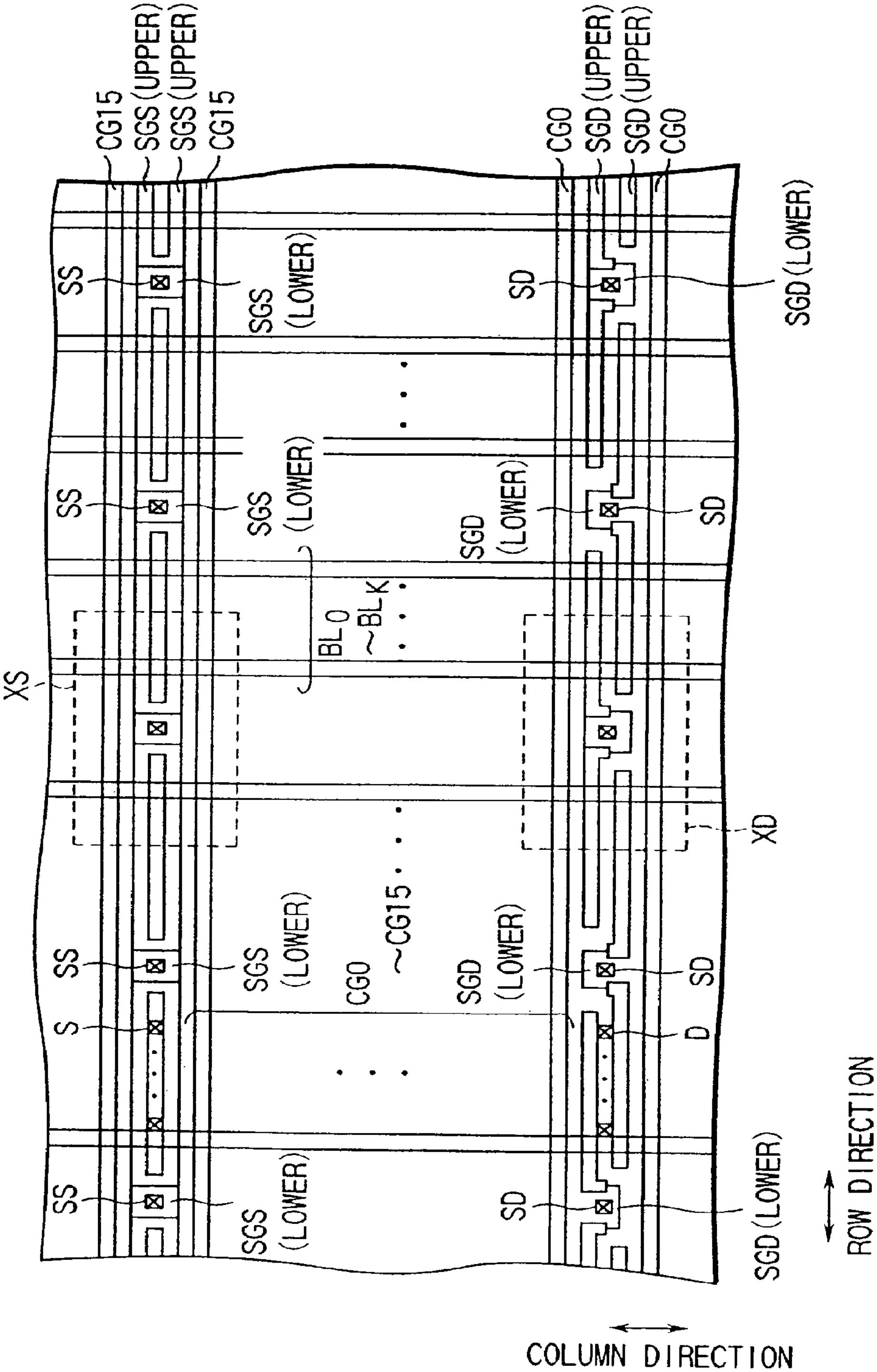
FIG. 47 shows a first example of a plan pattern of a NAND type of EEPROM of the present invention.
Figure 48:
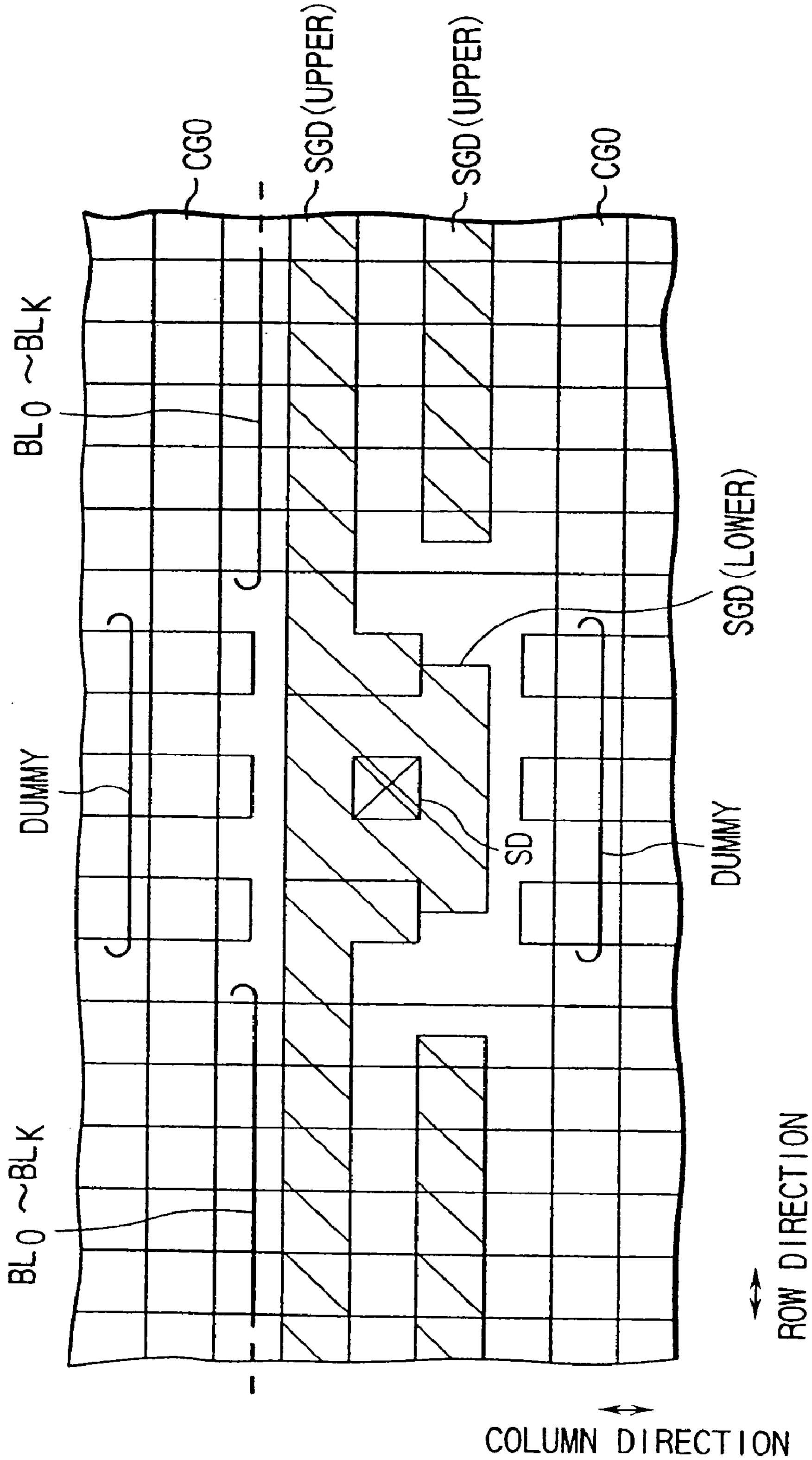
FIG. 48 is an enlarged view of the area XD of FIG. 47.
Figure 49:
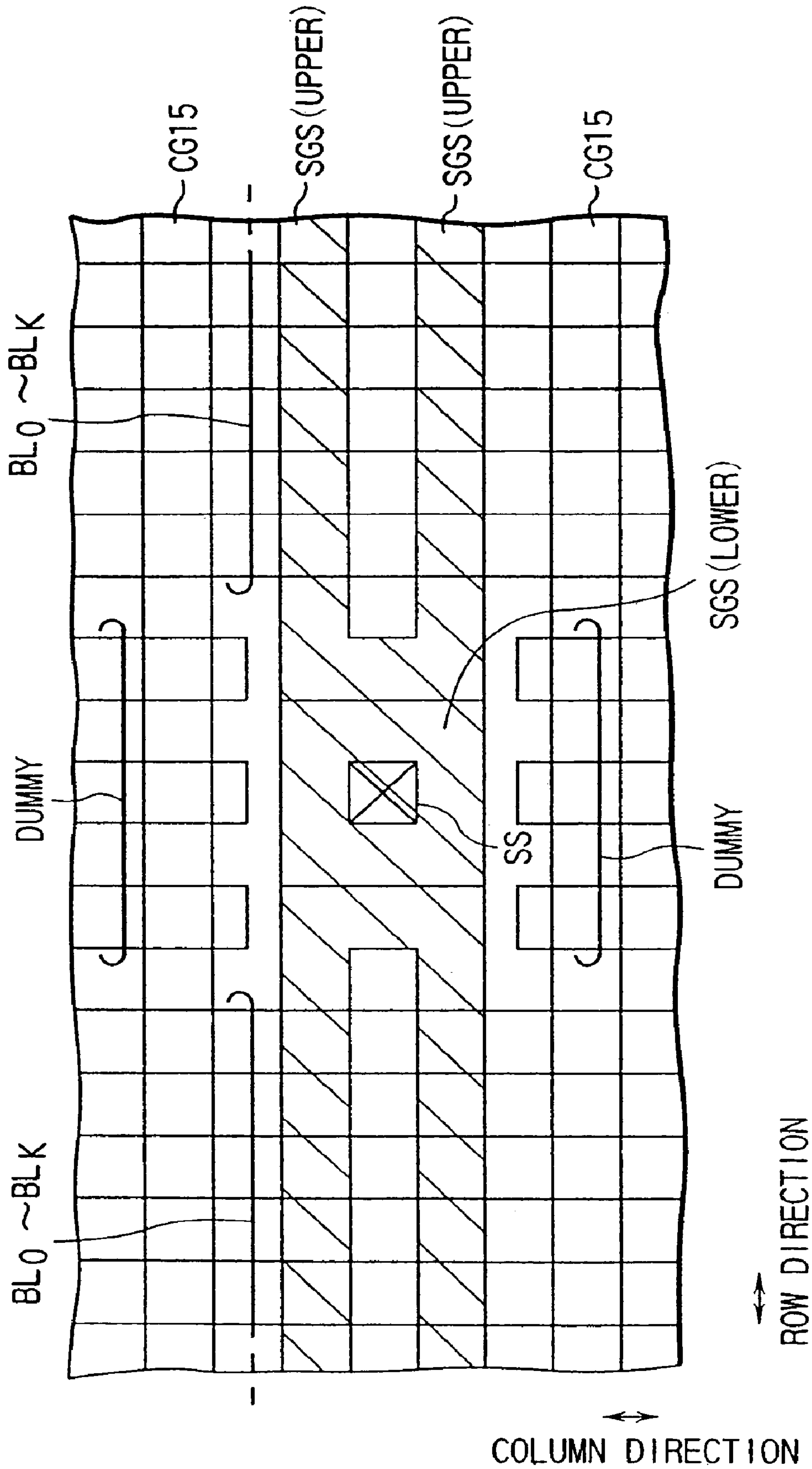
FIG. 49 is an enlarged view of the area XS of FIG. 47.
Figure 50:
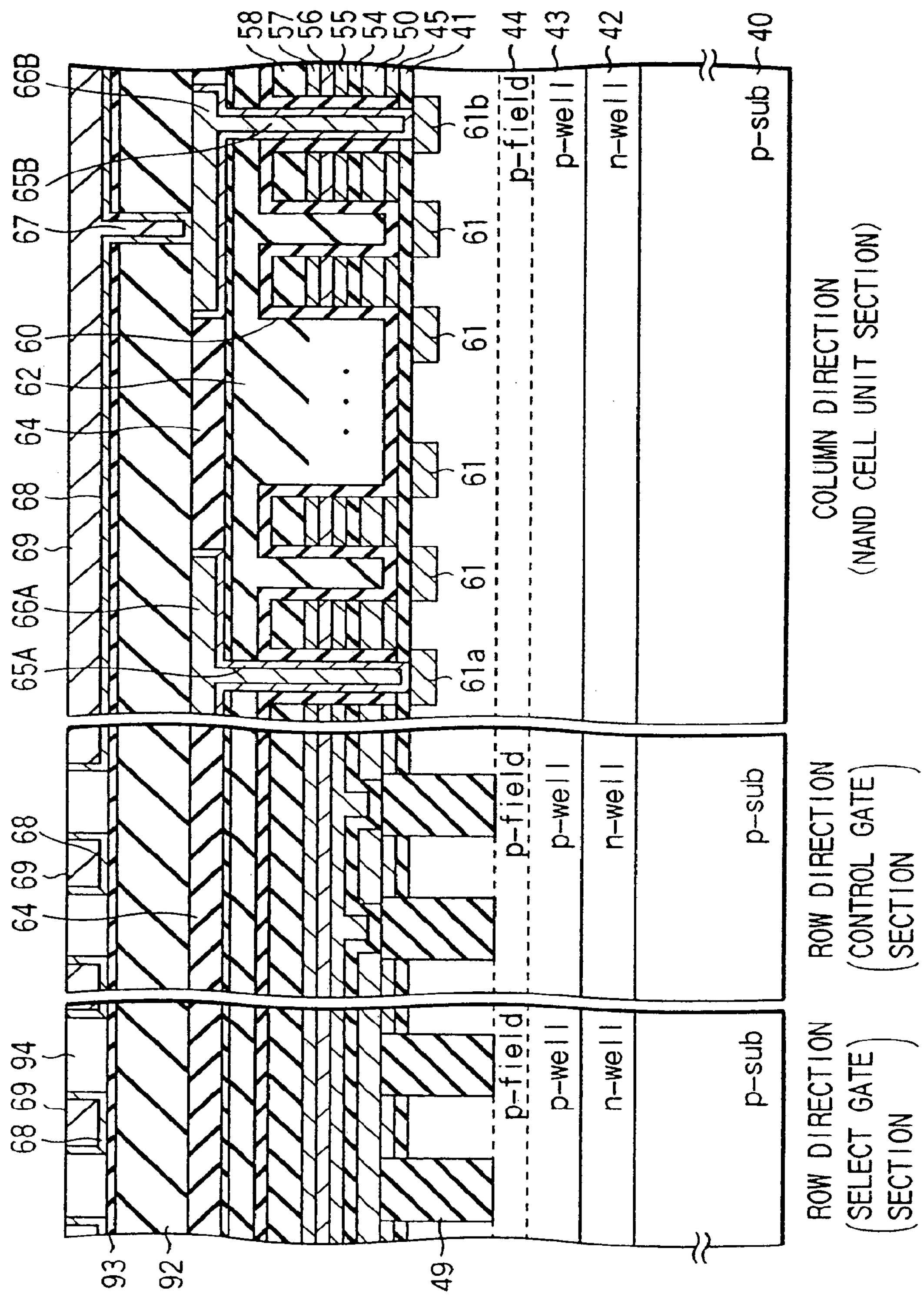
FIG. 50 is a sectional view of the NAND type of EEPROM of FIG. 47.

FIG. 47 shows a first example of a pattern of a memory cell array section of a NAND flash EEPROM of the present invention. In FIG. 48, an area XD of FIG. 47 is shown enlarged. In FIG. 49, an area XS of FIG. 47 is shown enlarged. In FIG. 50, the memory cell array section of the NAND flash EEPROM is shown in section.

Figure 51:
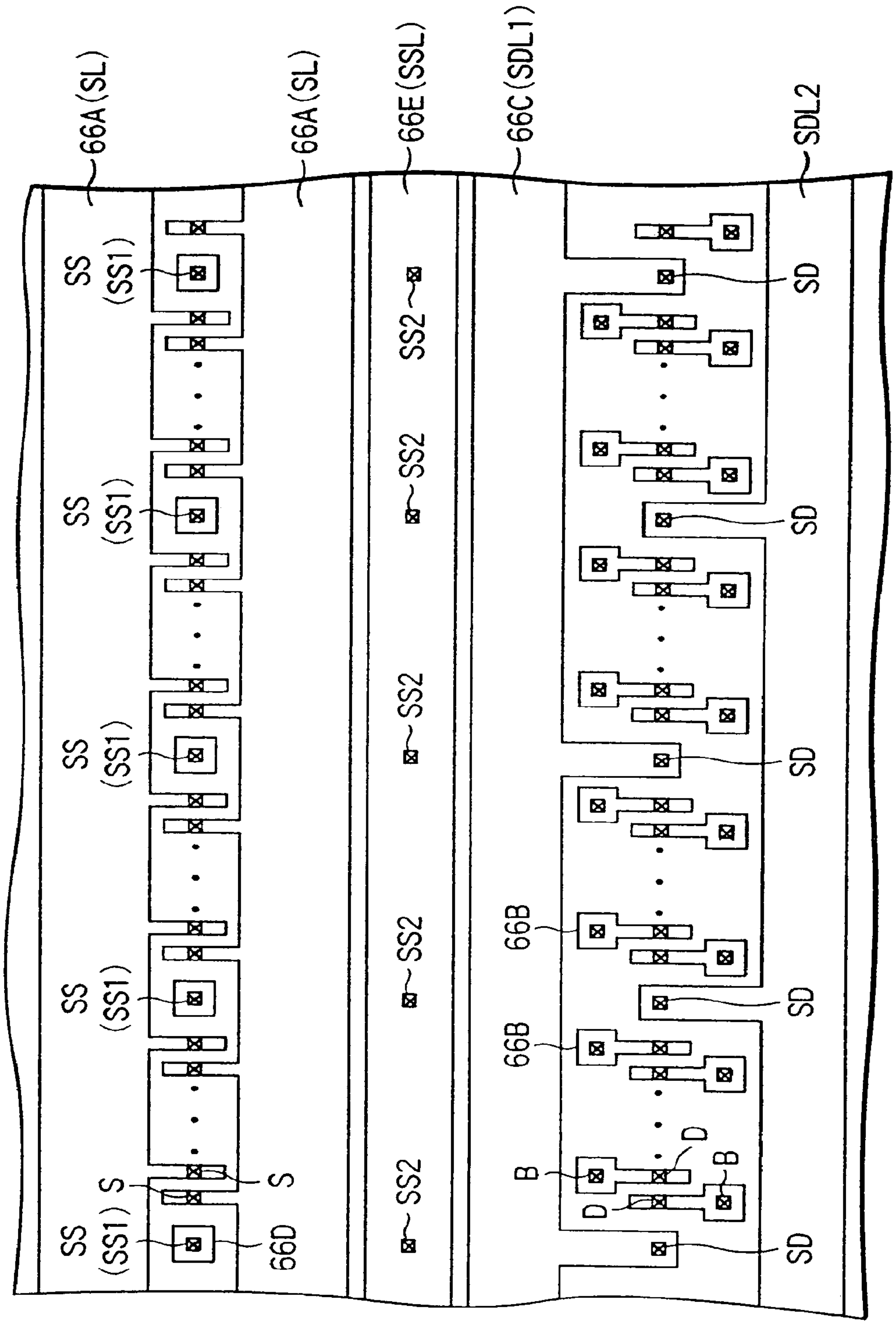
FIG. 51 shows a plan pattern of a first interconnection layer of the EEPROM of FIG. 47.
Figure 52:
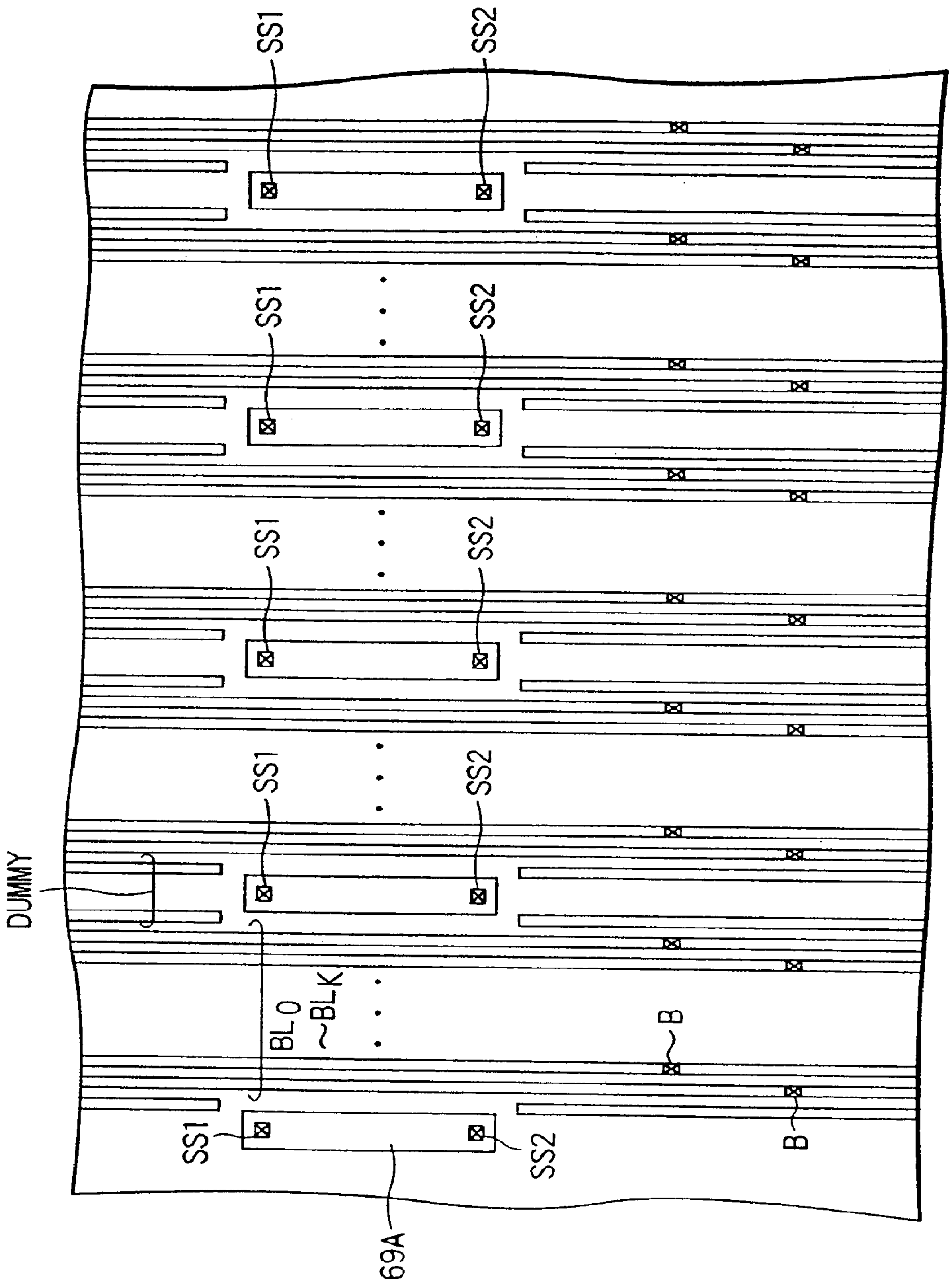
FIG. 52 shows a plan pattern of a second interconnection layer of the EEPROM of FIG. 47.

Further, FIG. 51 shows a pattern layout of a first layer of interconnections formed above NAND cell units, and FIG.

52 shows a pattern layout of a second layer of interconnections formed above the first interconnection layer of FIG. 51.

A device isolation layer 49 of STI (shallow-trench isolation) structure is formed in a silicon substrate 10. A NAND cell unit composed of, say, 16 memory cells and two select gate transistors is located within a device region surrounded with the device isolation layer 49.

The NAND cell unit comprises floating gate electrodes FG, control gate electrodes (word lines) CG0 to CG15, and N-type diffused layers 61. Each floating gate electrode consists of two layers 45 and 50 of polysilicon. Each control gate electrode CG consists of layers 55 and 56 of polysilicon and a layer 57 of tungsten silicide.

The source-side select gate transistor has first- and second-level gate electrodes SGS and N-type diffused layers 61 and 61*a*. The first-level select gate electrode SGS is formed of layers 45 and 50 of polysilicon. The second-level select gate electrode is made of layers 55 and 56 of polysilicon and a layer 57 of tungsten silicide.

The drain-side select gate transistor also has first- and second-level gate electrodes SGS and N-type diffused layers 61 and 61*b*. The first-level select gate electrode SGS is formed of layers 45 and 50 of polysilicon. The second-level select gate electrode is made of layers 55 and 56 of polysilicon and a layer 57 of tungsten silicide.

The control gate electrodes CG0 to CG15, the source-side first- and second-level select gate electrodes SGS, and the drain-side first- and second-level select gate electrodes SGD extend in the row direction, while bit lines BL0 to BLk extend in the column direction.

The bit lines BL0 to BLk each consist of a stack of a barrier metal layer 68 of titanium and titanium nitride and a layer 69 of metal such as aluminum. Each bit line is connected to the diffused layer (drain) 61*b* of the NAND cell unit through an interconnection 66 (66B) of tungsten which is formed immediately below it. A layer 65 (65B) of barrier metal consisting of, for example, titanium and titanium nitride is formed between the tungsten layer 66 and the diffused layer 61*b*.

Dummy bit lines DUMMY are provided to make the capacitance of the dummy line BL0 to BLk uniform, but they are not actually used in operation.

The source line SL is connected to the diffused layer (source) 61*a* of each NAND cell unit. The source line is made of a composite of a layer 65 (65B) of barrier metal consisting of titanium nitride and titanium and a layer 66 (66A) of tungsten.

The source- and drain-side select gate transistors are provided in order to select a memory cell to be written into or erased. Thus, unlike the memory cells, each of these transistors is designed to perform a switching operation at a fixed threshold.

In each of the select gate transistors, therefore, a control signal is directly applied to the first-level (lower) select gate electrodes SGS and SGD. Specifically, portions of the second-level (upper) select gate electrodes SGS and SGD are removed to form contact areas for the first-level select gate electrodes. Contact holes SS and SD are formed in these contact areas.

The hatched areas in FIGS. 48 and 49 indicate portions where the first-level select gate electrodes SGS and SGD are existent.

In view of the resistance of the select gate electrodes, the contact areas (i.e., contact holes SS and SD) are each formed for every several hundreds of bit lines. Further, the contact areas (SS) for the first-level select gate electrodes SGS of the source-side select gate transistors are each common to two first-level select gate electrodes SGS which are adjacent to each other in the column direction. On the other hand, the contact areas (SD) for the first-level select gate electrodes SGS of the drain-side select gate transistors are each not common to two first-level select gate electrodes SGS which are adjacent to each other in the column direction.

For the drain-side select gate transistors, the contact areas (SD) for two first-level (lower) select gate electrodes SGD adjacent to each other in the column direction are staggered so that they are not opposed to each other (that is, so that the contact areas for the lower select gate electrodes SGD are not brought into contact).

Here, an important point is that, of two pairs of upper and lower select gate electrodes SGD for the drain-side select gate transistors which are adjacent to each other in the column direction, the upper and lower select gate electrodes in one pair have their portions removed which are opposed to the contact area of the lower gate electrode in the other pair. Thus, even with the spacing between the lower select gate electrodes reduced, the contact area of the lower select gate electrode in the other pair will not contact the upper and lower select gate electrodes in the one pair.

In other words, in this example, the upper and lower select gate electrodes SGD in the one pair have their portions disconnected which are opposed to the contact areas for the lower select gate electrode in the other pair.

These upper and lower select gate electrodes thus disconnected are electrically connected by an upper interconnection SDL1 or SDL2. The interconnections SDL1 and SDL2 are formed at the same level as the source line SL and are made of a barrier metal 65 (65C) of titanium nitride and titanium and a layer 66 (66C) of tungsten.

The contact areas for two lower select gate electrodes SGS for the source-side select gate transistors adjacent to each other in the column direction are connected in common to an interconnection SSL by interconnections 66D and 95 (contact holes SS1 and SS2).

The interconnections 66D and SSL are formed at the same level as the source line SL and are made of a barrier metal 65 (65D, 65E) of titanium nitride and titanium and a layer 66 (66D, 66E) of tungsten. The interconnection 95 is formed at the same level as the bit lines BL0 to BLk and is made of a barrier metal 68 of titanium nitride and titanium and a layer 69 of metal such as aluminum.

Figure 53:
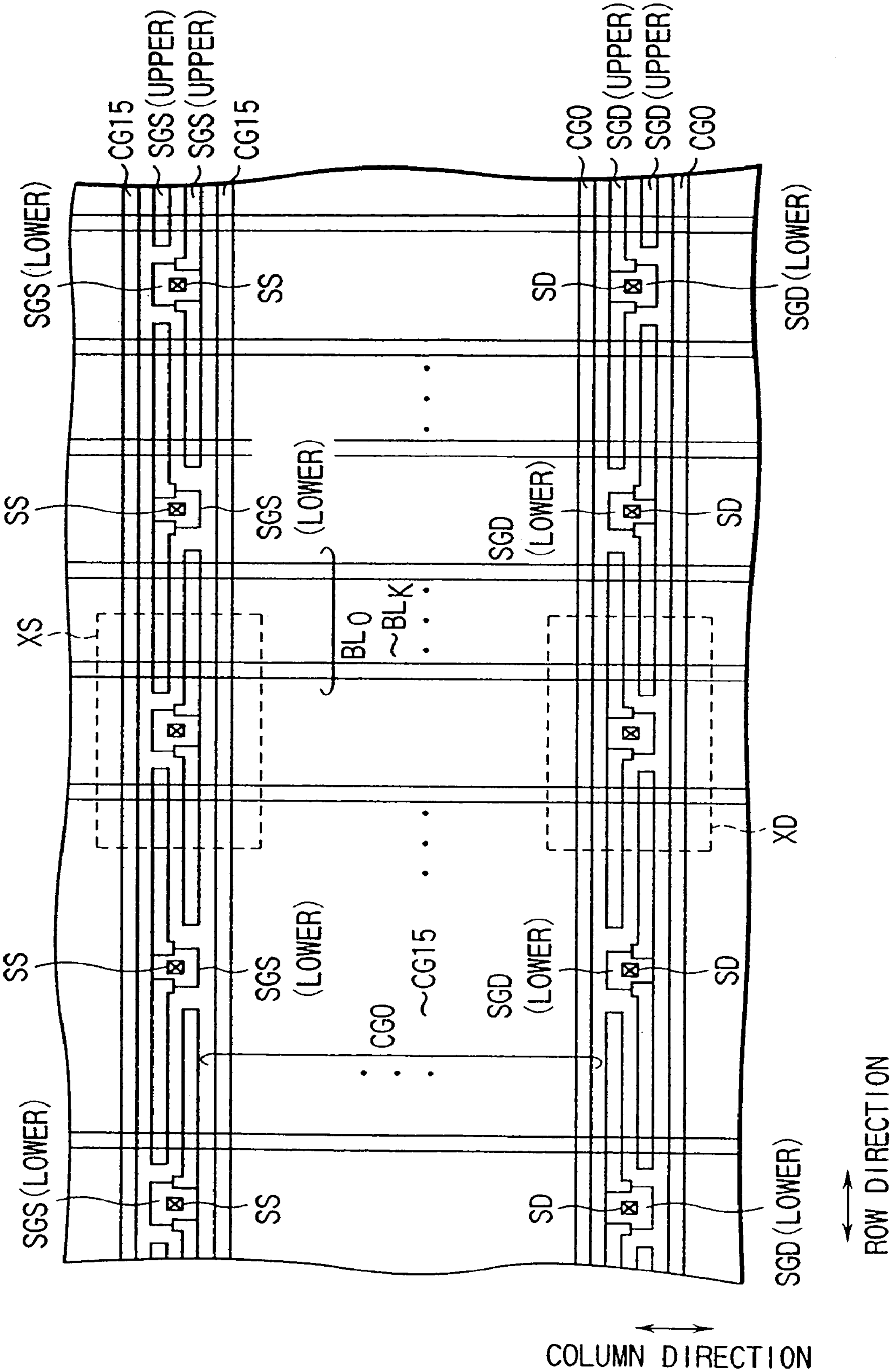
FIG. 53 shows a second example of a plan pattern of a NAND type of EEPROM of the present invention.
Figure 54:
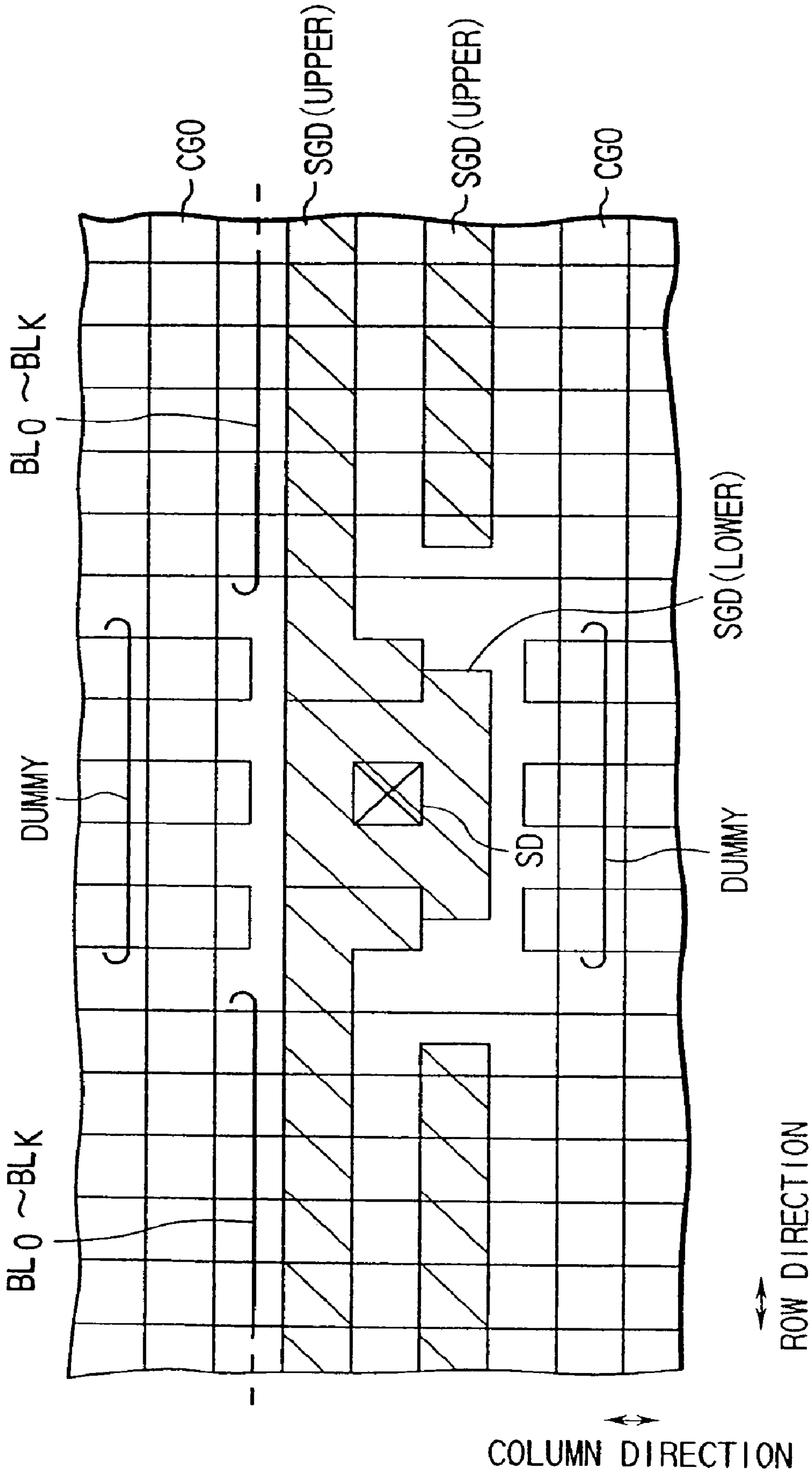
FIG. 54 is an enlarged view of the area XD of FIG. 53.
Figure 55:
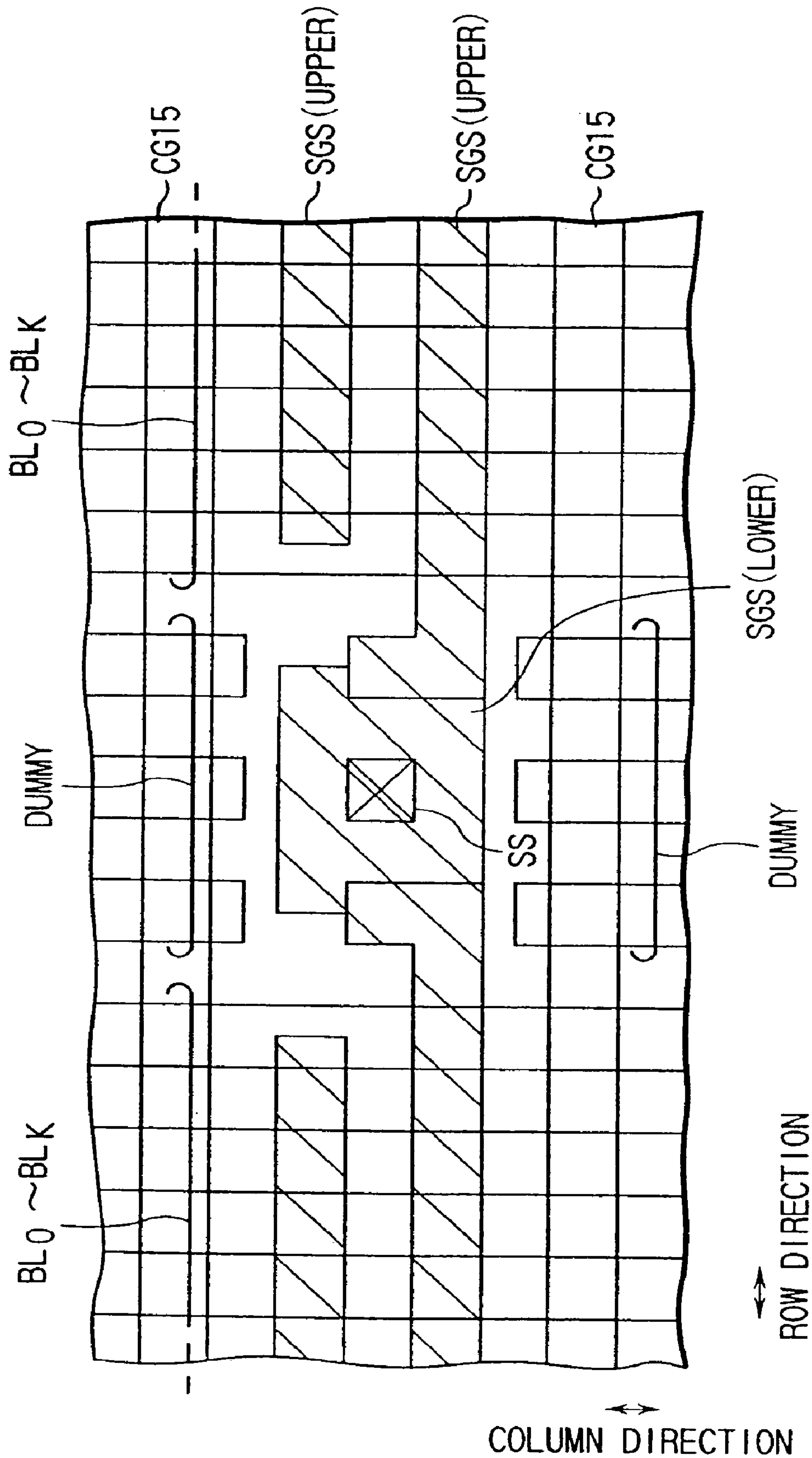
FIG. 55 is an enlarged view of the area XS of FIG. 53.

FIG. 53 shows a second example of a pattern of a memory cell array section of a NAND flash EEPROM of the present invention. In FIG. 54, an area XD of FIG. 53 is shown enlarged. In FIG. 55, an area XS of FIG. 53 is shown enlarged.

Figure 56:
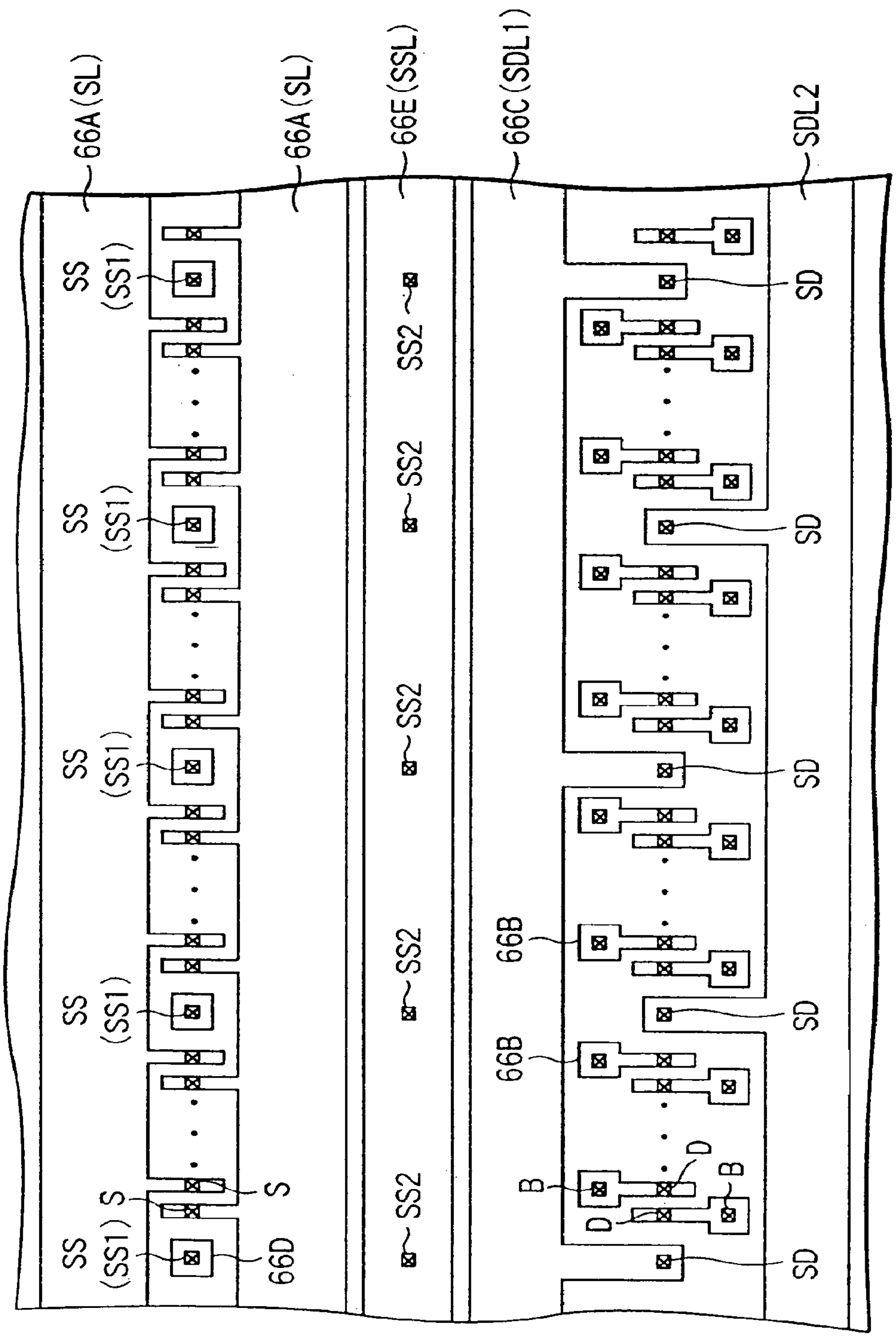
FIG. 56 shows a plan pattern of a first interconnection layer of the EEPROM of FIG. 53.
Figure 57:
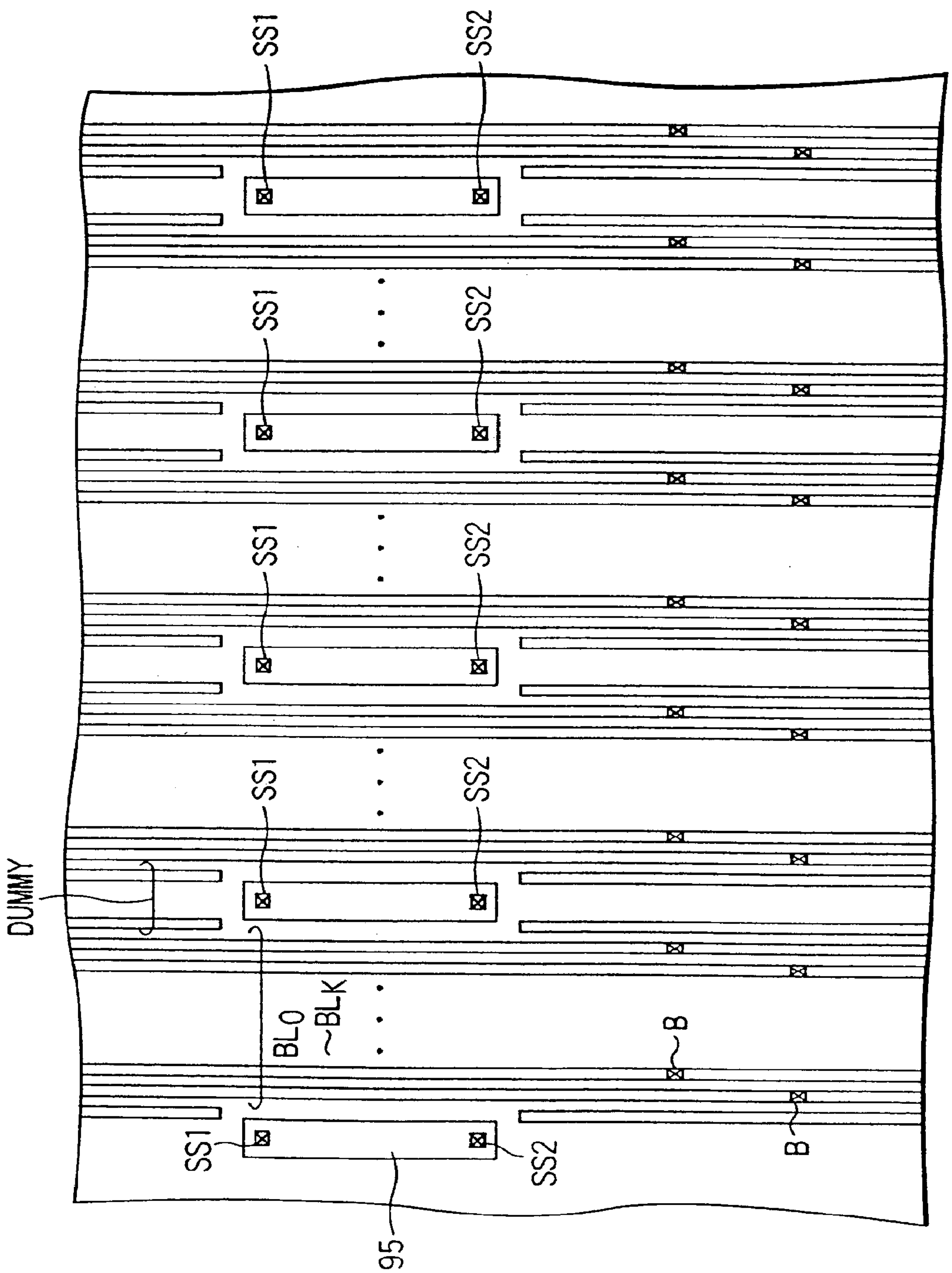
FIG. 57 shows a plan pattern of a second interconnection layer of the EEPROM of FIG. 53.

Further, FIG. 56 shows a pattern layout of a first interconnection layer formed above NAND cell units, and FIG. 57 shows a pattern layout of a second interconnection layer formed above the first interconnection layer of FIG. 56.

The memory cell array section of FIG. 53 has the same section as the memory cell section of FIG. 50.

A device isolation layer 49 of STI (shallow-trench isolation) structure is formed in a silicon substrate 10. A NAND cell unit composed of, say, 16 memory cells and two select gate transistors is located within a device region surrounded with the device isolation layer 49.

The NAND cell unit comprises floating gate electrodes FG, control gate electrodes (word lines) CG0 to CG15, and N-type diffused layers 61. Each floating gate electrode consists of two layers 45 and 50 of polysilicon. Each control gate electrode CG consists of layers 55 and 56 of polysilicon and a layer 57 of tungsten silicide.

The source-side select gate transistor has upper and lower select gate electrodes SGS and N-type diffused layers 61 and 61*a*. The lower select gate electrode SGS is formed of layers 45 and 50 of polysilicon. The upper select gate electrode is made of layers 55 and 56 of polysilicon and a layer 57 of tungsten silicide.

The drain-side select gate transistor also has upper and lower gate electrodes SGS and N-type diffused layers 61 and 61*b*. The lower select gate electrode SGS is formed of layers 45 and 50 of polysilicon. The upper select gate electrode is made of layers 55 and 56 of polysilicon and a layer 57 of tungsten silicide.

The control gate electrodes (word lines) CG0 to CG15, the source-side upper and lower select gate electrodes SGS, and the drain-side upper and lower select gate electrodes SGD extend in the row direction, while bit lines BL0 to BLk extend in the column direction.

The bit lines BL0 to BLk each consist of a stack of a barrier metal layer 68 consisting of titanium and titanium nitride and a layer 69 of metal such as aluminum. Each bit line is connected to the diffused layer (drain) 61*b* of the NAND cell unit through an interconnection 66 (66B) of tungsten which is formed immediately below it. A layer 65 (65B) of barrier metal consisting of, for example, titanium and titanium nitride is formed between the tungsten layer 66 and the diffused layer 61*b*.

Dummy bit lines DUMMY are provided to make the capacitance of the dummy line BL0 to BLk uniform, but they are not actually used in operation.

The source line SL is connected to the diffused layer (source) 61*a* of each NAND cell unit. The source line is made of a composite of a layer 65 (65A) of barrier metal consisting of titanium nitride and titanium and a layer 66 (66A) of tungsten.

The source- and drain-side select gate transistors are provided in order to select a memory cell to be written into or erased. Thus, unlike the memory cells, each of these transistors is designed to perform a switching operation at a fixed threshold.

In each of the select gate transistors, therefore, a control signal is directly applied to the first-level (lower) select gate electrodes SGS and SGD. Specifically, portions of the second-level (upper) select gate electrodes SGS and SGD are removed to form contact areas for the first-level select gate electrodes. Contact holes SS and SD are formed in these contact areas.

The hatched areas in FIGS. 54 and 55 indicate portions where the first-level select gate electrodes SGS and SGD are existent.

In view of the resistance of the select gate electrodes, the contact areas (i.e., contact holes SS and SD) are each formed for every several hundreds of bit lines. Further, the contact areas (SS) for the first-level select gate electrodes SGS of the source-side select gate transistors are each provided for a respective one of two first-level select gate electrodes SGS which are adjacent to each other in the column direction. On the other hand, the contact areas (SD) for the first-level select gate electrodes SGS of the drain-side select gate transistors are also each provided for a respective one of two first-level select gate electrodes SGS which are adjacent to each other in the column direction.

For the drain-side select gate transistors, the contact areas (SD) for two first-level (lower) select gate electrodes SGD adjacent to each other in the column direction are staggered so that they are not opposed to each other (that is, so that the contact areas for the lower select gate electrodes SGD do not overlap with each other).

Likewise, for the source-side select gate transistors, the contact areas (SD) for two first-level (lower) select gate electrodes SGS adjacent to each other in the column direction are staggered so that they are not opposed to each other (that is, so that the contact areas for the lower select gate electrodes SGD do not overlap with each other).

Of two pairs of upper and lower select gate electrodes SGD for the drain-side select gate transistors which are adjacent to each other in the column direction, the upper and lower select gate electrodes in one pair have their portions removed which are opposed to the contact area of the lower gate electrode in the other pair. Thus, even with the spacing between the lower select gate electrodes reduced, the contact area of the lower select gate electrode in the other pair will not contact the upper and lower select gate electrodes in the one pair.

Of two pairs of upper and lower select gate electrodes SGS for the source-side select gate transistors which are adjacent to each other in the column direction, the upper and lower select gate electrodes in one pair have their portions removed which are opposed to the contact areas of the lower gate electrode in the other pair. Thus, even with the spacing between the lower select gate electrodes SGS reduced, the contact areas of the lower select gate electrode in the other pair will not contact the upper and lower select gate electrodes in the one pair.

Thus, in this example, the source-side and drain-side select gate electrodes have their respective given potions disconnected.

These drain-side select gate electrodes thus disconnected are electrically connected by an upper interconnection SDL1 or SDL2. The interconnections SDL1 and SDL2 are formed at the same level as the source line SL and are made of a layer of barrier metal 65 (65C) consisting of titanium nitride and titanium and a layer 66 (66C) of tungsten.

The contact areas for two lower select gate electrodes SGS for the source-side select gate transistors adjacent to each other in the column direction are connected together to an interconnection SSL by interconnections 66D and 95 (contact holes SS1 and SS2).

The interconnections 66D and SSL are formed at the same level as the source line SL and are made of a layer of barrier metal 65 (65D, 65E) consisting of titanium nitride and titanium and a layer 66 (66D, 66E) of tungsten. The interconnection 95 is formed at the same layer as the bit lines BL0 to BLk and is made of a layer of barrier metal 68 consisting of titanium nitride and titanium and a layer 69 of metal such as aluminum.

Figure 58:
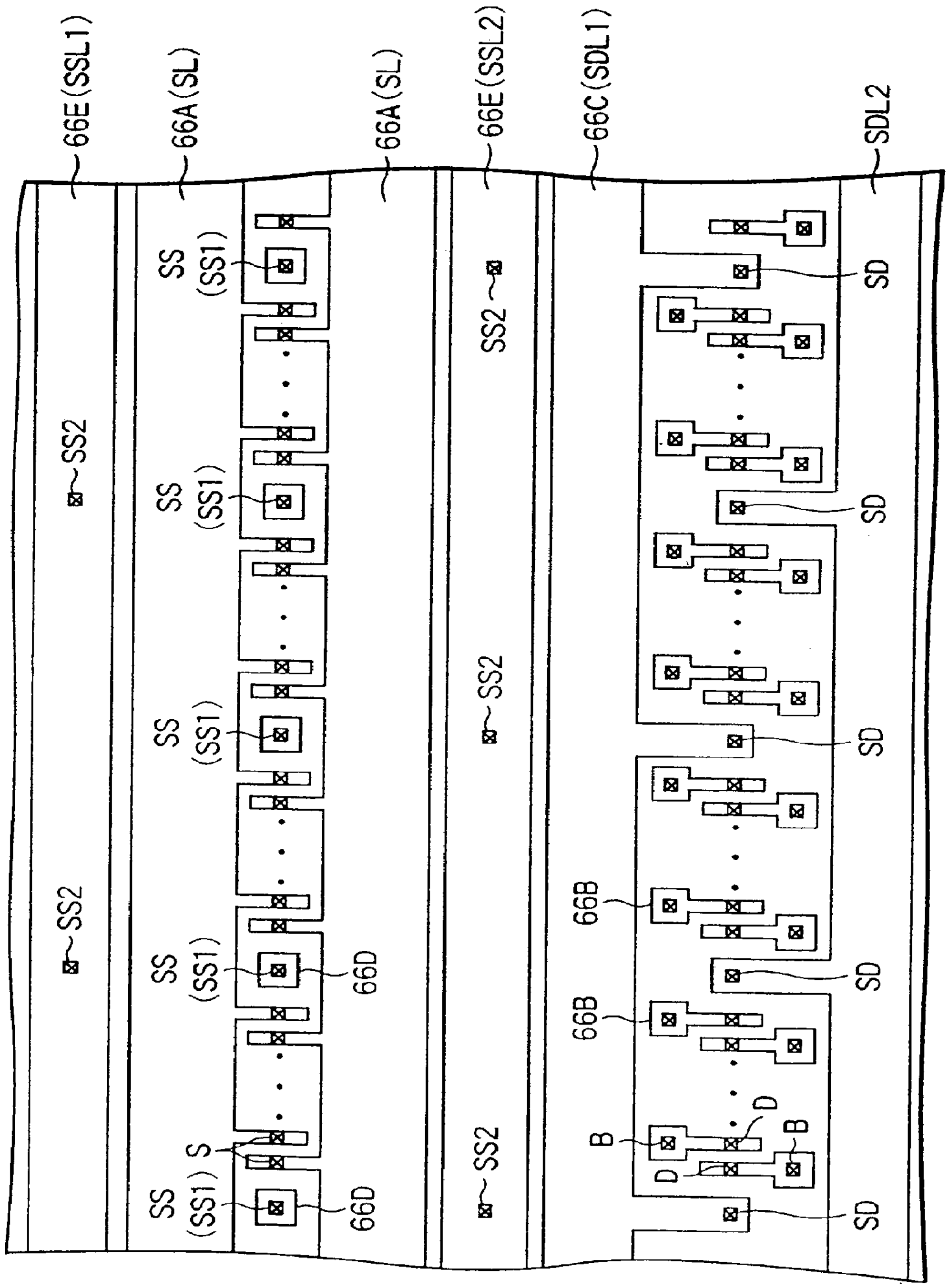
FIG. 58 shows a plan pattern of a first interconnection layer of a third example of an EEPROM of the present invention.
Figure 59:
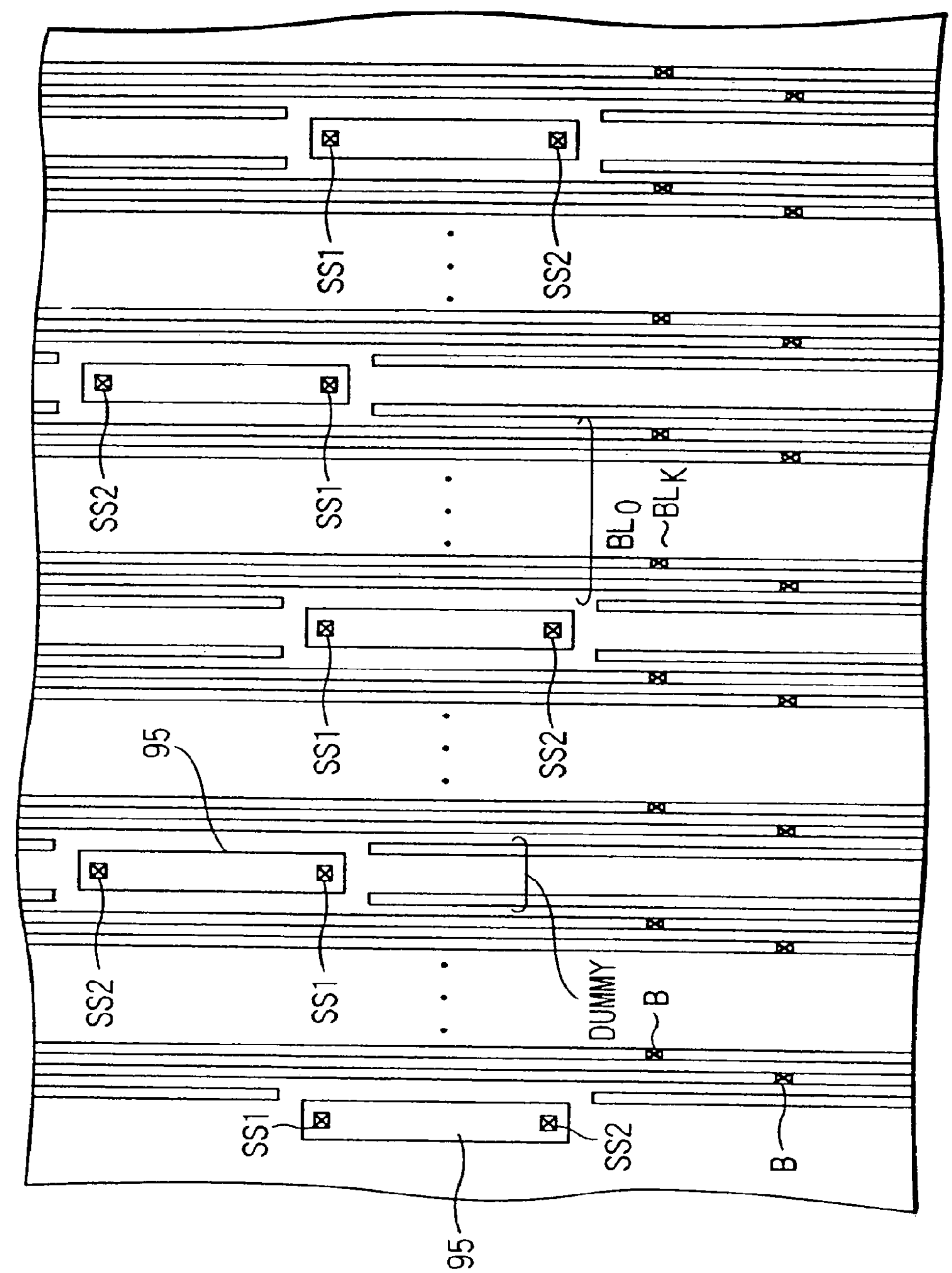
FIG. 59 shows a plan pattern of a second interconnection layer of the third example of EEPROM of the present invention.

FIGS. 58 and 59 show a third example of a memory array section of a NAND flash EEPROM of the present invention. This example is a modification of the second example. FIG. 58 shows a modification of the pattern of the first interconnection layer of FIG. 56, and FIG. 59 shows a modification of the pattern of the second interconnection layer of FIG. 57.

The section of the memory array section of the NAND flash EEPROM of this example remains unchanged from that shown in FIG. 50.

Of two pairs of upper and lower select gate electrodes SGS for the source-side select gate transistors which are adjacent to each other in the column direction, the upper and lower select gate electrodes in one pair have their respective portions disconnected which are opposed to the contact area of the lower gate electrode in the other pair.

The disconnected portions of the lower select gate electrode SGS are electrically connected by the upper interconnection SSL1 or SSL2 through the contact areas. That is, unlike the second example, in this example, two pairs of upper and lower select gate electrodes SGS which are adjacent to each other in the column direction are respectively connected to the different interconnections SSL1 and SSL2.

This arrangement allows the on-off control of the source- and drain-side select transistors in the NAND cell units for each block.

The interconnections SSL1 and SSL2 are formed at the same layer as the source line SL and made of a layer of barrier metal 65 (65E) consisting of titanium nitride and titanium and a layer 66 (66E) of tungsten.

In the first, second and third examples of the pattern of the memory cell array section of the NAND flash EEPROM, first, the contact areas of two select gate electrodes adjacent to each other in the column direction are located so that they are not opposed to each other. In addition, one of the select gate electrodes is disconnected at its portions that are opposed to the contact areas of the other.

Therefore, the spacing between the gate areas (linear areas other than the contact area) of the two select gate electrodes adjacent to each other in the column direction can be reduced independently of the size of the contact areas.

Figure 60:
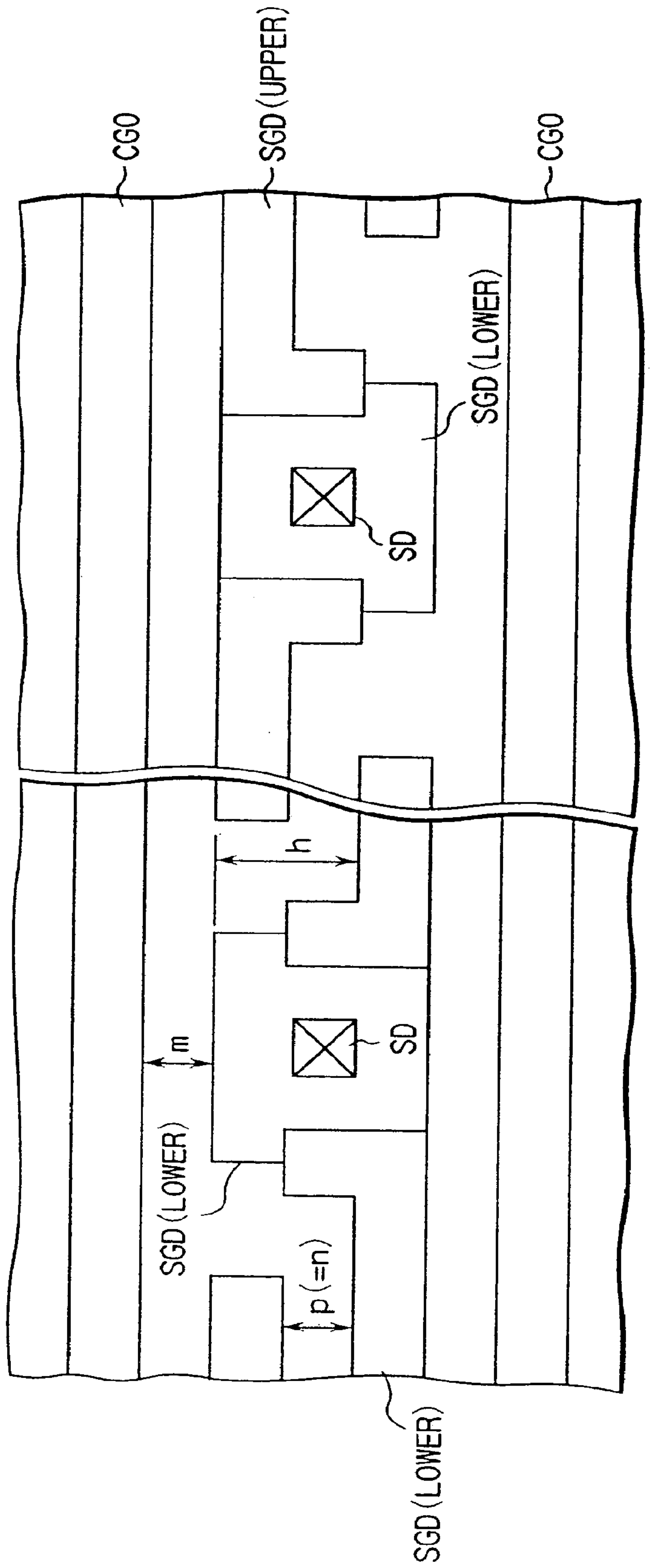
FIG. 60 illustrates the first advantage of the present invention that the spacing between select gates is reduced.

Specifically, assume that, as shown in FIG. 60, the minimum width possible with photolithographic processing is n (for example, the spacing between the control gate electrodes is set to n), the length of a portion of the contact area that protrudes from the gate area of the lower select gate electrode is h, and the spacing between the contact area of the lower select gate electrode SGD and the adjacent control gate electrode CG0 is m. Then, the spacing p between the gate areas of the two select gate electrodes adjacent to each other in the column direction can, in principle, be reduced to n independently of the size of the contact area, subject to the constraint $n<m$.

As a result, the size of the memory cell array section in the column direction can be reduced by nine to ten percent over conventional ones, contributing to an increase in the storage capacity of the memory cell array section (with the area fixed) or a reduction in the area of the memory cell array section (with the storage capacity fixed).

The disconnected portions of the first-level select gate electrode are electrically connected together by the upper interconnection through the contact areas. Making the upper interconnection of a low-resistance material, for example, a barrier metal consisting of titanium nitride and titanium and a tungsten layer will also serve to decrease the resistance of the select gate electrode.

Secondly, the second-level select gate electrode is removed in the portions where the contact areas for the first-level select gate electrode are formed. The pattern of the contact areas of the second-level select gate electrode has a length r in the column direction larger than the gate length g of the select gate electrode (for example, it is bent by 90 degrees in the column direction). Naturally, the first-level select gate electrode exists immediately below the second-level select gate electrode.

Figure 61:
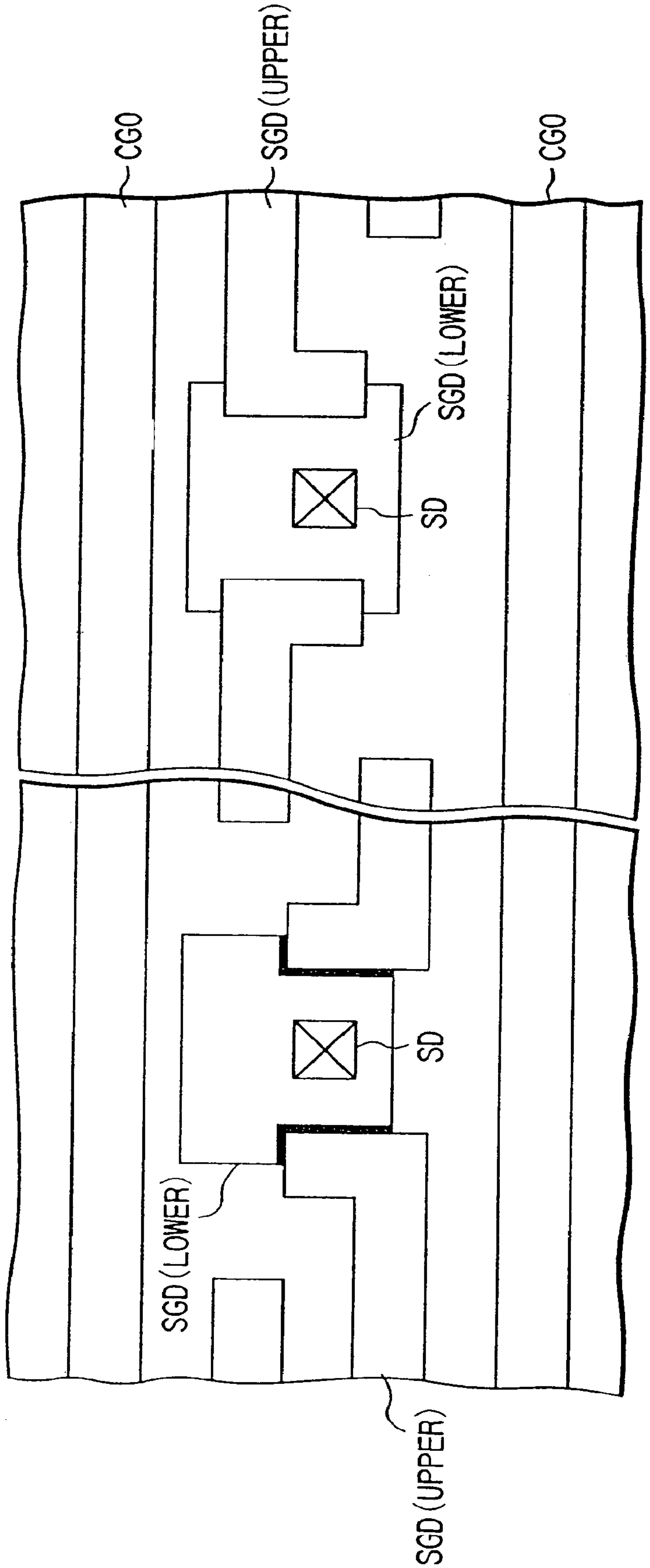
FIG. 61 illustrates the second advantage of the present invention that the resistance in the contact area is reduced.

Even if, as shown in FIG. 61, resist misalignment occurs during the lithographic processes for patterning the contact area of the first-level select gate electrode, the length of contact portion (shown in bold lines) where the contact area is brought into contact with the gate area will not become so short as to increase the resistance of the first-level select gate electrode.

A method of manufacturing the NAND flash EEPROM memory cell array section described thus far will be described next.

Figure 62:
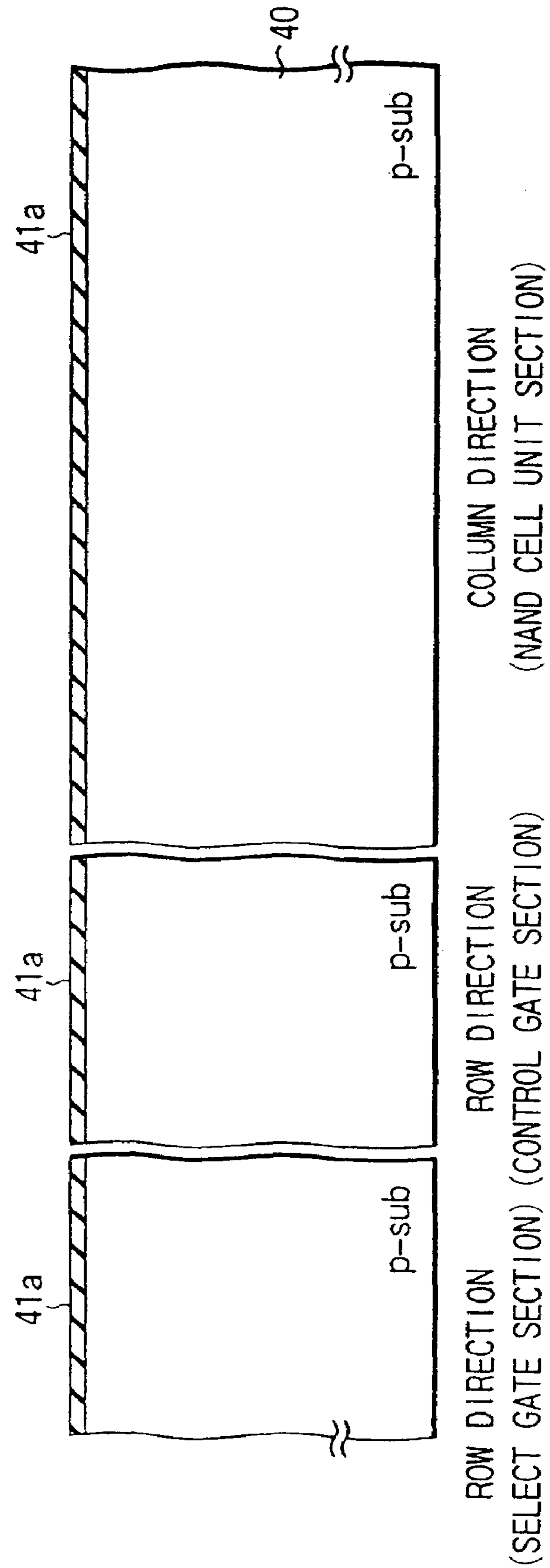
FIG. 62 is a sectional view illustrating a step of an EPROM manufacturing method of the present invention.

First, as shown in FIG. 62, a silicon oxide layer 41*a* of about 10 nm in thickness is formed over the surface of a p-type silicon substrate 40 by means of thermal oxidation by way of example.

Figure 63:
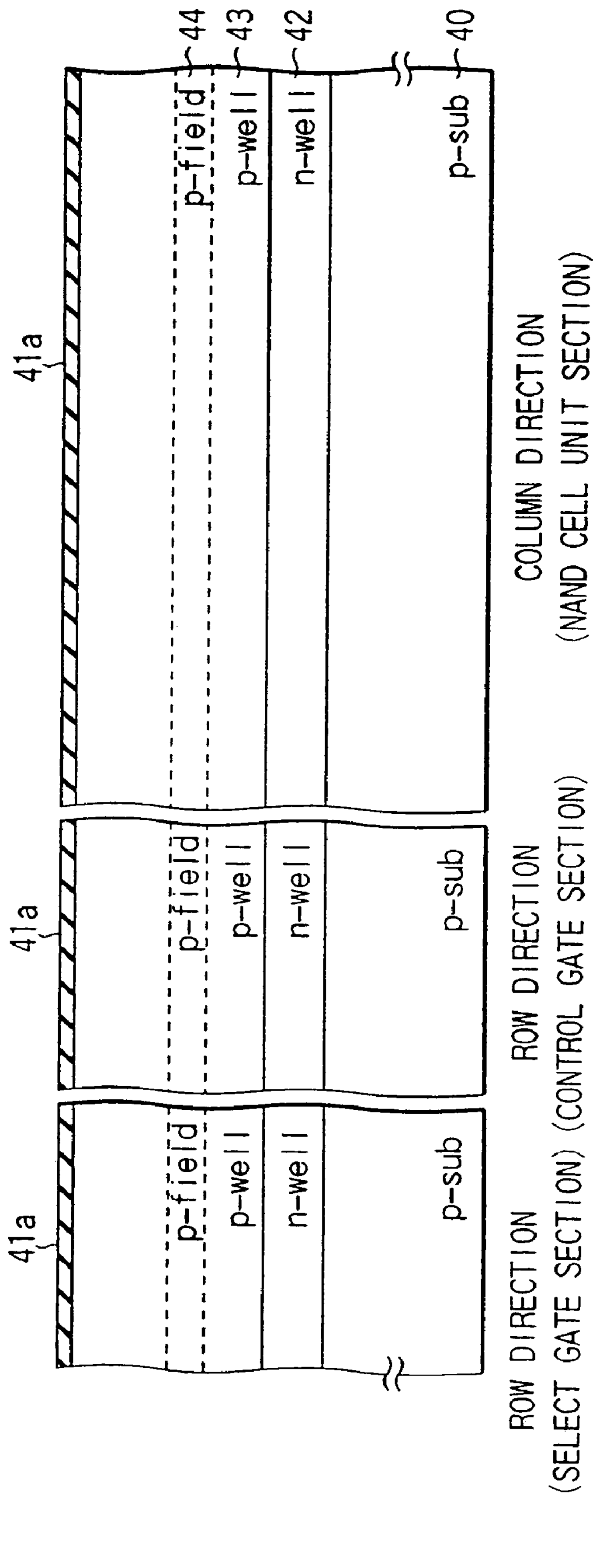
FIG. 63 is a sectional view illustrating a step of an EPROM manufacturing method of the present invention.
Figure 64:
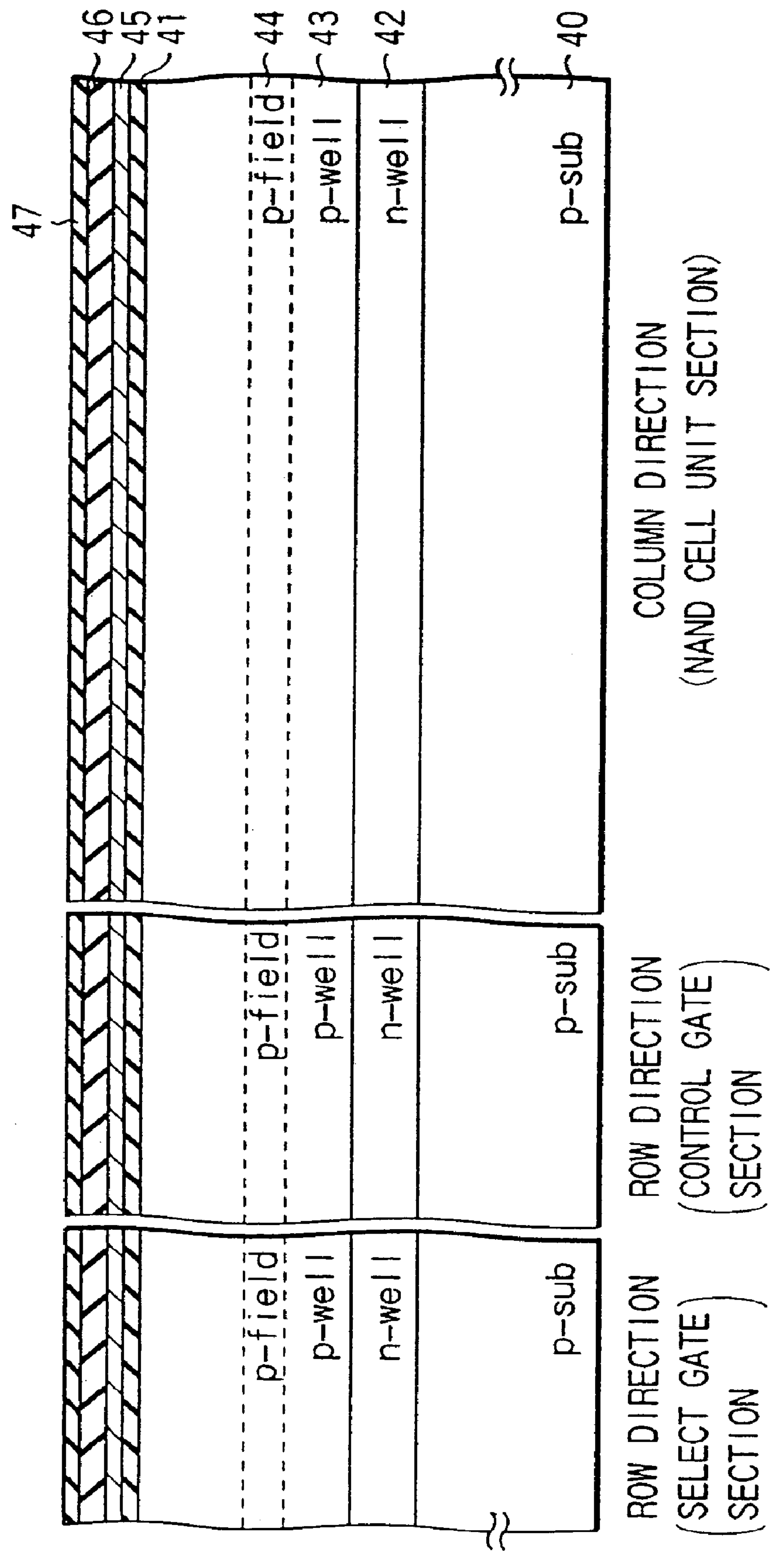
FIG. 64 is a sectional view illustrating a step of an EPROM manufacturing method of the present invention.

Next, as shown in FIG. 63, using a mask for n-well formation, n-type impurities (e.g., phosphorous) are ion implanted into the silicon substrate 40 to form an n-well region 42. Here, the formation of the n-well region is implemented by a three-step ion implantation process. That is, in the first step, phosphorous is implanted into the silicon substrate at 1.5 MeV and at a dose of $4.0\times10^{12}$ $cm^{-2}$. In the second step, phosphorous is implanted into the silicon substrate at 750 KeV and at a dose of $8.0\times10^{12}$ $cm^{-2}$. In the third step, phosphorous is implanted into the silicon substrate at 150 KeV and at a dose of $1.0\times10^{12}$ $cm^{-2}$.

Using a mask for p-well formation, p-type impurities (e.g., boron) are ion implanted into the silicon substrate 40 to form a p-well region 43. Here, the formation of the p-well region is implemented by a two-step ion implantation process. That is, in the first step, boron is implanted into the silicon substrate at 400 KeV and at a dose of $4.0\times10^{12}$ $cm^{-2}$. In the second step, boron is implanted into the silicon substrate at 200 KeV and at a dose of $1.0\times10^{12}$ $cm^{-2}$.

A p-field region 44 higher in impurity concentration than the p-well region 43 is formed into the p-well region 43. After that, the silicon oxide 41*a* is removed.

Next, the silicon substrate is subjected to thermal oxidation in an oxygen atmosphere at about 750° C. to form a layer 41 of silicon oxide of about 8 nm in thickness. Using CVD, a n-type polysilicon layer 45 of n-type impurity (e.g., phosphorous) concentration of about $2\times10^{20}$ $cm^{-3}$ and about 60 nm in thickness is formed over the silicon oxide layer 41.

After that, a layer 46 of silicon nitride of about 150 nm in thickness is formed over the polysilicon layer 45 by using CVD. A layer 47 of silicon oxide of about 100 nm in thickness is then formed over the silicon nitride layer 46 by using CVD.

Figure 65:
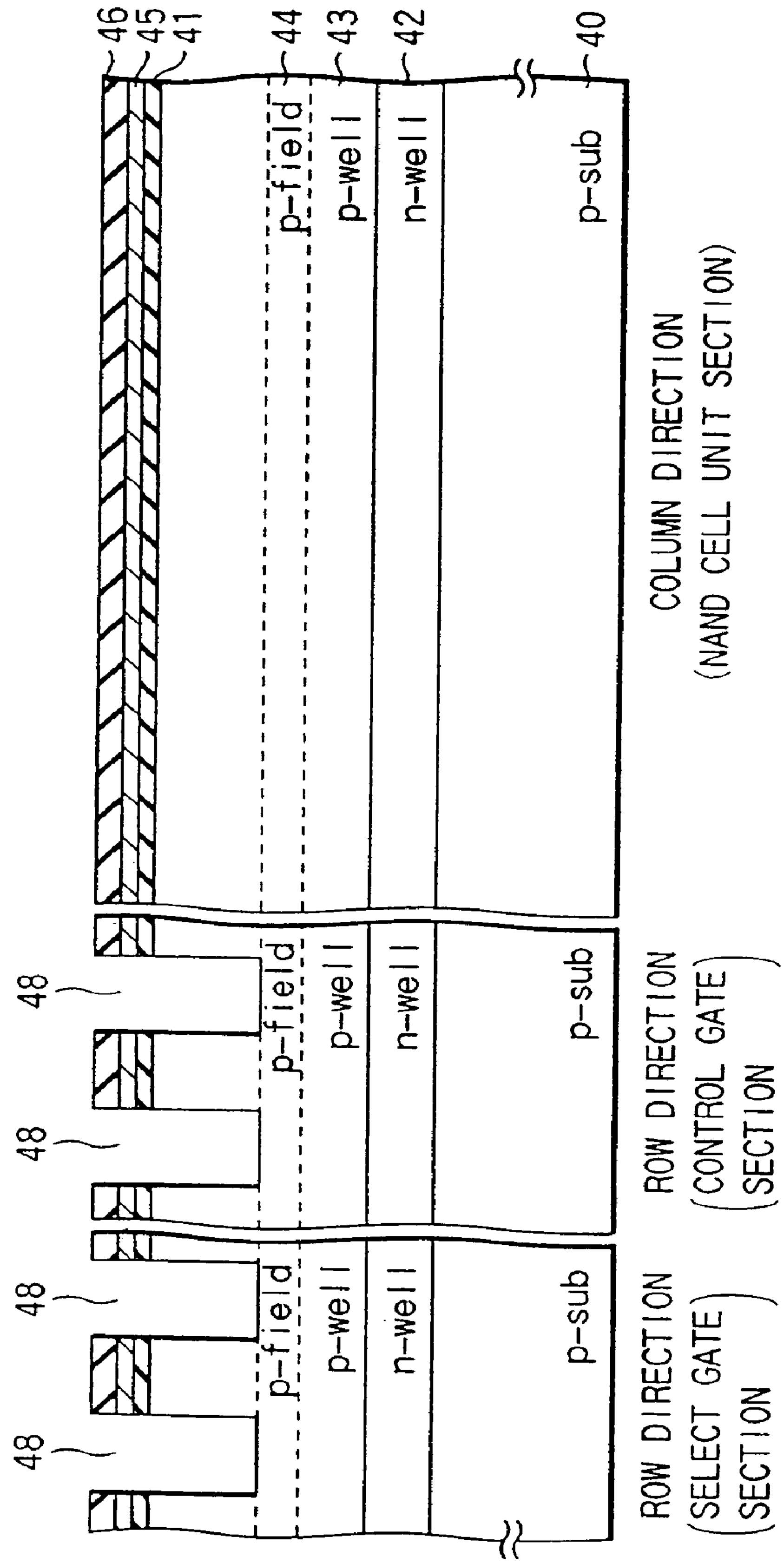
FIG. 65 is a sectional view illustrating a step of an EPROM manufacturing method of the present invention.

Next, as shown in FIG. 65, a resist pattern is formed on the silicon oxide layer 47 by means of PEP (photoetching process). Using this resist pattern as a mask, the silicon oxide layer 47 is etched by means of RIE (reactive ion etching). Using the resultant silicon oxide layer 47 as a mask, the silicon nitride layer 46 is etched by means of RIE and then the silicon oxide layer 47 is etched away.

After that, using the silicon nitride layer 46 as a mask, the polysilicon layer 45 and the silicon oxide layer 41 are etched in sequence by means of RIE. Using the silicon nitride layer 46 as a mask, the silicon substrate 40 is etched to form trenches 48 into the substrate to reach the p-field region 44.

Figure 66:
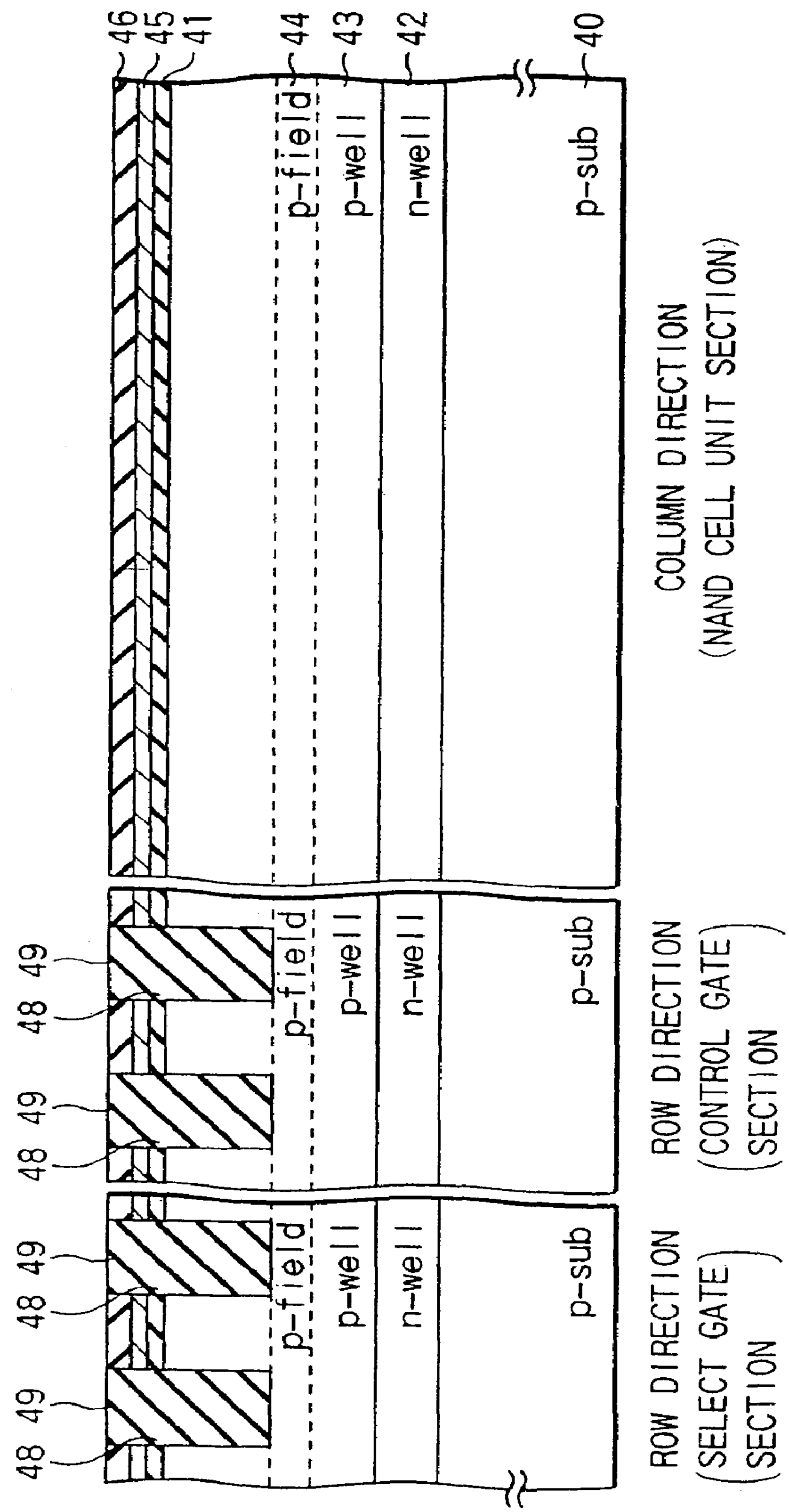
FIG. 66 is a sectional view illustrating a step of an EPROM manufacturing method of the present invention.

Next, as shown in FIG. 66, using CVD a TEOS layer 49 of about 820 nm in thickness is formed over the silicon nitride layer 46 so as to fill the trenches 48. After that, the TEOS layer 49 is polished by means of CMP (chemical mechanical polishing) so that it is left only within the trenches 48, thereby completing the STI (shallow trench isolation) structure.

The silicon nitride layer 46 serves as etching stopper at the time of CMP; thus, the surface of the TEOS layer 49 is substantially at the same level as the silicon nitride layer 46 (in general, the surface of the TEOS layer becomes slightly lower than the surface of the silicon nitride layer). After that, the silicon nitride layer 46 is etched away.

Figure 67:
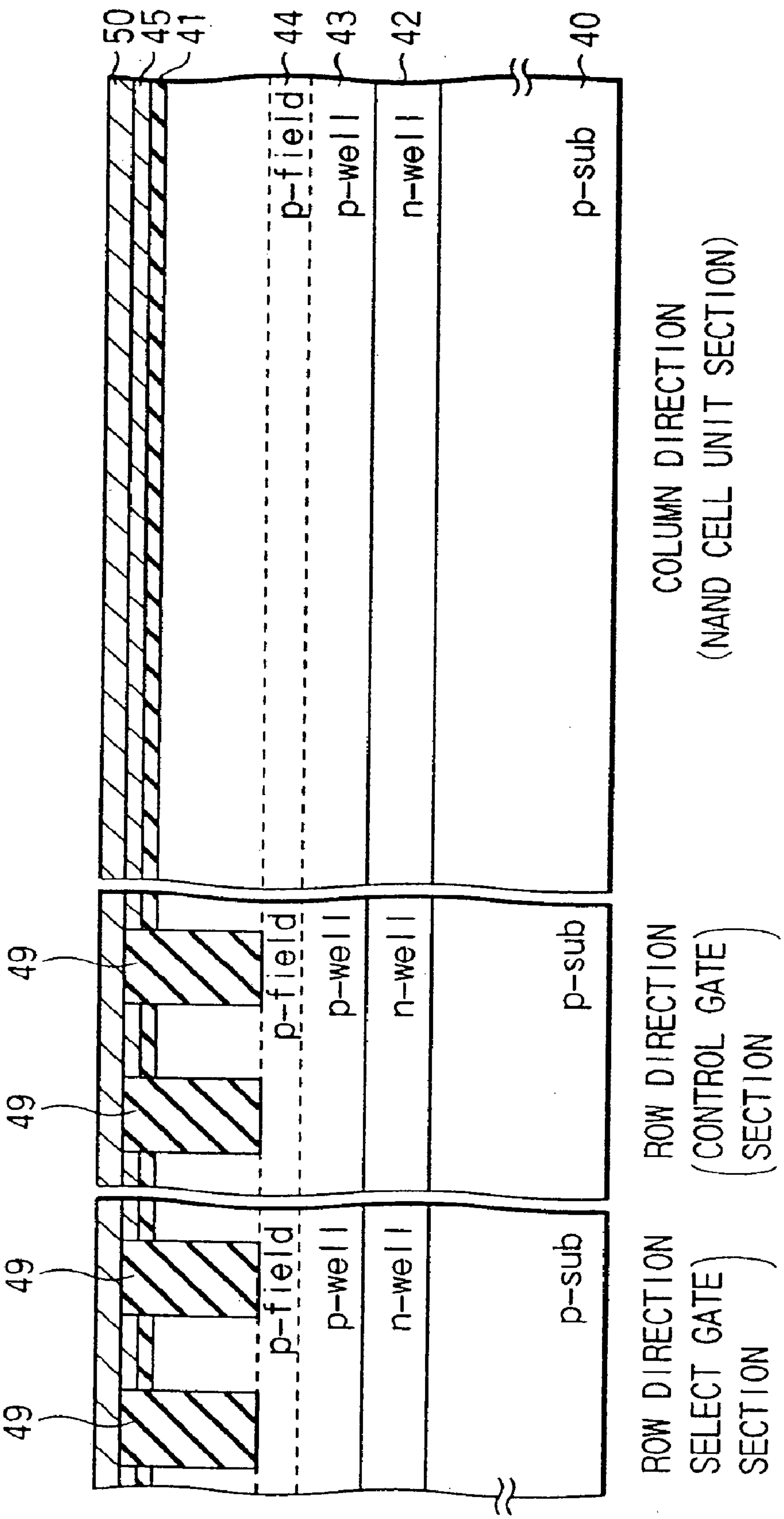
FIG. 67 is a sectional view illustrating a step of an EPROM manufacturing method of the present invention.

Next, as shown in FIG. 67, an n-type polysilicon layer 50 of n-type impurity (e.g., phosphorous) concentration of about $2\times10^{20}$ $cm^{-3}$ and about 100 nm in thickness is formed over the silicon oxide layer 45 by using CVD.

Figure 68:
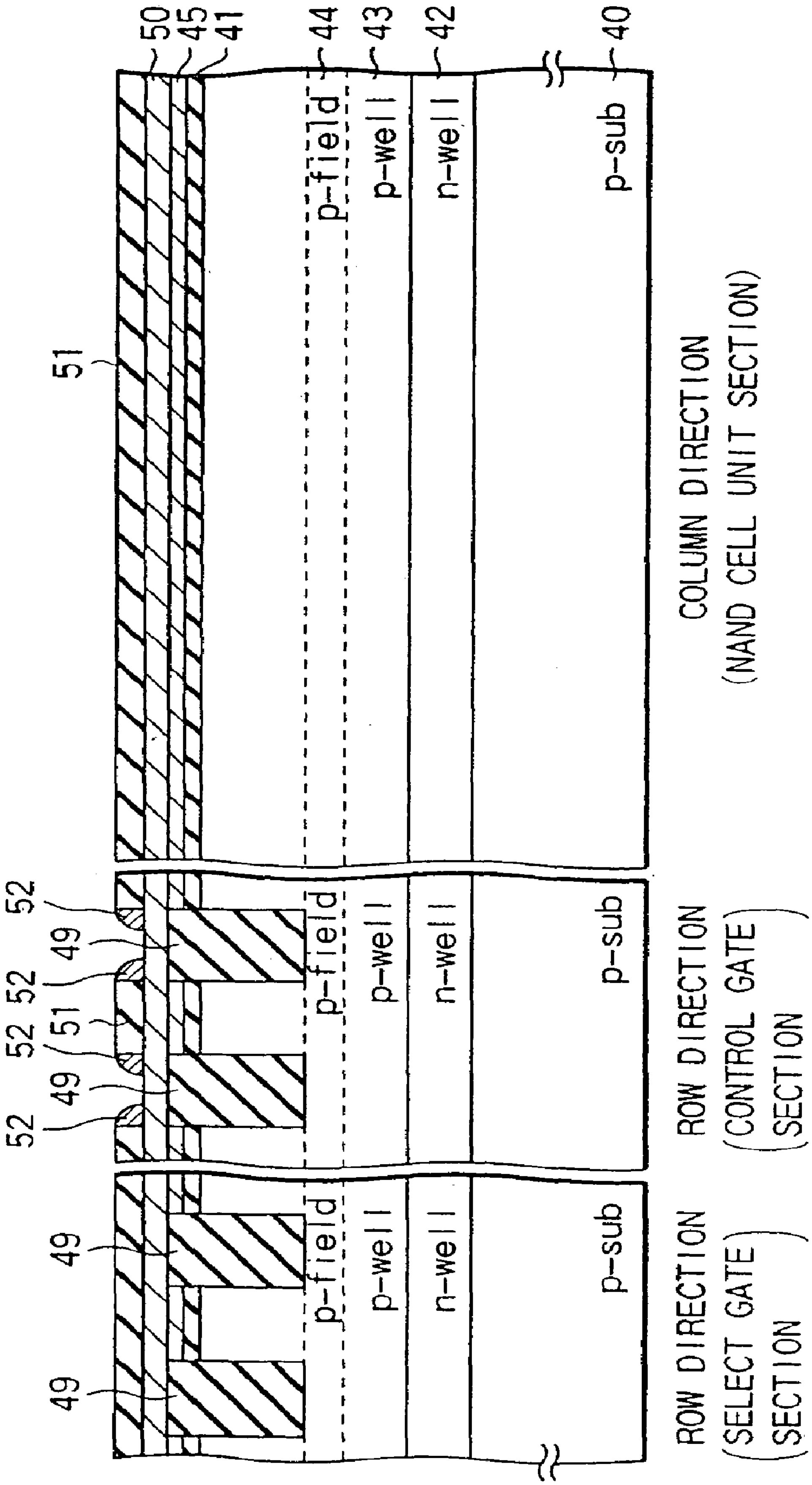
FIG. 68 is a sectional view illustrating a step of an EPROM manufacturing method of the present invention.

Next, as shown in FIG. 68, a layer 51 of silicon nitride of about 200 nm in thickness is formed over the polysilicon layer 50 by means of CVD. The silicon nitride layer 51 is patterned and etched to form slits extending in the column direction in the silicon nitride layer 51 except regions where source- and drain-side select gate transistors are formed. The width of the slits in the row direction is in the range of 200 to 300 nm.

A silicon nitride layer 52 of about 80 nm in thickness is formed over the silicon nitride layer 51 and then etched by means of RIE, so that it remains only on the sidewall of the slits.

Figure 69:
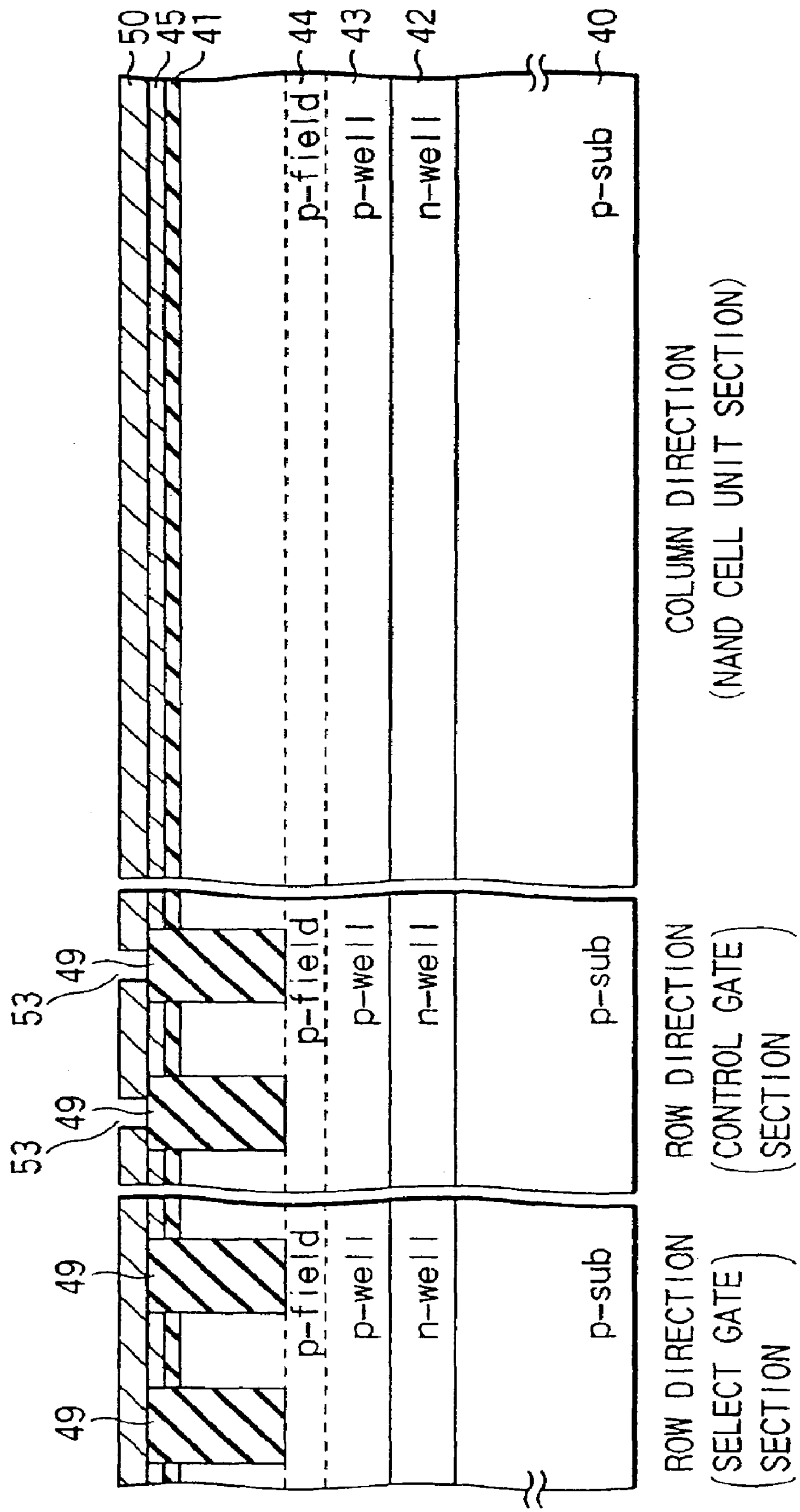
FIG. 69 is a sectional view illustrating a step of an EPROM manufacturing method of the present invention.

After that, using the silicon nitride layers 51 and 52, the polysilicon layer 50 is etched by means of RIE to form slit-like openings 53 in the polysilicon layer 50 as shown in FIG. 69. Since the width of the openings 52 in the row direction is narrower than that of the TEOS layer 49, the polysilicon layers 45 and 50 used as floating gates are in the form of wing.

The silicon nitride layers 51 and 52 are then etched away.

Figure 70:
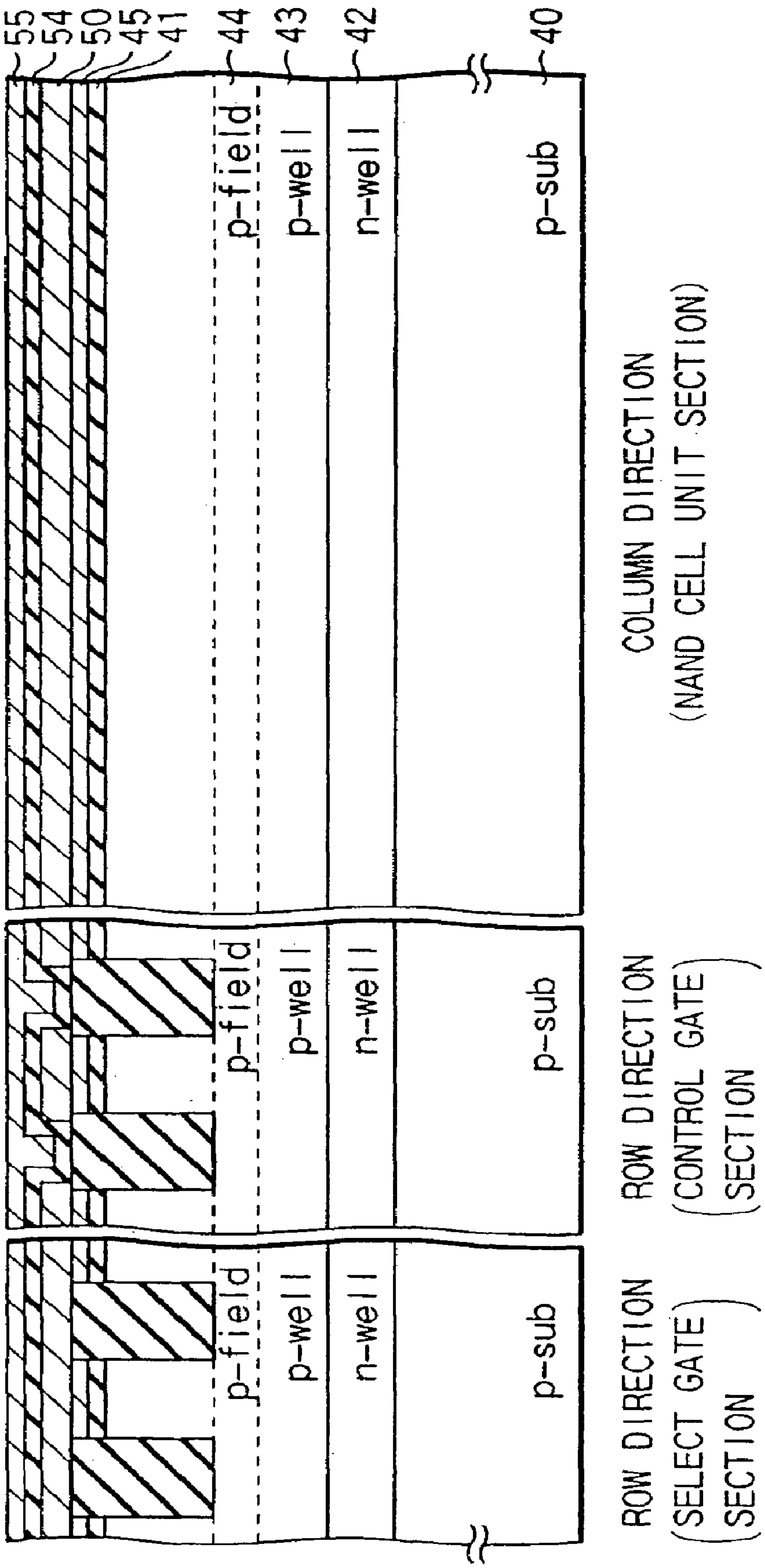
FIG. 70 is a sectional view illustrating a step of an EPROM manufacturing method of the present invention.

Next, as shown in FIG. 70, an insulating layer 54 is formed over the polysilicon layer 50, which is made of silicon oxide of about 5 nm in thickness, silicon nitride of about 8 nm in thickness, and silicon nitride of about 5 nm in thickness (what is called an ONO layer). A polysilicon layer 55 of n-type impurity (e.g., phosphorous) concentration of about $3.6\times10^{20}$ $cm^{-3}$ and about 200 nm in thickness is formed over the insulating layer 54 by using CVD.

Figure 71:
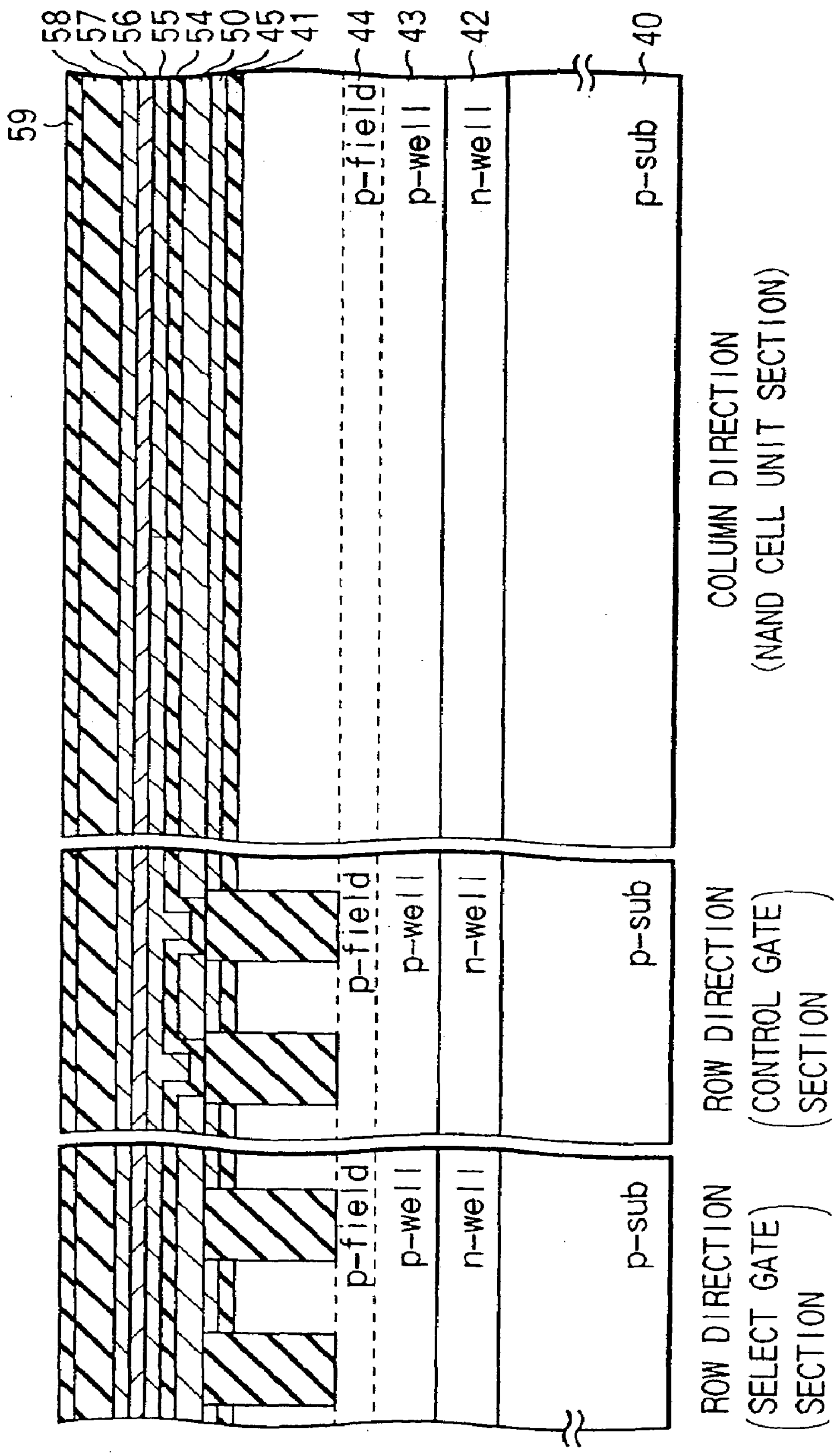
FIG. 71 is a sectional view illustrating a step of an EPROM manufacturing method of the present invention.

Next, as shown in FIG. 71, an n-type polysilicon layer 56 of about 100 nm in thickness is formed over the polysilicon layer 55 by means of CVD. A layer of tungsten silicide (WSi) of about 100 nm is then formed over the polysilicon layer 56 by means of CVD. A layer 58 of silicon nitride of about 280 nm is then formed over the tungsten silicide layer 57 by means of CVD. A layer 59 of silicon oxide (TEOS layer) of about 50 nm is then formed over the silicon nitride layer 58 by means of CVD.

After that, a resist pattern is formed over the silicon oxide layer 59 by using PEP and then the silicon oxide layer 59 is etched by means of RIE using the resist pattern as a mask. Using the silicon oxide layer 59 as a mask, the silicon nitride layer 58 is etched by means of RIE and the silicon oxide layer 59 is then removed.

Figure 72:
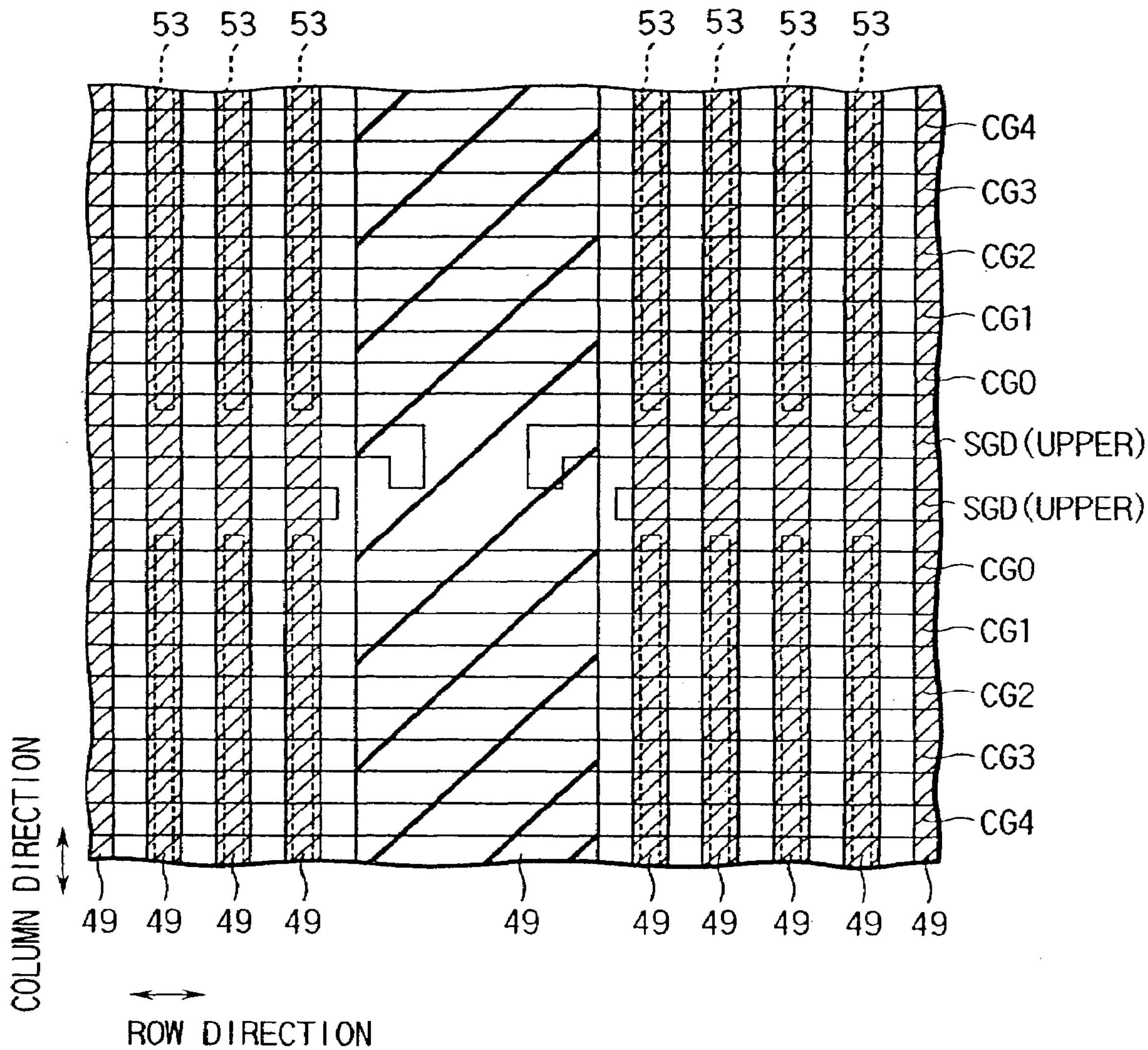
FIG. 72 is a sectional view illustrating a step of an EPROM manufacturing method of the present invention.
Figure 73:
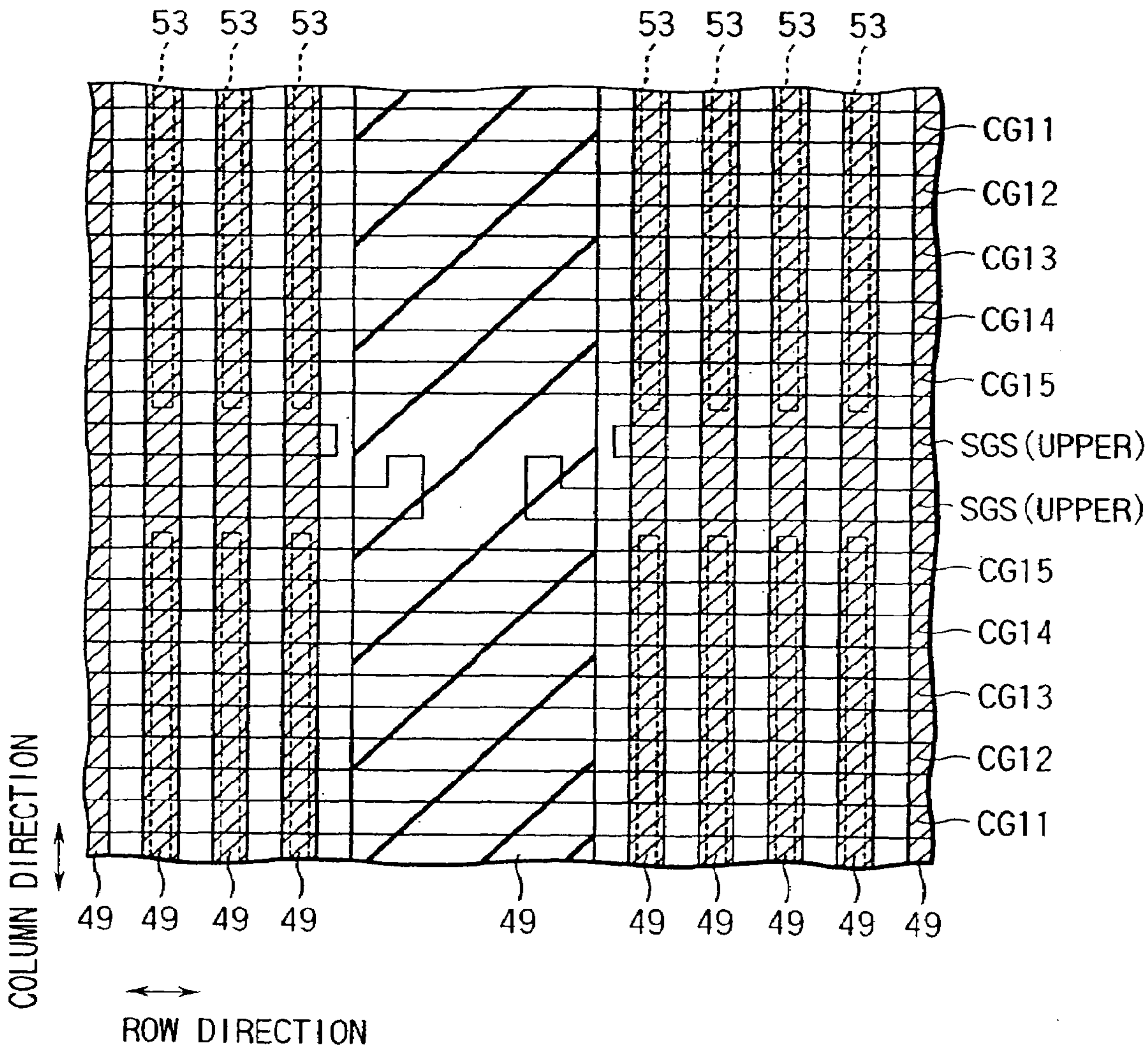
FIG. 73 is a sectional view illustrating a step of an EPROM manufacturing method of the present invention.
Figure 74:
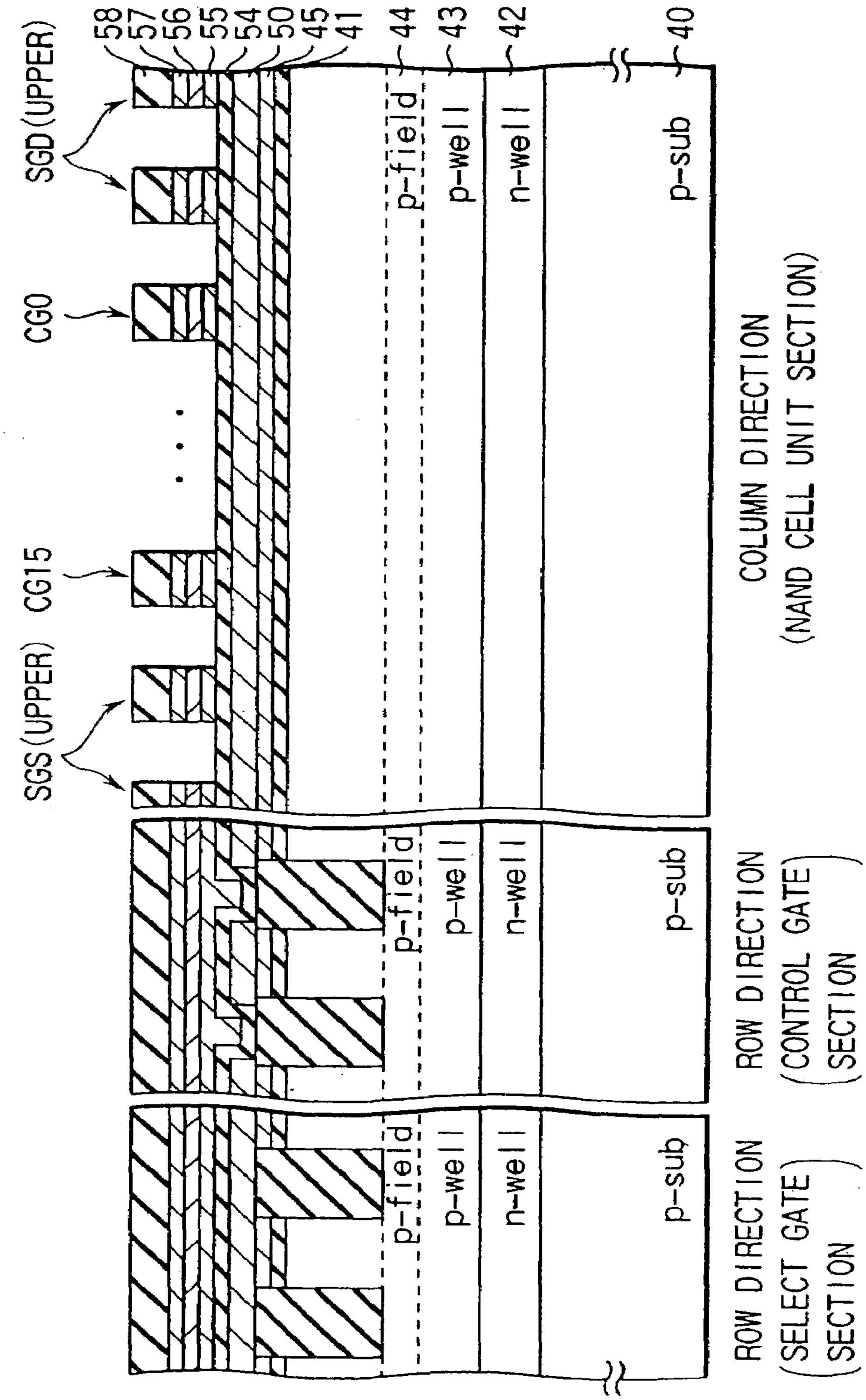
FIG. 74 is a sectional view illustrating a step of an EPROM manufacturing method of the present invention.
Figure 75:
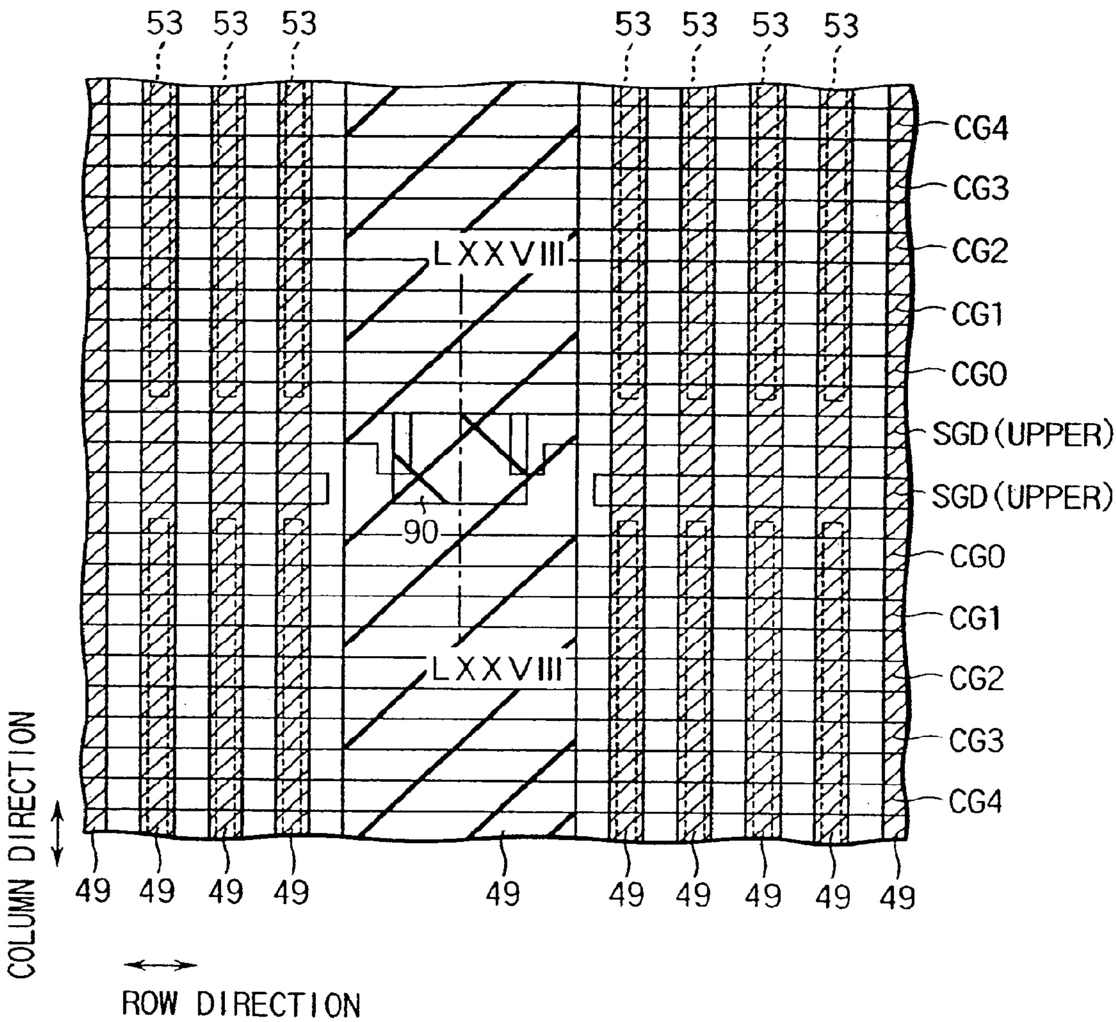
FIG. 75 is a sectional view illustrating a step of an EPROM manufacturing method of the present invention.
Figure 76:
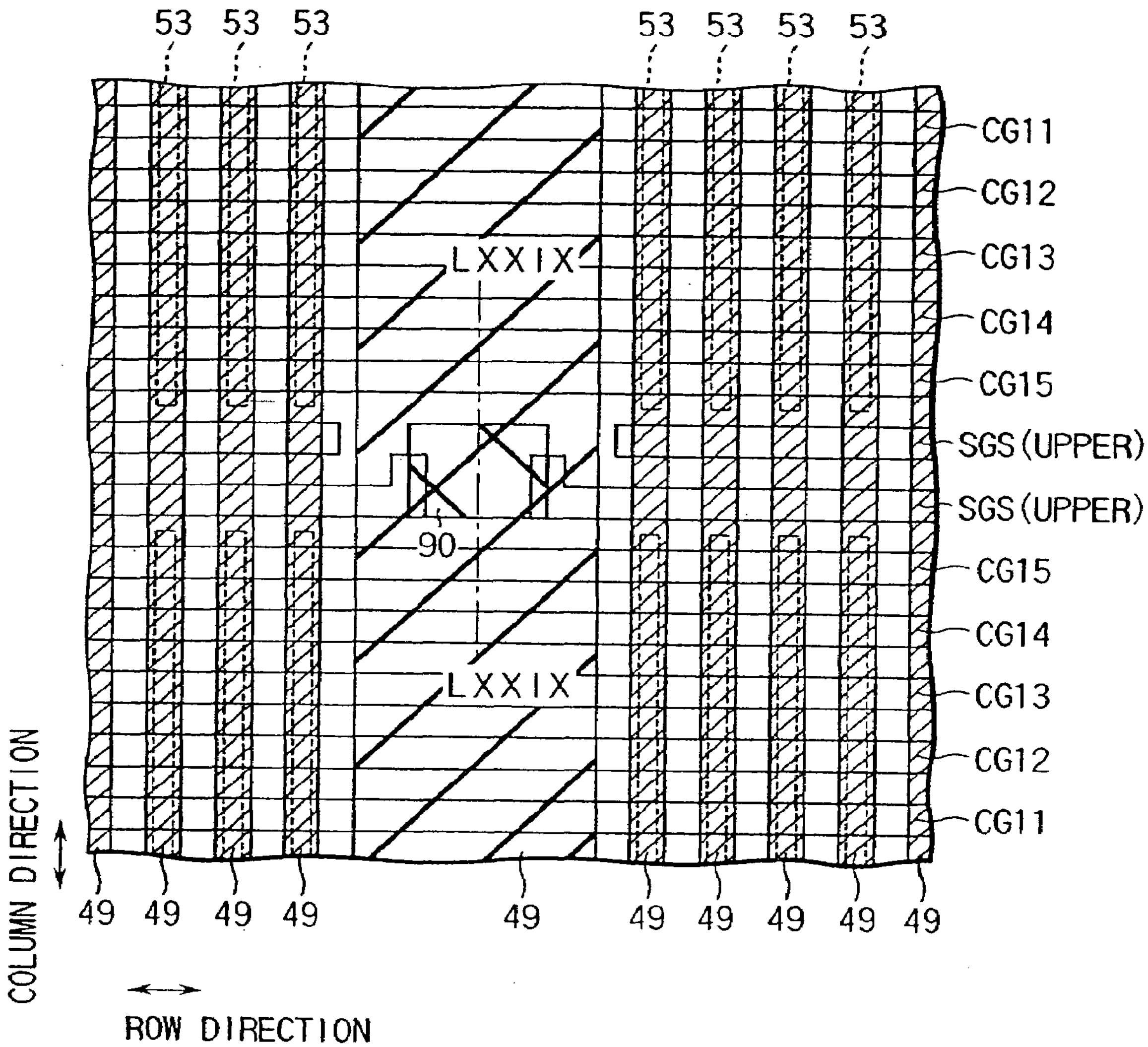
FIG. 76 is a sectional view illustrating a step of an EPROM manufacturing method of the present invention.
Figure 77:
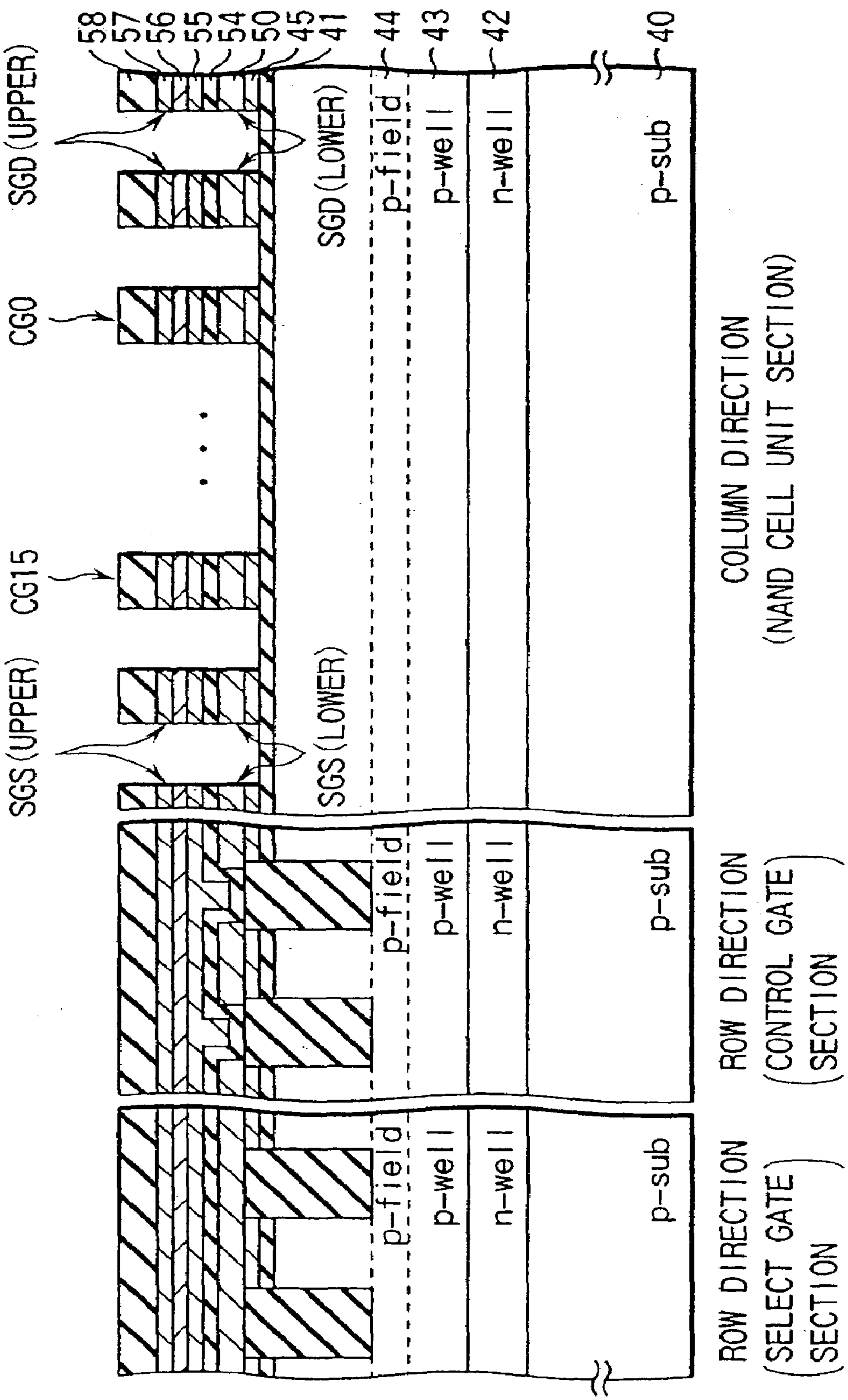
FIG. 77 is a sectional view illustrating a step of an EPROM manufacturing method of the present invention.
Figure 78:
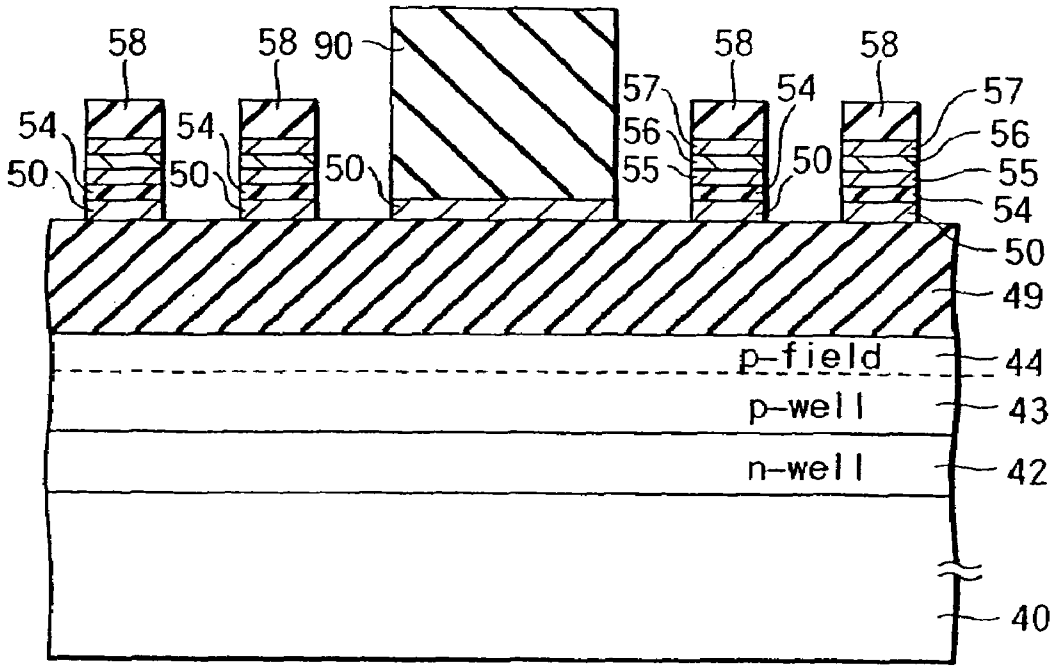
FIG. 78 is a sectional view taken along line LXXVIII-LXXVIII of FIG. 75.
Figure 79:
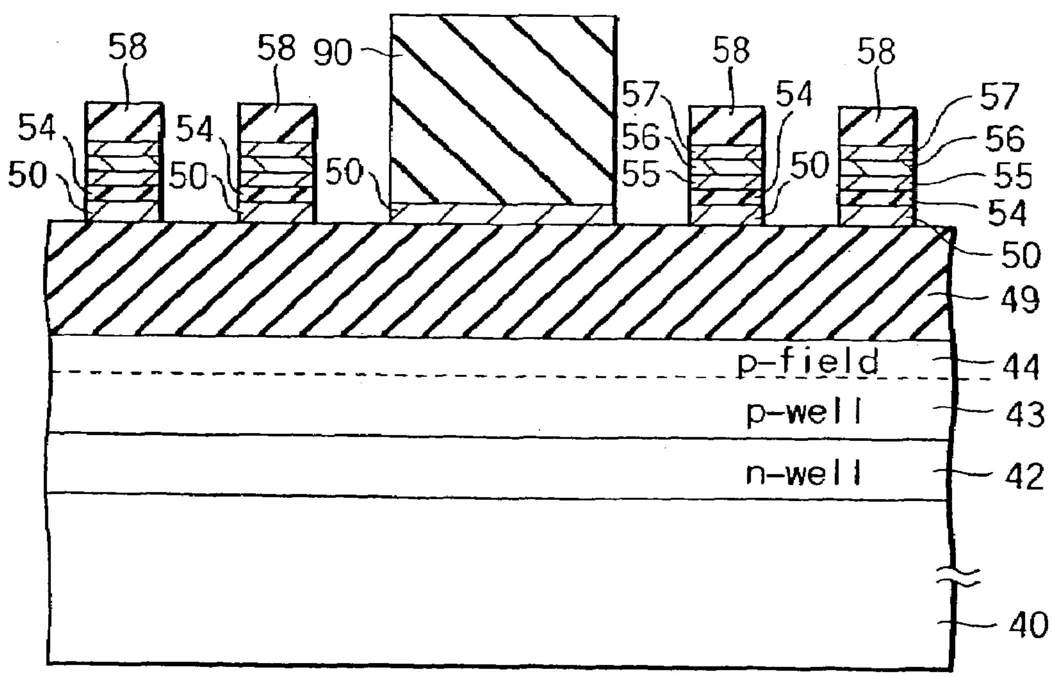
FIG. 79 is a sectional view taken along line LXXIX-LXXIX of FIG. 76.

Next, as shown in FIGS. 72, 73 and 74, using the silicon nitride layer 58 subjected to patterning as a mask, the tungsten silicide layer 57 and the polysilicon layers 56 and 55 are etched in sequence by means of RIE. In this manner, control gate electrodes CG0 to CG15 and upper select gate electrodes SGS and SGD, which all extend in the row direction, are completed.

The upper select gate electrodes SGS and SGD have their portions in which contact areas are to be located removed and are formed at those portions into a pattern in which they are bent at an angle of 90° in the column direction. The adjacent upper select gate electrodes SGS and SGD have also their portions in which contact areas are to be located removed.

Next, as shown in FIGS. 75 to 79, by using PEP a resist pattern 90 is formed on the portions where the contact areas are to be located. Using the resist pattern 90 and the silicon nitride layer 58 as a mask, the insulating layer 54 and the polysilicon layers 50 and 45 are sequentially etched by means of RIE. Thus, floating gate electrodes FG and lower select gate electrodes SGS and SGD (gate areas and contact areas), which all extend in the row direction, are completed. After that, the resist pattern 90 is removed.

Figure 80:
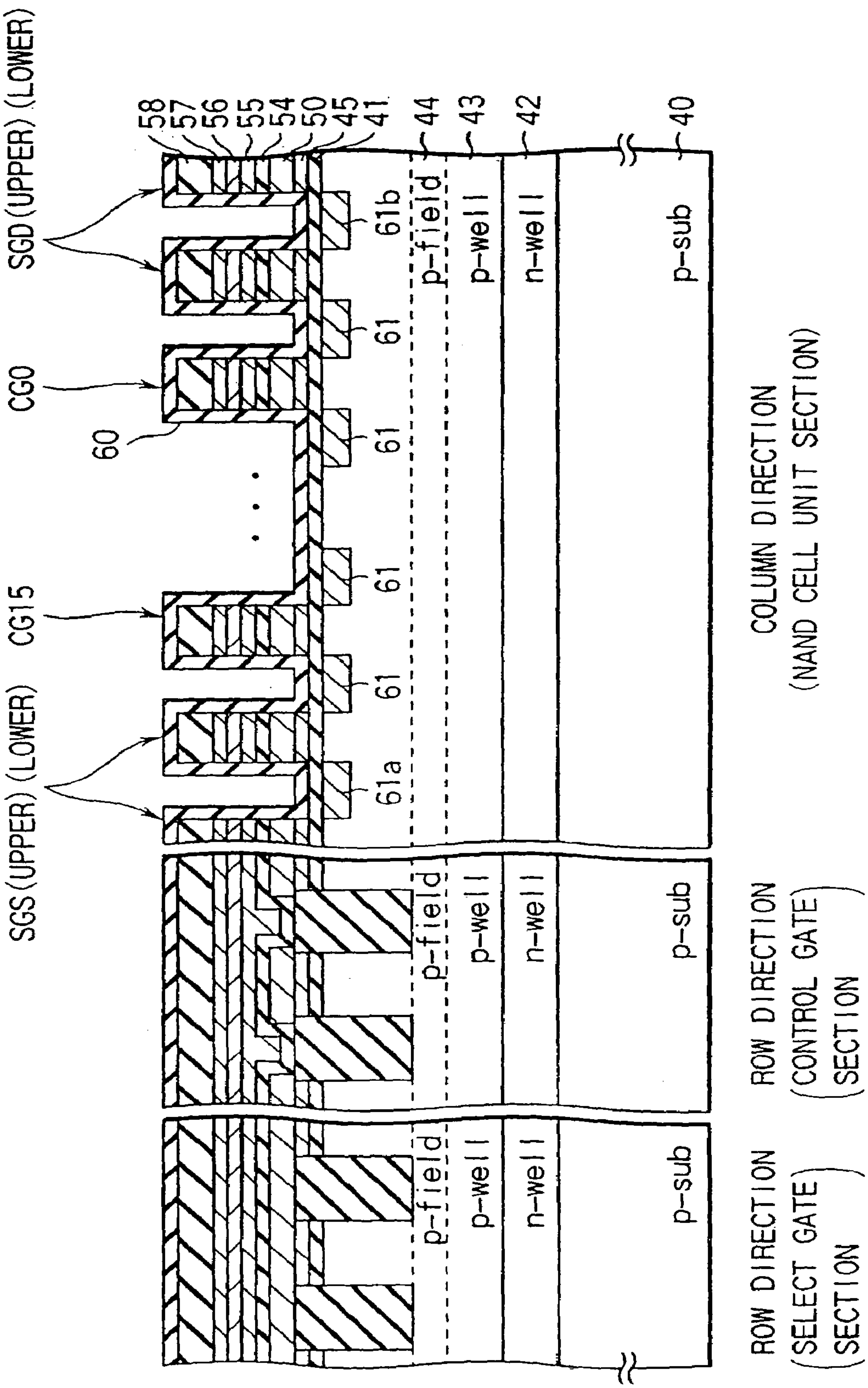
FIG. 80 is a sectional view illustrating a step of an EPROM manufacturing method of the present invention.

Next, as shown in FIG. 80, using the silicon nitride layer 58 (the control gate electrodes and the select gates) as a mask, n-type impurities (phosphorous or arsenic) are ion-implanted into the p-well region 43 using a self-aligned process to form n-type diffused layers 61, 61*a* and 61*b*. The diffused layer 61*a* serves as the source of a NAND cell unit and the diffused layer 61*b* serves as the drain of the NAND cell unit.

A silicon nitride layer 60 is formed at a thickness of about 60 nm on the sidewall of the control gate electrodes CG0 to CG15, the select gate electrodes SGS and SGD, and the floating gate electrodes FG by means of CVD.

Figure 81:
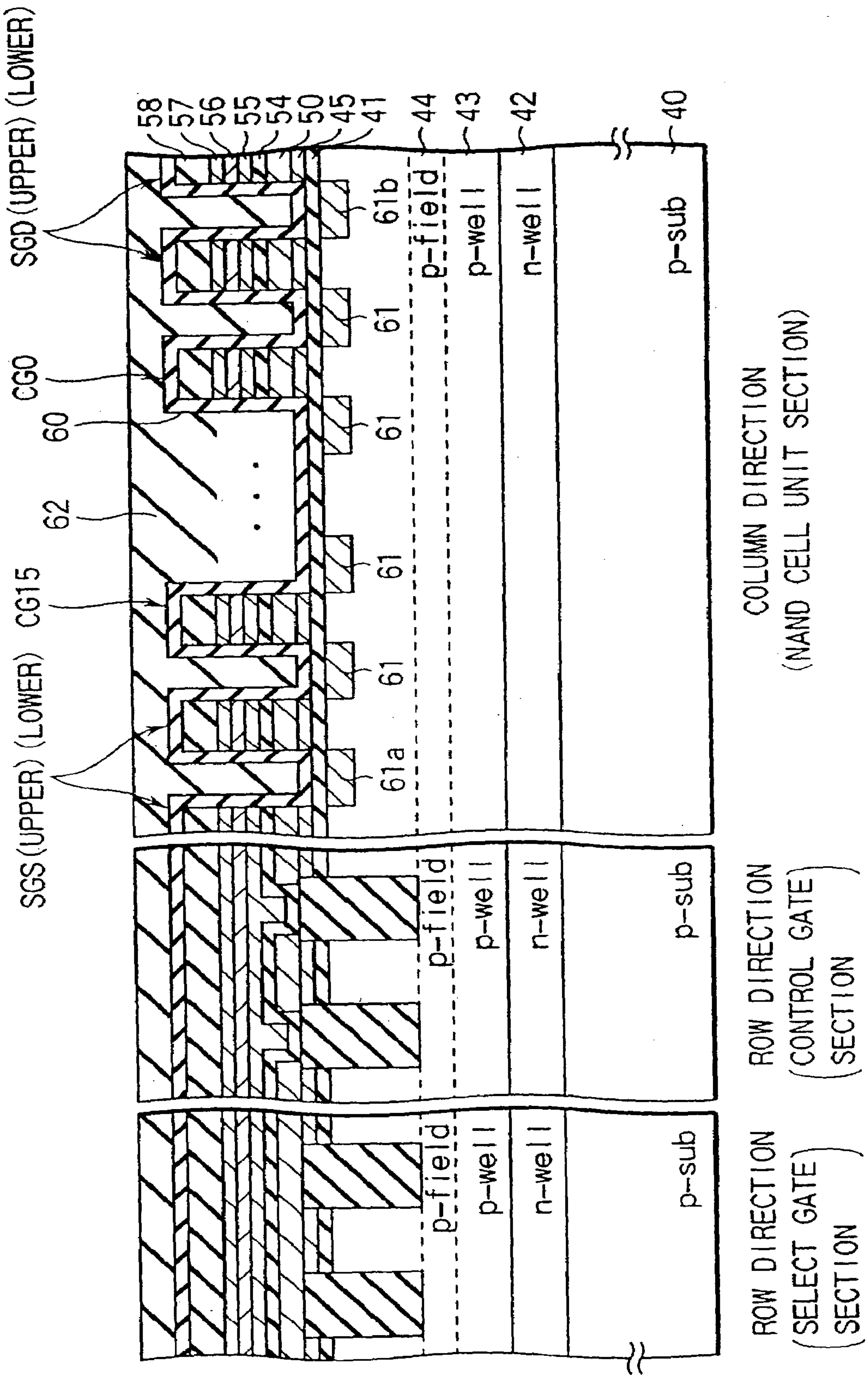
FIG. 81 is a sectional view illustrating a step of an EPROM manufacturing method of the present invention.
Figure 82:
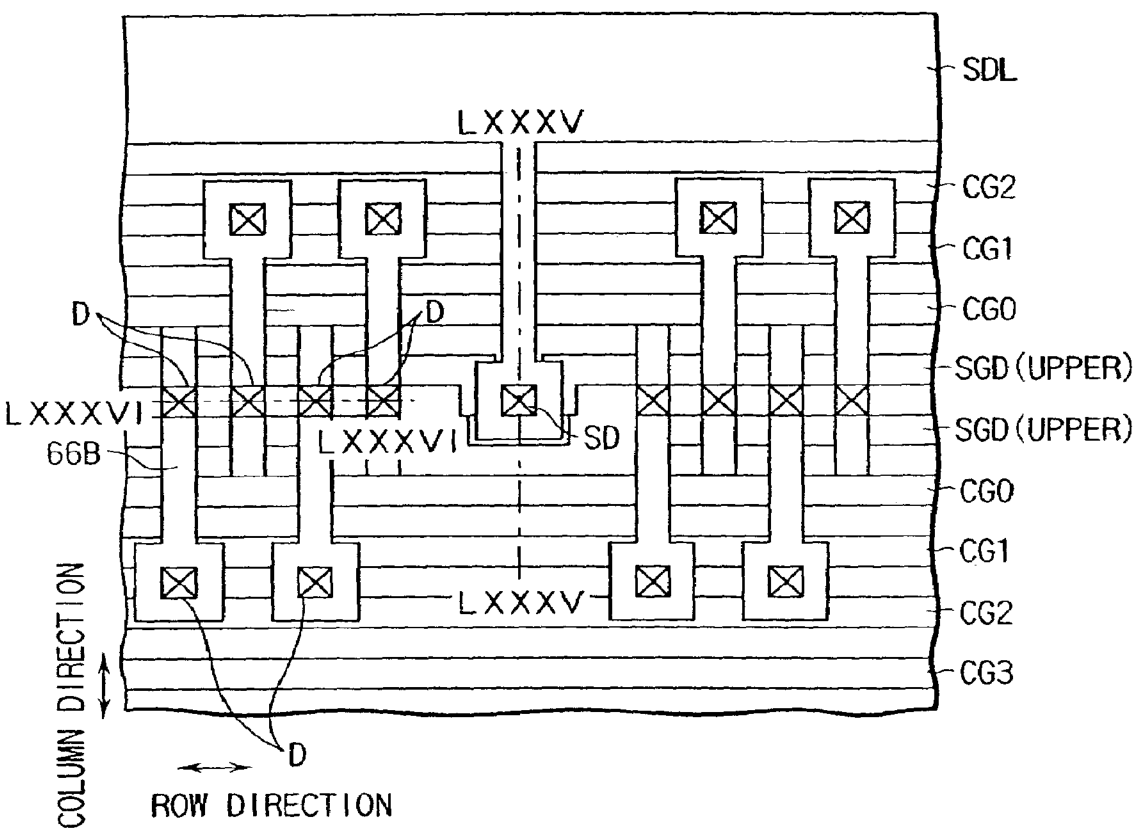
FIG. 82 is a plan view illustrating a step of an EPROM manufacturing method of the present invention.
Figure 83:
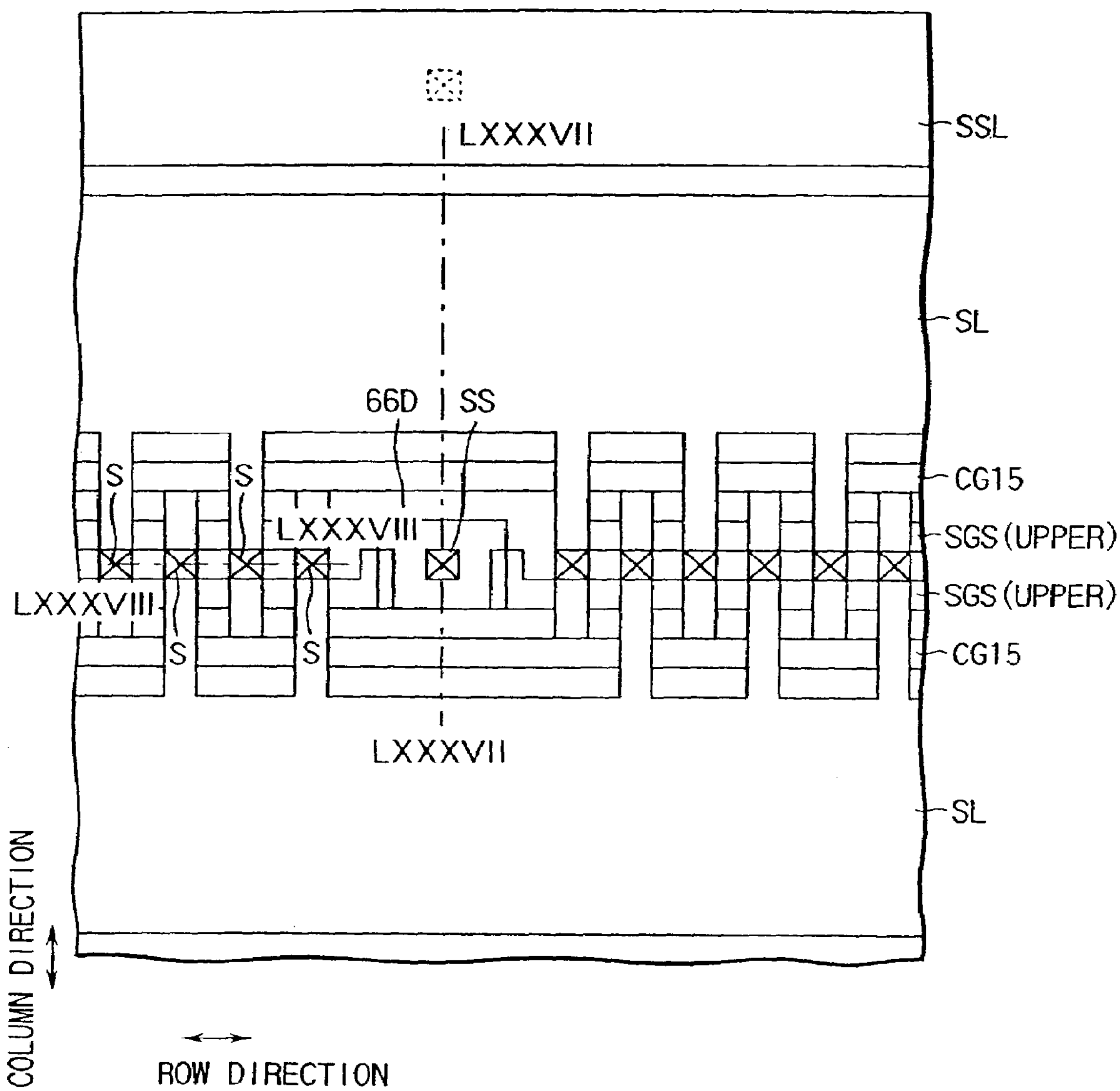
FIG. 83 is a plan view illustrating a step of an EPROM manufacturing method of the present invention.
Figure 84:
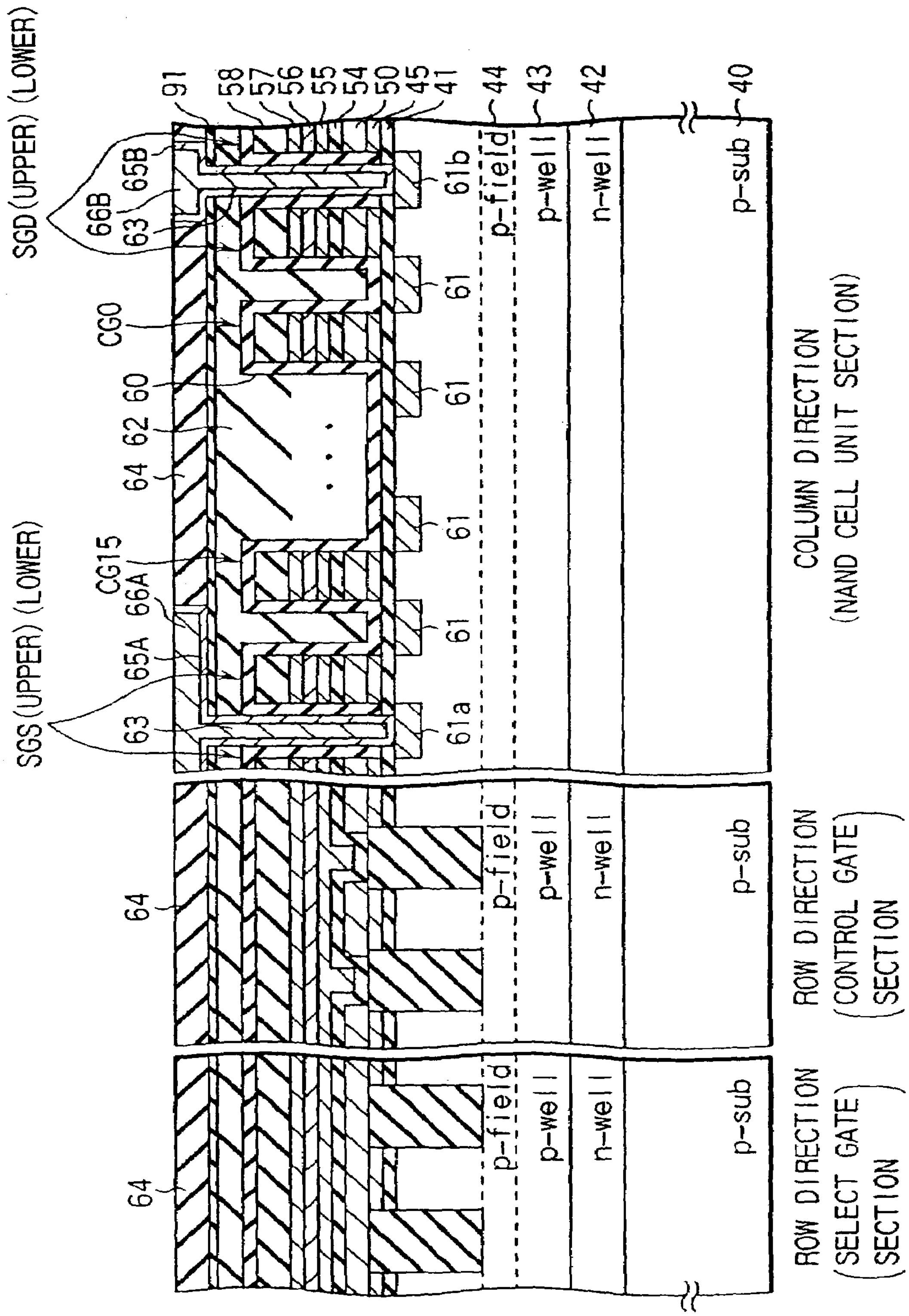
FIG. 84 is a sectional view illustrating a step of an EPROM manufacturing method of the present invention.
Figure 85:
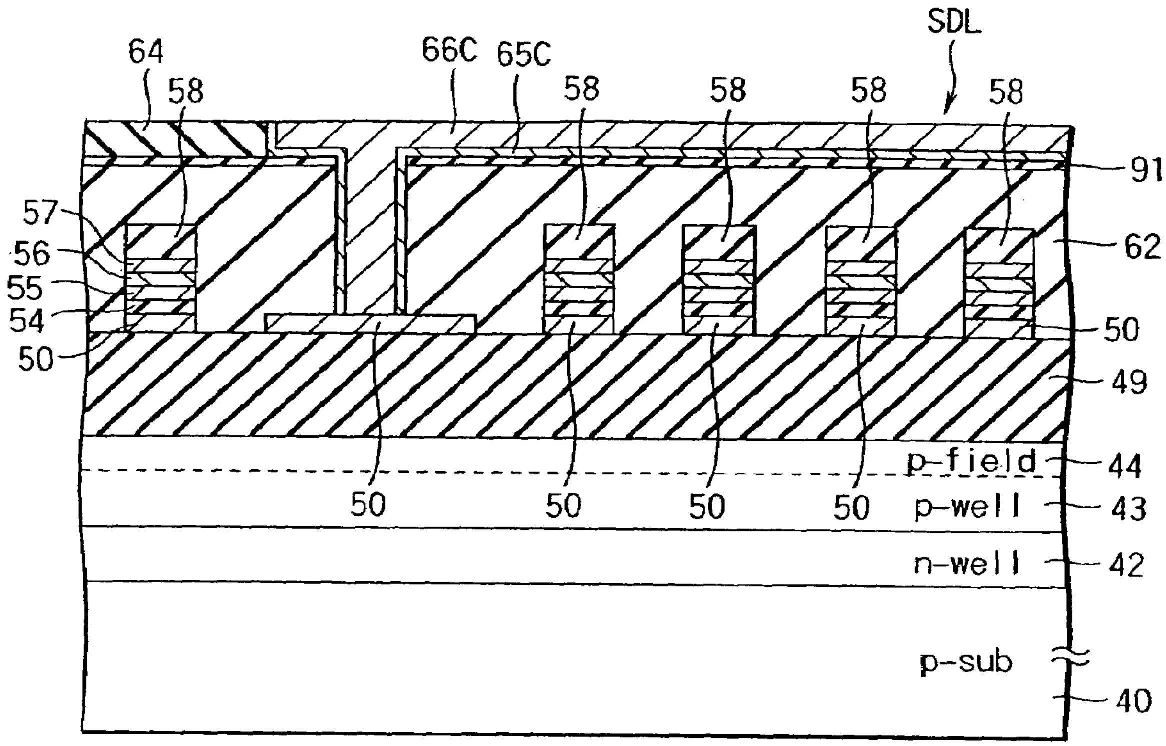
FIG. 85 is a sectional view taken along line LXXXV-LXXXV of FIG. 82.
Figure 86:
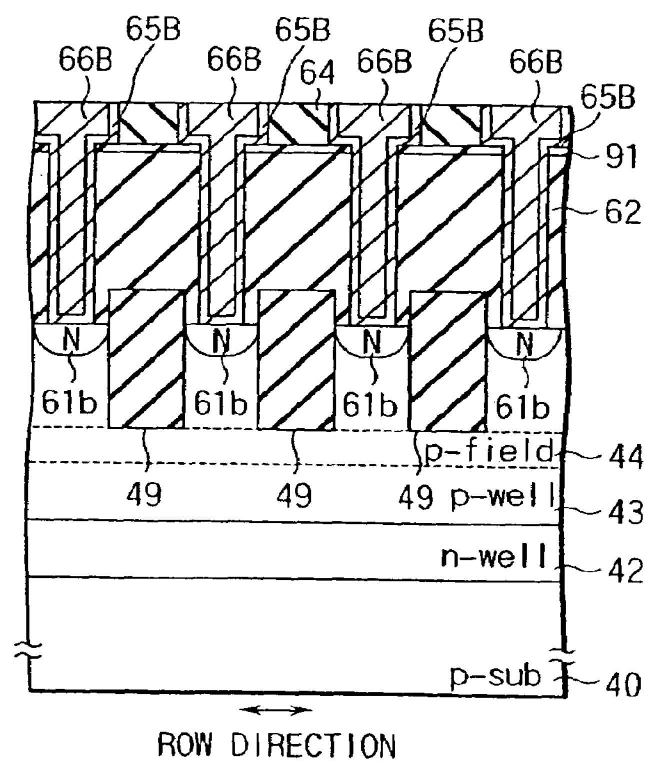
FIG. 86 is a sectional view taken along line LXXXVI-LXXXVI of FIG. 82.
Figure 87:
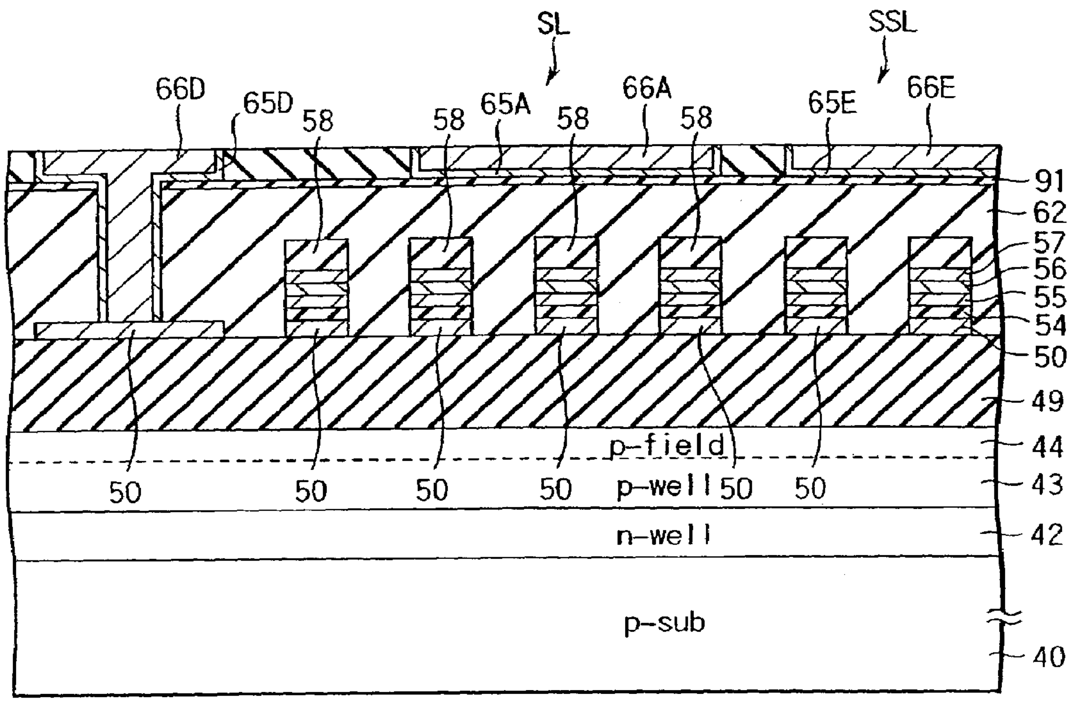
FIG. 87 is a sectional view taken along line LXXXVII-LXXXVII of FIG. 83.
Figure 88:
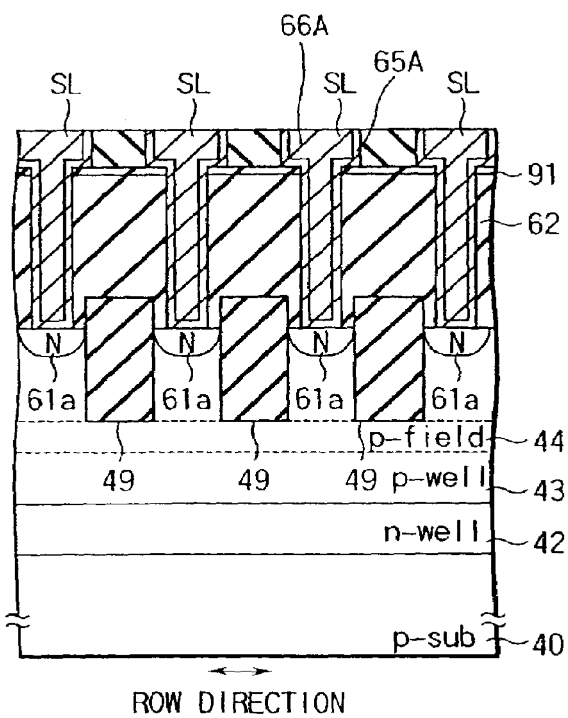
FIG. 88 is a sectional view taken along line LXXXVIII-LXXXVIII of FIG. 83.

Next, as shown in FIG. 81, a BPSG layer 62 of about 1.45 μm is formed over the silicon nitride layer 60. Using CMP the BPSG layer 62 is polished by about 0.4 μm to planarize its surface.

Next, as shown in FIGS. 82 to 88, a silicon nitride layer 91 serving as an etching stopper is formed over the BPSG layer 62. A TEOS layer 64 is then formed over the silicon nitride layer 91.

A resist pattern is then formed by PEP. Using this resist pattern as a mask, the TEOS layer 64 is etched by means of RIE to define trenches for interconnections in the TEOS layer. At this point, the silicon nitride layer 91 acts as an etching stopper for RIE. The resist pattern is then removed.

A resist pattern is formed again by means of PEP. Using this resist pattern as a mask, contact holes S and D are formed by means of RIE in the BPSG layer 62, the silicon nitride layer 60, and the silicon oxide layer 41 to reach the diffused layer (source) 61*a* and the diffused layer (drain) 61*b*. At the same time, by this RIE process contact holes SS and SD are formed to reach the first-level select gate electrodes SGS and SGD. After that, the resist pattern is removed.

Next, a barrier metal layer 65 (65A to 65E) made of, for example, a stack of titanium nitride and titanium is formed on the inside surfaces of the interconnection trenches and the contact holes. Over the TEOS layer 64 a tungsten layer 66 (66A to 66E) is formed to fill up the interconnection trenches and the contact holes. The tungsten layer 66 is polished by means of CMP to remain only within the interconnection trenches and the contact holes. Thus, source interconnections SL connected to the sources of the NAND cell units, interconnections 65B and 66B connected to the drains of the NAND cell units, interconnections SDL connected to the drain-side lower select gate electrodes SGD, and other interconnections 65D, 66D, and SSL are formed.

Figure 89:
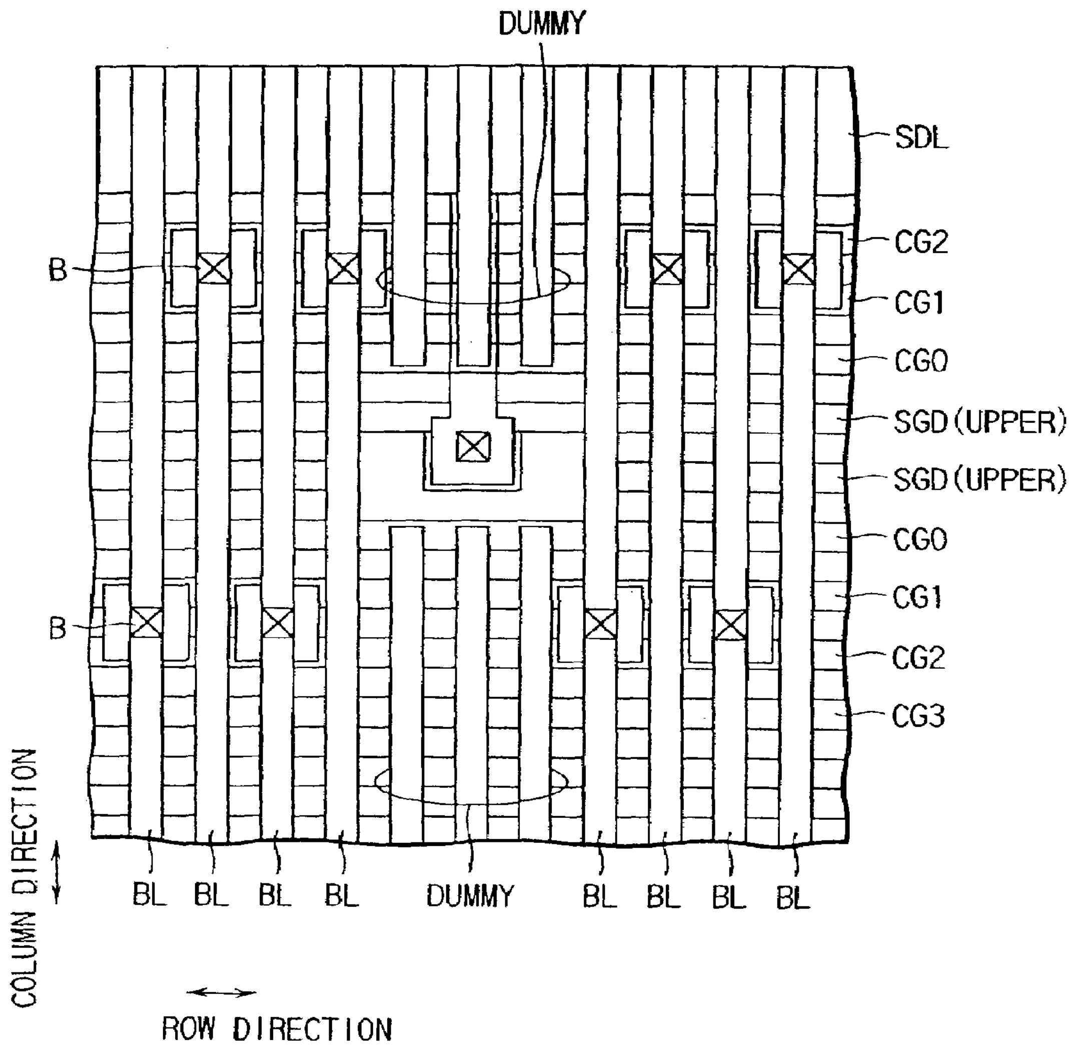
FIG. 89 is a plan view illustrating a step of an EPROM manufacturing method of the present invention.
Figure 90:
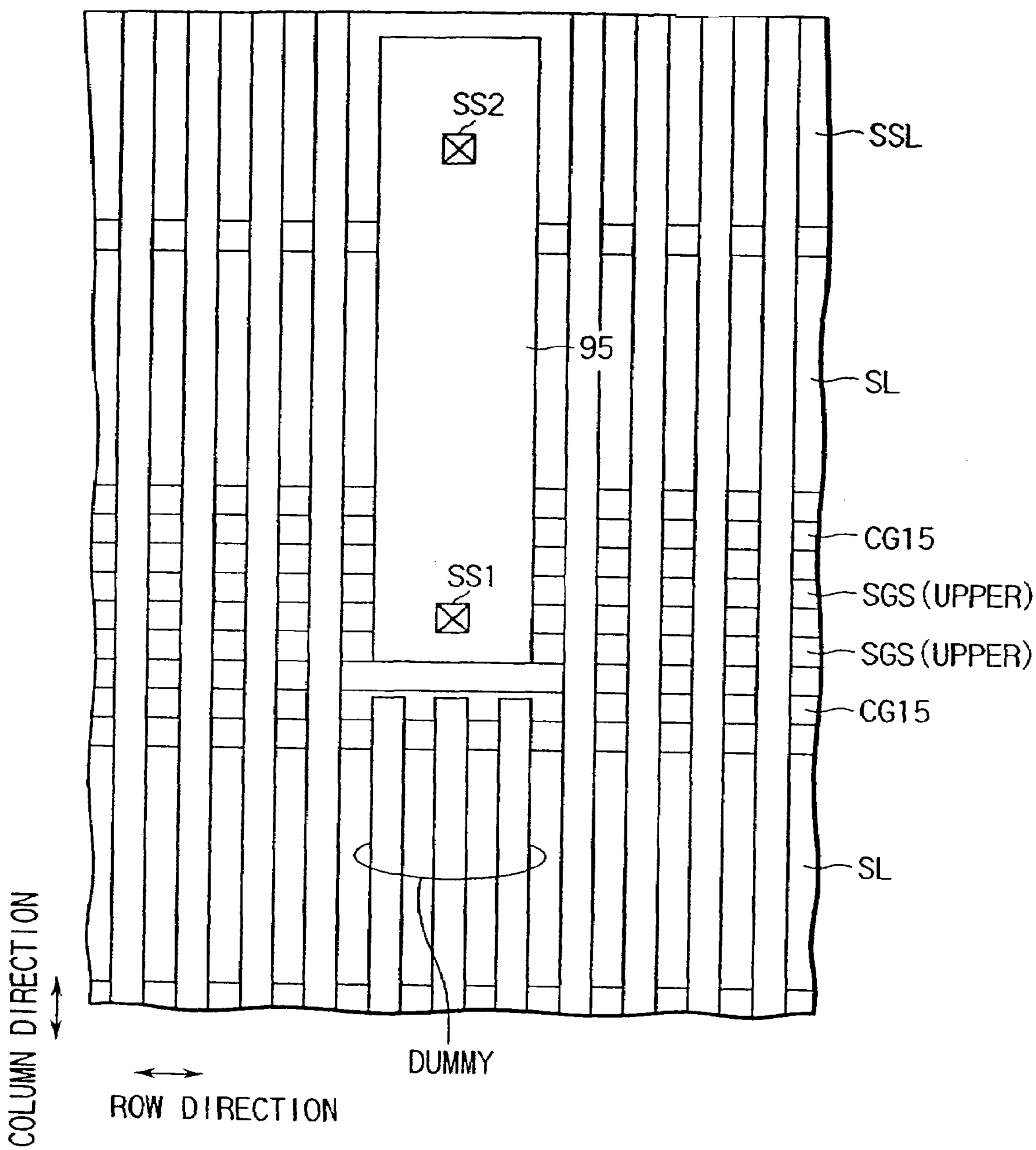
FIG. 90 is a plan view illustrating a step of an EPROM manufacturing method of the present invention.
Figure 91:
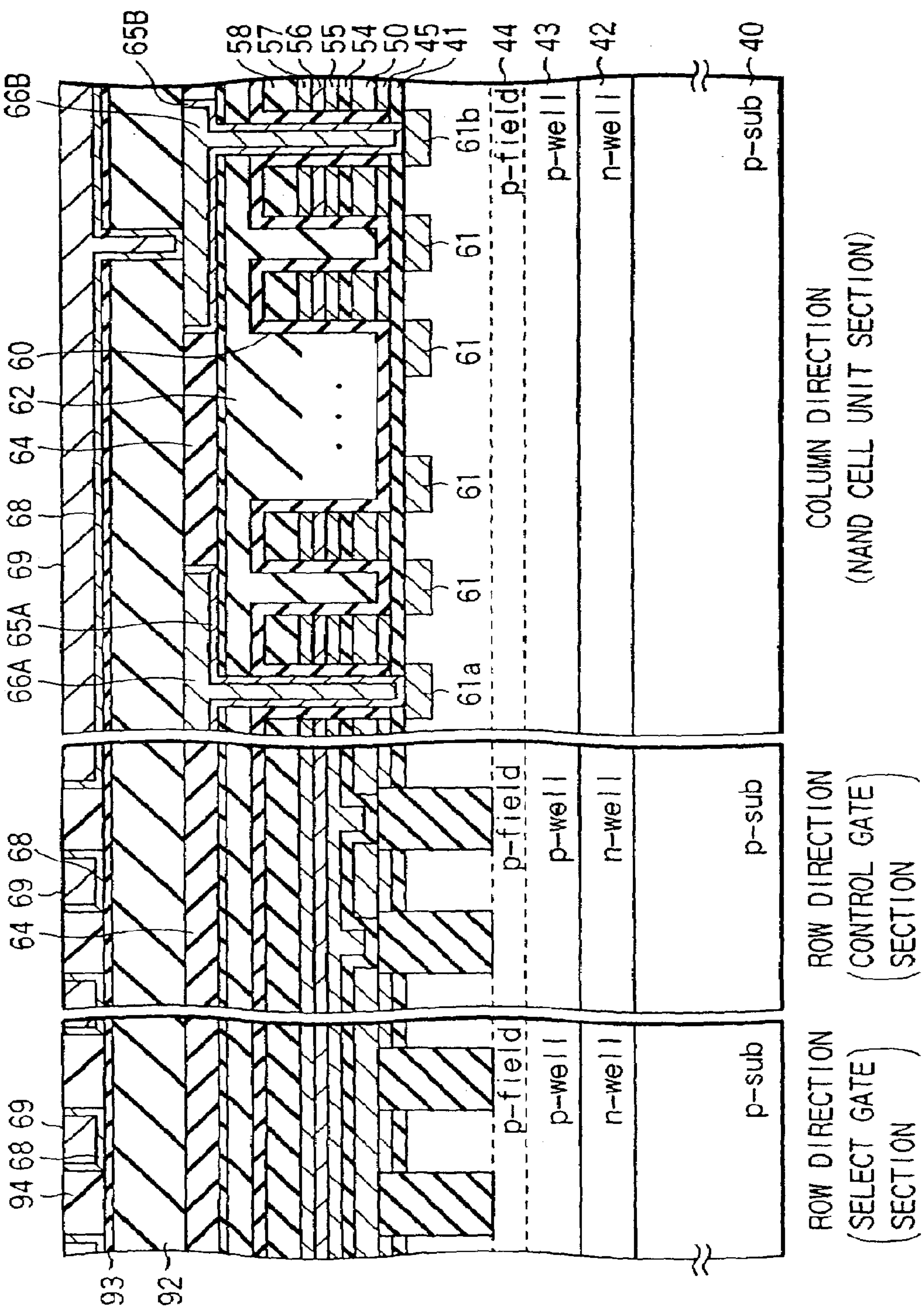
FIG. 91 is a sectional view illustrating a step of an EPROM manufacturing method of the present invention.

Next, as shown in FIGS. 89 to 91, a TEOS layer 92 is formed over the TEOS layer 64. A silicon nitride layer 93 acting as an etching stopper is formed over the TEOS layer 92. Subsequently, a TEOS layer 94 is formed over the silicon nitride layer 93.

A resist pattern is formed by means of PEP. Using this resist pattern as a mask, the TEOS layer 94 is etched by means of RIE to define interconnection trenches for bit lines and dummy bit lines. At this point, the silicon nitride layer 93 acts as an etching stopper for RIE. After that, the resist pattern is removed.

A resist pattern is formed again by means of PEP. Using this resist pattern as a mask the TEOS layer 94 is etched by means of RIE to form contact holes B that reach the interconnections 65B and 66B and other contact holes SS1 and SS2. After that, the resist pattern is removed.

Next, a layer 68 of barrier metal consisting of a stack of, for example, titanium nitride and titanium is formed on the inner surfaces of the interconnection trenches and the contact holes. A layer 69 of metal such as aluminum is formed over the TEOS layer 94 to fill up the interconnection trenches and the contact holes. The metal layer 69 is polished by means of CMP to remain only within the interconnection trenches and the contact holes, thereby forming a plurality of bit lines BL and interconnections 95 for connecting source-side lower select gate electrodes SGS to the interconnections SSL.

A passivation layer consisting of silicon nitride is formed on these interconnections.

By the manufacturing steps thus far described, a NAND flash EEPROM is completed.

The nonvolatile semiconductor memory of the present invention provide the following advantages:

First, the two source- and drain-side select gate electrodes that are adjacent to each other in the column direction have their contact areas formed not to be opposed to each other. One of the select gate electrodes is disconnected at its portions that are opposed to the contact areas of the other select gate electrode.

Thus, the spacing between the gate areas (the linear areas other than the contact areas) of the two select gate electrodes that are adjacent to each other in the column direction can be reduced independently of the size of the contact area, effecting an increase in the storage capacity of the memory cell array or a reduction in the area of the memory cell array.

The first-level select gate electrode, while being disconnected into a plurality of portions, is connected as a whole with the upper interconnection via contact areas. If the upper interconnection is made of a low-resistivity material (e.g., a barrier metal layer of titanium nitride and titanium and a layer of tungsten), the resistivity of the select gate electrode can be decreased.

Second, the second-level select gate electrode is removed in portions where the contact areas for the first-level select gate electrode are formed. The pattern of the second-level select gate electrode in the neighborhood of the contact areas has its length r in the column direction larger than the gate length g of the select gate electrode (for example, the pattern is bent at an angle of 90° in the column direction). Naturally, the first-level select gate electrode is present immediately below the second-level select gate electrode.

Thus, even if resist misalignment occurs during a photolithographic process for patterning the contact area for the first-level select gate electrode, the length of contact between the contact area and the gate area of the first-level select gate electrode will not be so reduced as to increase the resistance of the first-level select gate electrode.

Although the embodiments have been described in terms of NAND flash EEPROM, the present invention can be adapted to nonvolatile semiconductor memories such as of NOR, AND, and DINOR types that have two adjacent select gate lines (electrodes).

[II] As for EEPROMs which are non-volatile semiconductor memories, EEPROMs of various types have been known: such as of a NAND cell type, of a NOR cell type, of a DINOR cell type and of an AND cell type. Especially, a NAND cell EEPROM having a NAND series composed of a plurality of memory cells which are serially connected has drawn attention as an EEPROM which can secure a layout convenient for high integration of elements (increase in storage capacity).

Figure 92:
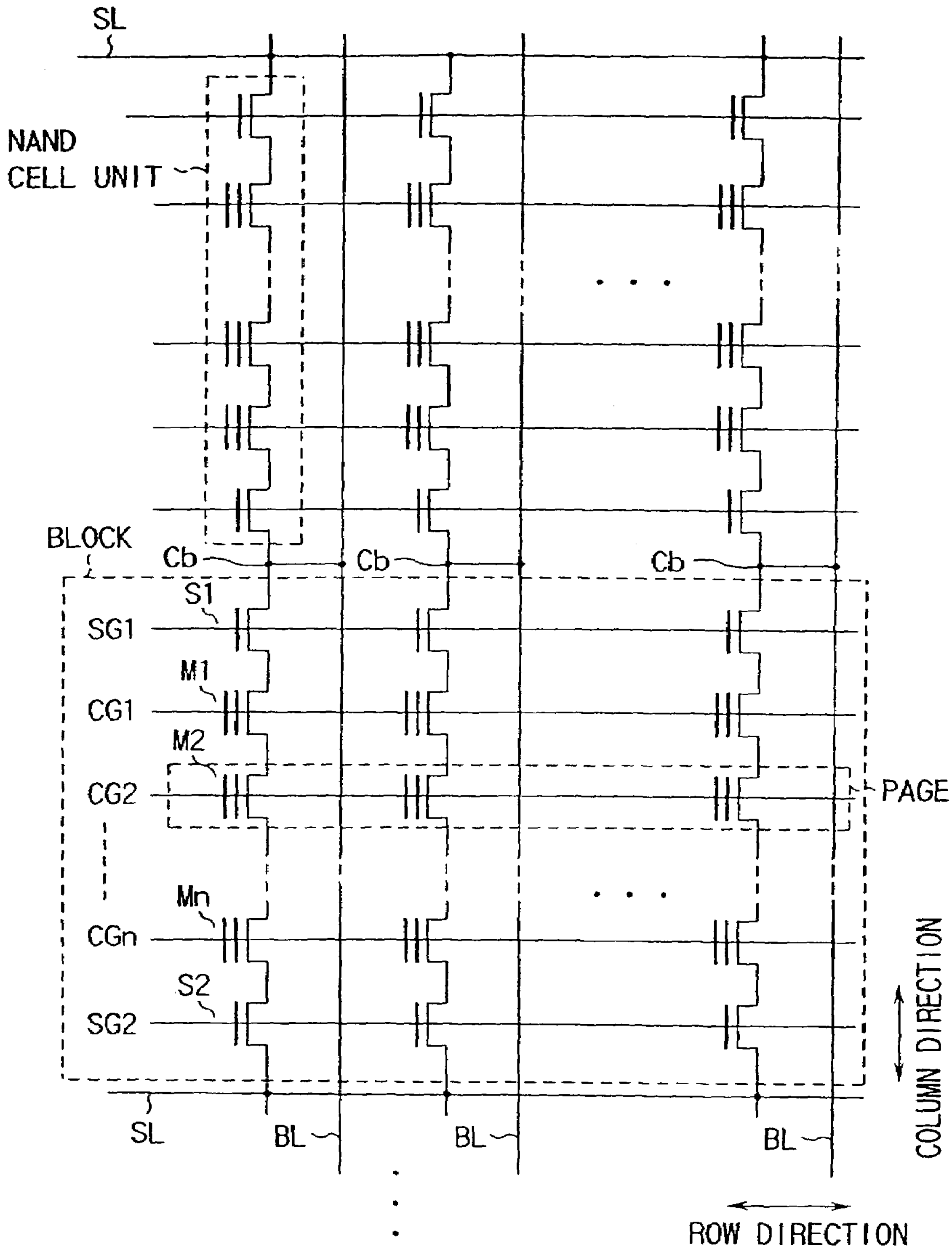
FIG. 92 is a circuit diagram of a memory cell array area of a NAND cell EEPROM.

FIG. 92 shows a circuit diagram of a memory cell array area of a NAND cell EEPROM.

A NAND cell unit comprises: a NAND line composed of a plurality of memory cells (for example, 4, 8 or 16 memory cells) M1 to Mn serially connected; and select transistors S1 and S2 which are respectively connected to both ends thereof. One end of the NAND cell unit is connected to a source line SL and the other end is connected to a bit line BL.

A memory cell array comprises a plurality of blocks. A plurality of NAND cell units is located in the row direction in one block BLOCK. Word lines (control gate lines=control gate electrodes) CGi (i=1, 2, . . . n) and select gates (select gate electrodes) SG1 and SG2 extend in the row direction, while bit lines extend in the column direction.

A plurality of memory cells which are connected to one word line (control gate line) constitutes a unit called as page PAGE. Generally, data included in one page are read in one read operation. The data included in one page are latched in a latch circuit and after that, serially output externally from the memory chip.

Operation of the NAND cell EEPROM of FIG. 92 will be described below.

In one NAND cell unit, data write operations are performed on the memory cells in the order of from a memory cell farthest from a bit line contact section Cb, that is a memory cell Mn closest to a source line SL to a memory cell closest to the bit line contact section Cb, that is a memory cell M1 closest the bit line BL, sequentially one cell at a time.

In a write operation, a word line which has been selected (hereinafter simply expressed as "selected"), that is a control gate electrode of a selected memory cell, is applied with a high potential VPP (on the order of 20V). Control gate electrodes (word lines which have not been selected; hereinafter expressed as "non-selected") of memory cells existent in the bit line contact section Cb side away from the selected memory cell as a boundary and a select gate line SG1 are applied with a medium potential Vmc (for example, on the order of 10V). A select gate line SG2 in the source line SL side is applied with the ground potential (0V). A bit line BL is applied with 0V or the medium potential Vmc (for example, on the order of 8V).

When a bit line BL is applied with 0V, the potential is transmitted to the drain of the selected memory cell by way of a select transistor S1 and a memory cell which is existent in the bit line contact section Cb side away from the selected memory cell. That is, in the selected memory cell, a potential of a control gate electrode assumes a high potential VPP and a potential of a drain assumes 0V, so that electrons move from the drain to the floating gate electrode.

Accordingly, a threshold of the selected memory cell is shifted in a positive direction. This state is considered, for example, as a state that data "1" has been written in a memory cell.

When a bit line is applied with the medium potential Vmb, too, the potential is transmitted to the drain of a selected memory cell by way of the select transistor S1 and a memory cell which is existent in the bit line contact section Cb side away from the selected memory cell. However, in the selected memory cell, since a potential of the control gate electrode assumes the high potential VPP and a potential of the drain assumes Vmb, no electrons move to the floating electrode from the drain.

Accordingly, a threshold of the selected memory cell maintains a negative state without any change. This state is considered, for example, as a state that data "0" has been written.

In the mean time, it is assumed that data of all memory cells which are to be written in are set as the state of "0" (an erased state) in advance.

A data erase operation is performed on all memory cells in a selected block at the same time. That is, all word lines (control gate lines) CG1 to CGn in the selected BLOCK block is set to 0V; and a bit line BL, a source line SL and a p-type well region (or a p-type substrate), and all non-selected word lines CG1 to CGn and all select gate lines SG1 and SG2 in the non-selected blocks are all set to a high potential (on the order of 20V).

With such settings, in all memory cells in the selected block, electrons in the floating gate electrode migrate to a p-type well region (or p-type substrate) and a threshold of all the memory cells is shifted in a negative direction.

A data read operation is performed in such manner that the control gate of a selected memory cell is set to “0,” the control electrodes of the other memory cells, the select gate electrode of select transistors S1 and S2 are all set to an electric source potential Vcc and it is detected whether or not a current flows in the selected memory cell.

Figure 93:
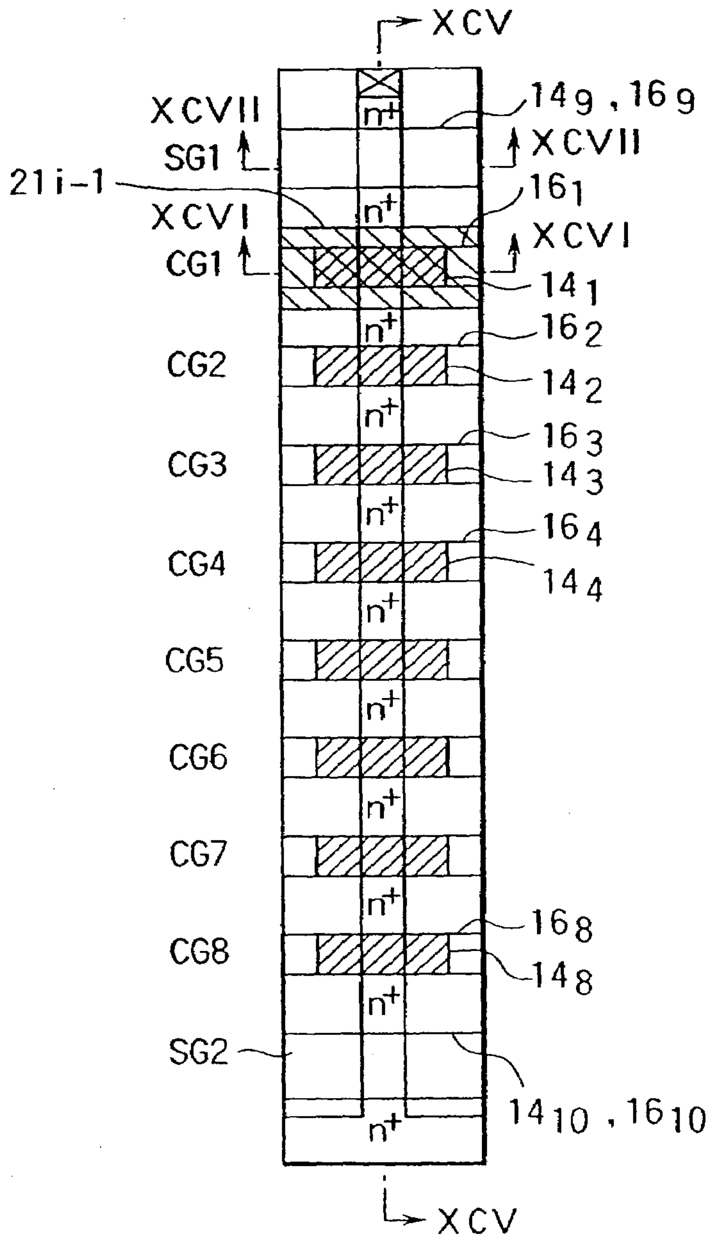
FIG. 93 is a plan view showing a NAND cell unit.
Figure 94:
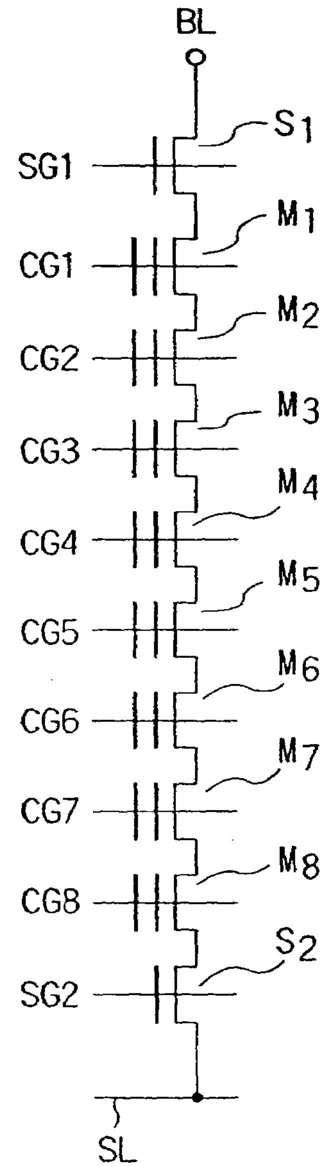
FIG. 94 is a diagram showing an equivalent circuit to the device of FIG. 93.
Figure 95:
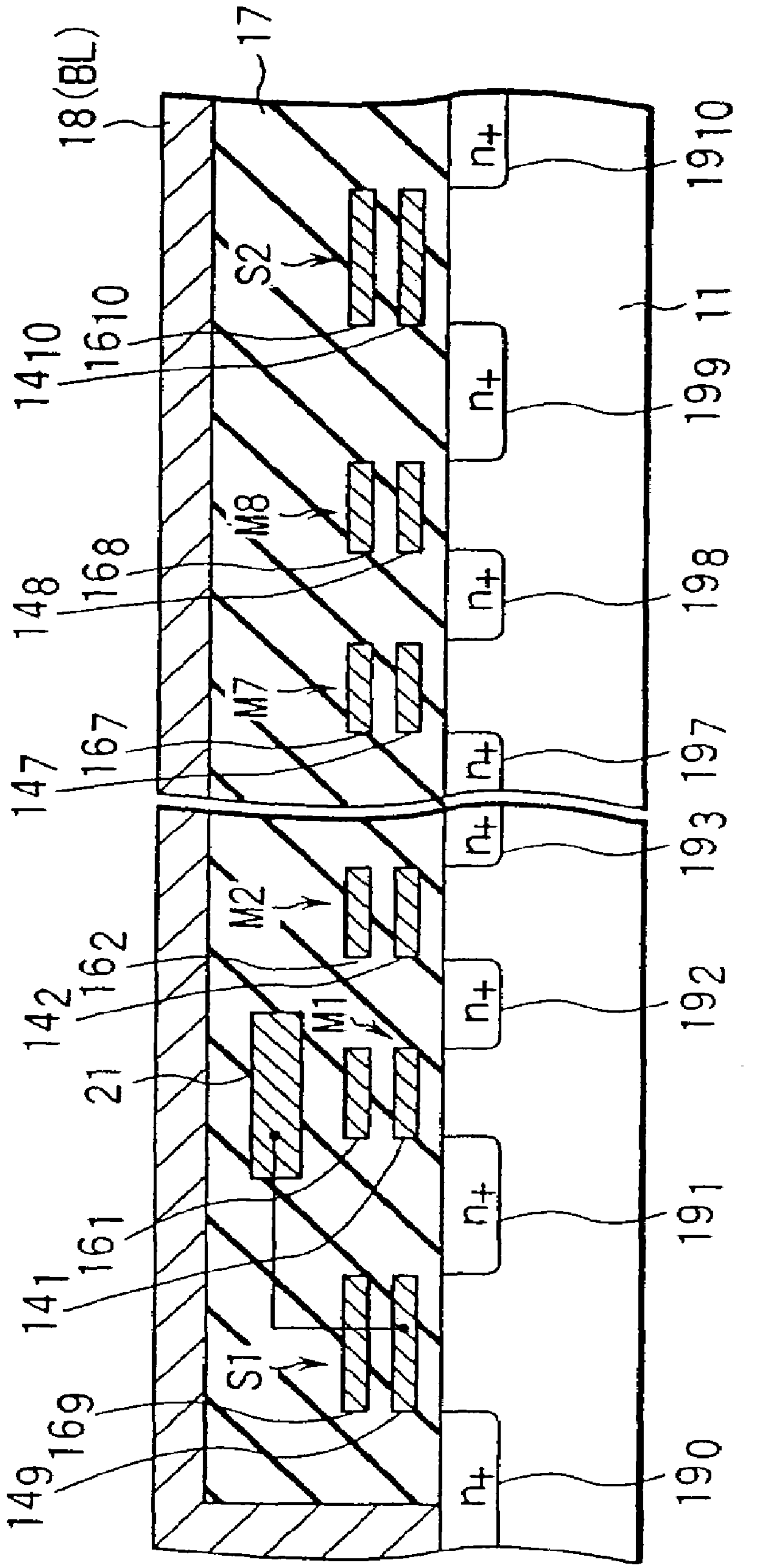
FIG. 95 is a sectional view taken along the line XCV-XCV of FIG. 93.
Figure 96:
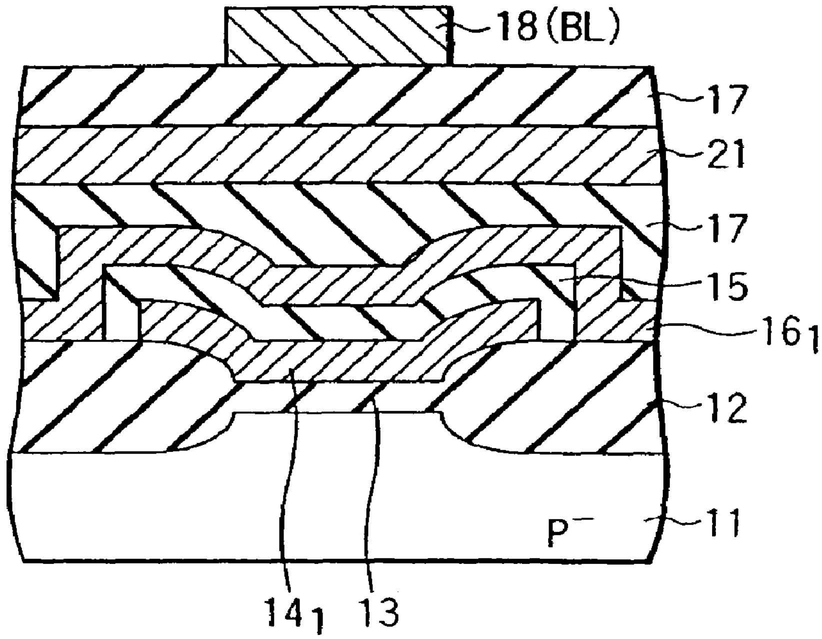
FIG. 96 is a sectional view taken along the line XCVI-XCVI of FIG. 93.
Figure 97:
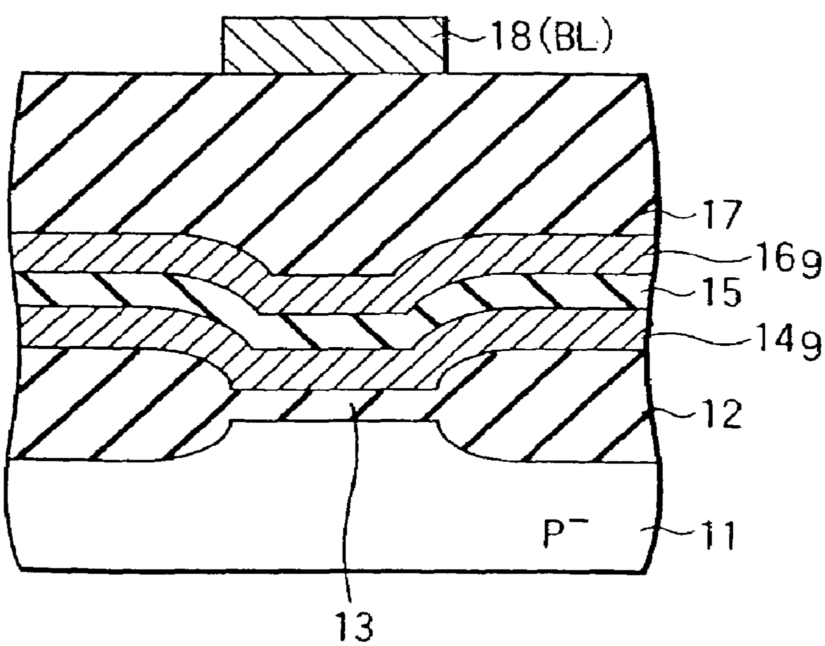
FIG. 97 is a sectional view taken along the line XCVII-XCVII of FIG. 93.

FIG. 93 shows a pattern in a plan of one NAND cell unit in a memory cell array. FIG. 94 is a diagram of an equivalent circuit to the device of FIG. 93. FIG. 95 is a sectional view taken along the line XCV-XCV of FIG. 93, FIG. 96 is a sectional view taken along the line XCVI-XCVI of FIG. 93 and FIG. 97 is a sectional view taken along the line XCVII-XCVII of FIG. 93.

A memory cell of a NAND cell EEPROM has a FET-MOS structure that a floating gate electrode (a charge storage layer) and a control gate electrode (word line) are stacked on a semiconductor substrate with an insulating layer interposed therebetween.

Below, a memory cell structure will be described more particularly.

A device isolation oxide layer 12 is formed on a p-type silicon substrate (or a p-type well region) 11. The device isolation oxide layer 12 is formed so as to surround a device region. A NAND cell unit is formed in the device region.

In this example, one NAND cell unit comprises: a NAND series constructed from 8 memory cells M1 to M8 which are serially connected therebetween and select transistors S1 and S2 which are respectively connected to both ends of the NAND series.

In a device region in which one NAND cell unit is formed, floating gate electrodes $\mathbf{14}_1$, $\mathbf{14}_2$, . . . $\mathbf{14}_8$ are formed on the silicon substrate 11 with a gate insulating layer 13 interposed therebetween. Control gate electrodes $\mathbf{16}_1$, $\mathbf{16}_2$, . . . $\mathbf{16}_8$ are formed on the floating gate electrodes $\mathbf{14}_1$, $\mathbf{14}_2$, . . . $\mathbf{14}_8$ with an inter-layer insulating layer 15 interposed therebetween.

In addition, select gate electrodes $\mathbf{14}_9$, $\mathbf{14}_{10}$, $\mathbf{16}_9$ and $\mathbf{16}_{10}$ are formed on the silicon substrate 11 with the gate insulating layer 13 interposed therebetween.

Select gate electrodes $\mathbf{14}_9$, $\mathbf{14}_{10}$, $\mathbf{16}_9$ and $\mathbf{16}_{10}$ are formed at the same time as when the floating gate electrodes $\mathbf{14}_1$, $\mathbf{14}_2$, . . . $\mathbf{14}_8$ and the control gate electrodes $\mathbf{16}_1$, $\mathbf{16}_2$, . . . $\mathbf{16}_8$ are formed.

The gate electrodes $\mathbf{14}_9$, $\mathbf{14}_{10}$ which are located in lower layers actually function as gate electrodes, among the select gate electrodes $\mathbf{14}_9$, $\mathbf{14}_{10}$, $\mathbf{16}_9$ and $\mathbf{16}_{10}$.

N-type diffused layers $\mathbf{19}_1$, $\mathbf{19}_2$, . . . $\mathbf{19}_9$ are formed in the silicon substrate 11. The n-type diffused layers $\mathbf{19}_1$, $\mathbf{19}_2$, . . . $\mathbf{19}_9$ are in common owned by two transistors (a memory cell and a select transistor) which are adjacent to each other. The diffused layer $\mathbf{19}_0$ which is located at the farthermost end of the drain side is connected to a bit line BL, while the diffused layer $\mathbf{19}_{10}$ which is located at the farthermost end of the source side is connected to a source line SL.

The memory cells M1 to M8 and the select transistors S1 and S2 are covered by the inter-layer insulating layer (for example, a silicon oxide layer) 17 which is formed on the silicon substrate 11. A bit line 18 (BL) is formed on the inter-layer insulating film 17.

An interconnection layer called as a so-called bypass line is formed in a layer which is above a layer in which the control gate electrodes $\mathbf{16}_1$, $\mathbf{16}_2$, . . . $\mathbf{16}_8$ and the select gate electrodes $\mathbf{16}_9$ and $\mathbf{16}_{10}$ are formed, and which is below a layer in which the bit line BL is formed.

Since the bypass line is provided for the purpose to decrease a resistance of an interconnection (a select gate line, a source line and the like) which is formed below the bypass line, a magnitude of the resistance is required to be lower than a resistance of the interconnection formed at least below the bypass line.

In the example, the select gate bypass line 21 connected to the select gate electrode $\mathbf{16}_9$ of the select transistor S1 in the drain side, that is the select gate line SG1, is formed in the inter-layer insulating layer 17.

Figure 98:
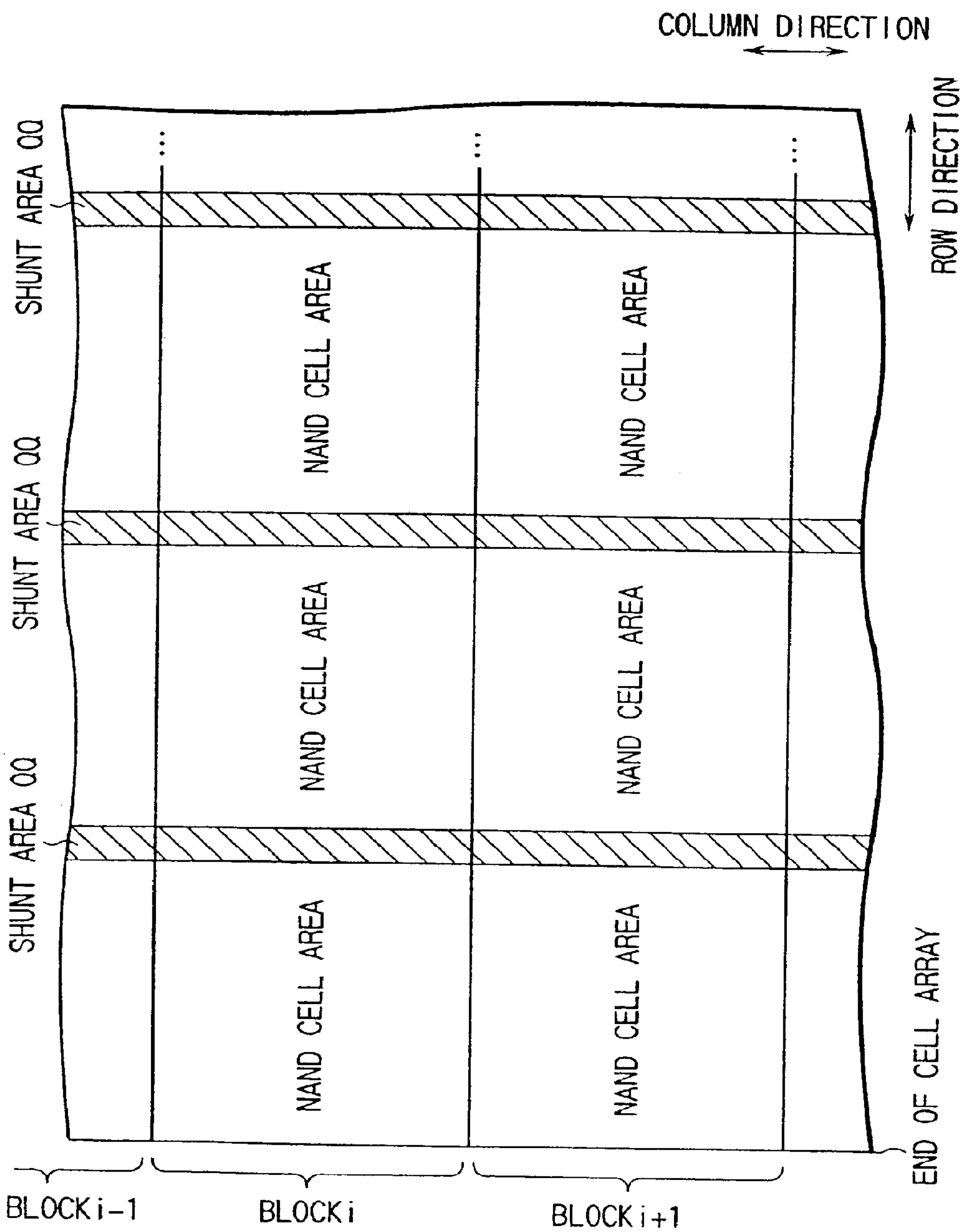
FIG. 98 is a view showing an arrangement example of NAND cell areas and shunt areas.
Figure 99:
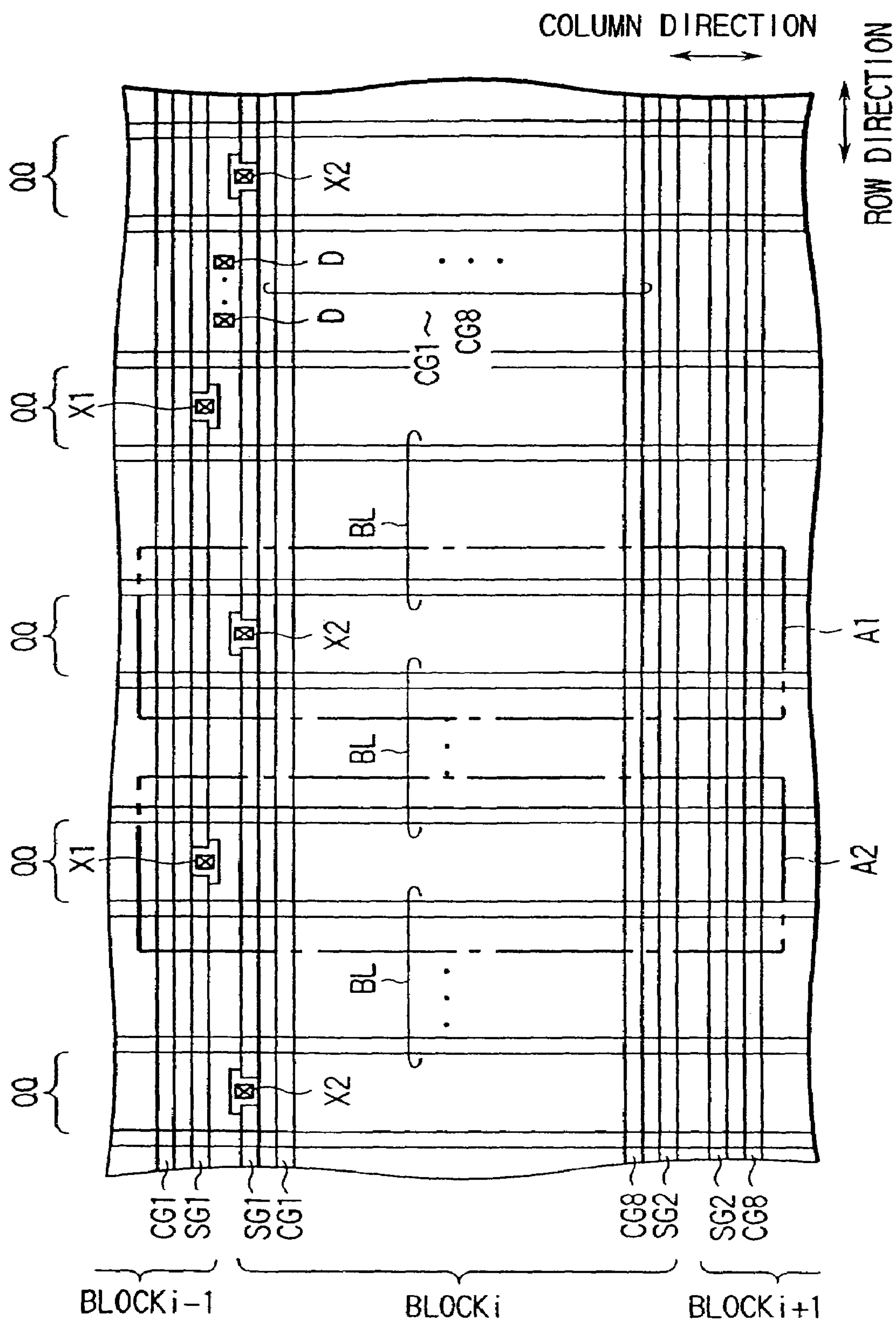
FIG. 99 is a plan view showing a configuration example of a shunt area.

FIG. 98 shows arrangement of NAND cell areas and shunt areas in a memory cell array. FIG. 99 shows a shunt area QQ in the memory cell array.

The shunt area is an area which connects a select gate line with a select gate bypass line.

In the example, the case where a select gate bypass line is provided for the select gate line SG1 is described.

A select gate line SG1 in a BLOCK block i−1 and a select gate line SG1 in a BLOCK block i are adjacent to each other. A contact section X1 which is used for connecting the select gate line SG1 in the BLOCK block i−1 with a select bypass line and a contact section X2 which is used for connecting the select gate line SG1 in the BLOCK block i with the select gate bypass line are not opposed to each other but staggered in the column direction and located alternatively at constant intervals in the row direction.

Figure 100:
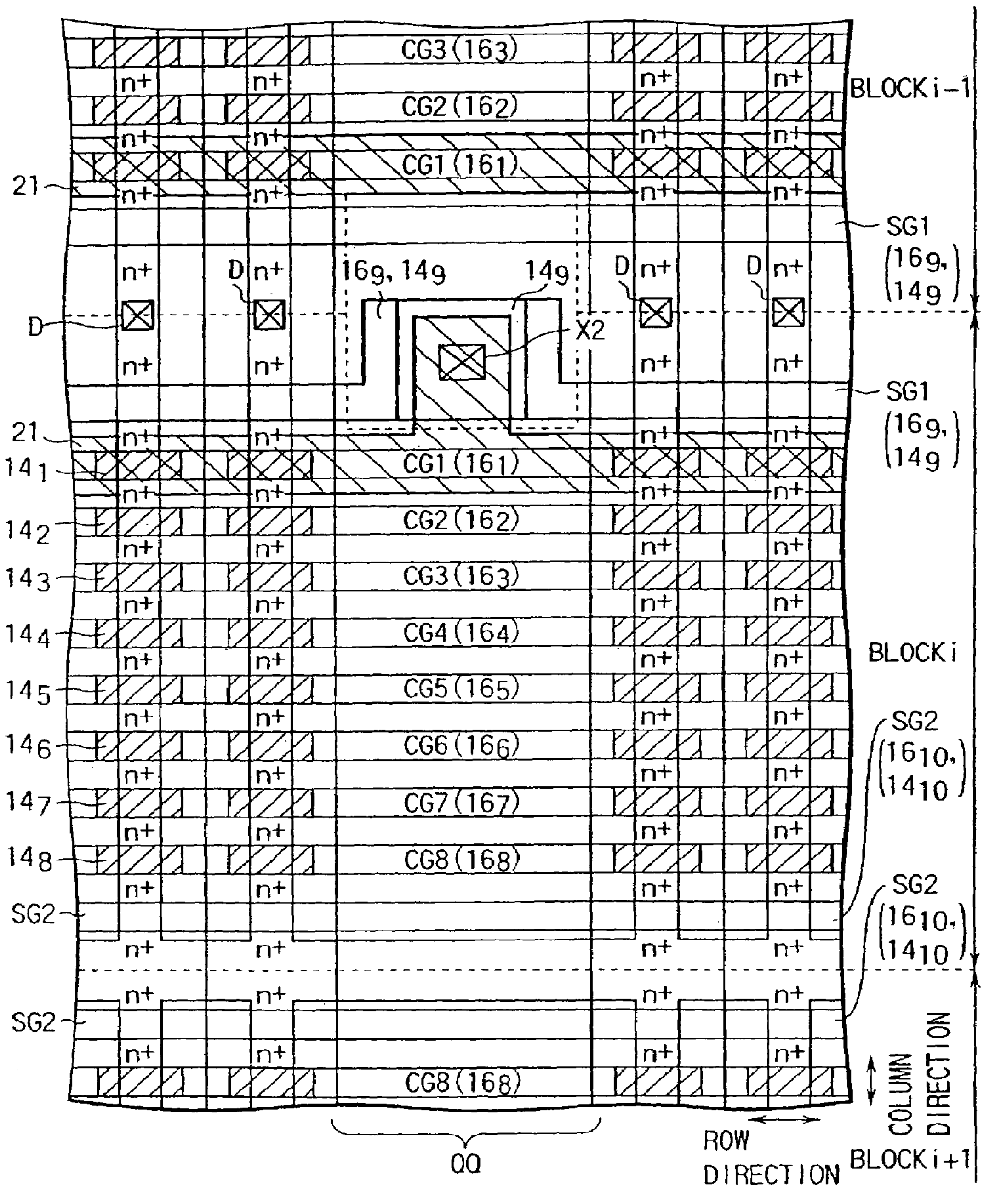
FIG. 100 is a view showing a configuration in the area A1 of FIG. 99.
Figure 101:
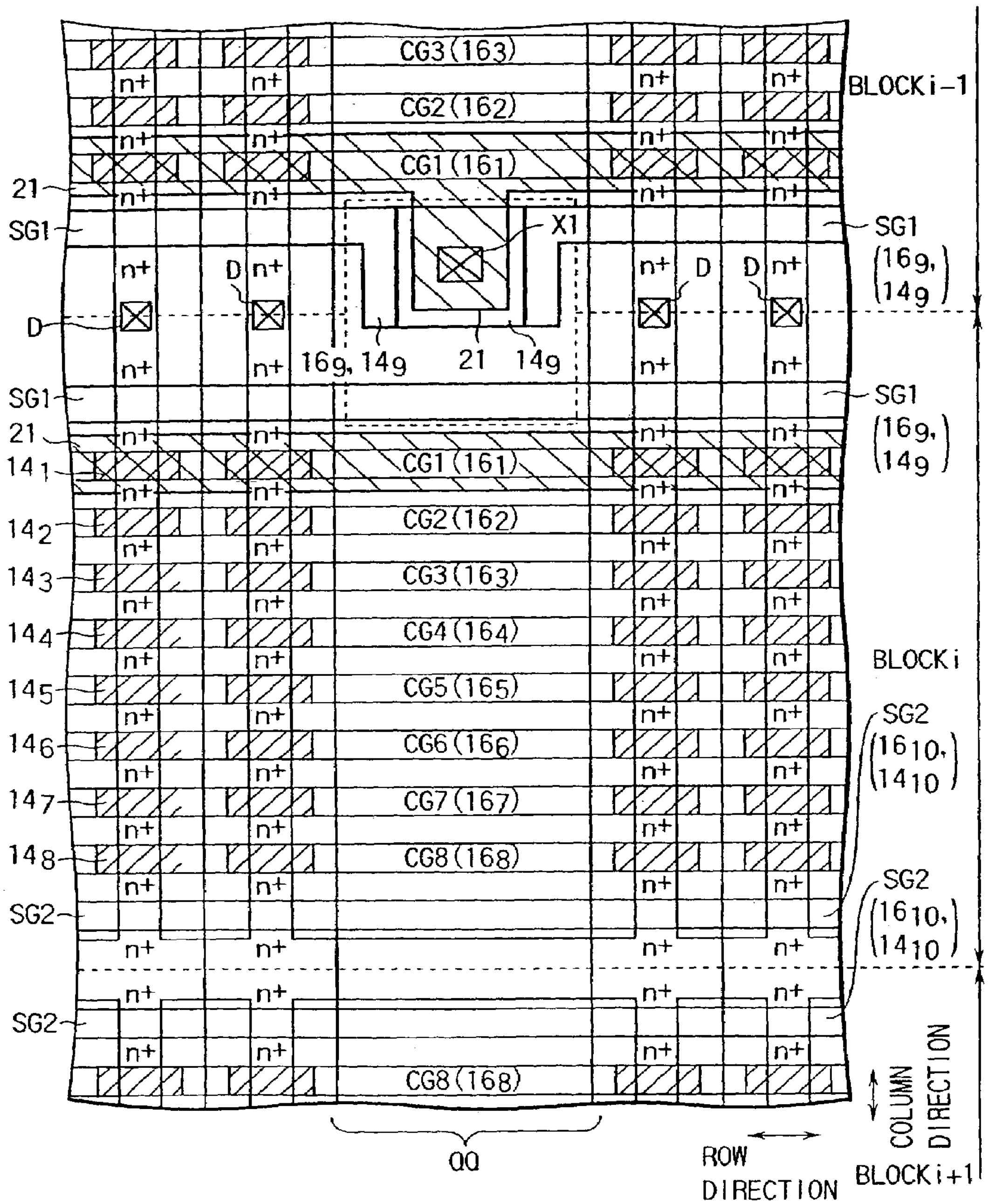
FIG. 101 is a view showing a configuration in the area A2 of FIG. 99.
Figure 102:
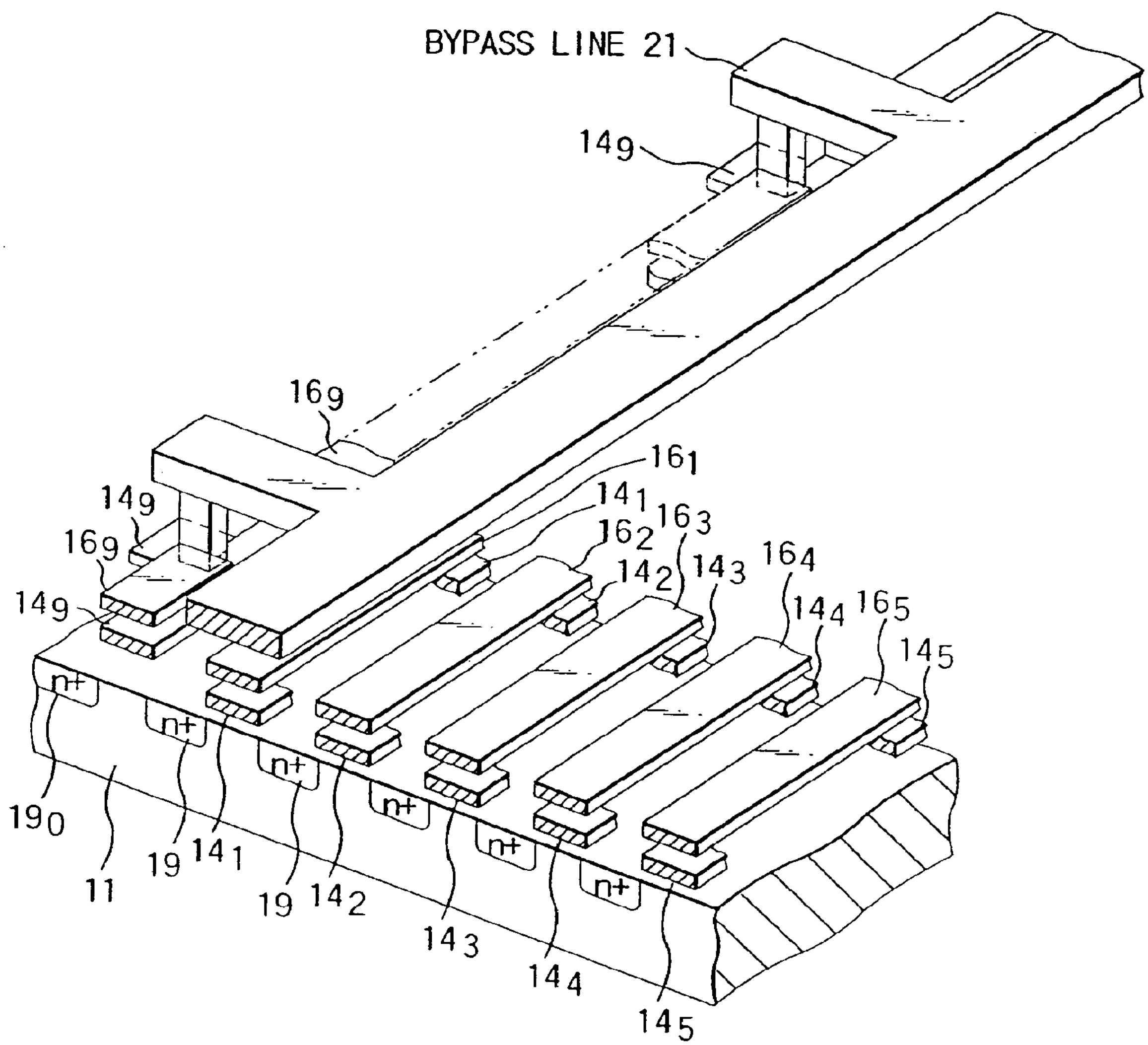
FIG. 102 is a view three-dimensionally showing part of the EEPROM of FIG. 100.

FIG. 100 shows a pattern of the area A1 of FIG. 99 in detail. FIG. 101 shows a pattern of the area A2 of FIG. 99 in detail. FIG. 102 is a view when part of the pattern of FIG. 100 is three-dimensionally represented.

The select gate $\mathbf{16}_9$ extending in the row direction is disconnected in a shunt area QQ, where the select gate line 149 is exposed. The contact sections X1 and X2 for the select gate lines and the select gate bypass lines are provided above the select gate line 149 exposed.

The end of the select gate line $\mathbf{16}_9$ in the shunt area QQ is formed in a shape bent at 90 degrees in order to secure large contact sections X1 and X2. A width of the select gate line 149 is made wide in the contact sections X1 and X2 in the shunt area QQ.

D indicates a contact section for the diffused layer in the drain side of a NAND cell unit.

A NAND cell EEPROM having the above described structure is characterized in that the select gate line SG1 and the select gate bypass line 21 corresponding thereto are existent in the same block and the select gate bypass line 21 is located above one word line (control gate line) CG1. That is, the select gate bypass line 21 is located along a word line CG1 of a memory cell which is closest to the drain so as to cover the word line CG1.

Figure 103:
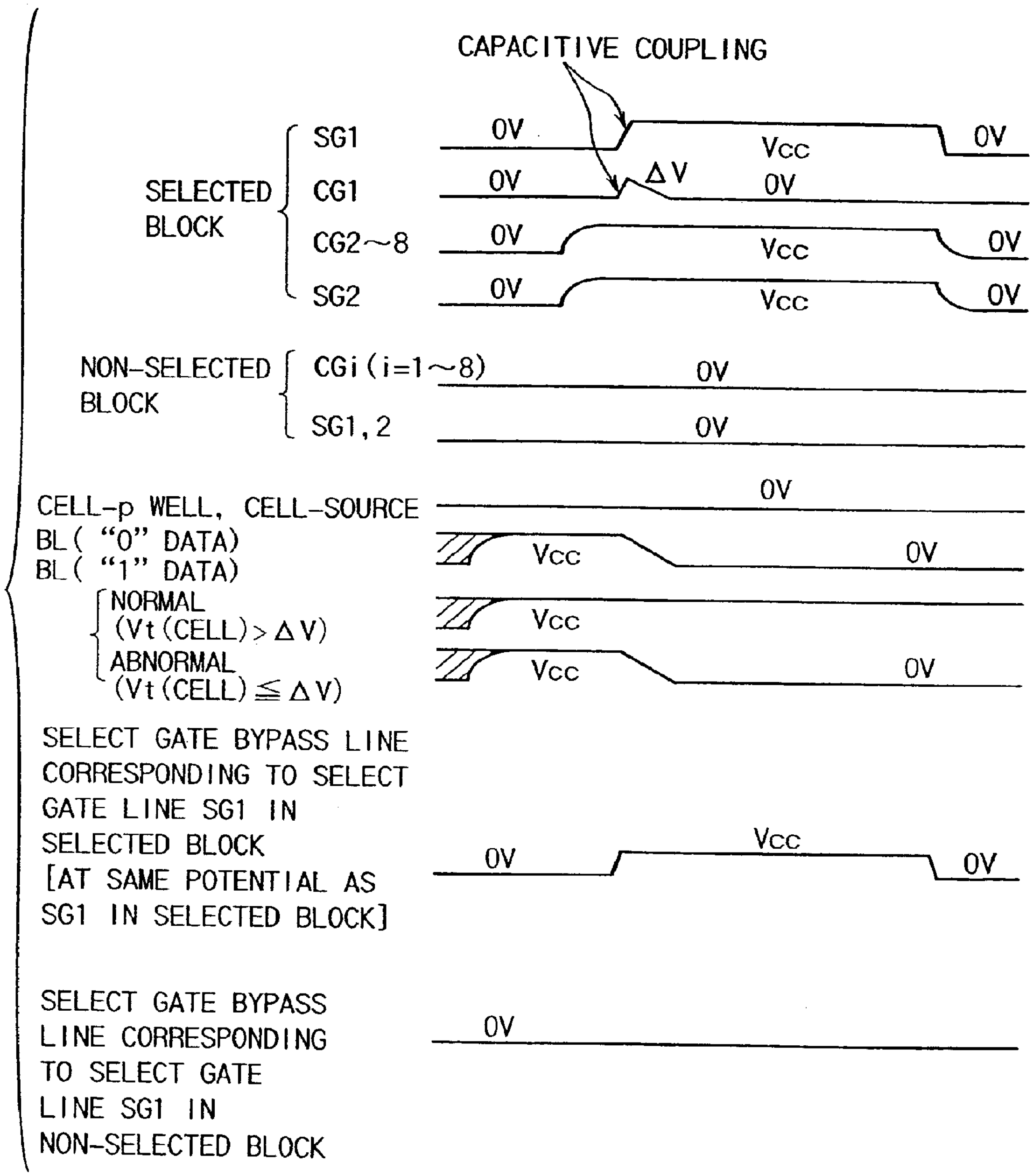
FIG. 103 is a waveform diagram showing an operation example of the EEPROM of FIGS. 100 and 101.

FIG. 103 shows operation timing of a conventional NAND cell EEPROM as described above.

A read operation (when a word line CG1 is selected) is performed in the steps in the following order.

(1) The bit line BL is set in the floating state after being precharged to a source potential Vcc.

(2) Charging to the electric source potential Vcc of non-selected word lines CG2 to CG8 and a select gate line SG2 in a selected block gets started (the selected word line CG1 is maintained at 0V).

(3) Charging to the electric source potential Vcc of a select gate line SG1 gets started and after that, this state is retained for a while.

At this point, when data of a selected memory cell which is connected to the selected word line CG1 is "0," the selected memory cell assumes the ON state and a potential of the bit line BL is lowered. On the other hand, when data of the selected memory cell is "1," the bit line BL maintains the electric source potential Vcc since the selected memory cell assumes the OFF state.

(4) Potentials of the non-selected word lines CG2 to CG8 and the select gate lines SG1 and SG2 in the selected block are set 0V.

When a select gate bypass line is connected to a select gate line SG1, a charging/discharging time of the select gate line SG1 is very much short as compared with a charging/discharging time of word lines CG1 to CG8 and a select gate bypass line SG2 which are not connected to the select gate bypass line since a resistance of the select gate bypass line is very low as compared with those of the select gate line SG2 or the word lines CG1 to CG8.

That is, a speed at which a potential of the select gate line SG1 changes from 0V to Vcc or from Vcc to 0V (where a waveform is steep) is higher than a speeds at which potentials of the word lines CG1 to CG8 and the select gate bypass line SG2 change from 0V to Vcc or from Vcc to 0V (where a waveform is easy).

Accordingly, even when charge timing to the electric source potential Vcc of the select gate line SG1 (the above described (3) step) is later than timing of charging to the electric source potential Vcc of the word lines CG1 to CG8 and the select gate line SG2 (the above described (2) step), a read operation can be performed without any elongation of an operating time.

That is, timing of discharge starting of the bit line BL (timing of data read) can be controlled by charge timing of the select gate line SG1.

However, in the above configuration (a pattern), a select gate bypass line 21 is located right above the word line (control gate line) CG1 so as to cover the word line CG1. Hence, a capacitance between the word line CG1 and the select gate bypass line 21 is very large. That is, variation of a potential of the word line CG1 due to capacitive coupling between the word line CG1 and the select gate bypass line 21 is problematic.

For example, in the (3) step, when charging to the electric source potential Vcc of the select gate SG1 gets started, a potential of the word line CG1 immediately below the select gate bypass line 21 is temporarily raised due to capacitive coupling between the word line CG1 and the select gate bypass line 21.

The rise in potential of the word line CG1 is not problematic when data of a selected memory cell is "0," whereas when the data is "1," there arises a possibility of erroneous read.

That is, a threshold of a selected memory cell which stores "1" data is essentially over 0V. Since a read potential of the word line CG1 is normally 0V, the selected memory cell must maintain the OFF state.

However, when a potential of the word line CG1 is raised by ΔV, provided that a threshold Vt (cell) of the selected memory cell is $0<Vt\ (cell)\leqq \Delta V$, the selected memory cell which must assume the OFF state is shifted to the ON state, whereby a potential of the bit line BL is discharged.

Accordingly, there arises an erroneous read that "1" data is read as "0."

Thus, in a non-volatile semiconductor memory such as a NAND cell EEPROM, a select gate bypass line which is connected to a select gate line has been located right above a word line so as to cover the word line, in connection to the select gate line and the word line in the same block.

Hence, when data of a selected memory cell is read onto a bit line in a data read operation, an erroneous rise in potential of a selected word line in a selected block due to capacitive coupling occurs between a select bypass gate line and the word line (control gate line). In this case, data of a selected memory cell changes from "1" to "0" and hence, there has been a problem that erroneous read (defective data read) occurs.

The present invention which will be described below relates to a layout of a select gate bypass line which can prevent a selected word line in a selected block from potential variation in a read operation.

Figure 104:
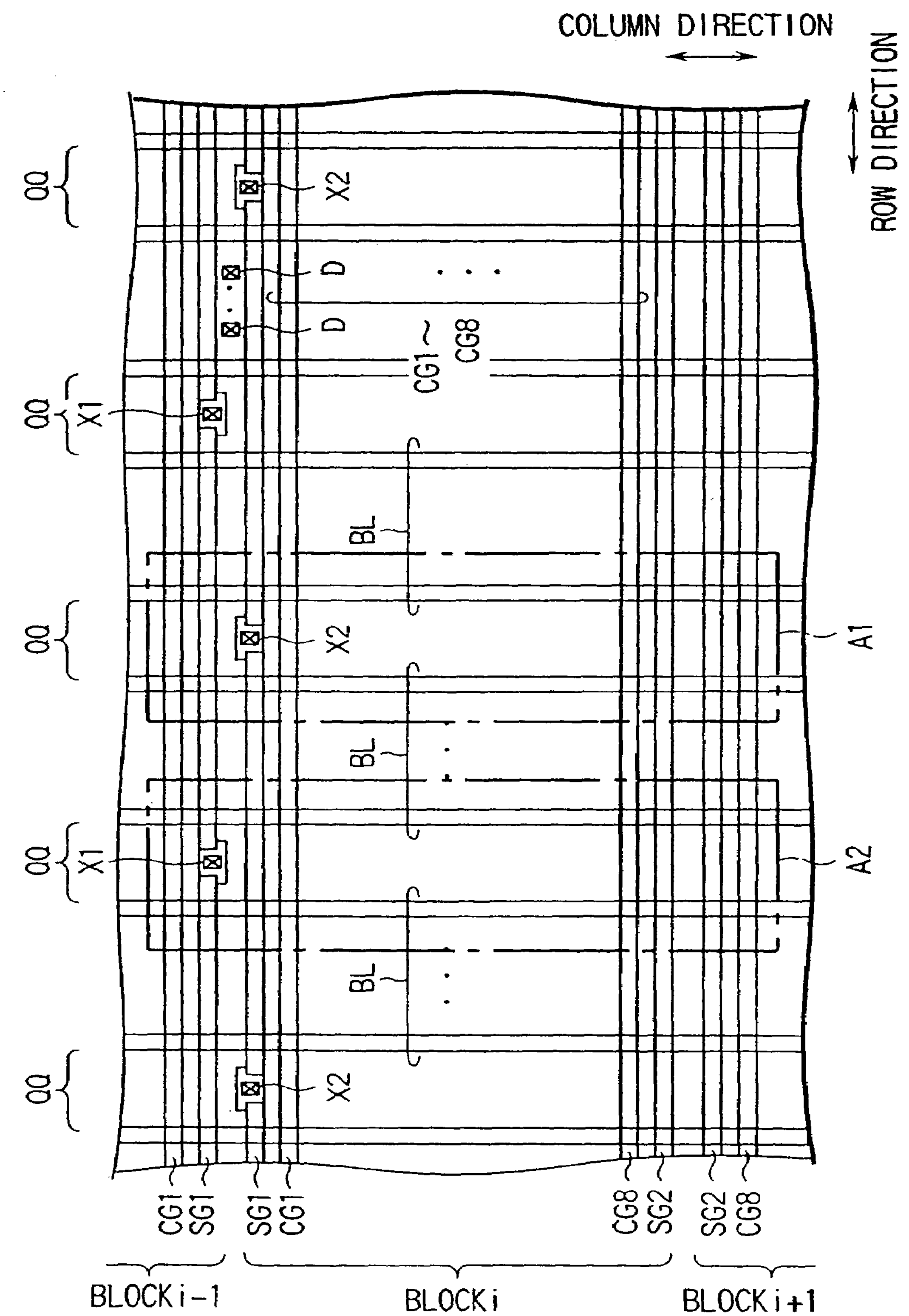
FIG. 104 is a plan view showing a first embodiment of an EEPROM of the present invention.
Figure 105:
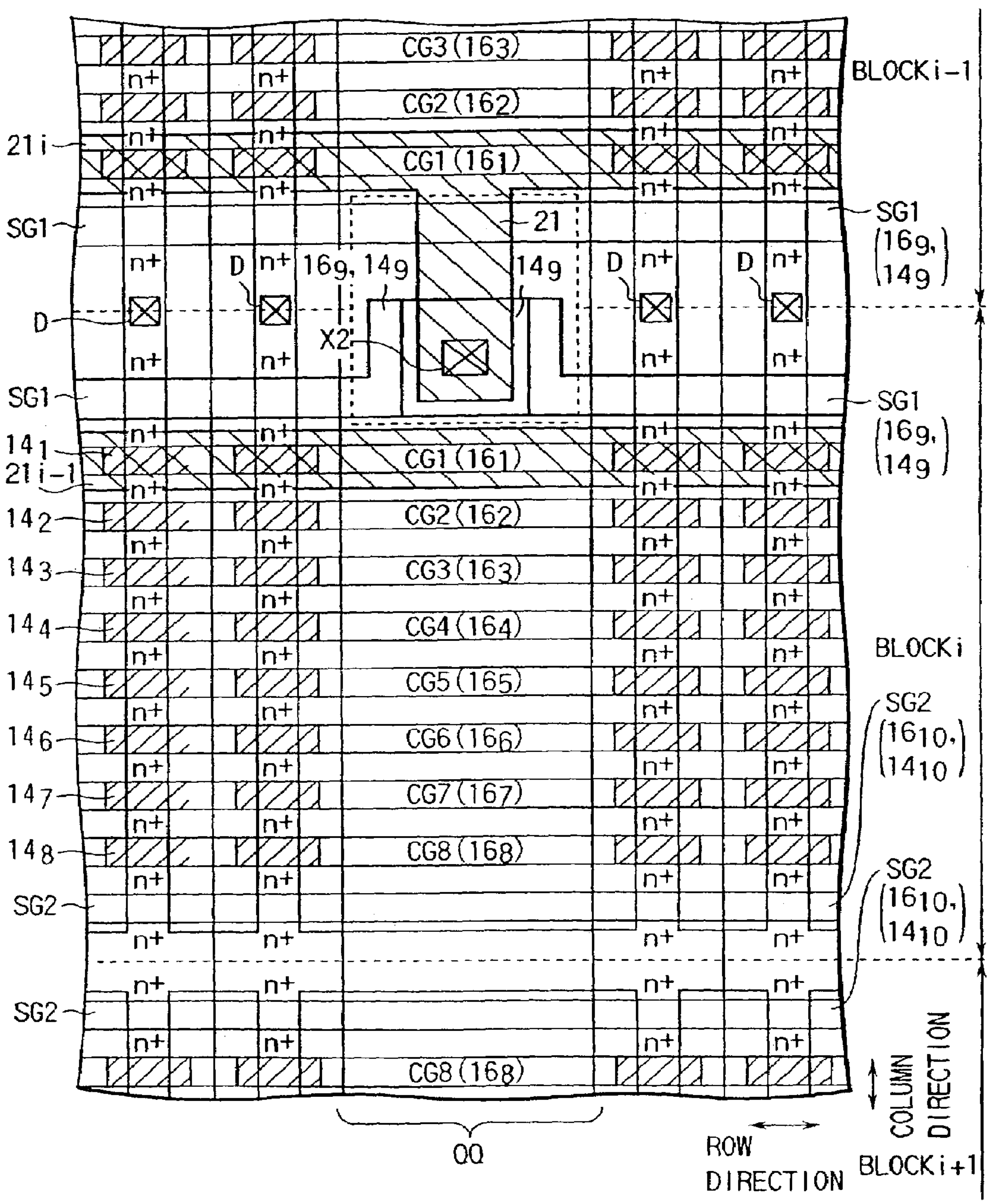
FIG. 105 is a view in detail showing the area A1 of FIG. 104.
Figure 106:
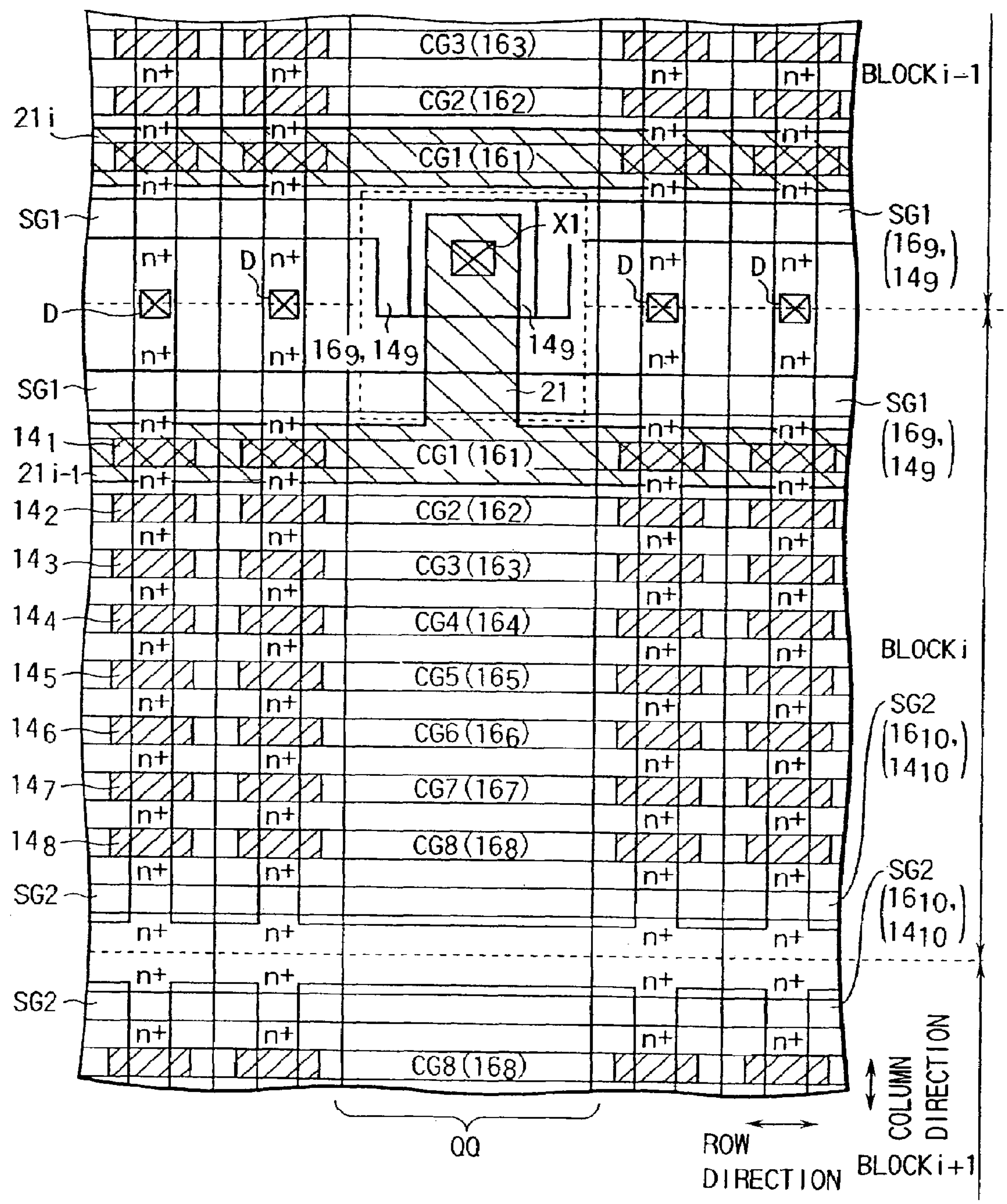
FIG. 106 is a view in detail showing the area A2 of FIG. 104.

FIG. 104 shows a first embodiment of pattern of a NAND cell EEPROM of the present invention. FIG. 105 is a view showing the inside of the area A1 of FIG. 104 in detail. FIG. 106 is a view showing the inside of the area A2 of FIG. 104.

A memory cell array is constructed of a plurality of blocks BLOCK i−1, BLOCK i, BLOCK i+1, . . . . A plurality of word lines (control gate lines=control gate electrodes) CG1 to CG8 and select gate lines SG1 and SG2 extending in the row direction are located in each block. A plurality of bit lines BL extending in the column direction are shared in common with each block.

Shunt areas QQ are located at constant intervals in the row direction. In a shunt area, select gate lines SG1 and SG2 are connected to select gate bypass lines 21*i* and 21*i*−1, which are formed above the select gate lines SG1 and SG2, and whose resistances are lower than each of the select gate lines SG1 and SG2. In the example, the case where the select gate bypass lines 21*i* and 21*i*−1 are provided for the select gate line SG1 gate in the drain side is considered.

Herein, meaning of provision of a select bypass line will be described.

As a capacity of a memory cell array is increased, the memory cell array is eventually composed of a tremendously large number of memory cells each with a fine pattern and a total area of the memory cell array which is occupied on a chip is very large. As a result, select gate lines SG1 and SG2 which are located on the memory cell array are narrower and longer. Hence, magnitudes of wiring resistance of the select gate lines SG1 and SG2 are very high.

On the other hand, control of whether or not a BLOCK block is selected is performed by potentials of the select gate lines SG1 and SG2. That is, selection or non-selection of a BLOCK block is determined by whether a select gate transistor is in the ON state or the OFF state. At this point, in order to operate selection of a block at a higher speed and improve reliability of a memory operation, it is necessary to shorten a charging/discharging time of each of the select gate lines SG1 and SG2.

Therefore, in order to shorten a charging/discharging time of each of the select gate lines SG1 and SG2, the select gate bypass lines 21*i* and 21*i*−1 each with a lower resistance (for example, whose interconnection width can be made wide without any influence of the word lines CG1 and CG2 or which can be made of low resistivity material) than each of the select gate lines SG1 and SG2 are provided.

The select gate line SG1 in the block BLOCK i−1 and the select gate line SG1 in the block BLOCK i are adjacent to each other. A select gate line SG1 is formed in the same layer as that in which word lines (control gate electrodes) CG1 to CG8 are formed, and the select gate line SG1 is made narrow and longer like the word lines CG1 to CG8.

A contact section X1 which is used for connecting the select gate line SG1 in the block BLOCK i−1 with a select gate bypass line 21*i*−1 and a contact section X2 which is used for connecting the select gate line SG1 in the block BLOCK i with a select gate bypass line 21*i* are not opposed to each other but staggered in the column direction and alternatively located in the row direction in constant intervals.

A select gate bypass line 21*i*−1 which is connected to the select gate line SG1 in the block BLOCK i−j is located above the word line (control gate electrode) CG1 in BLOCK i. A select gate bypass line 21*i* which is connected to the select gate line SG1 in the block BLOCK i is located above the word line (control gate electrode) CG1 in the BLOCK i−1.

That is, the select gate bypass line 21*i*−1 is located in the block BLOCK i different from the block BLOCK i−1 in which the select gate line SG1 to which the gate bypass line 21*i*−1 is connected is existent and the select gate bypass line 21*i* is located in the block BLOCK i−1 different from the block BLOCK i in which the select gate line SG1 to which the select gate bypass line 21*i* is connected is existent.

In the example, while the select gate bypass lines 21*i*−1 and 21*i* are respectively located above word lines CG1 in blocks different from blocks in which select gate lines SG1 to which the select gate bypass lines 21*i*−1 and 21*i* are connected are existent, there is no specific limitation to this but the select gate bypass lines 21*i*−1 and 21*i* may be located above a different word line or a plurality of word lines.

Figure 107:
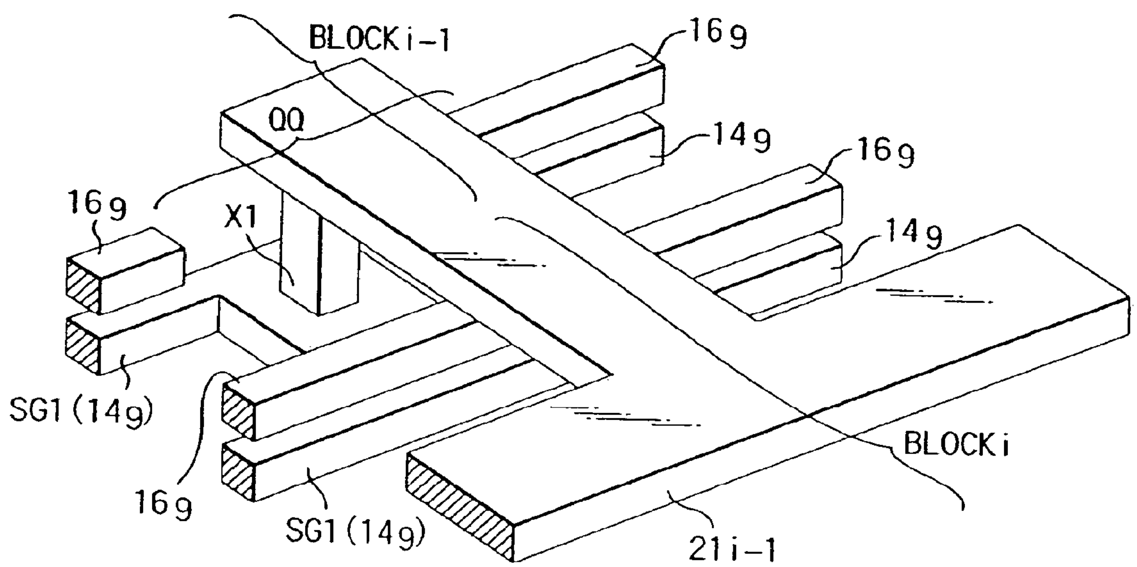
FIG. 107 is a view three-dimensionally showing part of the pattern of FIG. 106.

FIG. 107 is a view when part of the pattern of FIG. 106 is three-dimensionally represented.

A select gate line $16_9$ extending in the row direction is disconnected in a shunt area QQ, where a select gate line SG1 ($14_9$) is exposed. It is the select gate line SG1($14_9$) that actually functions as a select gate electrode of the select gate transistor S1 and a contact section X1 between the select gate line SG1 ($14_9$) and the select gate bypass line 21*i*−1 is provided on the select gate line SG1 ($14_9$) which has been exposed.

In order to secure a large contact section X1, a width of the select gate line SG1 ($14_9$) in a portion of the shunt area where the select gate line $16_9$ is disconnected is wider than outside the shunt area QQ.

The NAND cell EEPROM with the construction as described above is characterized in that the select gate bypass lines 21*i*−1 and 21*i* are respectively existent in blocks different from blocks in which the corresponding select gate lines SG1 are existent. That is, a select gate bypass line which is connected to a select gate line in a selected block is located in a non-selected block.

Accordingly, when an electric source potential Vcc which is employed for selecting a BLOCK block is applied to a select gate bypass line which is connected to a select gate line in a selected block, a situation in which a potential of a word line in the selected BLOCK block is raised due to capacitive coupling does not occur and therefore, erroneous read is prevented from occurring.

Description in this regard will be detailed in operation of a memory of the present invention.

Since select gate bypass lines 21*i*−1 and 21*i* with low resistance are connected to a select gate line SG1, a charging time for the select gate line SG1 is shortened, which enables an operating speed to be faster. Since the select gate bypass lines 21*i*−1 and 21*i* are formed above word lines CG1 to CG8 and the select gate lines SG1 and SG2, restrictions from the design rule become also milder.

Figure 108:
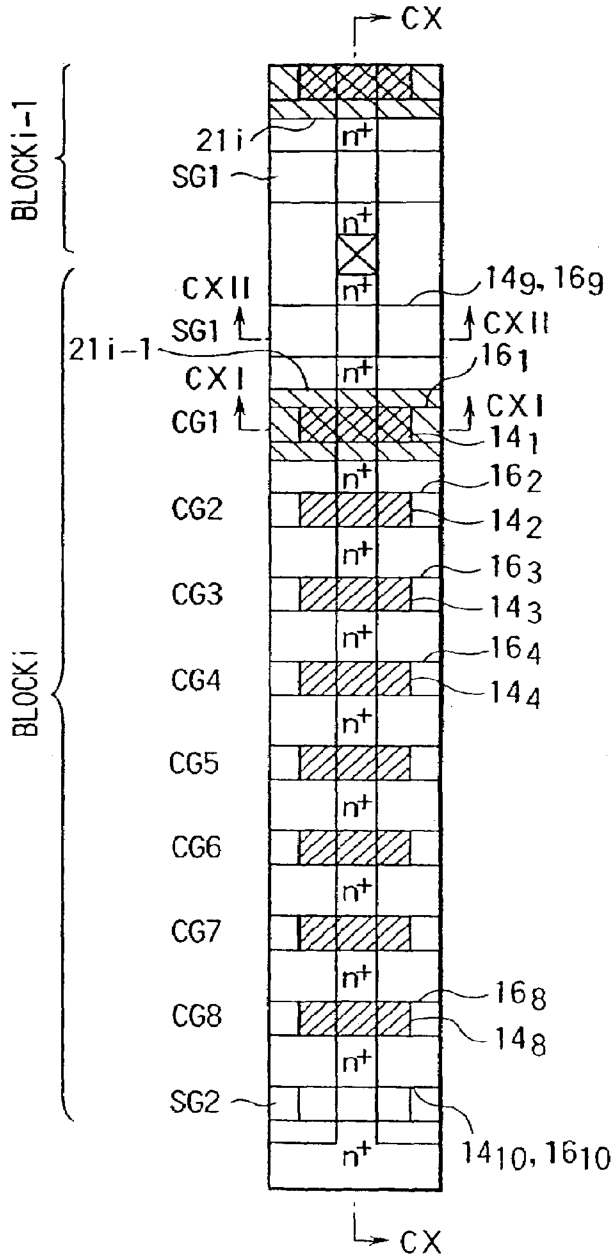
FIG. 108 is a plan view showing a NAND cell unit.
Figure 109:
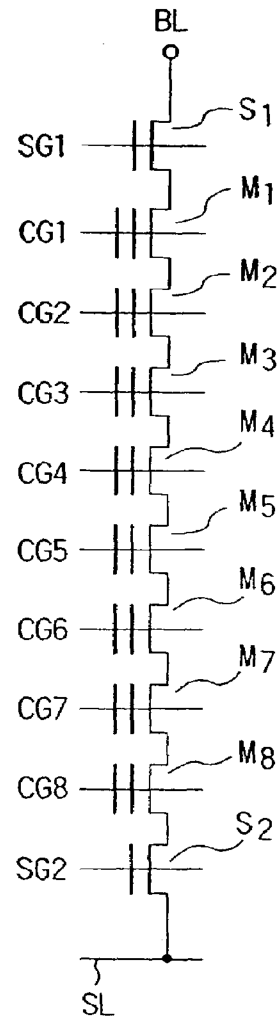
FIG. 109 is a diagram showing an equivalent circuit to the device of FIG. 108.
Figure 110:
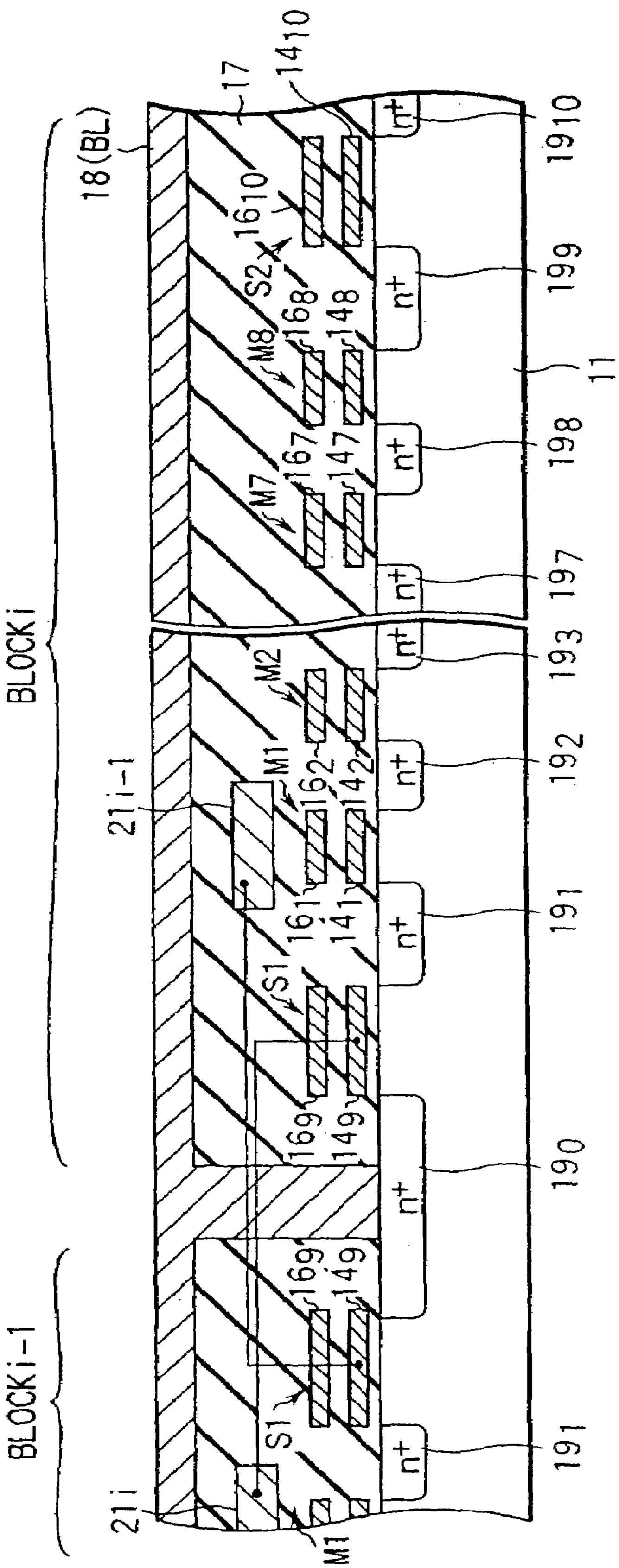
FIG. 110 is a sectional view taken along the line CX-CX of FIG. 108.
Figure 111:
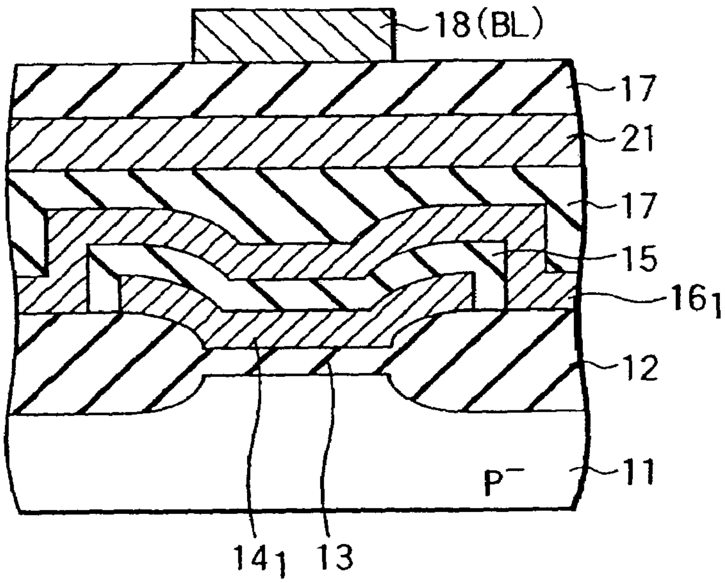
FIG. 111 is a sectional view taken along the line CXI-CXI of FIG. 108.
Figure 112:
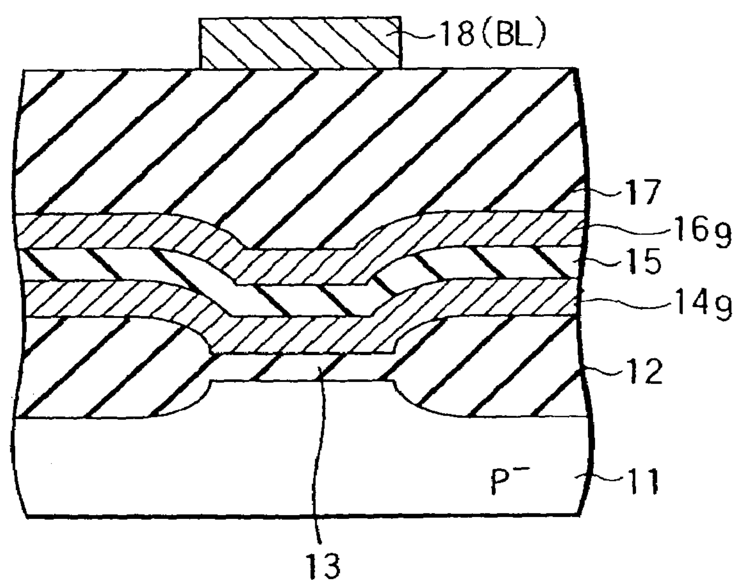
FIG. 112 is a sectional view taken along the line CXII-CXII of FIG. 108.

FIG. 108 shows a pattern of one NAND cell unit and its peripheral area in the memory cell array of FIGS. 105 and 106. FIG. 109 is an equivalent circuit diagram to one NAND cell unit of FIG. 108. FIG. 110 is a sectional view taken along the line CX-CX of FIG. 108, FIG. 111 is a sectional view taken along the line CXI-CXI of FIG. 108 and FIG. 112 is a sectional view taken along the line CXII-CXII of FIG. 108.

A device isolation oxide layer 12 is formed on a p-type silicon substrate (or p-type well region). The device isolation oxide layer 12 is formed so as to surround a device region. A NAND cell unit is formed in the device region.

In the example, one NAND cell unit comprises: a NAND series constructed of 8 memory cells M1 to M8 which are serially connected therebetween: and select transistors S1 and S2 which are connected to both ends thereof.

In a device region where the one NAND cell unit is formed, floating gate electrodes $14_1$, $14_2$, . . . $14_8$ are formed on the silicon substrate 11 with a gate insulating layer 13 interposed therebetween. Control gate electrodes $16_1$, $16_2$, . . . $16_8$ are formed on the floating gate electrodes $14_1$, $14_2$, . . . $14_8$ with an inter-layer insulating layer 15 interposed therebetween.

Select gate electrodes $14_9$, $14_{10}$, $16_9$ and $16_{10}$ are formed on the silicon substrate 11 with the gate insulating layer 13 interposed therebetween. The select gate electrodes $14_9$, $14_{10}$, $16_9$ and $16_{10}$ are formed at the same time as when the floating gate electrodes $14_1$, $14_2$, . . . $14_8$ and the control gate electrodes $16_1$, $16_2$, . . . $16_8$ are formed.

In the example, it is the select gates $14_9$ and $14_{10}$ located in a lower layer that actually function as gate electrodes, among the select gate electrodes $14_9$, $14_{10}$, $16_9$ and $16_{10}$. It is also possible that the select gate electrodes $14_9$ and $14_{10}$ in the lower layer and the select gate electrodes $16_9$ and $16_{10}$ in an upper layer are electrically connected therebetween and both sets of the electrodes may actually function.

N-type diffused layers $19_1$, $19_2$, . . . $19_9$ are formed in the silicon substrate 11. The n-type diffused layers $19_1$, $19_2$, . . . $19_9$ are in common owned by two transistors (memory cell and select transistor) which are adjacent to each other. The diffused layer $19_0$ which is located at the farthermost end of the drain side is connected to a bit line BL, while the diffused layer $19_{10}$ which is located at the farthermost end of the source side is connected to a source line SL.

The memory cells M1 to M8 and the select transistors S1 and S2 are covered with an inter-layer insulating layer (for example, a silicon oxide layer) 17 which is formed on the silicon substrate 11. A bit line 18 (BL) is formed on the inter-layer insulating layer 17.

Select gate bypass lines 21*i*−1 and 21*i* are formed in a layer which is above a layer in which the control gate electrodes $16_1$, $16_2$, . . . $16_8$ and the select gate electrodes $16_9$ and $16_{10}$ are formed, and which is a lower layer of a layer in which the bit line BL is formed.

The select gate bypass line 21*i* in a block BLOCK i−1 is connected to the select gate electrode $16_9$ of the select transistor S1 in the drain side of a block BLOCK i and the select gate bypass line 21*i*−1 in the block BLOCK i is connected to the select gate electrode $16_9$ of the select transistor S1 in the drain side of the block BLOCK i−1.

Figure 113:
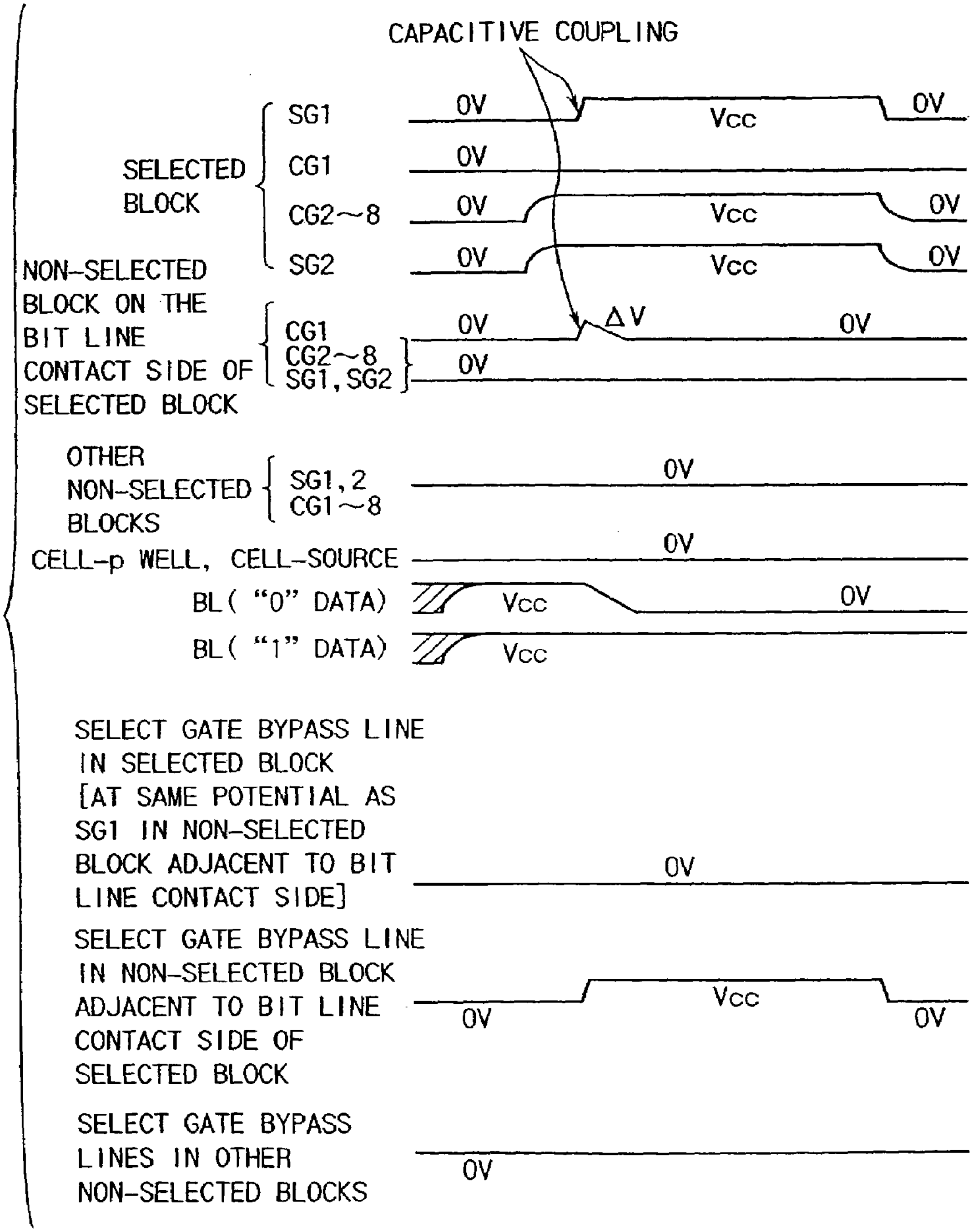
FIG. 113 is a waveform diagram showing an operation example of the EEPROM of FIGS. 105 and 106.

FIG. 113 shows timing of operation of a NAND cell EEPROM of the present invention.

A read operation (when a word line CG1 is selected) is, as is in a conventional case, performed in the steps in the order as follows.

(1) The bit line BL is set in the floating state after being precharged to an electric source potential Vcc.

(2) Charging to the electric source potential Vcc of non-selected word lines CG2 to CG8 and a select gate line SG2 in a selected block gets started. At this point, the selected word line CG1 is maintained at 0V.

(3) Charging to the electric source potential Vcc of a select gate line SG1 gets started and after that, this state is retained for a while.

At this point, when data of selected memory cells which is connected to a selected word line CG1 is "0," the selected memory cells assumes the ON state and a potential of the bit line BL is lowered. On the other hand, when data of the selected memory cells is "1," the bit line BL maintains the electric source potential Vcc since the selected memory cells assumes the OFF state.

(4) Potentials of the non-selected word lines CG2 to CG8 and the select gate lines SG1 and SG2 in the selected block are set to 0V.

In the NAND cell EEPROM of the example, the select gate bypass lines 21*i*−1 and 21*i* are connected to the select gate line SG1. Magnitudes of resistance of the select gate bypass lines 21*i*−1 and 21*i* are low by a great margin as compared with each of those of the select gate line SG2 and the word lines CG1 to CG8. Accordingly, a charging/discharging time of the select gate line SG1 is very much short as compared with each of charging/discharging times for the word lines CG1 to CG8 and the select gate line SG2 which are not connected to a select gate bypass line.

That is, a speed at which a potential of the select gate line SG1 changes from 0V to Vcc or from Vcc to 0V (where a waveform is steep) is higher than a speed at which potentials of the word lines CG1 to CG8 and the select gate line SG2 change from 0V to Vcc or from Vcc to 0V (where a waveform is easy).

Accordingly, even when charge timing to the electric source potential Vcc of the select gate line SG1 (the above described (3) step) is later than charge timing to the electric source potential Vcc of the word lines CG2 to CG8 and the select gate line SG2 (the above described (2) step), a read operation can be performed without any elongation of an operating time.

That is, timing of discharge starting of the bit line BL (timing of data read) can be controlled by charge timing of the select gate line SG1.

For example, when a select gate bypass line which is connected to the select gate line SG1 in the block BLOCK i is located right above a word line (control gate electrode) in the block BLOCK i so as to cover the word line, capacitive coupling at a high level occurs between the select gate bypass line and the word line. Accordingly, a potential of the select gate bypass line is raised and thereby a potential of a selected word line (normally assume 0V) is also raised, so that erroneous read occurs.

However, in the structure of the present invention, for example, the select gate bypass line 21*i*−1 which is connected to the select gate line SG1 in the block BLOCK i−1 is located in a block BLOCK i which is different from the block BLOCK i−1.

Therefore, when the block BLOCK i−1 is selected, for example, a word line (normally assuming 0V) CG1 whose potential is raised due to capacitive coupling between a select gate bypass line and the word line in company with a rise in potential of the select gate bypass line 21*i*−1 is existent in the block BLOCK i−1.

That is, since there is no chance when a potential of a selected word line (normally assuming 0V) in the selected block BLOCK i is erroneously raised, an erroneous read in a data read operation is prevented from occurring.

In such a manner, according to a NAND cell EEPROM of the present invention, a select gate bypass line which is connected to a select gate line SG1 in a selected BLOCK block is located in a non-selected block which is adjacent to the selected block on the bit line contact side of the selected block. For this reason, in a data read operation, a word line whose potential varies due to a capacitive coupling between a select gate bypass line (0V→Vcc) and the word line (control gate electrode) is existent in a non-selected block which is adjacent to the selected block on the bit line contact side of the selected clock.

In a non-selected block, select gate lines SG1 and SG2 are set to 0V and select gate transistors S1 and S2 assume the OFF state. Hence, in the non-selected block, a NAND cell unit is placed in a state where the unit is disconnected from a bit line BL (a state where a discharge path of a bit line BL is cut off) and even when a potential of a word line (control gate electrode) is raised due to an influence of capacitive coupling, there is no chance that the bit line BL discharges in error.

On the other hand, a select gate bypass line located in a selected BLOCK block is connected to a select gate line SG1 in a non-selected block which is adjacent to the selected block on the bit line contact side of the selected block and is kept fixed at a potential 0V. Therefore, there is no chance where a potential of a word line (control gate electrode) is raised due to capacitive coupling between a select gate bypass line and the word line in a selected block.

Since a select gate bypass line which is fixed at 0V is located above a word line in a selected block, noises are hard to be produced in a data read operation.

Accordingly, a normal data read operation is realized as shown in FIG. 113.

The present invention is not restricted to the example described above but various changes and modifications thereof are possible.

Below, another example of the present invention will sequentially be described.

Figure 114:
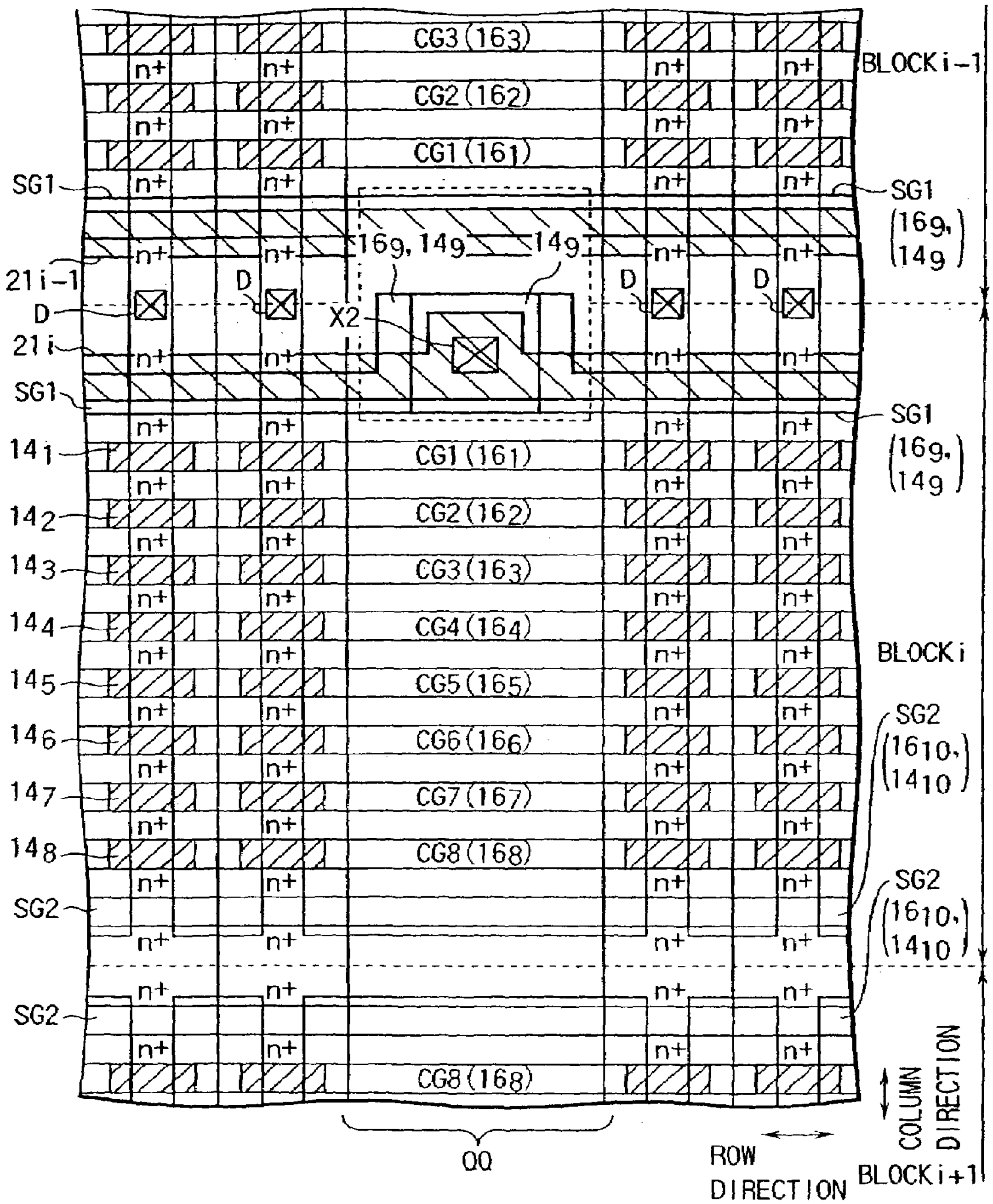
FIG. 114 is a view showing an area corresponding to the area A1 of FIG. 104 in a second embodiment of the present invention.
Figure 115:
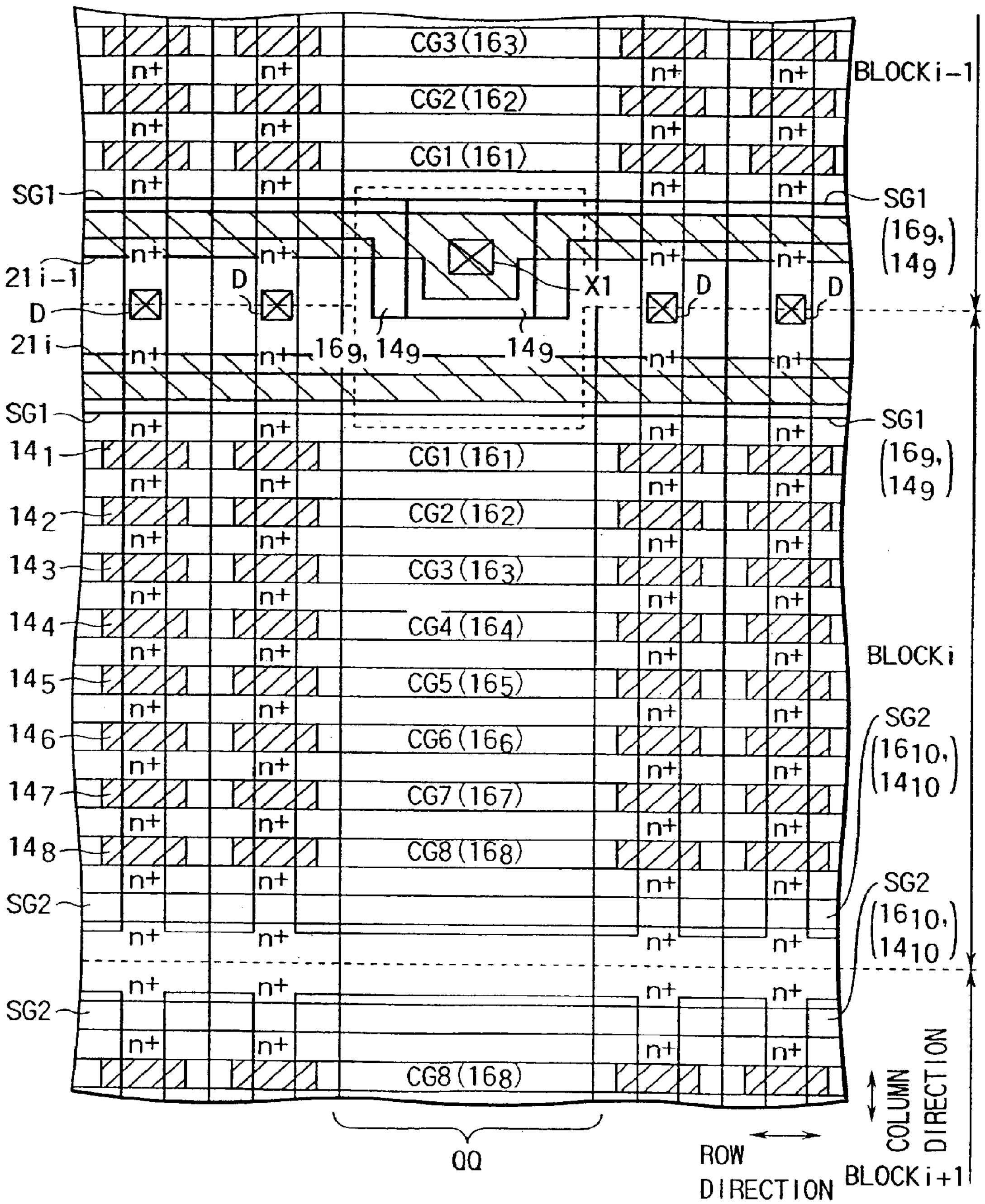
FIG. 115 is a view showing an area corresponding to the area A2 of FIG. 104 in the second embodiment of the present invention.

FIGS. 114 and 115 show the second embodiment of pattern of a NAND cell EEPROM of the present invention. FIG. 114 is a view in detail showing the area A1 of FIG. 104, and FIG. 115 is a view in detail showing the area A2 of FIG. 104.

An EEPROM of the example will be compared with the EEPROM of the first embodiment described above. The EEPROM of the second embodiment is different from the first embodiment in that a select gate bypass line which is connected to a select gate line SG1 in a selected BLOCK block is existent in the selected block.

That is, a select gate bypass line 21*i*−1 which is connected to a select gate line SG1 in a block BLOCK I−1 is located in the block BLOCK i−1 and a select gate bypass line 21*i* which is connected to a select gate line SG1 in a block BLOCK i is located in the block BLOCK i.

A feature of the EEPROM of the second embodiment resides in the following points.

The select gate bypass lines 21*i*−1 and 21*i* are located in the drain side (bit contact section) away from the source side edge of a select gate line SG1. That is, the select gate bypass lines 21*i*−1 and 21*i* are not located above word lines CG1, CG2, . . . .

Actually, since select gate bypass lines 21*i*−1 and 21*i* which are connected to a select gate line SG1 are provided in each of blocks BLOCK i−1 and BLOCK i, the select gate bypass lines 21*i*−1 and 21*i* are formed in a space from (the central portion of) a bit contact section to the source side edge of the select gate line SG1 in order to prevent short-circuit of the adjacent select gate bypass lines 21*i*−1 and 21*i* from occurring.

In such a manner, while a select gate bypass line which is connected to a select gate line SG1 in a selected BLOCK block is located in the selected block, the select gate bypass line is not located above a word line (control gate electrode) and therefore, a capacitance between the select gate bypass line and the word line can be very small.

Figure 116:
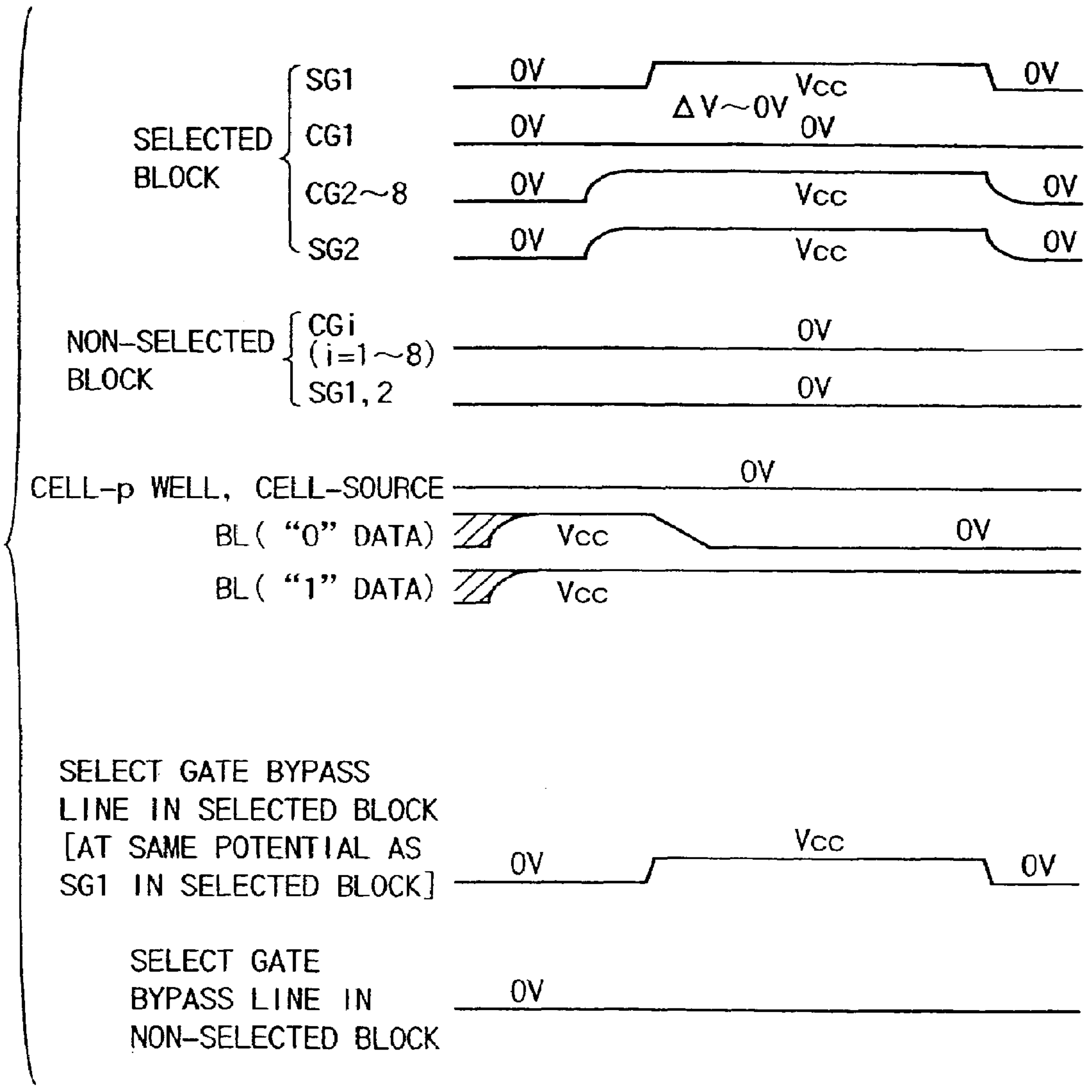
FIG. 116 is a waveform diagram showing an operation example of the EEPROM of FIGS. 114 and 115.

Accordingly, as shown in FIG. 116, a variation ΔV of a potential of a word line (control gate electrode) due to capacitive coupling between a select gate bypass line and the word line is so small that it can be neglected in a selected block. Therefore, an erroneous discharge of a bit line can be prevented from occurring and reliability of a data read operation can thus be improved greatly.

When a select gate bypass line with a low resistance is provided, a charging time for a select gate line is short and thereby a high speed operation becomes possible. In company with this, timing of data read can be controlled by charge timing of the select gate line.

Figure 117:
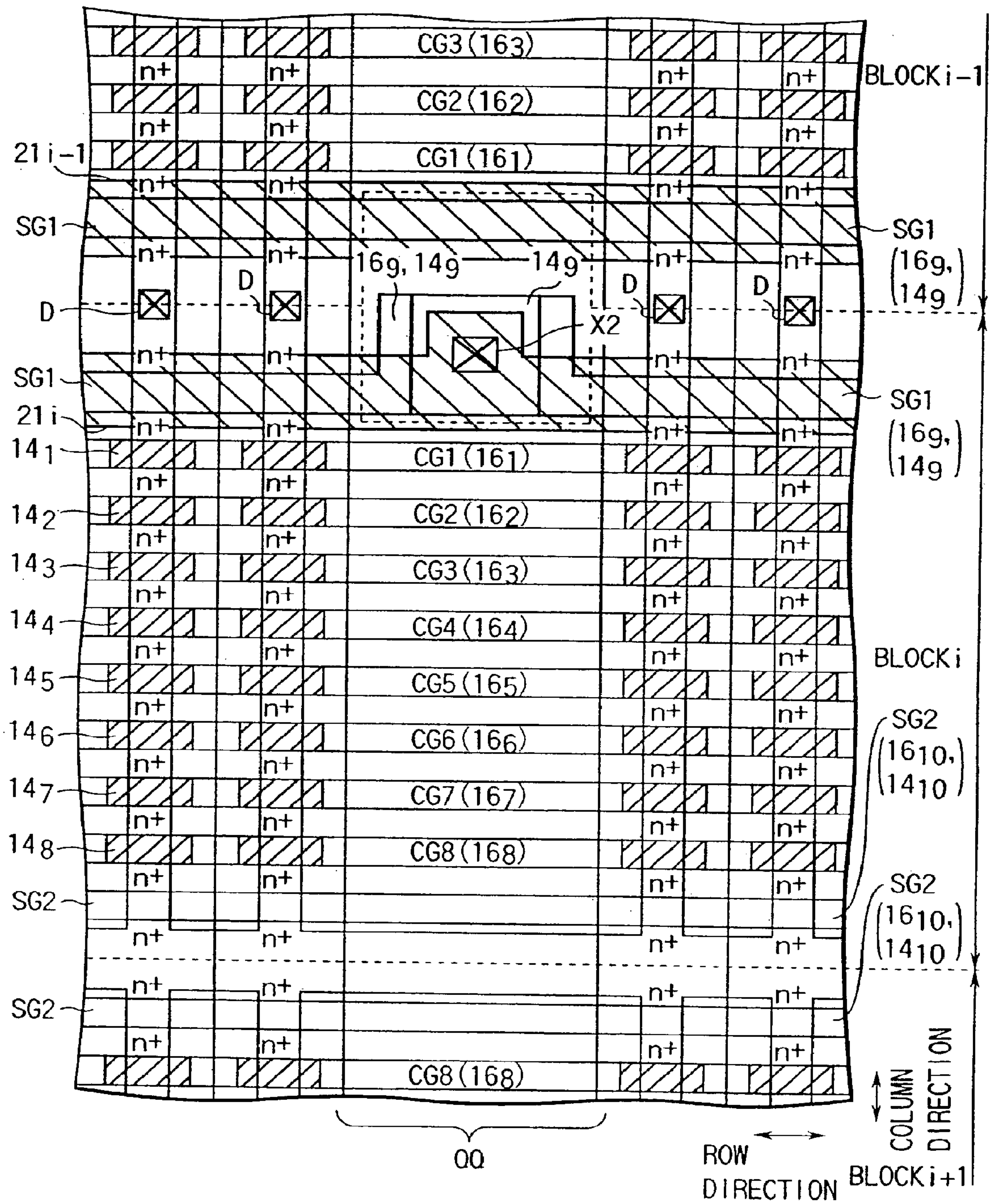
FIG. 117 is a view showing an area corresponding to the area A1 of FIG. 104 in a third embodiment of the present invention.

FIG. 117 shows the third embodiment of pattern of a NAND cell EEPROM of the present invention. FIG. 117 is a view in detail showing the area A1 of FIG. 104. In the example, a figure corresponding to the area A2 of FIG. 104 is omitted.

The EEPROM of the example will be compared with the EEPROM of the second embodiment. It is same as the second embodiment that a select gate bypass line which is connected to a select gate line SG1 in a selected BLOCK block is existent in the selected block, whereas it is different from the second embodiment that the source side edges of select gate bypass lines 21*i*−1 and 21*i* are both located between the drain side edge of a word line (control gate electrode) CG1 closest to the drain (bit line contact section) and the source side edge of a select gate line SG1.

In other words, select gate bypass lines 21*i*−1 and 21*i* which are connected to a select gate line SG1 are located in the drain side (bit line contact section) further away from the drain side edge of a word line (control gate electrode) CG1 closest to the drain (bit line contact section). That is, the select gate bypass lines 21*i*−1 and 21*i* are not located above the word lines CG1, CG2 . . . .

Since select gate bypass lines 21*i*−1 and 21*i* which are connected to a select gate line SG1 are provided in each of blocks BLOCK i−1 and BLOCK i, the select gate bypass lines 21*i*−1 and 21*i* are actually formed in the space from (the central potion of) the bit line contact section to the drain side edge of the word line CG1 in order to prevent short-circuit of the adjacent select gate bypass lines 21*i*−1 and 21I from occurring.

In such a manner, while a select gate bypass line which is connected to a select gate line SG1 in a selected BLOCK block is located in the selected block, since the select gate bypass line is not located above a word line (control gate electrode), a capacitance between the select gate bypass line and the word line can be very small.

Accordingly, in a selected block, a variation ΔV of a potential of a word line (control gate electrode) due to capacitive coupling between a select gate bypass line and the word line is so small that the variation ΔV of a potential can be neglected, whereby an erroneous discharge of a bit line BL can be prevented from occurring.

In addition, when a select gate bypass line with a low resistance is provided, a charging time for the select gate line is short, and a high speed operation can be realized. In company with this, timing of data read can be controlled by charge timing of a select gate line.

Figure 118:
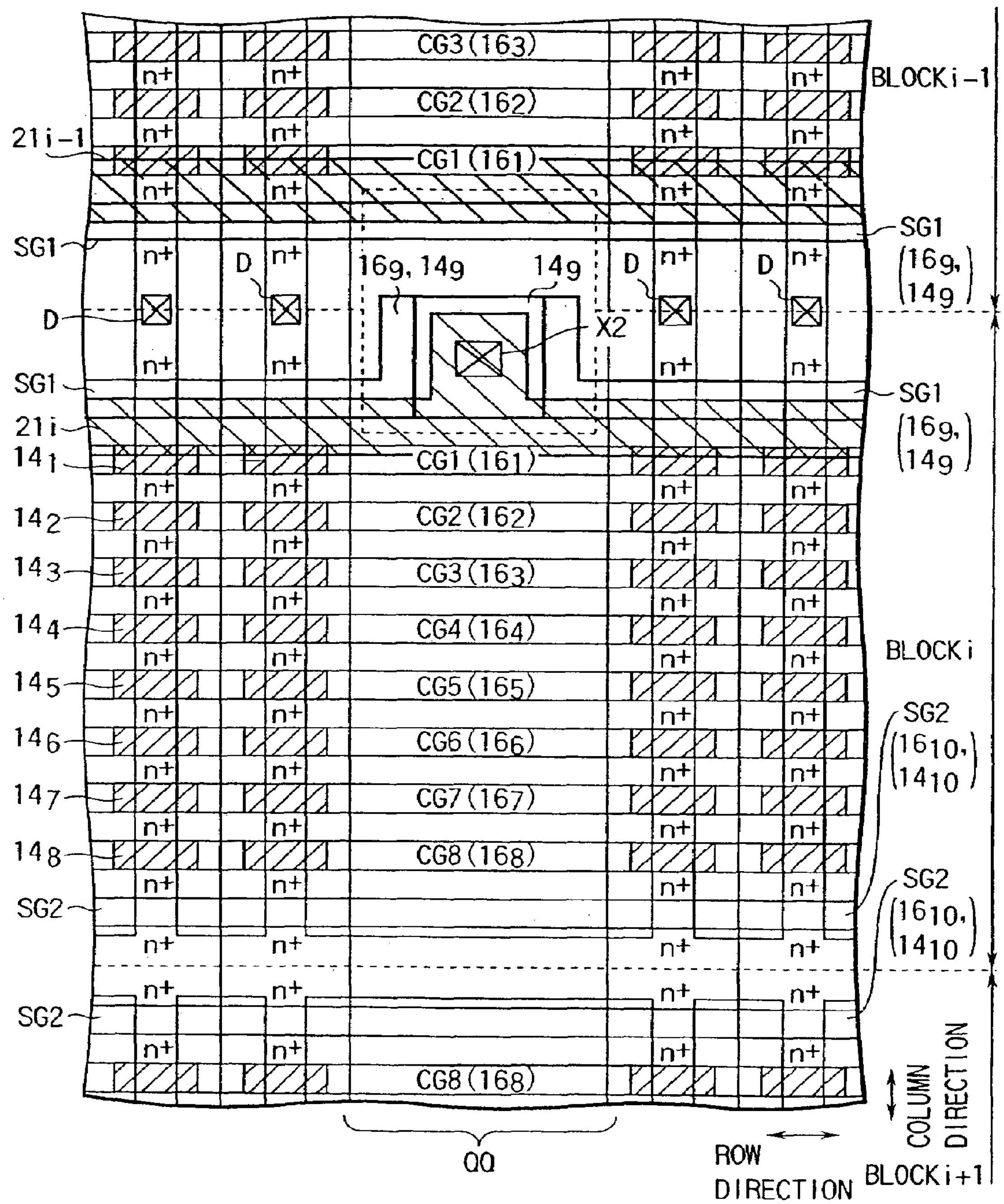
FIG. 118 is a view showing an area corresponding to the area A1 of FIG. 104 in a fourth embodiment of the present invention.

FIG. 118 shows the fourth embodiment of pattern of a NAND cell EEPROM of the present invention. FIG. 118 is a view in detail showing the area A1 of FIG. 104. In the example, too, a figure corresponding to the area A2 of FIG. 104 is omitted.

The EEPROM of the example will be compared with the third embodiment. It is same as the third embodiment that a select gate bypass line which is connected to a select gate line SG1 in a selected BLOCK block is existent in the selected block, whereas it is different from the third embodiment that edges of the source side of select gate bypass lines 21*i*−1, and 21*i* are located above a word line (control gate electrode) CG1 closest to the drain (bit line contact section).

In other words, select gate bypass lines 21*i*−1 and 21*i* which are connected to a select gate line SG1 are located in the drain (bit line contact section) side further away from the source side edge of a word line (control gate electrode) CG1 closest to the drain (bit line contact section). That is, the select gate bypass lines 21 i−1 and 211 partially overlaps on the word line CG1.

With such a structure, while a select gate bypass line which is connected to a select gate line SG1 in a selected BLOCK block is located in the selected block, since a word line (control gate electrode) is not fully covered, a capacitance between the select gate bypass line and the word line CG1 can be small.

Accordingly, in a selected block, a variation ΔV of a potential of a word line (control gate electrode) due to capacitive coupling between a select gate bypass line and a word line can be small, whereby an erroneous discharge of a bit line BL can be prevented from occurring.

In addition, when a select gate bypass line with a low resistance is provided, a charging time for the select gate line is short, and a high speed operation can be realized. In company with this, timing of data read can be controlled by charge timing of a select gate line.

Figure 119:
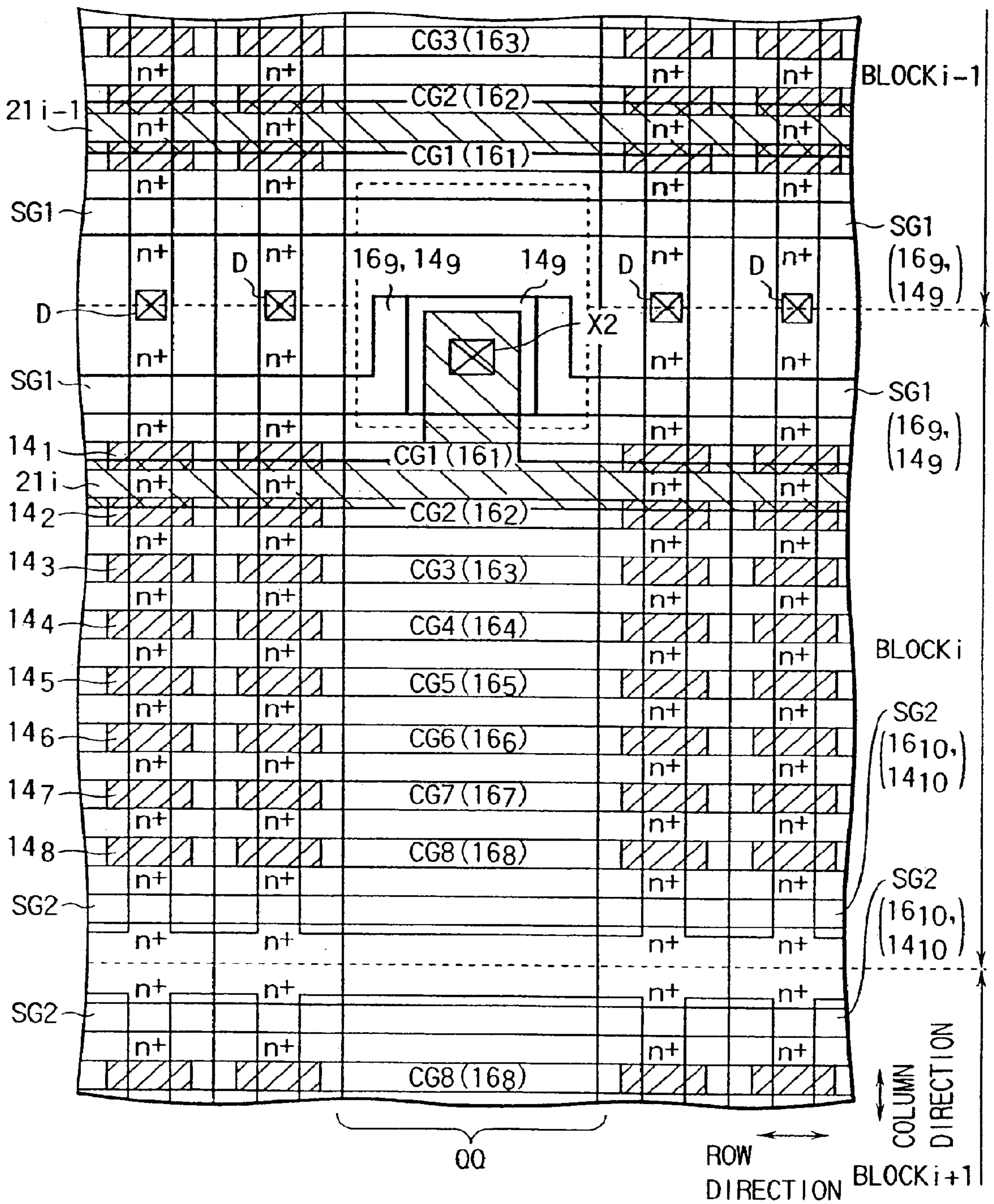

FIG. 119 shows a fifth embodiment of pattern of a NAND cell EEPROM of the present invention. FIG. 119 is a view in detail showing the area A1 of FIG. 104. In the example, too, the figure corresponding to the area A2 is omitted.

The EEPROM of the example will be compared with the fourth embodiment. It is same as the fourth embodiment that a select gate bypass line which is connected to a select gate line SG1 in a selected BLOCK block is existent in the selected block, while it is different from the fourth embodiment that select gate bypass lines 21*i*−1 and 21*i* are located above the space between a word lines (control gate electrodes) CG1 and CG2.

With such a structure, while select gate bypass lines 21*i*−1 and 21*i* which are connected to a select gate line SG1 in a select BLOCK block is located in the selected block, since neither of word lines (control gate electrodes) CG1 and CG2 are fully covered, a capacitance between the select gate bypass lines 21*i*−1 and 21*i* between the word lines CG1, CG2 can be small.

Accordingly, in a selected block, a variation ΔV of a potential of a word line (control gate electrode) due to capacitive coupling between a select gate bypass line and the word line can be small, whereby an erroneous discharge of a bit line BL can be prevented from occurring.

In addition, when a select gate bypass line with a low resistance is provided, a charging time for the select gate line is short, and a high speed operation can be realized. In company with this, timing of data read can be controlled by charge timing of a select gate line.

Besides, in the example, an area where select gate bypass lines 21*i*−1 and 21*i* are located is not limited to above the space between the word lines CG1 and CG2, as far as the area is the space between word lines. For example, the select gate bypass lines 21*i*−1 and 21*i* may be located in the space between word lines CG2 and CG3.

All the previous description on the first through fifth embodiments considered, since in any example, select gate bypass lines 21*i*−1 and 21*i* which are connected to a select gate line SG1 in a selected block do not fully cover a word line (control gate electrode) in the selected block, a capacitance between the select gate bypass lines and the word line can be small.

In the examples, it is the first embodiment that an increment ΔV of a potential can perfectly be suppressed and the increasing order of ΔV among the other examples are as follows: the second embodiment (FIG. 114)<the third embodiment (FIG. 117)<the fourth embodiment (FIG. 118) <the fifth embodiment (FIG. 119).

However, in the second embodiment (FIG. 114), since a select gate bypass line has to be located in a very narrow space from the source side edge of a select gate line SG1 to a bit line contact section, there is a fault of restriction from the design rule.

The design rule will be considered. In the first embodiment, there is basically no restriction form the design rule. In the other examples, the increasing order of restriction from the design rule are as follows: the fifth embodiment (FIG. 119)<the fourth embodiment (FIG. 118)<the third embodiment (FIG. 117)<the second embodiment (FIG. 114).

Accordingly, in application of EEPROMs of the examples for actual products, the most proper pattern is selected taking the two conditions of a potential increment ΔV due to the capacitive coupling and the design rule into consideration.

While the previous description is made in the cases where a select gate bypass line is provided for a drain side select gate line SG1, the present invention can be applied for other cases, for example the case where a select gate bypass line is provided for a source side select gate line SG2.

Figure 120:
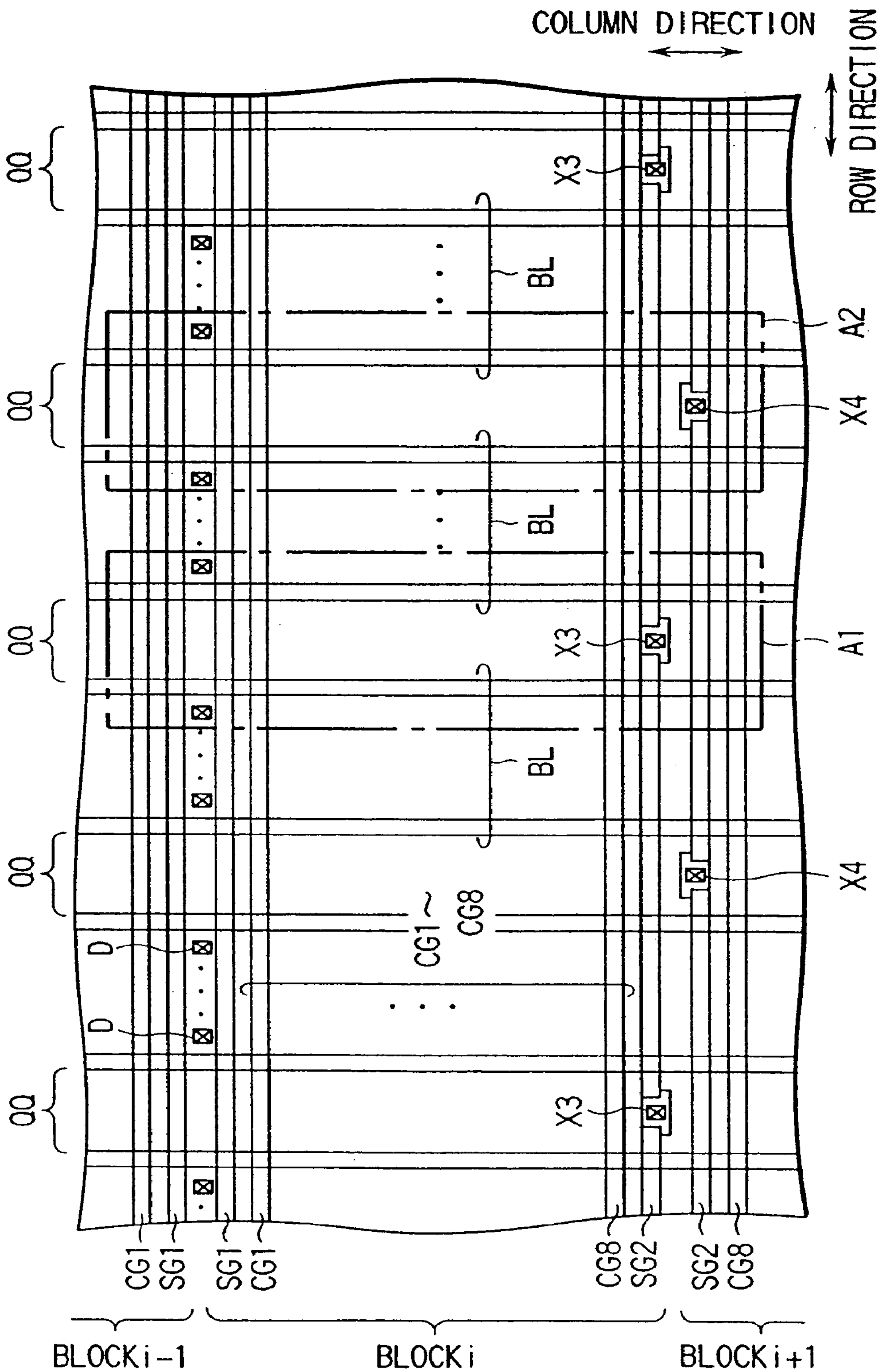
Figure 121:
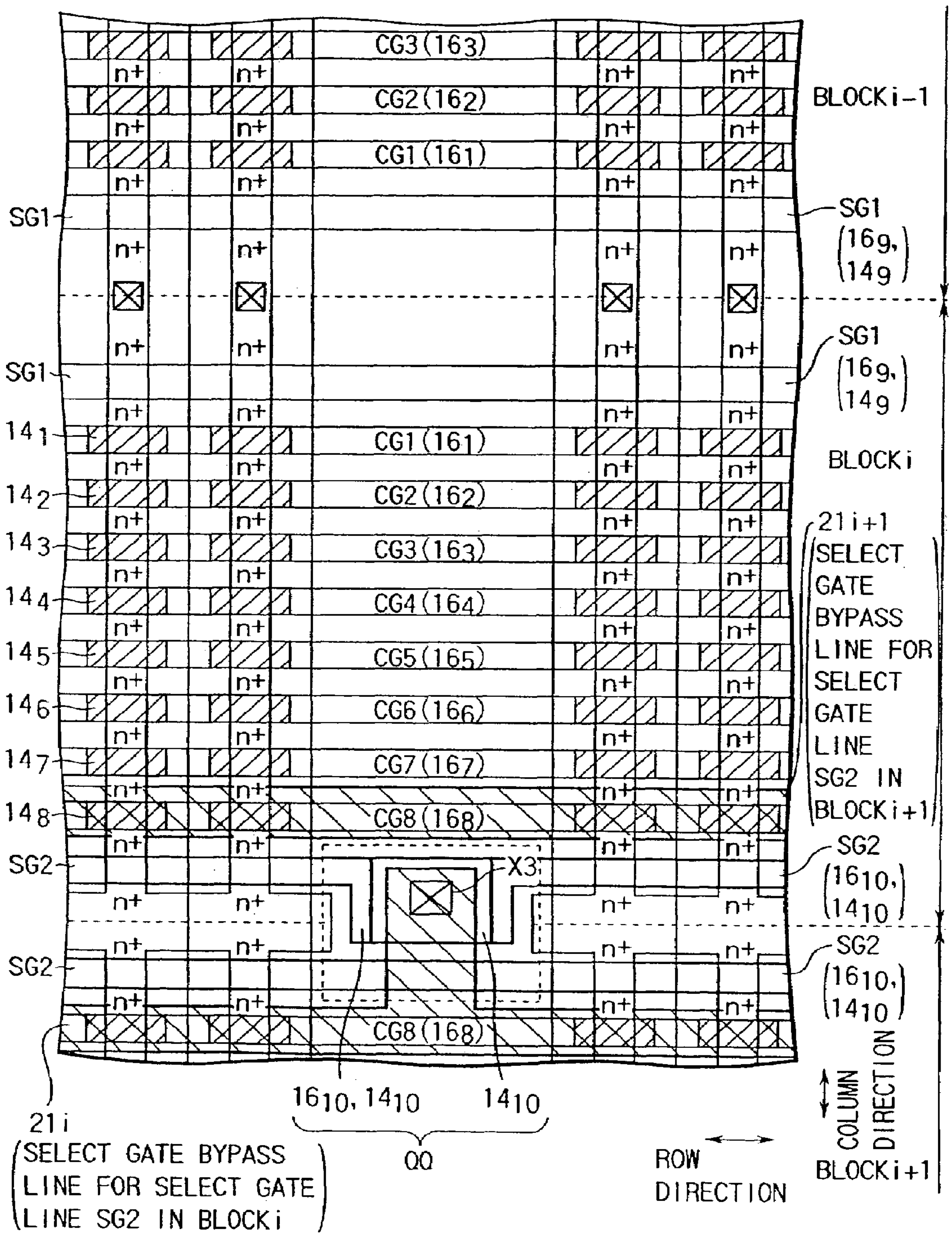
Figure 122:
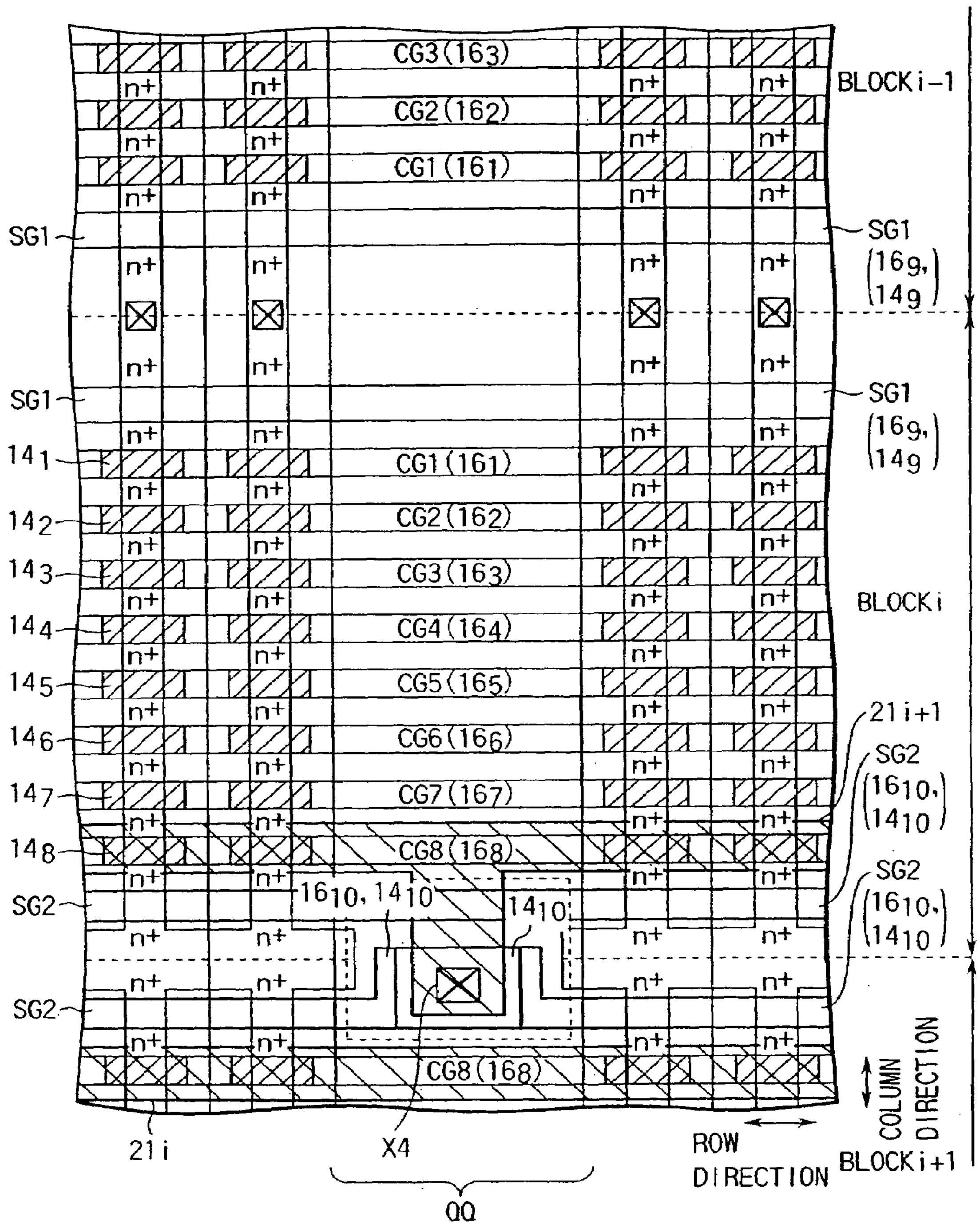

FIG. 120 shows a sixth example of pattern of a NAND cell EEPROM of the present invention. FIG. 121 is a view in detail showing the area A1 of FIG. 120 and FIG. 122 is a view in detail showing the are A2 of FIG. 120.

A memory cell array is constructed of a plurality of blocks BLOCK i−1, BLOCK i, BLOCK i+1, . . . . In each block, a plurality of word lines (control gate electrodes) CG1 to CG8 and select gate line SG1 and SG2 extending in the row direction are located. A plurality of bit lines BL extending in the column direction commonly serve the blocks.

Shunt areas QQ are provided at constant intervals in the row direction. In a shunt area QQ, connection between a source side select gate line SG2 and select gate bypass lines 21*i*−1 and 21*i* with a low resistance which are formed above the select gate line SG2 is performed.

A select gate line SG2 in the block BLOCK i and a select gate line SG2 in the block BLOCK i+1 are adjacent to each other. A select gate line SG2 is formed in the same layer as that in which word lines (control gate electrodes) CG1 to CG8 are formed, and the select gate line SG2 is narrower and longer as in the cases of the word lines CG1 to CG8.

A contact section X3 for connecting a select gate line SG2 in a block BLOCK i with a select gate bypass line 21*i*, and a contact section X4 for connecting a select gate line SG2 in a block BLOCK i+l with a select gate bypass 21*i*+1 are not opposed to each other in the column direction and alternatively located in the row direction at constant intervals.

A select gate bypass 21*i* which is connected to the select gate line SG2 in the block BLOCK i is located above a word line (control gate electrode) CG8 in the block BLOCK i+1. A select gate bypass line 21*i*+1 which is connected to the select gate line SG2 in the block BLOCK i+1 is located above a word line (control gate electrode) CG8 in the block BLOCK i.

That is, a select gate bypass line 21*i* is located in a block BLOCK i+1 which is different from a block BLOCK i in which a select gate line SG2 to which the select gate bypass line 21*i* is connected is existent and a select gate bypass line 21*i*+1 is located in the block BLOCK i which is different from the block BLOCK i+1 in which a select gate line SG2 to which the select gate bypass line 21*i*+1 is connected is existent.

In this example, while select gate bypass lines 21*i* and 21*i*+1 are located above a word line CG8 in a block which is different from a BLOCK block in which a select gate line SG2 to which the select gate bypass lines 21*i* and 21*i*+1 are connected is existent, there is no specific limitation to this, but the select gate bypass lines 21*i* and 21*i*+1 may be located above a different word line or a plurality of word lines.

A feature of the NAND cell EEPROM with the above described structure is that select gate bypass lines 21*i* and 21*i*+1 are existent in a block which is different from a BLOCK block in which a source side select gate line SG2 to which the select gate bypass lines 21*i* and 21*i*+1 is connected is existent. That is, a select gate bypass line which is connected to a select gate line in a selected BLOCK block is located in a non-selected block.

Therefore, when an electric source potential Vcc for selecting a BLOCK block is applied to a select gate bypass line which is connected to a select gate line in a selected block, no situation where a potential of a word line in the selected BLOCK block is raised due to the capacitive coupling occurs, so that an erroneous read can be prevented from occurring.

When a select gate bypass line with a low resistance is provided, a charging time is short and a high speed operation can be realized. In company with this, timing of data read can be controlled by charge timing of a select gate line.

Figure 123:
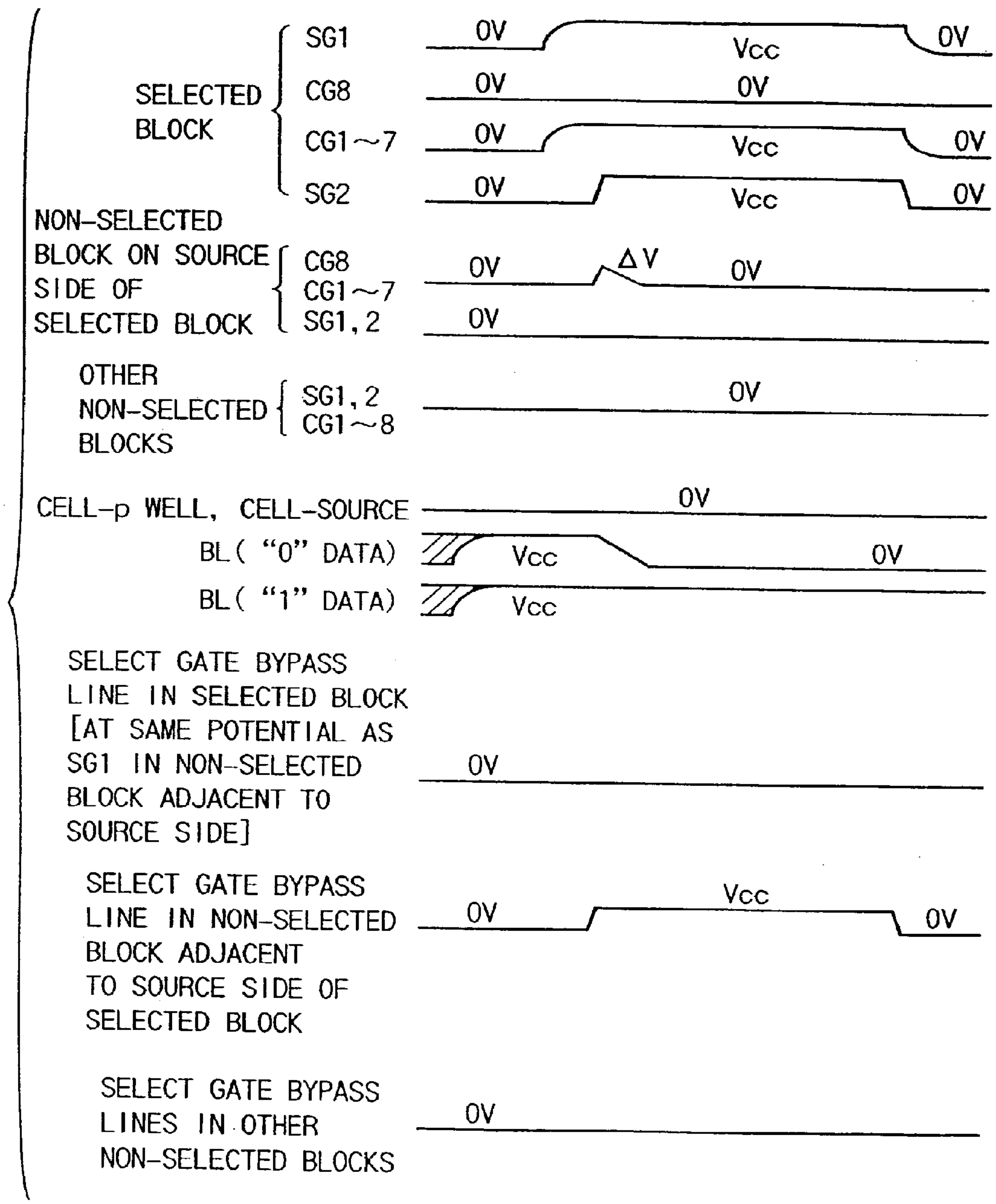

FIG. 123 shows timing of operation of a NAND cell EEPROM relating to the sixth example of the present invention.

While a read operation (when a word line CG8 is selected) is basically same as the case of the previously described first embodiment, it is different from the first embodiment that the order in which an electric source potential Vcc is applied to select gate lines SG1 and SG2 is different.

The read operation is performed in the steps in the order as follows.

(1) A bit line BL is set in the floating state after being precharged to an electric source potential Vcc.

(2) Charging to the electric source potential Vcc of non-selected word lines CG1 to CG8 and a select gate line SG1 in a selected block gets started. At this point, a selected word line CG8 is maintained at 0V.

(3) Charging to the electric source potential Vcc of a select gate line SG2 gets started and after that, this state is retained for a while.

At this point, when data of a selected memory cell which is connected to a selected word line CG8 is "0", the selected memory cell assumes the ON state and a potential of a bit line BL is lowered. On the other hand, when data of a selected memory cell is "1", a bit line BL maintains the electric source potential Vcc since the selected memory cell assumes the OFF state.

(4) Potentials of the non-selected word lines CG1 to CG7 and the select gate lines SG1 and SG2 in the selected block are set to 0V.

In the NAND cell EEPROM in the example, since select gate bypass lines 21*i* and 21*i*+1 are connected to a source side select gate line SG2, a charging/discharging time of the select gate line SG2 is very much short as compared with those of word lines CG1 to CG8 and a select gate line SG1 which are not connected to a select gate bypass line.

That is, a speed at which a potential of the select gate line SG2 changes from 0V to Vcc or from Vcc to 0V (where a waveform is steep) is higher than a speed at which potentials of the word lines CG1 to CG8 and the select gate line SG1 change from 0V to Vcc or from Vcc to 0V (where a waveform is easy).

Accordingly, even when timing of charge to the electric source potential Vcc of the select gate line SG2 (the above described (3) step) is later than timing of charging to the electric source potential Vcc of the word lines CG1 to CG7 and the select gate line SG1 (the above described (2) step), a read operation can be performed without any elongation of an operating time.

That is, timing of discharge starting of the bit line BL (timing of data read) can be controlled by charge timing of the select gate line SG2.

In the structure of the present invention, for example, a select gate bypass line 21*i* which is connected to a select gate line SG2 in a block BLOCK i is located in a block BLOCK i+1.

Therefore, for example, when the block BLOCK i is selected, a word line (normally 0V) CG8 whose potential is raised due to capacitive coupling between a select gate bypass line and the word line, as a potential of the select gate bypass line 21*i* is raised, is existent in the non-selected block BLOCK i+1.

That is, since there is no chance when a potential of a selected word line (normally 0V) in the selected block BLOCK i is raised in error, an erroneous read is prevented from occurring in a data read operation.

In such a manner, according to a NAND cell EEPROM of the present invention, a select gate bypass line which is connected to a select gate line SG2 in a selected block is located in a non-selected block adjacent to the source side of the selected block. Hence, in a read operation, a word line whose potential is varied due to capacitive coupling between a select gate bypass line (0V→Vcc) and the word line (control gate electrode) is existent in a non-selected block adjacent to the selected block on the source side of the selected block.

In a non-selected block, select gate lines SG1 and SG2 are set to 0V and select gate transistors S1 and S2 assume the OFF state. For this reason, in a non-selected block, a NAND cell unit is in a state where the NAND cell unit is disconnected from a bit line BL (a state where a discharge path of a bit line BL is cut off) and even when a potential of a word line (control gate electrode) is raised due to an influence of capacitive coupling, there is no chance that the bit line BL discharges in error.

On the other hand, a select gate bypass line located in a selected block is connected to a select gate line SG2 in a non-selected block which is adjacent to the selected block on the source side of the selected block and is kept fixed at a potential 0V. Therefore, there is no chance that a potential of a word line (control gate electrode) is raised due to capacitive coupling between a select gate bypass line and the word line in a selected block.

Accordingly, a normal data read operation can be realized as shown in FIG. 123.

The present invention is not restricted to the example described above but various changes and modifications thereof are possible.

Figure 124:
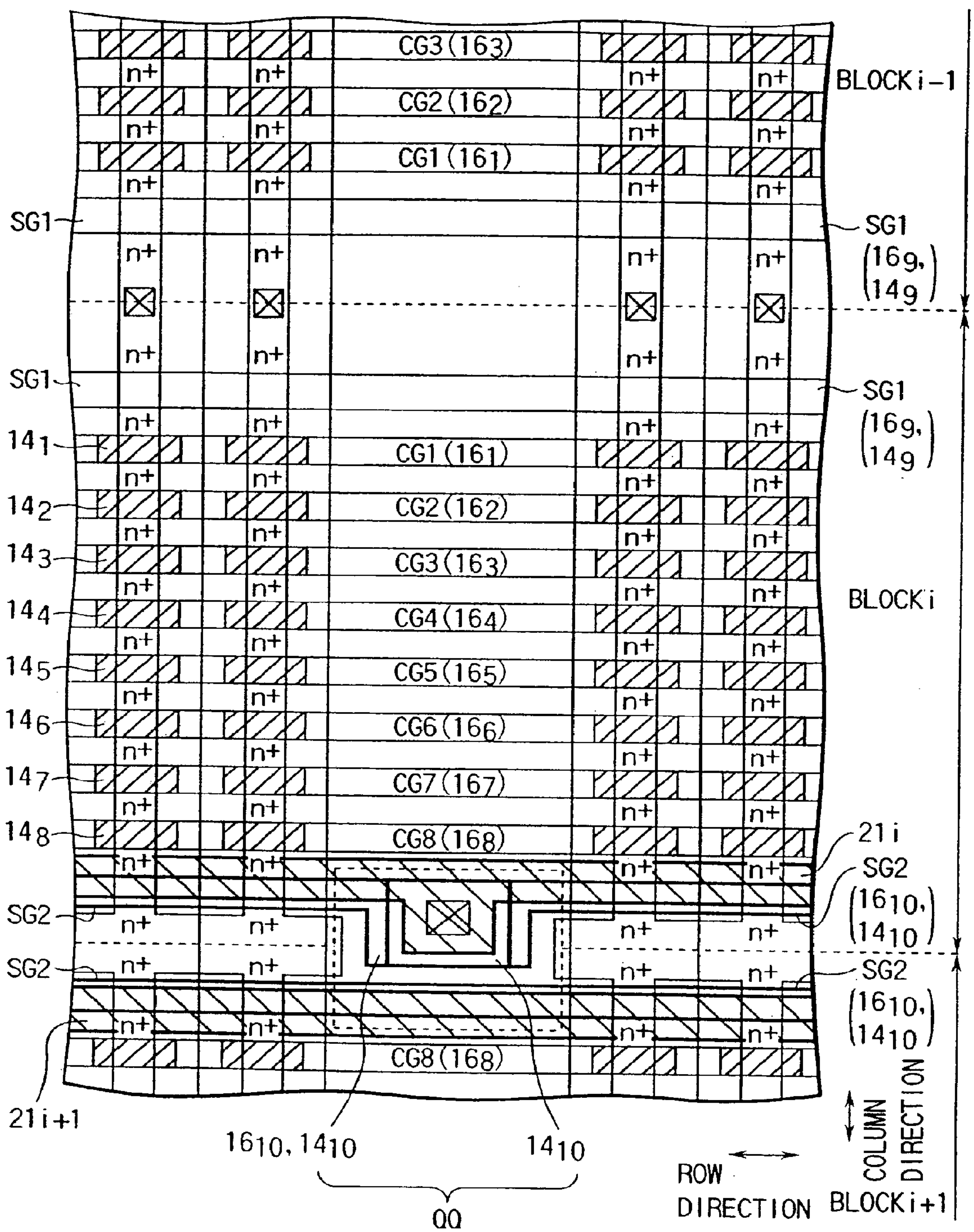
Figure 125:
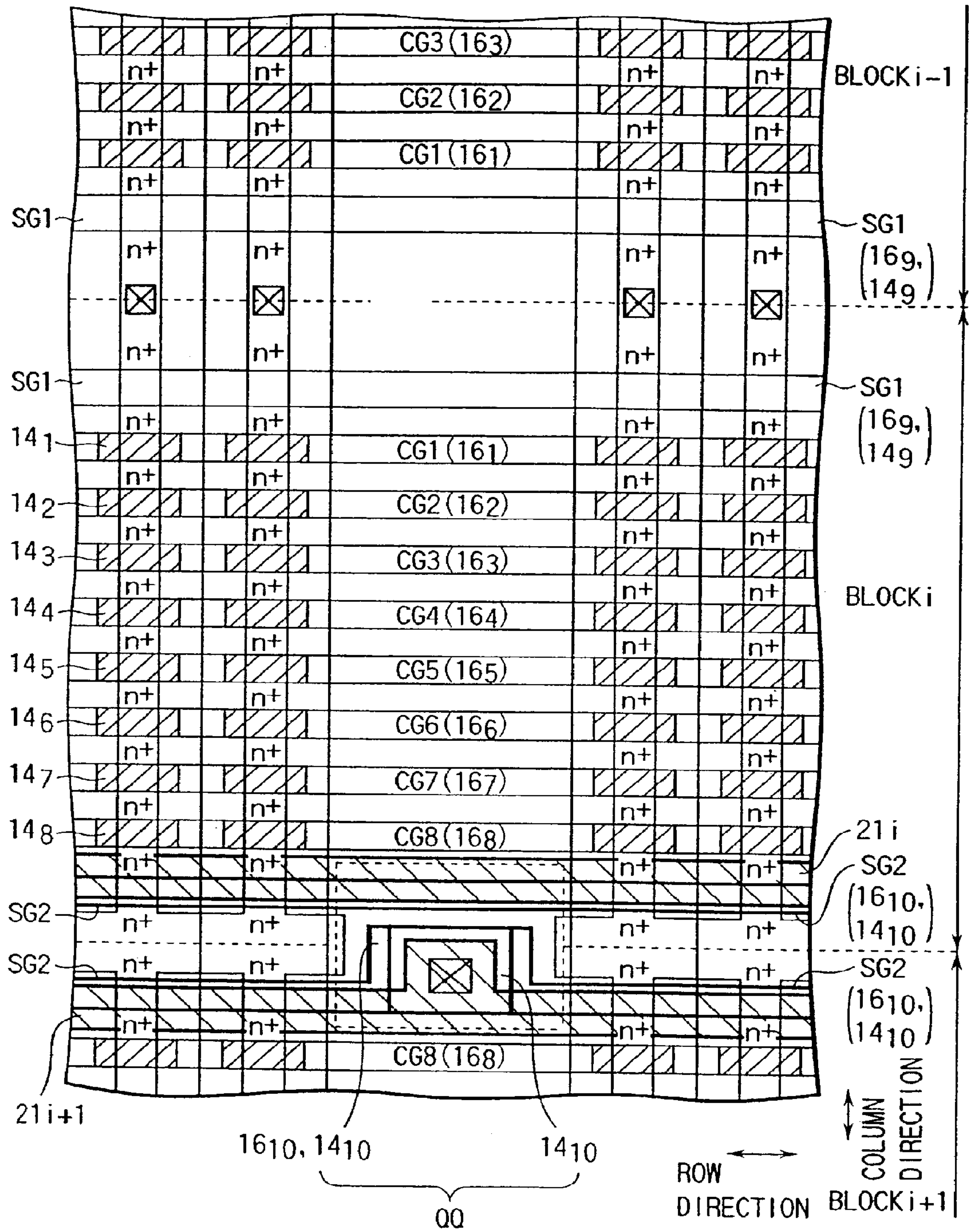

FIGS. 124 and 125 show the seventh embodiment of plan pattern of a NAND cell EEPROM of the present invention. FIG. 124 is a view in detail showing the area A1 of FIG. 120, and FIG. 125 is a view in detail showing the area A2 of FIG. 120.

An EEPROM of the example will be compared with the EEPROM of the sixth embodiment described above. The EEPROM of the seventh embodiment is different from the sixth embodiment in that a select gate bypass line which is connected to a select gate line SG2 in a selected block is existent in the selected block.

That is, a select gate bypass line 21*i* which is connected to a select gate line SG2 in a block BLOCK i is located in the block BLOCK i and a select gate bypass line 21*i*+1 which is connected to a select gate line SG2 in a block BLOCK i+1 is located in the block BLOCK i+1.

The select gate bypass lines 21*i* and 21*i*+1 are located in the drain side away from the drain (bit line contact section) side edge of a word line (control gate electrode) CG8. That is, the select gate bypass lines 21*i* and 21*i*+1 are not located above word lines CG1, CG2, . . . .

Actually, since select gate bypass lines 21*i* and 21*i*+1 which are connected to a select gate lines SG2 are respectively provided in blocks BLOCK i and BLOCK i+1, the select gate bypass lines 21*i* and 21*i*+1 are each formed in a space from (the central portion of ) a bit line contact section to the drain side edge of the word line CG8 in order to prevent short-circuit of the adjacent select gate bypass lines 21*i* and 21*i*+1 from occurring.

In such a manner, while a select gate bypass line which is connected to a select gate line SG2 in a selected block is located in the selected block, the select gate bypass line is not located above a word line (control gate electrode) and therefore, a capacitance between the select gate bypass line and the word line can be very small.

Accordingly, in a selected block, a variation ΔV of a potential of a word line (control gate electrode) due to capacitive coupling between a select gate bypass line and a word line is so small that it can be neglected and therefore can be regarded to be 0. Therefore, an erroneous discharge of a bit line BL can be prevented from occurring and reliability of a data read operation can thus be improved greatly.

When a select gate bypass line with a low resistance is provided, a charging time for a select gate line is short and thereby a high speed operation is enabled. In company with this, timing of data read can be controlled by charge timing of the select gate line.

In the mean time, a pattern of select gate bypass lines 21*i* and 21*i*+1 in this example corresponds to that of the select gate bypass lines 21*i*−1 and 21*i* in the above described third embodiment.

While detailed description using a figure is omitted, it is natural that the patterns which respectively correspond to the second, fourth and fifth embodiments be each employed in the case of the select gate bypass lines 21$i$ and 21$i$+1 which are connected to the select gate line SG2 in the source side.

There are no limitations for patterns of select gate bypass lines in the first and sixth embodiments. That is, a select gate bypass line may be located so as to cover a plurality of word lines. A select gate bypass line which is connected to a select gate line in a selected block may be formed in a different block from a block adjacent to a selected block, where there is no specific limitation to the adjacent block.

Figure 126:
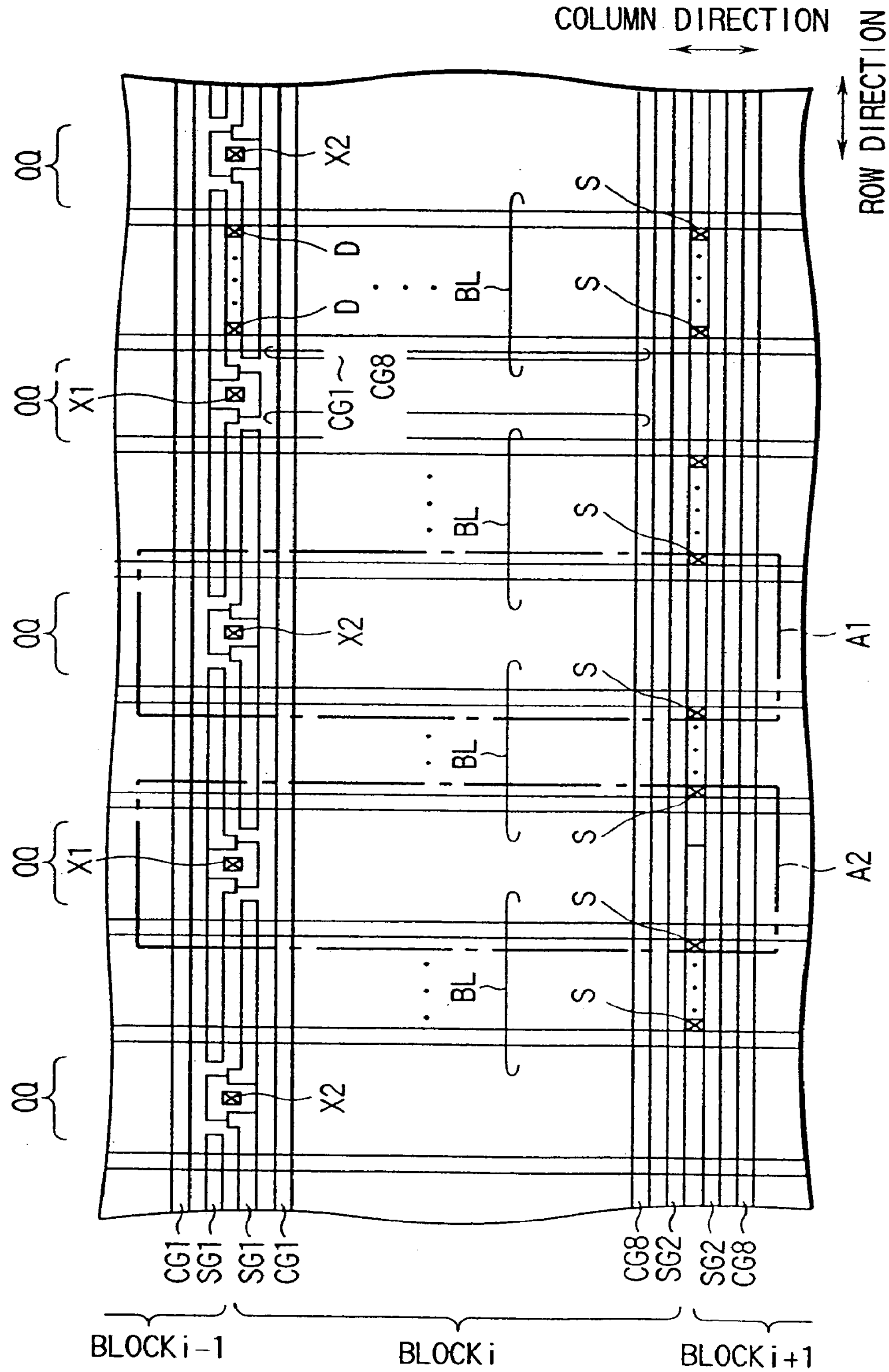
Figure 127:
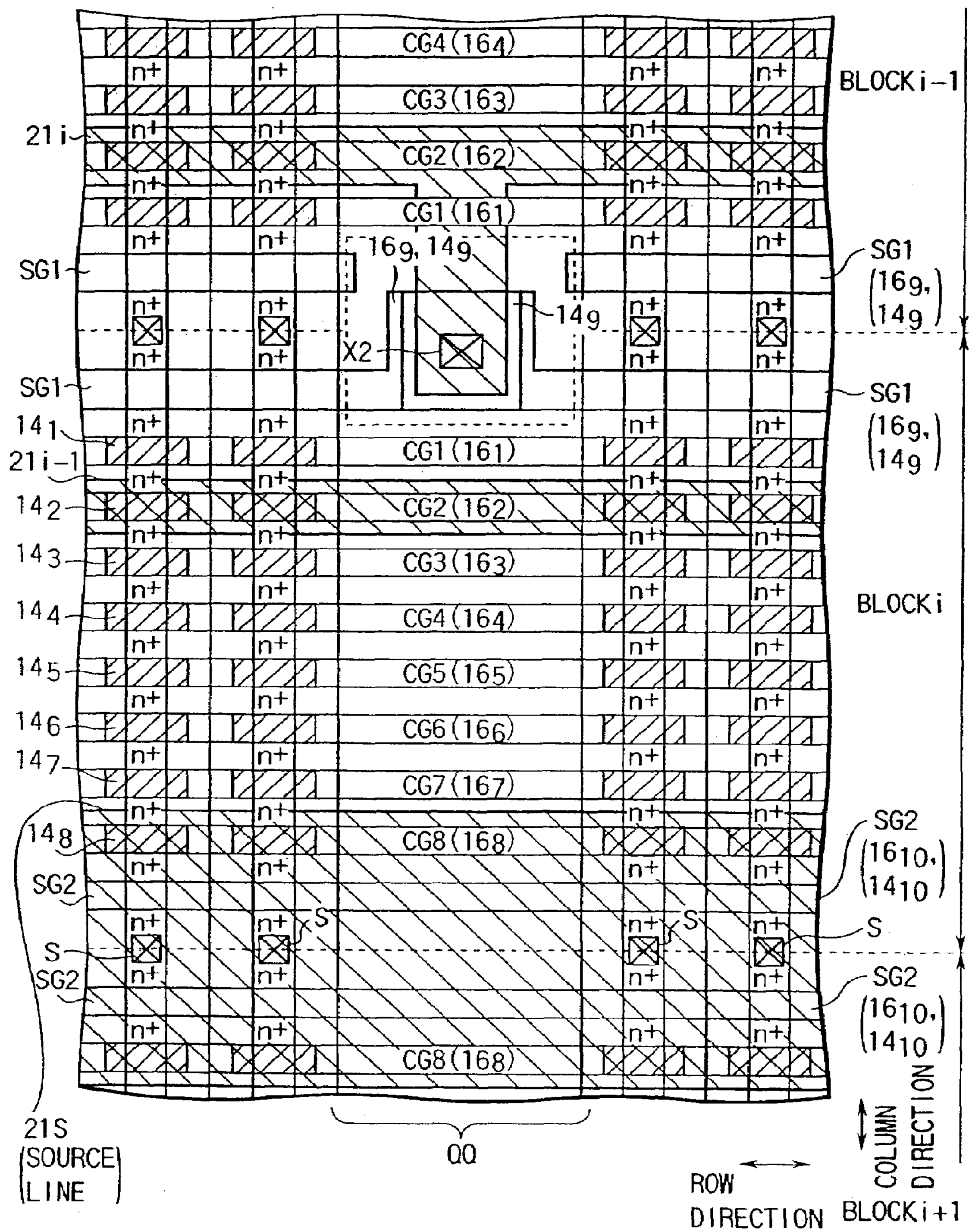
Figure 128:
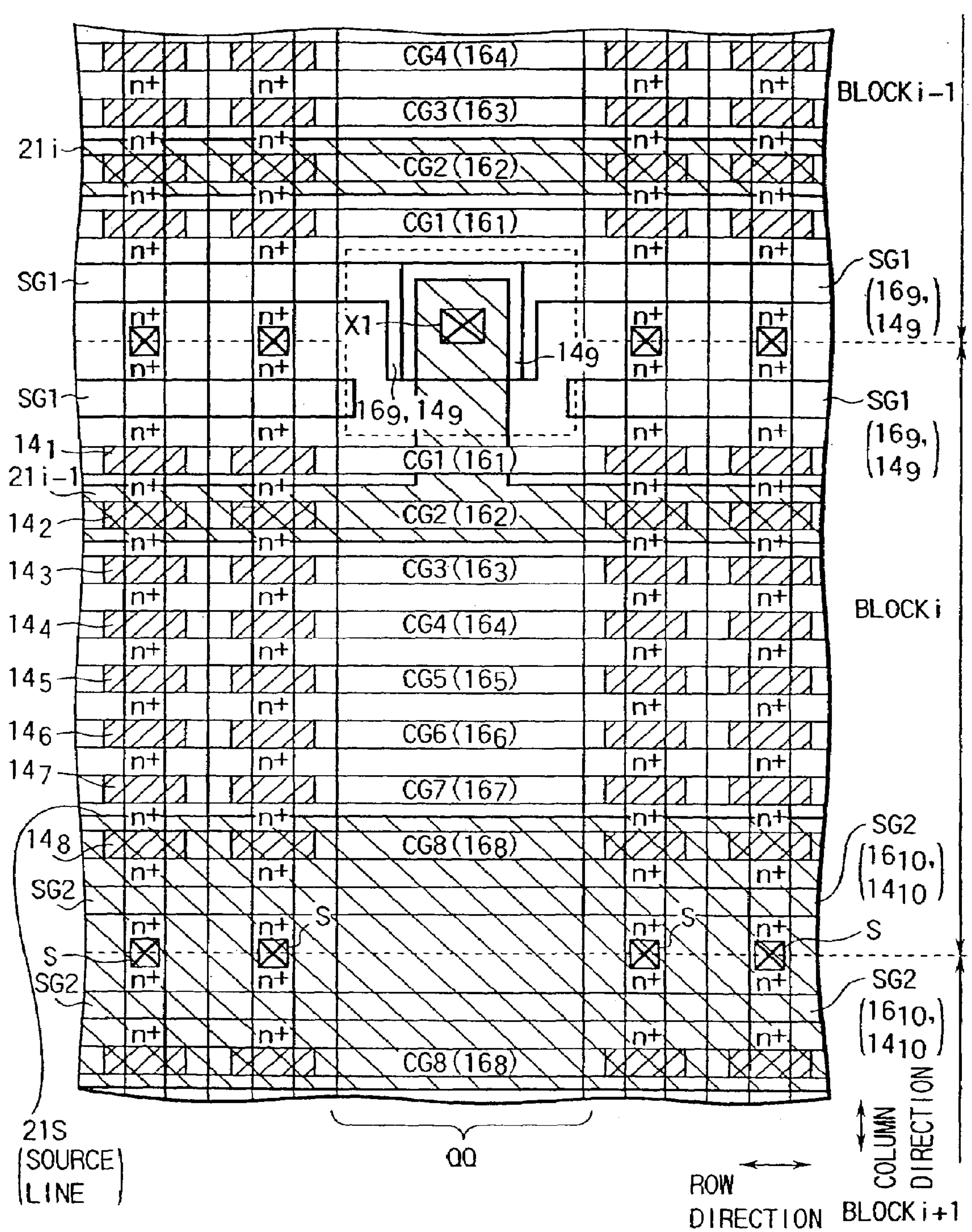

FIG. 126 shows the eighth embodiment of plan pattern of a NAND cell EEPROM of the present invention. FIG. 127 is a view in detail showing the area A1 of FIG. 126, and FIG. 128 is a view in detail showing the area A2 of FIG. 126.

A memory cell array is constructed of a plurality of blocks BLOCK i−1, BLOCK i and BLOCK i+1. In each of the blocks, a plurality of word lines (control gate electrodes) CG1 to CG8 and select gate lines SG1 and SG2, which all extends in the row direction are located. Each of a plurality of bit lines BL extending in the column direction commonly serves the blocks.

Shunt areas QQ are provided in the row direction at constant spaces. In a shunt area QQ, connection between a drain side select gate line SG1 and select gate bypass lines 21$i$−1 and 21$i$ each with a low resistance which are formed in an upper layer of the select gate line SG1 is affected.

The select gate line SG1 in the block BLOCK i−1 and the select gate line SG1 in a block BLOCK i are located adjacent to each other. A select gate line SG1 is formed in the same layer as that in which word lines (control gate electrodes) CG1 to CG8 are formed and the select gate line SG1 is narrow and long like the word lines CG1 to CG8.

A contact section X1 for connecting the select gate line SG1 in the block BLOCK i−1 to a select gate bypass line 21$i$−1 and a contact section X2 for connecting the select gate line SG1 in the block BLOCK i to a select gate bypass line 21$i$ are not opposed to each other or staggered in the column direction and alternatively located in the row direction at constant spaces.

Herein, in the present invention, a select gate line SG1 ($\mathbf{14}_9$ and $\mathbf{16}_9$) in the block BLOCK i opposed to a contact section X1 in the block BLOCK i−1 is eliminated. Likewise, a select gate line SG1 ($\mathbf{14}_9$ and $\mathbf{16}_9$) in the block BLOCK i−1 opposed to a contact section X2 in the block BLOCK i is eliminated.

For example, the select gate line SG1 in the block BLOCK i−1 has contact sections X1 in the 2nth shunt area QQ from an end of the memory cell array and disconnected in the 2n−1th from the end of the memory cell array (wherein n is a positive integer except 0). In this case, the select gate line SG1 in the block BLOCK i has contact sections X2 in the 2n−1th shunt area QQ from the end of the memory cell array and disconnected in the 2nth from the end of the memory cell array (wherein n is a positive integer except 0).

Such a structure is effective for narrowing a size of a memory cell array in the column direction.

As is similar to the case of the above described first embodiment, a select gate bypass line 21$i$−1 which is connected to the select gate line SG1 in the block BLOCK i−1 is located above the word line (control gate electrode) CG2 in the block BLOCK i. A select gate bypass line 21$i$ which is connected to the select gate line SG1 in the block BLOCK i is located above the word line (control gate electrode) CG2 in the block BLOCK i−1.

That is, a select gate bypass line 21$i$−1 is located in the block BLOCK i which is different from the block BLOCK i−1 in which the select gate line SG1 to which the select gate bypass line 21$i$−1 is connected is existent and a select gate bypass line 21$i$ is located in the block BLOCK i−1 which is different from the block BLOCK i in which the select gate line SG1 to which the select gate bypass line 21$i$ is connected is existent.

In the example, a source contact section S is provided on a source diffused layer and a source line 21S is located above the source contact section S. The source line 21S is formed in the same layer as that in which select gate bypass lines 21$i$−1 and 21$i$ are formed and extends in the row direction.

In the mean time, a source line 21S may be formed in a different layer from a layer in which select gate bypass lines 21$i$−1 and 21$i$ are formed.

In the NAND cell EEPROM having the above described structure, as in the case of the first embodiment, select gate bypass lines 21$i$−1 and 21$i$ are respectively existent in blocks which are different from blocks in which a select gate line SG1 to which the select gate bypass lines 21$i$−1 and 21$i$ are respectively connected are existent. That is, a select gate bypass line which is connected to a select gate line in a selected block is located in a non-selected block.

Accordingly, when an electric source potential Vcc for selecting a block is applied onto a select gate bypass line which is connected to a select gate line in a selected block, since there arises no situation where a potential of a word line in a selected block is raised, an erroneous read can be prevented from occurring.

When a select gate bypass line with a low resistance is provided, charging time for a select gate line is short and a high speed operation can be realized. In company with this, timing of data read can be controlled by charge timing of the select gate line.

Figure 130:
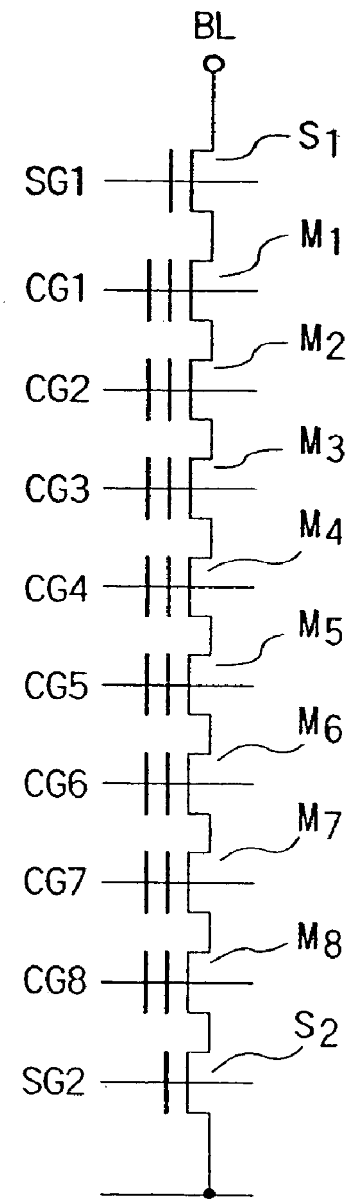

FIG. 129 shows one NAND cell unit taken out from the memory cell array of FIGS. 127 and 128. FIG. 130 is an equivalent circuit to the device of FIG. 129 and FIG. 131 is a sectional view taken along the line CXXXI-CXXXI of FIG. 129.

A feature of the example is that a common source region extending in the row direction in common to NAND cell units in a block is not required to be provided in a p-type silicon substrate (or p-type well region) since a source line 21S is provided.

That is, in the examples other than the just described example, a pattern of an active region of a NAND cell (a region other than a device isolation region, that is, a region comprising channel regions and $n^+$ regions of a memory cell and a select transistor) has a lattice-like shape constructed from a linear region extending in the column direction in which a NAND cell unit is formed and a linear region extending in the row direction in which a common source region is formed.

On the other hand, in the example, a pattern of an active region of a NAND cell is of a linear shape constituted of a region, which extends in the column direction, and in which a NAND cell unit is formed. That is, in the example, NAND cell units located in the row direction in an adjacent manner has no source region ($n^+$ region) common to the units, but source regions are connected to each other by a source line 21S.

Why the active region is linear is that active regions ($n^+$ region) of the NAND cell unit are located, in an adjacent manner, in the column direction.

In the example, an advantage can be enjoyed that processing of device isolation regions (for example, a STI structure) is easy and an active region of a stable shape can be formed since an active region is not of a lattice like shape which has many corners, but of a linear shape.

FIG. 132 shows the ninth embodiment of plan pattern of a NAND cell EEPROM of the present invention. FIG. 133 is a view in detail showing the area A1 of FIG. 132 and FIG. 134 is a view in detail showing the area A2 of FIG. 132.

The example is a modification of the above described eighth embodiment and a pattern of a select gate line SG1, and select gate bypass lines 21*id* and 21(*i*−1)*d* in the drain (bit line contact section) side of a NAND cell unit is same as the eighth embodiment.

A feature of the ninth embodiment is that in the source side of a NAND cell unit, not only are a source contact section S and a source line 21S provided, but a select gate contact section X3, and select gate bypass lines 21*is* and 21(*i*+1)S are provided.

The source lines 21S are disconnected by shunt areas QQ, in parts emptied by which disconnection contact sections X3 and X4 for select gate line SG2 are exposed.

A select gate bypass line 21*is* which is connected to a select gate line SG2 in a block BLOCK i is located in a block BLOCK i+1 which is adjacent to the block BLOCK i and a select gate bypass line 21(*i*+1)*s* which is connected to a select gate line SG2 in a block BLOCK i+1 is located in the block BLOCK i which is adjacent to the block BLOCK i+1.

A select gate line SG2 ($\mathbf{14}_{10}$ and $\mathbf{16}_{10}$) in the block BLOCK i+1 opposed to a contact section X3 in the block BLOCK i is eliminated. In a similar way, a select gate line SG2 ($\mathbf{14}_{10}$ and $\mathbf{16}_{10}$) in the block BLOCK i opposed to a contact section X4 in the block BLOCK i+1 is eliminated.

A source line 21S is formed in the same layer as that in which select gate bypass lines 21*is* and 21(*i*+1)*s* are formed. But the source line 21S and the select gate bypass lines 21*is* and 21(*i*+1)*s* may be formed in two layers in a bestriding manner or in different layers respectively.

According to the above described structure, in the source side of a NAND cell unit, select gate bypass lines 21*is* and 21(*i*+1)*s*, and a source line 21S are provided. A source line 21S is of a low resistance and is connected to the source region of each NAND cell unit by way of a contact section S. Accordingly, a stable potential can be supplied to the source region of each NAND cell unit.

Besides, with select gate bypass lines 21*is* and 21(*i*+1)*s* having a low resistance provided since a charging time for a select gate SG2 is short, a high speed operation can be realized. In company with this, timing of data read can be controlled by charge timing of a select gate line SG2. In the drain side, too, since select gate bypass lines 21(*i*−1)*d* and 21*id* are provided, a charging time for a select gate line SG1 is short and there by a high speed operation can be realized.

Besides, an erroneous read caused by capacitive coupling between a word line and a select gate bypass line can naturally be prevented from occurring, which is a fundamental effect of the present invention.

FIG. 135 is the tenth embodiment of plan pattern of a NAND cell EEPROM of the present invention. FIG. 136 is a view in detail showing the area A1 of FIG. 135 and FIG. 137 is a view in detail showing the area A2 area.

The example is a modification of the above described ninth embodiment.

In the above described ninth embodiment, the contact section X2 for the select gate line SG1 and the contact section X3 for the select gate line SG2 in the block BLOCK i are located in the same shunt area.

On the other hand, in the tenth embodiment, a contact section X2 for a select gate line SG1 and a contact section X3 for a select gate line SG2 in a block BLOCK I are not located in the same shunt area.

That is, a contact section X2 for a select gate line SG1 in a block BLOCK i and a contact section X4 for a select gate line SG2 in a block BLOCK i+1 are in the same shunt area and a contact section X1 for a select gate line SG1 in a block BLOCK i−1 and a contact section X3 for a select gate line SG2 in a block BLOCK i are in the same shunt area.

In the above described structure, too, in the source side of a NAND cell unit, select gate bypass lines 21*is* and 21(*i*+1)*s*, and a source line 21S are provided. A source line 21S is of a low resistance and connected to the source region of each NAND cell unit by way of a contact section S. Accordingly, a stable potential can be supplied to the source region of each NAND cell unit.

Besides, with select gate bypass lines 21*is* and 21(*i*−1)*s* having a low resistance provided, since a charging time for a select gate SG2 is short, a high speed operation can be realized. In company with this, timing of data read can be controlled by charge timing of a select gate line SG2. In the drain side, too, since select gate bypass lines 21(*i*−1)*d* and 21*id* are provided, a charging time for a select gate line SG1 is short and thereby a high speed operation can be realized.

Besides, an erroneous read caused by capacitive coupling between a word line and a select gate bypass line can naturally be prevented from occurring, which is a fundamental effect of the present invention.

Then, which of the patterns of the above described ninth and tenth embodiments is better will be considered. When discharge timings of select gate lines SG1 and SG2 are the same, the pattern of the ninth embodiment is more advantageous.

That is, in the ninth embodiment, for example, each of the NAND cell units in the block BLOCK i is located at a position whose distances from the contact section X2 for the select gate line SG1 and from the contact section X3 for the select gate line SG2 are equal.

For this reason, in the above described ninth embodiment, waveforms of charging/discharging of the select gate lines SG1 and SG2 in each NAND cell unit are same and thereby there arise advantages that control and analysis of operation of a NAND cell (especially, control and analysis of timing after start of a read operation in a selected block and the like) are easy.

On the other hand, in the tenth embodiment, each of the NAND cell units in the block BLOCK i are in many cases located at a position whose distances from the X2 contact section for the select gate line SG1 and from the contact section X3 for the select gate line SG2 are not equal.

However, the pattern of the tenth embodiment is more advantageous than the ninth embodiment in order to, for certain, electrically separate a NAND cell unit from a bit line BL and a source line 21S in a non-selected block.

That is, in the tenth embodiment, distances of each NAND cell unit from a contact section X2 and from a contact section X3 are not equal to each other, but there is no chance that the distances can assume the longest value at the same time (when one is of the longest, the other is of the shortest).

Hence, for example, in a NAND cell unit which is close to a contact section X2 for a select gate line SG1, the NAND cell unit can electrically be separated from a bit line BL for certain by a select gate line SG1 (0V), and for a NAND cell unit which is close to a contact section X3 for a select gate line SG2, the NAND cell unit can electrically be separated from a source line 21S for certain by a select gate line SG2 (0V).

FIG. 138 shows the eleventh embodiment of plan pattern of a NAND cell EEPROM of the present invention. FIG. 139 is a view in detail showing the area A1 of FIG. 138. A figure which is a view in detail showing the area A2 of FIG. 138 is omitted.

The eleventh embodiment is a modification of the ninth and tenth embodiments.

In the ninth and tenth embodiments, a source side select gate line SG2 in a block BLOCK i and a source side select gate line SG2 in a block BLOCK i+1 are respectively connected to different select bypass lines 21*is* and 21(*i*+1)*s*.

To the contrary, in the eleventh embodiment, a source side select gate line SG2 in a block BLOCK i and a source side select gate line SG2 in a block BLOCK i+1 are connected to the same select gate bypass line 21*i*(*i*+1)*s* by way of a select gate contact section X5.

In this case, select gate lines SG2 in a block BLOCK i and a block BLOCK i+1 which are located adjacent to each other with a source line 21S sandwiched therebetween are driven in the same timing.

In the case where a selected word line (normally 0V) is CG6, a potential of the word line CG6 is considered to be raised by ΔV due to capacitive coupling between the word line CG6 and a select gate bypass line 21*i*(*i*+1)*s*.

Then, such a problem is solved by an operation method.

That is, according to the operation method, charging of a source side select gate line SG2 gets first started and after that: this state is retained for a while (after a potential of a word line is raised by ΔV due to capacitive coupling and then the potential is lowered back to a value in the vicinity of 0V), charging of a select gate line SG1 in the drain side gets started.

With such procedures applied, a situation where a potential of a bit line BL is discharged in error by rise in potential due to capacitive coupling can be avoided and a data read operation with high reliability can be realized.

FIG. 140 shows the twelfth embodiment of plan pattern of a NAND cell EEPROM of the present invention. FIG. 141 is a view in detail showing the area A1 of FIG. 140. A figure which is a view in detail showing the area A2 of FIG. 140 is omitted.

The twelfth embodiment is a modification of the ninth and tenth embodiments.

In the above described ninth and tenth embodiments, a drain side select gate line SG1 in a block BLOCK i−1 and a drain side select gate line SG1 in a block BLOCK i are respectively connected to different select gate bypass lines 21(*i*−1)*d* and 21*id*.

To the contrary, in the twelfth embodiment, a drain side select gate line SG1 in a block BLOCK i−1 and a drain side select gate line SG1 in a block BLOCK i are connected to the same select gate bypass line 21(*i*−1)*id* by way of a select gate contact area X0.

In this case, the select gate lines SG1 in the blocks BLOCK i−1 and BLOCK i are driven in the same timing.

When a selected word line is CG2, a potential of the word line CG2 (normally 0V) is considered to be raised by ΔV due to capacitive coupling between the word line CG2 and a select gate bypass line 21(*i*−1)*id*.

Therefore, charging of a select gate line SG1 in the drain side gets first started and after that: this state is retained for a while (after a potential of a word line is raised by ΔV due to capacitive coupling and then the potential is lowered back to a value in the vicinity of 0V), charging of a select gate line SG2 in the source side gets started.

With such procedures applied, a situation where a potential of a bit line BL is discharged in error by a rise in potential due to capacitive coupling can be avoided and a data read operation with high reliability can be realized.

FIG. 142 shows the thirteenth embodiment of plan pattern of a NAND cell EEPROM of the present invention.

The thirteenth embodiment is a modification of the twelfth embodiment.

A feature of the present invention is that widths in the column direction of contact sections X0 and X5 which are respectively opposed to a drain side select gate line SG1 (14$_9$) and a source side select gate line SG2 (14$_{10}$) are a little narrowed, that is, a width of a contact section X0 is narrower than a space between the source sides edges of two select gate lines SG1 and a width of a contact section S5 is narrower than a space between the drain side edges of two select gate lines SG2.

According to the thirteenth embodiment, margins in processing of select gate lines SG1 (14$_9$) and SG2 (14$_{10}$) can be larger a little. That is, in shunt areas QQ, when a distance between a word line (control gate electrode) CG1 and a select gate line SG1 (14$_9$) and a distance between a word line CG8 and a select gate line SG2 (14$_{10}$) are respectively secured so as to be larger values, probabilities to produce short-circuit between the word line CG1 and the select gate line SG1 (14$_9$) and short-circuit between the word line CG8 and the select gate line SG2 (14$_{10}$) are greatly reduced.

In the meantime, the contact sections X0 and X5 can be fabricated with ease: for example, after upper layers 16$_9$ and 16$_{10}$ of select gate lines are processed, resist is formed on the contact sections X0 and X5 and thereafter, lower layers 14$_9$ and 14$_{10}$ are processed.

FIG. 143 shows a view of the fourteenth embodiment of plan pattern of a NAND cell EEPROM of the present invention.

The fourteenth embodiment is a modification of the above described eleventh embodiment (FIG. 139).

A feature of the fourteenth embodiment is that a select gate bypass line 21*i*(*i*+1)*s* is located only in a block BLOCK i and connection of a source line 21S is affected in a block BLOCK i+1.

That is, while in the example of FIG. 139 a total of two select gate bypass lines are respectively provided in blocks BLOCK i and BLOCK i+1 one in one, in the fourteenth embodiment, one of the two select gate bypass lines is eliminated and a source line 21S is located in the space emptied by the elimination.

With this structure, the source line 21S can extend in line in the row direction in the same layer, so that the source line 21S is not required to be formed across a plurality of layers in a bestriding manner.

While the first to fourteenth embodiments are sequentially made clear in the above description, the examples can be employed, singly or in combination of examples.

Besides, it is also possible that the present invention is applied to one of select gate lines SG1 and SG2 and a conventional technique is applied to the other. In this case, it is only required that charging of the other select gate line to which a conventional technique is applied gets first started and after that: this state is retained for a while (after a potential of a word line is raised by ΔV due to capacitive coupling and then the potential is lowered back to a value in the vicinity of 0V), charging of the one select gate line gets started.

FIGS. 144 to 156 show schematic patterns of a select gate bypass line which is connected to a drain (bit line contact section) side select gate line SG1.

The example of FIG. 144 corresponds to the second or third embodiment (FIGS. 114 and 115 or FIG. 117). That is, a select gate bypass line 21A which is connected to a select gate line SG1 in a block A is located above the select gate line SG1 in the block A and a select gate bypass line 21B which is connected to a select gate line SG1 in a block B is located above the select gate line SG1 in the block B.

Another effect of the pattern of the example is that a large area is secured above word lines of NAND cell groups in the same layer as that in which a select gate bypass line is located and therefore, for example, an interconnection such as a block decode line can be located, in addition to a fundamental advantage that increase in potential of a non-selected word line in a selected block due to capacitive coupling does not occur.

The example of FIG. 145 corresponds to the above described fourth or fifth embodiment (FIG. 118 or FIG. 119). That is, a select gate bypass line 21A which is connected to a select gate line SG1 in a block A is located in the source side away from the select gate line SG1 in the block A and a select gate bypass line 21B which is connected to a select gate line SG1 in a block B is located in the source side away from the select gate line SG1 in the block B. In the fourth or fifth embodiment, select gate bypass lines 21A and 21B are not located so as to cover word lines CG1 to CG8.

An effect of the pattern of the example of FIG. 145 is that since a space between a select gate bypass line 21A in a block A and a select gate bypass line 21B in a block B can be wide, there is no restriction from the design rule.

The example of FIG. 146 corresponds to the above described first embodiment (FIGS. 105 to 107). That is, a select gate bypass line 21A which is connected to a select gate line SG1 in a block A is located in a block B and a select gate bypass line 21B which is connected to a select gate line SG1 in the block B is located in the block A.

According to the example of FIG. 146, since positions and widths of select gate bypass lines 21A and 21B can freely be set, effects such as reduction in interconnection resistance and realization of easy design can be attained, in addition to prevention of an erroneous read due capacitive coupling.

The example of FIG. 147 corresponds to the above described twelfth or thirteenth embodiment (FIG. 141 or FIG. 142). That is, select gate lines in blocks A and B are commonly connected to select gate contact sections in common to both, provided in shunt areas QQ and a select gate bypass line 21AB is connected to the contact sections.

In the example, the select gate bypass line 21AB is located in blocks A and B and connected to select gate lines SG1 in all shunt areas QQ. Accordingly, a select gate bypass line 21AB with a low resistance can be realized. A problem of an erroneous read due to capacitive coupling can be solved by timing of potential application to select gate lines SG1 and SG2.

In the example of FIG. 148, not only are contact sections for a select gate line SG1 in a block A provided in all shunt areas QQ, but contact sections for a select gate line SG1 in a block B are also provided in all the shunt areas QQ. That is, two contact sections are provided in one shunt area. A select gate bypass line 21A is connected to a select gate line SG1 in a block A and a select gate bypass line 21B is connected to a select gate line SG1 in a block B.

In the pattern of the example, since the number of contact sections for one select gate line SG1 can be increased and a space between adjacent contact sections can be narrowed, a charging time for a select gate line SG1 can be shortened. Since potentials of a select gate line SG1 in a block A and a select gate line SG1 in a block B can independently be set, no restriction on operation of the select gate lines SG1 is existent.

In the example of FIG. 149, as in the example of FIG. 148, contact sections for a select gate line SG1 in a block A are provided in all shunt areas QQ and contact sections for a select gate line SG1 in a block B are provided in all the shut areas. However, in the example of FIG. 149, a select gate bypass line 21A which is connected to a select gate line SG1 in a block A is located in a block B and a select gate bypass line 21B which is connected to a select gate line SG1 in the block B is located in the block A.

According to the example of FIG. 149, an effect like that of the example of FIG. 148 is attained and in addition, since positions and widths of select gate bypass lines 21A and 21B can freely be set, other effects can be obtained that an erroneous read due to capacitive coupling is prevented from occurring, an interconnection resistance is decreased, designing is made easy and the like.

In the example of FIG. 150, select gate lines SG1 of blocks A and B are commonly connected to select gate contact sections in common to both, provided in shunt areas QQ and a select gate bypass lines 21AB is connected to the contact sections. In the example, the select gate bypass line 21AB is located in the block A only.

An effect of the example of FIG. 150 is that since a large area can be secured in a block B in the same layer as that in which a select gate bypass line 21AB is located, other interconnections can be located in the large area.

In the example of FIG. 151, select gate lines SG1 of blocks A and B are commonly connected to select gate contact sections in common to both, provided in shunt areas QQ and a select gate bypass lines 21AB is connected to the contact sections. In the example, the select gate bypass line 21AB is alternatively located in the blocks A and B in the form of a square wave (or in a meandering manner) through shunt areas QQ.

In the example, a size of an area in which a word line (control gate electrode) and a select gate bypass line overlap in blocks A and B is halved. That is, since an effect of capacitive coupling between a word line and a select gate line is reduced by half and an increment ΔV in potential can thereby be halved, an erroneous read is hard to occur and data read with high reliability can be attained.

In the example of FIG. 152, a select gate bypass line 21A which is connected to a select gate line SG1 in a block A is located above the select gate line SG1 in the block A and a select gate bypass line 21B which is connected to a select gate line SG1 in a block B is located above the select gate line SG1 in the block B.

In the example of FIG. 153, a select gate bypass line 21A which is connected to a select gate line SG1 in a block A is located in the source side away from the select gate line SG1 in the block A and a select gate bypass line 21B which is connected to a select gate line SG1 in a block B is located in the source side away from the select gate line SG1 in the block B.

In the examples of FIGS. 152 and 153, a select gate line SG1 in a block B is disconnected at a position corresponding to a position where a contact section for a select gate line SG1 in a block A is provided and the select gate line SG1 in the block A is disconnected at a position corresponding to a position where a contact section for the select gate line SG1 in the block B is provided.

In the examples of FIGS. 152 and 153, since a select gate line SG1 is disconnected at predetermined positions, a space between two select gate lines adjacent to each other can be narrowed. Thereby, a size of a memory cell area in the column direction can be smaller, which can in turn contribute to downsizing of a memory chip.

The example of FIG. 154 corresponds to the eighth to eleventh embodiments (FIGS. 127, 128, 133, 134, 135, 137, 139 and the like). That is, a select gate bypass line 21A which is connected to a select gate line SG1 in a block A is located in a block B and a select gate bypass line 21B which is connected to a select gate line SG1 in the block B is located in the block A.

A select gate line SG1 in a block B is disconnected at a position corresponding to a position where a contact section for a select gate line SG1 in a block A is provided and the select gate line SG1 in the block A is disconnected at a position corresponding to a position where a contact section for the select gate line SG1 in the block B is provided.

In the example of FIG. 154, while an effect similar to that of the example of FIGS. 152 and 153 can be attained, since positions and widths of select gate bypass lines 21A and 21B can freely set, additional effects can also be obtained that an erroneous read due to capacitive coupling is prevented from occurring, an interconnection resistance is decreased, designing is made easy and the like.

The example of FIG. 155 is a modification of FIG. 148. That is, in one shunt area QQ, a contact section for a select gate line SG1 in a block A and a contact section for a select gate line SG1 in a block B are both provided. Besides, not only are select gate lines SG1 disconnected in shunt areas QQ, but the select gate lines SG1 which are disconnected are connected to select gate bypass lines 21A and 21B through contact sections corresponding to disconnected ends of the select gate lines SG1.

In the example of FIG. 155, too, while effects similar to those of FIGS. 152 and 153 are attained, an additional effect is obtained that a charging time for a select gate line SG1 is shortened.

The example of FIG. 156 is a modification of FIG. 149. That is, in one shunt area QQ, a contact section for a select gate line SG1 in a block A and a contact section for a select gate line SG1 in a block B are both provided. Besides, not only are select gate lines SG1 disconnected in shunt areas QQ, but the select gate lines SG1 disconnected are connected to select gate bypass lines 21A and 21B through contact sections corresponding to disconnected ends of the select gate lines SG1.

In the example of FIG. 156, too, since select gate lines are disconnected in predetermined positions, a space between select gate lines can be narrowed, which can contribute to realization of a memory cell array of a smaller size and reduction in cost of a chip.

FIGS. 157 to 169 show schematic patterns of a select gate bypass line which is connected to a source side select gate line SG2.

Select gate bypass lines which are connected to source side select gate lines SG2 can adopt patterns similar to those of select gate bypass lines which are connected to drain (bit line contact section) side select gate lines SG1 and the patterns of FIGS. 157 to 169 can attain effects similar to those attained in the drain side.

The example of FIG. 157 corresponds to the example of FIG. 144. That is, a select gate bypass line 21B which is connected to a select gate line SG2 in a block B is located above the select gate line SG2 in the block B and a select gate bypass line 21C which is connected to a select gate line SG2 in a block C is located above the select gate line SG2 in the block C.

The example of FIG. 158 corresponds to the example of FIG. 145. That is, a select gate bypass line 21B which is connected to a select gate line SG2 in a block B is located in the drain side away from the select gate SG2 in the block B and a select gate bypass line 21C which is connected to a select gate line SG2 in a block C is located in the drain side away from the select gate line SG2 in the block C.

The example of FIG. 159 corresponds to the example of FIG. 146. That is, a select gate bypass line 21B which is connected to a select gate line SG2 in a block B is located in a block C and a select gate bypass line 21C which is connected to a select gate line SG2 in the block C is located in the block B.

The example of FIG. 160 corresponds to the example of FIG. 147. That is, select gate lines SG2 in blocks B and C are commonly connected to select gate contact sections in common to both, provided in shunt areas QQ and a select gate bypass line 21BC is connected to the contact sections. In the example, the select gate bypass line 21BC is located in both of the blocks B and C.

The example of FIG. 161 corresponds to the example of FIG. 148. That is, not only are contact sections for a select gate line SG2 in a block B provided in all shunt areas, but contact sections for a select gate line SG2 in a block C are provided in all the shunt areas. That is, two contact sections are located in one shunt area QQ.

The example of FIG. 162 corresponds to the example of FIG. 149. That is, a contact section for a select gate line SG2 in a block B and a contact section for a select gate line SG2 in a block C are provided in one shunt area. In the example of FIG. 162, a select gate bypass line 21B which is connected to the select gate line SG2 in the block B is located in the block C and a select gate bypass line 21C which is connected to the select gate line SG2 in the block C is located in the block B.

The example of FIG. 163 corresponds to the example of FIG. 150. That is, select gate lines SG2 in blocks B and C are commonly connected to select gate contact sections in common to both, provided in shunt areas QQ and a select gate bypass line 21BC is connected to the contact sections. In the example of FIG. 163, the select gate bypass line 21BC is located in the block B only.

The example of FIG. 164 corresponds to the example of FIG. 151. That is, select gate lines SG2 in blocks B and C are commonly connected to select gate contact sections in common to both, provided in shunt areas QQ and a select gate bypass line 21BC is connected to the contact sections. In the example of FIG. 164, the select gate bypass line 21BC is alternatively located in the blocks B and C in the form of a square wave (or in a meandering manner) through shunt areas QQ.

In the example of FIG. 165 corresponds to the example of FIG. 152 and the example of FIG. 166 corresponds to the example of FIG. 153. In the examples of FIGS. 165 and 166, a select gate line SG2 in a block C is disconnected at positions corresponding to positions where contact sections for a select gate line SG2 in a block B are provided and a select gate line SG2 in the block B is disconnected at positions corresponding to positions where contact sections for the select gate line SG2 in the block C are provided.

The example of FIG. 167 corresponds to the example of FIG. 154. That is, a select gate bypass line 21B which is connected to a select gate line SG2 in a block B is located in a block C and a select gate bypass line 21C which is connected to a select gate line SG2 in the block C is located in the block B.

The select gate line SG2 in the block C is disconnected at positions corresponding to positions where the contact sections for the select gate line SG2 in the block B are respectively provided and the select gate line SG2 in the block B is disconnected at positions corresponding positions where the contact sections for the select gate lines SG2 in the block C are respectively provided.

The example of FIG. 168 corresponds to the example of FIG. 155. That is, in one shunt area QQ, a contact section for a select gate line SG2 in a block B and a contact section for a select gate line SG2 in a block C are both provided. Besides, not only are select gate lines SG2 disconnected in shunt areas, but the select gate lines SG2 disconnected are respectively connected to select gate bypass lines 21B and 21C through contact sections corresponding to disconnected ends of the select gate lines SG2.

The example of FIG. 169 corresponds to the example of FIG. 156. That is, in one shunt area, a contact section for a select gate line SG2 in a block B and a contact section for a select gate line SG2 in a block C are both provided. Besides, not only are select gate lines SG2 disconnected in shunt areas, but the select gate lines SG2 are respectively connected to select gate bypass lines 21B and 21C through contact sections corresponding to disconnected ends of the select gate lines SG2.

Then, a relationship between a data read operation and the present invention will be considered.

In timing of operation of FIG. 170, after a non-selected word line (control gate electrode) CG2 to CG8 are charged (a selected CG1 is kept at 0V as it was), this state is retained for a while and select gate lines SG1 and SG2 are then charged to an electric source potential Vcc in the same timing. In this case, there is a risk that a potential of a selected word line CG1 is raised by ΔV by an influence of capacitive coupling in the charging of the select gate lines SG1 and SG2.

Accordingly, it is effective to adopt structures by which no increment ΔV in potential occurs or an increment ΔV in potential is small, for example layouts of FIGS. 144, 146, 148, 149, 151, 152, 154, 155 and 156 for the select gate line SG1 and layouts of FIGS. 157, 159, 161, 162, 164, 165, 167, 168 and 169 for the select gate line SG2.

In timing of operation of FIG. 171, after a non-selected word line (control gate electrode) CG1 to CG7 and a select gate SG2 are charged (a selected CG8 is kept at 0V as it was), this state is retained for a while and a select gate line SG1 is then charged to an electric source potential Vcc. The cases of the charging of the select gate lines SG2 are shown together where a potential of the selected word line CG8 is raised by ΔV by an influence of capacitive coupling and where a potential of the selected word line CG8 is not raised (the potential is kept fixed at 0V) by ΔV by an influence of capacitive coupling.

Timing of operation is adopted that if a potential of the word line CG8 is raised by ΔV due to capacitive coupling, charging of the select gate line SG1 gets started after the potential ΔV of the word line CG8 is reduced to again assume 0V.

In this case, for a select gate bypass line which is connected to a select gate line SG1 in the drain side, structures in which increase in potential of the word line CG1 by capacitive coupling is nothing or small are adopted, considering the case where the word line CG1 is selected: the structures being, for example, FIGS. 144, 147, 148, 149, 151, 152, 154, 155, 156 and the like.

In timing of operation of FIG. 172, after a non-selected word line (control gate electrode) CG2 to CG8 and a select gate line SG1 are charged (a selected CG1 is kept at 0V as it was), this state is retained for a while and a select gate line SG2 is then charged to an electric source potential Vcc. The cases in the charging of the select gate lines SG1 are shown together where a potential of the selected word line CG1 is raised by ΔV by an influence of capacitive coupling and where a potential of the selected word line CG1 is not raised (the potential is kept fixed at 0V) by ΔV by an influence of capacitive coupling.

Accordingly, timing of charging is adopted that after a potential ΔV of the word line CG1 attained by the capacitive coupling is again reduced to its original value 0V, charging of the select gate line SG2 gets started.

In this case, for a select gate bypass line which is connected to a select gate line SG2 in the source side, structures in which increase in potential of the word line CG8 by capacitive coupling is nothing or small are adopted, considering the case where the word line CG8 is selected: the structures being, for example, FIGS. 157, 159, 161, 162, 164, 165, 167, 168, 169 and the like.

Then, capacitive coupling between a word line (control gate electrode) and a diffused layer (source/drain) or a channel of a memory cell will be considered.

Timing of a read operation of FIG. 173 shows that the case where charge timings of select gate lines SG1 and SG2 are same.

When a data read operation gets started, a bit line BL is precharged to an electric source potential Vcc. Thereafter, a floating state is established and subsequently, charging of non-selected word lines CG2 to CG8 is effected. Subsequently, charging of select gate lines SG1 and SG2 is effected.

Besides, since charging of the select gate line SG1 is very fast, for example, an n+ diffused layer $\mathbf{19}_1$ in FIG. 131 assumes [Vcc−Vt(SG1)] at almost the same time as when the select gate line SG1 assumes an electric source potential Vcc, wherein Vt(SG1) is a threshold voltage of a select gate transistor S1 (for example, see FIGS. 129 to 131).

In this case, a potential of a selected word line CG1 should be normally fixed at 0V, but the potential is ΔV2 due to capacitive coupling between an n+ diffused layer $\mathbf{19}_1$ and the word line CG1.

At this point, since a select gate line SG2 is at an electric source potential Vcc, when a threshold voltage Vt (cell) of a selected memory cell is in the range of 0V <Vt(cell)<ΔV2, a potential of a bit line BL which normally shows the electric source potential Vcc is discharged through the selected memory cell and an erroneous read occurs.

In the read timing of FIG. 174, after non-selected word lines CG2 to CG8 and a select gate line SG1 are charged to the electric source potential Vcc, this state is retained for a while and charging of a select gate line SG2 is then conducted. In this case, in the charging of the select gate line SG1, a potential of the word line CG1, which is normally fixed at 0V, is ΔV2 due to capacitive coupling between the word line CG1 and an n+ diffused layer $\mathbf{19}_1$.

However, even when a potential of the word line CG1 has been raised to ΔV2, since there is available enough time in which the potential of the word line CG1 is returned to again be 0V before charging of the select gate line SG2 gets started after a potential of the word line CG1 has been raised to ΔV2, an advantage is enjoyed that an erroneous read does not occur.

Accordingly, in a method that after a bit line BL is precharged to the electric source potential Vcc, a floating state is established and data read is then effected according to a state of a selected memory cell, a data read operation with high reliability can be realized by controlling timing of charge starting of the select gate line SG2 so as to be later than those of the non-selected word lines CG2 to CG8 and the select gate line SG1.

Timing of data read operation shown in FIG. 175 shows a method in which charging to an electric source potential Vcc of a bit line BL which is in the floating state at 0V is conducted from a source line through a memory cell and a potential of the bit line BL after the charging is completed is sensed to judge data of the memory cell.

In this method of timing, the source line is at the electric source potential Vcc before starting of a read operation. When the read operation gets started, the bit line BL is first fixed at 0V and subsequently enters the floating state. Then, a select gate line SG2 and non-selected word lines CG1 to CG7 are charged to the electric source potential Vcc.

Here, an $n^+$ diffused layer $\mathbf{19}_9$ is charged to

[Vcc−Vt(SG2)] at almost the same time as the charging of the select gate line SG2, wherein Vt (SG2) is a threshold voltage of a select gate transistor S2. Hence, a potential of a selected word line CG8 is ΔV2 due its capacitive coupling with the $n^+$ diffused layer 199.

However, there is available enough time for the potential of the word line CG8 to be restored to 0V before charging of the select gate line SG1 gets started after increase in potential of the word line CG8. Therefore, when charging of the select gate line SG1 gets started, a potential of the word line CG8 has been fixed to 0V and a normal data read operation can be performed.

That is, after charging of the select gate line SG1, when data of a selected memory cell is "0," the selected memory cell is in the ON state and a bit line BL is charged to a VH potential through the selected memory cell from a source line, whereby "0" data is read. On the other hand, when data of a selected memory cell is "1," the selected memory cell is in the OFF state and a potential of a bit line BL is maintained at a potential as low as about 0V since no charging of a bit line BL is conducted, whereby "1" data is read.

In such a manner, an erroneous read due to capacitive coupling between the n+ diffused layer $\mathbf{19}_9$ and the selected word line CG8 can be prevented from occurring by controlling timing of charge starting of the control gate line SG1 so as to be later than those of the control gate SG2 and the non-selected word lines CG1 to CG7.

To sum up, as shown in FIGS. 174 and 175, a method in which charge timings for two select gate lines SG1, SG2 are shifted from each other and a select gate line closer to a bit line BL or a source line, whichever is higher in potential, is charged ahead of the other and after this state is kept for a while, charging of the other select gate line is conducted is very effective as a charging method for a select gate line in a read operation. With this method of charging adopted, a data read operation with high reliability can be realized.

Then, another pattern example will be described in the case where a non-volatile semiconductor memory of the present invention is applied to a NAND cell EEPROM.

FIG. 176 shows a pattern of a NAND cell unit used in the following example. FIG. 177 is an equivalent circuit to the pattern of FIG. 176.

A NAND cell unit is constructed of a NAND cell series composed of eight NAND cells which are serially connected therebetween and two select gate transistors S1 and S2 connected to both ends. A bit line BL contact section D is provided in an n+ diffused layer at the farthermost end in the drain side (select gate transistor S1 side) of the NAND cell unit and a source line contact section S is provided in an n+ diffused layer at the farthermost end in the source side (select gate transistor S2 side).

Bit line contact sections D are independently (separated by a device isolation insulating layer) provided in two NAND cell units adjacent to each other in the row direction respectively, while a bit line BL contact section D is shared by two NAND cell units adjacent to each other in the column direction. In the case of a source line contact section S, two source line contact sections S are independently provided in two NAND cell units adjacent to each other in the row direction respectively, while a source line contact section is shared by two NAND cell units adjacent to each other in the column direction.

FIGS. 178 to 181 show the fifteenth example of a NAND cell EEPROM of the present invention.

FIG. 178 shows a pattern of one interconnection layer formed on a NAND cell unit. FIG. 179 shows patterns of two interconnection layers including an interconnection layer formed in an upper layer of the interconnection layer of FIG. 178.

FIG. 180 shows a sectional view taken on line CLXXX-CLXXX line of FIG. 179 and FIG. 181 shows a sectional view taken on line CLXXXI-CLXXXI of FIG. 179.

In the example, there is arranged a source line 21S extending in the row direction which is commonly connected to source contact sections S in the row direction of a NAND cell unit. As a select gate bypass line which is connected to a source side select gate line SG2, for example, in a block B, a select gate bypass line 21C which is connected to a select gate line SG2 in a block C is located.

As a select gate bypass line which is connected to a drain side select gate line SG1, for example, in a block B, a select gate bypass line 21AB which is commonly connected to select gate lines SG1 in the blocks A and B is located.

In the example, a block decode line 21BLK is arranged in between select gate bypass lines 21AB and 21BC. The block decode line 21BLK is a signal line whose level is changed according to whether a block is selected or not selected and used in determination on selection or non-selection of the block.

When row decoders corresponding to one block are provided on both sides in the row direction, the block decode line 21BLK is provided for giving block selection signals to both of the row decoders existing on both sides. Structures of row decoders including the block decode line 21BLK will later be detailed.

In the example, connection between a bit line 18 (BL) and the NAND cell unit is effected using an interconnection for a bit line-cell connection 21BL-CELL which is formed in an interconnection layer between the bit line 18 and the NAND cell unit. The interconnection for bit line-cell connection 21BL-CELL is provided for the purpose that a contact hole through which the bit line 18 and the NAND cell unit are connected to each other is not too deep (when being shallow, processing is easy) and defects caused by a shift of a contact hole, hole to hole variation in size of contact holes and the like are prevented from occurring by increasing a pitch of contact sections B.

Accordingly, a width of a contact section B provided in an interconnection for bit line-cell connection 21BL-CELL is wider than that of the bit line 18 (or that of an active region). For this reason, contact sections B are alternatively arranged in the block sides A and B with contact sections D as boundary.

In the EEPROM according to the above described example, the select gate bypass lines 21AB and 21C, the block decode line 21BLK, the interconnection for bit line-cell connection 21BL-CELL and the source line 21S are all provided in the same interconnection layer and thereby, the number of interconnection layers can greatly reduced as compared with the case where the interconnections are respectively provided in different layers, so that a chip at a low cost can be realized. Besides, since the interconnection for bit-line cell connection 21BL-CELL is provided and a pitch of contact sections B is widened, margins for shift of a contact hole and hole to hole variation in size of contact holes can be secured and therefore, connection between a bit line BL and a memory cell can be performed for certain even for memory cells which are applied with a small design rule.

FIGS. 182 and 183 show configurations of shunt areas QQ of the EEPROMs of FIGS. 178 to 181.

In the figures, interconnections drawn by a heavy line are all formed in the same layer.

In the example, for example, the pattern of FIG. 182 is used in the 2nth shunt area QQ from an end of a memory cell array and the pattern of FIG. 183 is used in the 2n−1th shunt area QQ from the end of a memory cell, wherein n is an integer except 0. That is, the patterns of FIGS. 182 and 183 are alternatively arranged in the row direction of the memory cell array.

In the drain side of a shunt area QQ of FIG. 182, a select gate contact section X0 ($\mathbf{14}_9$) in common to select gate lines SG1 in blocks A and B is provided, and in the source side thereof, a select gate contact section X4 ($\mathbf{14}_{10}$) for a select gate line SG2 in a block C is provided.

A select gate bypass line 21AB is connected to the select gate lines SG1 in the blocks A and B by way of the contact section X0 and a select gate bypass line 21C is connected to the select gate line SG2 in the block C by way of the contact area X4. A block decode line 21BLK is arranged between the select gate bypass lines 21AB and 21C.

In the drain side of a shut area of FIG. 183, a contact section X6 for providing a predetermined potential to a p well region $\mathbf{19}_{11}$ (corresponding to the p well regions of FIGS. 180 and 181) in which a memory cell and a select gate transistor of a NAND cell unit are formed is provided and in the source side thereof a select gate contact section X3 ($\mathbf{14}_{10}$) for a select gate line SG2 in the block B is provided.

The drain side select gate lines SG1 are disconnected at positions corresponding to positions where the contact sections X6 are provided. An interconnection for cell-p well connection 21CELL-WELL is connected to a p well region $\mathbf{19}_{11}$ in the silicon substrate by way of the contact section X6.

FIGS. 184 and 185 show patterns in interconnection layers formed above those of FIGS. 182 and 183.

Interconnections drawn by a heavy line in the FIGS. 184 and 185 are formed in the same layer.

The pattern of FIG. 184 shows the interconnection layer formed above the pattern of FIG. 182. A bit line 18 (BL) is connected to the interconnection for bit line-cell connection 21BL-CELL by way of a contact section B. In a shunt area QQ a source line 18 is connected to a source line 21S by way of a contact section SS.

The pattern of FIG. 185 shows the interconnection layer formed above the pattern of FIG. 183. A cell p-well line 18 extends in the column direction like the bit line 18 (BL) and is connected to the interconnection for cell-p well connection 21CELL-WELL by way of the contact section X6. The bit line 18 (BL) is connected to the interconnection for bit line-cell connection 21BL-CELL by way of a contact section B.

The source line 18 is connected to the source line 21S in a shunt area QQ by way of a contact section SS.

FIGS. 186 and 187 show patterns in interconnection layers formed above those of FIGS. 184 and 185.

FIG. 186 shows the interconnection layer formed at the upper level of FIG. 184 and FIG. 187 shows the interconnection layer formed at the upper level of FIG. 185. In the figures, interconnections drawn by a heavy line are formed in the same layer.

A source line 22 which extends in the column direction in the shunt area QQ is provided in the interconnection layer and the source line 22 is connected to the source line 18 in a lower layer thereof by way of contact sections SSS. Thereby, the source lines 18, 21S and 22 formed in respective three layers are electrically connected therebetween.

As described above, the patterns of FIGS. 182, 184 and 186 and the patterns of FIGS. 183, 185 and 187 are alternatively arranged in the row direction.

The drain side select gate lines SG1 in blocks A and B are connected together to a contact section in a shunt area QQ and assume the same potential. In this case, when the contact sections X0 for a drain side select gate line SG1 and a select gate bypass line 21AB are provided in every other shunt area QQ in the row direction, the number of contact sections for a select gate line SG2 in the source side and a select gate bypass line can be equal to the number of contact sections for a select gate line SG1 in the drain side and a select gate bypass line.

Accordingly, open spaces of shunt areas where contact sections X0 are not provided can be used for other purposes, for example in order to connect the cell p-well line 21CELL-WELL to the p-well region $\mathbf{19}_{11}$.

In this case, since an area in which the cell p-well line 21CELL-WELL is connected to the p-well region 1911 is not required to be newly provided, an advantage can be attained that an area of a memory cell array can be smaller.

If a read method is adopted which is especially effective for when select gate lines SG1 in adjacent two blocks are connected, that is after charging of a select gate line SG1 is conducted, this state is kept for a sufficient time and charging of a select gate line SG2 is then conducted, there can be attained another effect that a malfunction due to capacitive coupling between a select gate bypass line and the word lines CG1 to CG8 can be prevented from occurring, in addition to the effect of contraction of a memory cell array.

Then, the reason why the source line 22 and the cell p-well line 18 are provided will be described.

In a data read operation of a NAND cell EEPROM, since a large current of several mA normally flows to the earth terminal (0V) through a source line from memory cells whose number is counted to the order of several thousands, it is very important to set a resistance of the source line to a low value.

On the other hand, since a large current never flows in a p well region where a memory cell and a select gate transistor are formed, a cell p well line for fixing the p well region to a predetermined potential (for example, 0V) is not so seriously required to be an interconnection of a low resistance as compared with a source line.

As is apparent from FIGS. 182 to 187, while there are many interconnections extending in the row direction, only a source line 22 and a cell p-well line 18 are existent as interconnections extending in the column direction except a bit line (BL). Besides, since a sheet resistance of an interconnection which is formed in an upper layer is lower than that of an interconnection which is formed in a lower layer, an interconnection which is highly required to be of a low resistance is generally formed in an upper layer as high as possible.

In addition, as is again apparent from FIG. 187, an interconnection layer in an upper layer (for example, the interconnection layer 22) can be thicker (wider in width) than an interconnection layer (the interconnection layer 18)

in a lower layer. In general, in a shunt area QQ, since an interconnection in an upper layer can be thicker than that in a lower layer, an interconnection with a low resistance can easily be realized.

For this reason, in a shunt area QQ, the interconnection layer 22 is used as a source line SL extending in the column direction and the interconnection layer 18 which is existent below the source line SL is used as a cell p-well line.

While interconnection layers constituting a source line and a cell p-well line in a shunt area QQ is described in the above example, the source line and the cell p-well line can also be arranged in other area, wherein there is no specific limitation to a shunt area QQ. For example, a source line can be arranged in the same layer as that in which a cell p-well line is arranged or in an upper layer thereof, or in an interconnection layer which is of a lower resistance than a sheet resistance of the cell p-well line, in order to realize a source line as an interconnection with a low resistance in a peripheral area of a memory cell array or an area in between a memory cell array and a peripheral circuit thereof.

Examples in this case are shown in FIGS. 188 and 189.

FIGS. 188 and 189 each show a boundary section between a memory cell array and a peripheral area of the memory cell array. In each of the examples of FIGS. 188 and 189, a source line and a cell-p well line are located in a boundary section between a memory cell array and a peripheral area of the memory cell array in addition to those in a shunt area QQ.

FIGS. 188 and 189 show configuration examples in the case where a source line and a cell p-well line are provided in a direction perpendicular to a bit line in a peripheral area of a memory cell array. Layouts of FIGS. 185 and 187 are adopted as configurations of a shunt area QQ. The layouts of FIGS. 188 and 189 are used, for example, in combination at the same time in a memory cell array peripheral area of one memory chip. Accordingly, interconnection layers and layouts are determined so that a source line and a cell p-well line does not cause short-circuit therebetween.

FIG. 188 shows contact sections G for cell p-well lines 18, 21 which are respectively formed in different interconnection layers. FIG. 189 shows a cell p-well line 18 and a source line 22 which are respectively formed in different interconnection layers.

In the configurations shown in FIGS. 188 and 189, the cell p-well line 18 extending in the column direction in a shunt area QQ is connected to the cell p-well line 21 extending in the row direction in a peripheral area of a memory cell array. The cell p-well line 21 is connected to the cell p-well line 18 in a shunt area QQ by way of contact sections G since the cell p-well line 21 is formed in a different layer from the cell p-well line 18 (which is formed in the same layer as the bit line 18 (BL)) in a shunt area QQ.

The cell p-well line 18 in the shunt area QQ is connected to a p well region in a silicon substrate by way of a contact section X6' as shown in FIGS. 185 and 187. Besides, the source line 22 extending in the column direction is further prolonged up to the peripheral area of the memory cell array as it is in the shunt area QQ and the source line 22 is prolonged in the row direction, changing a direction, in the peripheral area of the memory cell array. The source line 22 is connected to the source lines 18 and 21S by way of contact sections SSS and SS as shown FIGS. 184 to 187.

Since a bit line comes out from the inside of the memory cell array as it is in the peripheral area of the memory cell array shown in FIGS. 188 and 189, the cell p-well line 18 in the shunt area QQ cannot be prolonged in the row direction changing a direction in the peripheral area of the memory cell array as it is (while staying in the same layer). Accordingly, for example, a cell p-well line 21 which is formed in an upper layer of the cell p-well line 18 is used in the peripheral area of the memory cell array instead of the cell p-well line 18. The source line 22 is formed in the same layer, continuing up to the peripheral area of the memory cell array from a shunt area QQ.

In such a manner, in a peripheral area of a memory cell array, a source line 22 is formed in an upper layer of a cell p-well lines 18 and 21. In this case, since a sheet resistance of the source line 22 can be reduced, this structure is very effective for setting of a source potential.

In an area where a bit line does not come out in the peripheral area of a memory cell array from the inside of the memory cell array, which is different from FIGS. 188 and 189, the cell p-well line 18 extending in the column direction in a shunt area QQ can be prolonged in the row direction changing a direction in the memory cell array peripheral area as it is (while staying in the same layer). In this case, too, since the source line 22 can be formed in an upper layer of an interconnection layer in which the cell p-well line 18 is arranged, this structure is very effective for setting a source potential.

FIG. 190 shows a pattern of the NAND cell unit used in the sixteenth example of the present invention. FIG. 191 is an equivalent circuit to the pattern of FIG. 190.

A NAND cell unit comprises: a NAND cell series composed of sixteen NAND cells which are serially connected therebetween; and two select gate transistors S1 and S2 connected to both ends thereof. A bit line contact section D is provided in an $n^+$ diffused layer at the farthermost end in the drain side (select gate transistor S1 side) of the NAND cell unit and a source line contact section S is provided in an $n^+$ diffused layer at the farthermost end in the source side (select gate transistor S2 side) of the NAND cell unit.

Bit line contact sections D are independently (separated by a device isolation insulating layer) provided in two NAND cell units adjacent to each other in the row direction and a bit line contact line D is shared by two NAND cell units adjacent to each other in the column direction. Source line contact sections S are independently provided in two NAND cell units adjacent to each other in the row direction and a source line contact section S is shared by two NAND cell units adjacent to each other in the column direction.

FIGS. 192 and 193 show NAND cell EEPROMs according to the sixteenth example of the present invention.

FIG. 192 shows a pattern of word lines (control gate electrodes) CG1 to CG16 and select gates SG1 and SG2 of a NAND cell unit. In the figure, floating gate electrodes are omitted. FIG. 193 shows a pattern of an interconnection layer formed in an upper layer of the NAND cell unit of FIG. 192.

In the example, a source line 21S which is commonly connected to source line contact sections S of NAND cell units in the row direction is arranged. Besides, as a select gate bypass line which is connected to a source side select gate line SG2, for example, a select gate bypass line 21C which is connected to a select gate line SG2 in a block C is arranged in a block B and a select gate bypass line 21B which is connected to a select gate line SG2 in the block B is arranged in the block C.

As a select gate bypass line which is connected to a drain side select gate line SG1, for example, a select gate bypass line 21AB which is commonly connected to select gate lines SG1 in the blocks A and B is arranged in both of the blocks A and B.

In the example, a block decode line 21BLK is located in between the select gate bypass lines 21AB and 21C. The block decode line 21BLK is a signal line whose level is changed according to whether a block is selected or not and used in determination on selection or non-selection of the block.

In the example, connection between a bit line 18 (BL) and a NAND cell unit is effected using an interconnection for bit line-cell connection 21BL-CELL which is formed in an interconnection layer between the bit line 18 and the NAND cell unit.

Accordingly, a width of a contact section B which is provided in the interconnection for bit line-cell connection 21BL-CELL is wider than an interconnection width of the bit line 18 (or a width of an active region). Hence, contact sections B are alternatively provided in the block A side and the block B side with contact sections D as boundary.

The EEPROMs according to the sixteenth example and the fifteenth example will be compared with each other. The patterns of the interconnection layers of both are same as each other, while both are different from each other only in the numbers of memory cells which constitute respective NAND cell units of both. That is, in the fifteenth example, a NAND cell unit is composed of eight memory cells, while in the sixteenth example, a NAND cell unit is composed of sixteenth memory cells.

FIGS. 194 and 195 show configuration examples of shunt areas QQ of the EEPROMs of FIGS. 192 and 193.

In the example, for instance, the pattern of FIG. 194 is used in 2nth shunt areas from an end of a memory cell and the pattern of FIG. 195 is used in 2n−1th shunt areas form the end of a memory cell, wherein n is an integer except 0. That is, the patterns of FIG. 194 and the patterns of FIG. 195 are alternatively arranged in the row direction.

In the drain side of a shunt area QQ of FIG. 194, a select gate contact section X0 ($\mathbf{14}_9$) in common to select gate lines SG1 in the blocks A and B is provided and in the source side thereof, a select gate contact section X4 ($\mathbf{14}_{10}$) for a select gate line SG2 in the block C is provided.

In the drain side of the shunt area QQ of FIG. 195, a contact section X6 for providing a predetermined potential to a p well region $\mathbf{19}_{11}$ in which a memory cell and a select gate transistor of a NAND cell unit are formed is provided and in the source side thereof, a select gate contact section X3 ($\mathbf{14}_{10}$) for a select gate line SG2 in the block B is provided.

FIGS. 196 and 197 show patterns of interconnection layers formed in upper layers of FIGS. 194 and 195.

In the mean time, interconnections drawn by a heavy line are formed in the same layer.

FIG. 196 is an interconnection layer formed in the upper layer of FIG. 194. A select gate bypass line 21AB is connected to select gate lines SG1 in blocks A and B by way of a contact section X0 and a select gate bypass line 21C is connected to a select gate line SG2 in a block C by way of a contact section X4. A block decode line 21BLK is located in between the select gate bypass lines 21AB and 21C.

FIG. 197 is an interconnection layer formed in the upper layer of FIG. 195.

Drain side select gate lines SG1 are disconnected at positions corresponding to positions where contact sections X6 are provided. An interconnection for cell-p well connection 21CELL-WELL is connected to a p well region 1911 in a silicon substrate by way of the contact section X6.

FIGS. 198 and 199 show patterns of interconnections formed in upper layers of FIGS. 196 and 197.

In FIGS. 198 and 199, interconnections drawn by a heavy line are formed in the same layer.

The pattern of FIG. 198 shows an interconnection layer formed in the upper layer of the pattern of FIG. 196. A bit line 18 (BL) is connected to an interconnection for bit line-cell connection 21BL-CELL by way of a contact section B. A source line 18 is connected to a source line 21S by way of contact sections SS in a shunt area QQ.

The pattern of FIG. 199 shows an interconnection layer formed in the upper layer of the pattern of FIG. 197. A cell p-well line 18 extends in the column direction like the bit line 18 (BL) and is connected to an interconnection for cell p-well connection 21CELL-WELL by way of a contact section X6. The bit line 18 (BL) is connected to the interconnection for bit line-cell connection 21BL-CELL by way of a contact section B. A source line 18 is connected to a source line 21S by way of contact sections SS in a shunt area QQ.

FIGS. 200 and 201 show patterns of interconnections formed in upper layers of FIGS. 198 and 199.

FIG. 200 shows an interconnection layer formed in the upper layer of FIG. 198 and FIG. 201 shows an inter connection layer formed in the upper layer of FIG. 199. In FIGS. 200 and 201, interconnections drawn in heavy lines are formed in the same layer.

A source line 22 extending in the column direction in a shunt area QQ is provided in the interconnection layer and the source line 22 is connected to bit lines 18 in a lower layer thereof by way of contact sections SSS. With the structure, the source lines 18, 21S and 22 which are respectively formed in three layers are electrically connected therebetween.

As described above, when the patterns of FIGS. 194, 196, 198 and 200 and the patterns of FIGS. 195, 197, 199 and 201 are alternatively arranged in the row direction, drain side select gate lines SG1 in blocks A and B are commonly connected to contact sections in shunt areas so as to assume the same potential. Contact sections X0 for a select gate line SG1 and a select gate bypass line 21AB are provided in every other shunt area QQ in the row direction.

Accordingly, a shunt area QQ in which no contact area X0 is provided can be used for other purposes, for example for connection of a cell p-well line 21CELL-WELL to a p well region $\mathbf{19}_{11}$.

In this case, since an area in which the cell p-well line 21CELL-WELL is connected to the p well region $\mathbf{19}_{11}$ is not required to be newly provided, there arises an advantage that an area of a memory cell array can be smaller.

If a read method is adopted which is especially effective for when select gate lines SG1 in adjacent two blocks are connected to a common contact section, that is after charging of a select gate line SG1 is conducted, this state is kept for a sufficient time and charging of a select gate line SG2 is then conducted, there can be attained another effect that a malfunction due to capacitive coupling between the select gate bypass line SG1 and the word lines CG1 to CG8 can be prevented from occurring in addition to the effect of the above described contraction of a memory cell array area.

FIGS. 202 to 205 shows structure examples of a row decoder applied for an EEPROM of the present invention.

In any one of the four examples, row decoders RD1 and RD2 are arranged on both ends of a memory cell array MA in the row direction. In this case, block selection signals RDECI are required to be respectively supplied to the row decoders RD1 and RD2 existent on both ends of the memory cell array MA in the row direction.

Therefore, the patterns described in the fifteenth and sixteenth examples are used in order to supply the block selection signals RDECI to the row decoders RD1 and RD2. That is, a block selection signal RDECI is supplied to the row decoder RD2 through a block decode line 21BLK arranged on the memory cell array.

The block decode line 21BLK is arranged in the same interconnection layer as that in which a select gate bypass line and a source line are formed as described in the fifteenth and sixteenth examples.

In the circuit of FIG. 202, the block decode line 21BLK is a single line and the single block decode line 21BLK constitutes a passing interconnection which passes through above the memory cell array MA. The row decoder RD1 determines potentials of select gates SG1 and SG2, and word lines CG2, CG4 and CG6 and the row decoder RD2 determines potentials of word lines CG1, CG3, CG5, CG7 and CG8.

In the example, in a read operation, a signal RDEC assumes "H" and all NAND cell block decode signals assume "H" in a selected block. Accordingly, an output signal of an inverter I (block selection signal) RDECI assumes "H." The block selection signal RDECI is supplied to not only a NAND circuit N1 of the row decoder RD1 as input, but a NAND circuit N2 of the row decoder RD2, by way of the block decode line 21BLK.

Hence, high potentials are produced by circuits HVL and HVR based on clock signals OSCRD and OSC, and the high potentials are applied onto gates of MOS transistors Q. Accordingly, the MOS transistors Q comes into the ON state and a read operation is enabled as described in FIGS. 170 to 175.

A circuit 203 has almost the same structure as that of the circuit of FIG. 202. The circuit of FIG. 203 will be compared with that of FIG. 202. There is a difference therebetween in regard to the word lines CG1 to CG8 to which the row decoders RD1 and RD2 are connected. That is, in the example of FIG. 203, the row decoder RD1 determines potentials of the select gate lines SG1 and SG2, and the word lines CG3, CG5 and CG7, and the row decoder RD2 determines potentials of the word lines CG1, CG2, CG4, CG6 and CG8.

A circuit of FIG. 204 has almost the same structure as that of the circuit of FIG. 202. The circuit of FIG. 204 will be compared with that of FIG. 202. There is a difference therebetween in regard to the word lines CG1 to CG8 to which the row decoders RD1 and RD2 are connected. That is, in the example of FIG. 204, the row decoder RD1 determines potentials of the select gate line SG1, and the word lines CG2, CG4, CG6 and CG8, and the row decoder RD2 determines potentials of the select gate line SG2, and the word lines CG1, CG3, CG5 and CG7.

In the example of FIG. 204, since the row decoder RD2 controls a potential of the select gate SG2, the number of block decode lines 21BLK which passes over the memory cell array is two. A newly added block decode line 21BLK is used for applying an output signal RDECIB of a NAND circuit NO onto the gate of a MOS transistor T in the row decoder RD2.

When the two block decode lines 21BLK are used, there arise requirements for contriving such as that widths of the block decode lines 21BLK or the other interconnections which are formed in the same interconnection layer as the block decode lines 21BLK are narrowed, that the spacing between interconnections including the block decode lines 21BLK are narrowed and the like.

However, when widths of the block decode lines 21BLK or other interconnections which are formed in the same interconnection layer are narrowed, since an interconnection resistance of an interconnection whose width is narrowed is increased, there arises a problem that a transmission speed of a signal is reduced and a circuit operation is in turn slower.

When the spacings between interconnections including the block decode line 21BLK are narrowed, there are problems that not only is the minimal interconnection spacing a limitation in layout, but a risk probability of short-circuit between interconnections is increased.

A circuit of FIG. 205 is to solve the problem which occurs with FIG. 204. That is, in FIG. 205, not only is the circuit of FIG. 204 adopted, but a single block decode line 21BLK is employed. Since the single block decode line 21BLK is employed, a block selection signal RDECIB is produced in the row decoder RD2 based on a block selection signal RDECI.

In a concrete manner, one inverter IB is added in the row decoder RD2. In the example, there arises no such a problem as arises in FIG. 101, whereas a pattern area of the row decoder RD2 is more or less larger due to the addition of the one inverter IB.

In the circuits of from FIGS. 202 to 205, it is preferable that the number of MOS transistors Q and T in the row decoder RD1 side and the number of MOS transistors Q and T in the row decoder RD2 side are set equal to each other. That is, the sum of the numbers of select gate lines and word lines which the row decoder RD1 controls and the sum of the numbers of select gate lines and word lines which the row decoder RD2 controls are preferably set equal to each other.

The reason why the sum of the numbers of select gate lines and word lines which are controlled in the row decoder RD1 side and the sum of the numbers of select gate lines and word lines which are controlled in the row decoder RD2 are set equal to each other, in such a manner, will be described below.

Many regular patterns such as select gate lines and word lines are included in a memory cell array. The regular patterns are easy to be processed, as compared with irregular patterns. However, design rules applied for interconnections in a memory cell array area are set smaller than those for interconnections in a row decoder. That is, two interconnections respectively with different design rules are connected to each other between the memory cell array area and the row decoder.

Irregular patterns are produced in a boundary area in which interconnections (word lines and select gate lines) in the memory cell array area and interconnections in the row decoder are connected therebetween. Therefore, in interconnection patterns of this area, there occurs part (part with a narrow pitch) where the minimal spacing which is determined by the design rules is adopted. This means that as the number of interconnections is increased, parts of a pattern with the minimal spacing becomes conspicuous in number, which entails a pattern with a low margin in processing.

That is, when the numbers of interconnections (the numbers of word lines and select gate lines) which are connected to the row decoders RD1 and RD2 existent on both sides of a memory cell array are different from each other, a processing margin for interconnections in a connection area of the row decoder to which more interconnections are connected is more severe.

Accordingly, it is set that the sum of the numbers of select gate lines and word lines which are connected to the row decoder RD1, and the sum of the numbers of select gate lines and word lines which are connected to the row decoder RD2 are equal to each other.

While the four examples have been described above in regard to a row decoder, the circuits of FIGS. 202 and 203 are considered to be most suitable for the present invention from the view points of layout, an operation speed, reliability, a chip area and the like.

That is, when a NAND circuit NO to which a NAND cell block decode signal is supplied as input is provided in the row decoder RD1, two MOS transistors T which communicate with select gate lines SG1 and SG2 are provided in the row decoder DRI since a single block decode line 21BLK is used. In addition, three MOS transistors T which communicate with three word lines are provided in the row decoder DRI, while five MOS transistors T which communicate with the residual five word lines are provided in the row decoder RD2, so that the numbers of MOS transistors Q and T in the row decoders RD1 and RD2 are equal to each other.

FIGS. 206 to 211 show arrangement examples of select gate contact sections and p well contact sections in shunt areas QQ.

In FIG. 206, contact sections XA for a select gate line SG1 in a block A and contact sections XB for a select gate line SG1 in a block B are alternatively arranged in shunt areas QQ in the row direction. A contact section XW for a p well region is located in a predetermined shunt area. In the example, one contact section XW is located in one of shunt areas QQ in which a contact section XA is provided. Two contact sections XA are provided in the one of shunt areas QQ so as to sandwich the contact section XW therebetween.

In FIG. 207, contact sections XB for a select gate line SG2 in a block B and contact sections XC for a select gate line SG2 in a block C are alternatively arranged in shunt areas QQ in the row direction. A contact section XW for a p well region is located in a predetermined shunt area QQ. In the example, a contact section XW is located in one of shunt areas QQ in which a contact section XB is provided. Two contact sections XB are provided so as to sandwich the contact section XW therebetween in the one of shunt area QQ.

In FIG. 208, contact sections XAB for select gate lines SB1 in blocks A and B and contact sections XW for p well regions are alternatively arranged in shunt areas QQ in the row direction. The select gate lines SG1 are disconnected in contact sections XW.

In FIG. 209, contact sections XBC for select gate lines SB2 in blocks B and C and contact sections XW for p well regions are alternatively arranged in shunt areas QQ in the row direction. The select gate lines SG1 are disconnected in contact sections XW.

In FIG. 210, contact sections XA for a select gate line SG1 in a block A and contact sections XB for a select gate line SG1 in a block B are alternatively provided in shunt areas QQ in the row direction. A contact section XW for a p well region is located in a predetermined shunt area QQ. In the example, since the select gate lines SG1 are not disconnected, one contact section XA and one contact section XW are provided in a predetermined shunt area QQ.

In FIG. 211, contact sections XB for a select gate line SG2 in a block B and contact sections XC for a select gate line SG2 in a block C are alternatively arranged in shunt areas QQ in the row direction. A contact section XW for a p well region is located in a predetermined shunt area QQ. In the example, since the select gate lines SG2 are not disconnected, one contact section XB and one contact section XW are provided in a predetermined shunt area QQ.

While in the fifteenth and sixteenth examples, the numbers of memory cells constituting a NAND cell unit are respectively set eight and sixteen, the numbers can naturally be, for example, 2, 4, 32, 64 and the like, which does not entail any troubles.

While in all the above described examples, a NAND cell EEPROM is taken as an example of a non-volatile semiconductor memory, the present invention can be applied for other devices, for example a NOR cell EEPROM, a DINOR cell EEPROM, an AND cell EEPROM, a NOR cell EEPROM with a select transistor and the like.

FIGS. 212 to 215 show structure examples of a memory cell constituted of an EEPROM other than a NAND cell type.

FIG. 212 shows a circuit diagram of a memory cell array area of a NOR cell EEPROM. In the figure, WL indicates a word line, BL indicates a bit line and SL indicates a source line.

FIG. 213 shows a circuit diagram of a memory cell array area of a DINOR cell EEPROM. In the figure, WL indicates a word line, BL indicates a bit line, LB indicates a local bit line, ST indicates a select gate line and SL indicates a source line.

FIG. 214 shows a circuit diagram of a memory cell array area of an AND cell EEPROM. In the figure, WL indicates a word line, BL indicates a bit line, LB indicates a local bit line, ST indicates a select gate line, SL indicates a source line and LS indicates a local source line.

FIG. 215 shows a circuit diagram of a memory cell array area of a NOR cell EEPROM with a select transistor. In the figure, WL indicates a word line, BL indicates a bit line, ST indicates a select gate line and SL indicates a source line.

Details of a DINOR cell EEPROM are described, for example, in "H. Onoda et al., IEDM Tech. Digest, 1992, pp. 599-602" and details of an AND cell EEPROM are described, for example, in "H. Kume et al., IEDM Tech. Digest, 1992, pp. 991-993."

Then, layout of a device isolation region and an active region (device region) in a memory cell array area will be considered.

As shown in FIG. 216, a memory chip 101 comprises a memory cell array area 102 and a peripheral circuit area 103 which surrounds the memory cell array area 102. FIG. 217 shows details of layout of a device isolation region and an active region in part B of the memory cell array area 102.

As shown in FIG. 217, in the example, an active region 104 in a NAND cell area has a pattern extending linearly in the column direction. The example is same as the examples shown in FIGS. 190 to 201 in this regard.

In the example of FIG. 217, dummy active regions 105 are also arranged in a shunt area QQ. A dummy active region 105 has a pattern extending linearly in the column direction like an active region 104 in a NAND cell area and the dummy active regions 105 are arranged at widths and pitches which are substantially equal to (or are regarded as being substantially equal to) those of the active regions 104. However, the dummy active regions 105 are disconnected at contact sections X0, X3 and X4 which are used for connecting a select gate line and a select gate bypass line to each other and at a contact section X6 which is used for providing a potential onto a well (see FIGS. 218 and 219).

The reason why dummy active regions 105 are provided in a shunt area QQ is that variation in size of active regions in an edge portion of a NAND cell area which is generated in a lithographic process or processing of active regions is prevented from occurring.

Areas other than active areas 104 and dummy active areas 105 are occupied by a device isolation region. As a device isolation region, a field oxide layer by means of a LOCOS method has conventionally been adopted in general. In recent years, however, an insulating layer having a STI (shallow trench device isolation) structure has been arranged in a device isolation region in order to realize increase in storage capacity due to a high density of devices on a chip.

When a device isolation region is formed by an insulating layer having a STI structure, however, the following problems occur if the layouts described above are adopted.

In forming a device isolation insulating layer having a STI structure, CMP (chemical mechanical polishing) for trench-filling is generally employed, but variation in polishing removal rate for the insulating layer occurs according to sites on the insulating layer in CMP, which causes the insulating layer not to be uniform in thickness. Since a polishing speed in the central portion of the memory cell array area is slow as compared with that in the peripheral circuit area, there has arisen the case where a residual layer is remained in the central portion of the memory cell array after polishing. Besides, when a polishing removal in CMP is increased, a silicon substrate (active regions) is polished off in the peripheral circuit area.

Below, the reason why such problems arise will be described along with a manufacturing process of STI.

As shown in FIG. 220, a silicon oxide layer 201 and a silicon nitride layer 202 are first formed on a silicon substrate 200. A resist pattern is formed on the silicon nitride layer 202 by means of photolithography and the silicon nitride layer 202, the silicon oxide layer 201 and the silicon substrate 200 are sequentially etched using the resist pattern as a mask by means of RIE. As a result, a trench for device isolation is formed in the silicon substrate 200.

In the memory cell array area, trenches for device isolation are regularly formed substantially at constant widths and constant pitches. On the other hand, in the peripheral circuit area, trenches for device isolation are not especially formed in a regular manner. Widths of trenches and spacings between adjacent trenches are larger in the peripheral circuit area than in the memory cell array area.

In the mean time, the resist pattern is removed after the trenches are formed.

A silicon oxide layer (for example, a TEOS layer) 203 with which a trench is fully filled is formed on the silicon substrate 200 by means of a CVD method. At this point, the surface of the silicon oxide layer 203 is almost flattened in the memory cell array area, while recesses EE are sporadically formed in the peripheral circuit area. This is caused by active areas being formed in a more scattered manner in the peripheral circuit area than in the memory cell array area, that is widths of trenches in the peripheral circuit area are wider than in the memory cell array area.

Then, as shown in FIG. 221, the silicon oxide layer 203 is polished using the silicon nitride film 202 as an etching stopper by CMP and the silicon oxide film 203 existent outside a trench is removed. At this point, a polishing speed in the memory cell array area (especially in the central portion thereof) is slow as compared with a polishing speed in the peripheral circuit area and thereby, the silicon oxide layer 203 in the memory cell array area is not sufficiently removed, so that a residual oxide layer occurs in the memory cell array area after polishing.

Such variation in stock removal by polishing in CMP has been conceived to be caused by a recess or a protrusion of the silicon oxide layer 203 in the surface thereof. That is, a polishing agent (slurry) for CMP is hard to be built up on a flat surface portion of the silicon oxide layer 203 like in the memory cell array area and thereby, a polishing speed is slowed down, while the polishing agent is apt to be collected in a recess EE of the silicon oxide layer 203 in the peripheral circuit area and thereby, a polishing speed is accelerated.

When stock removal by CMP is increased in order to avoid a residual layer in the memory cell array area after polishing, the silicon nitride layer 202 and the silicon oxide layer 201 are polished off in the peripheral circuit area and besides, even the silicon substrate (active region) 200 is polished off.

In the mean time, a silicon oxide layer 203 may be an oxide layer formed by a HDP (high density plasma) method in addition to a TEOS layer.

FIG. 222 shows layout of a device isolation region and an active area which can solve the above problems.

In the example, active regions 104 in a NAND cell area each has a pattern extending linearly in the column direction. No dummy active areas are formed in a shunt area QQ but a STI section with a large width is arranged there. A width H1 of the STI section (or a trench for device isolation) in a shunt area QQ is set sufficiently larger than a width H0 of a STI section (or a trench for device isolation) of the memory cell array area. For example, the width H1 of the STI of a shunt area QQ is set in the range of from 0.5 to 5 μm. As shown in FIG. 223, the spacing H2 of STI sections (or trenches for device isolation) of shunt areas QQ is set in the range of from 20 to 500 μm. In this case, amounts of stock removal by CMP are most uniform across the substrate.

The reason why in such a manner, a polishing speed in the central portion of the memory cell array area and a polishing speed in the peripheral circuit area are substantially same and uniformity in stock removal by CMP can be improved is that recesses in which a polishing agent is collected are formed in (a shunt area QQ of) the memory cell array area.

FIGS. 224 and 225 show layouts which are formed by adding a layout of a select gate line and a word line (control gate line) to the layout of FIG. 222.

In the examples, no dummy active regions are arranged in a shunt area QQ. In the examples, however, since it is a precondition that a device isolation insulating layer of a STI structure is applied for a device isolation region, a problem of variation in size of an end portion of a NAND cell area which is generated when a field oxide layer by means of a LOCOS method is used in a device isolation area is suppressed to its minimal limit.

Below, the reason why uniformity in stock removal by CMP can be improved will be described along with a manufacturing process of STI.

As shown in FIG. 226, a silicon oxide layer 201 and a silicon nitride layer 202 are first formed on a silicon substrate 200. A resist pattern is formed on the silicon nitride layer 202 by means of photolithography and the silicon nitride layer 202, the silicon oxide layer 201 and the silicon substrate 200 are sequentially etched using the resist pattern as a mask by means of RIE. As a result, a trench for device isolation is formed in the silicon substrate 200.

In a NAND cell area in a memory cell array area, trenches for device isolation are regularly formed substantially at constant widths and constant pitches. In a shunt area QQ in the memory cell array area, a trench for device isolation is formed with a width in the range 0.5 to 5 μm. On the other hand, in a peripheral circuit area, trenches for device isolation are not especially formed in a regular manner.

In the mean time, the resist pattern is removed after trenches are formed.

A silicon oxide layer (for example, a TEOS layer) 203 with which a trench is fully filled is formed on the silicon substrate 200 by means of a CVD method. At this point, the surface of the silicon oxide layer 203 is almost flattened in a NAND cell area in the memory cell array area, while recesses EE are formed in a shunt area QQ in the memory cell array area and in the peripheral circuit area.

Then, as shown in FIG. 227, the silicon oxide layer 203 is polished using the silicon nitride film 202 as an etching stopper by CMP and the silicon oxide film 203 existent outside a trench is removed. At this point, a polishing speed in the memory cell array area is almost equal to a polishing speed in the peripheral circuit area. This is because recesses EE in which a polishing agent is collected are also formed in a shunt area QQ of the memory cell array area as in the peripheral circuit area.

Accordingly, while no residual layer occurs in the memory cell array area after polishing and the silicon substrate (active region) 200 in the peripheral circuit area is not polished off, trenches can be filled with the silicon oxide layer 203 and a STI structure for each trench can be achieved.

In the mean time, a silicon oxide layer 203 may be an oxide layer formed by a HDP (high density plasma) method in addition to a TEOS layer.

While, in the above example, a STI section having a larger width than that of a STI section of a NAND cell area is provided in a shunt area QQ, in addition to this, a dummy area is provided in an arbitrary portion in a NAND cell area and a STI section having a larger width than that of a STI section of the NAND cell area may be provided in the dummy area.

Besides, the example is not limited to an EEPORM of a NAND cell type and can be applied for EEPROMs of other types and further, other memory devices (DRAM, SRAM) as well.

To sum up, as described above, according to a nonvolatile semiconductor memory of the present invention, variation in potential of a selected word line in a read operation due to capacitive coupling between a select gate bypass line which plays a role to reduce an interconnection resistance of a select gate line and the word line (control gate electrode) can be prevented from occurring or suppressed by employing a new layout. When variation in potential of a selected word line in a read operation occurs, an erroneous read can be prevented from occurring by adjusting charge timing for a select gate line. Accordingly, an erroneous read data caused by potential variation of a selected word line which is normally 0V can be eliminated and a chip with high reliability can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A nonvolatile semiconductor memory comprising:

a memory cell array including a cell unit composed of at least one memory cell and at least one select gate transistor;

a word line which is connected to the memory cell and extends in a row direction on the memory cell array;

a select gate line which is connected to the select gate transistor and extends in the row direction on the memory cell array;

a bit line extending in a column direction on the memory cell array;

a shunt area which is located in the memory cell array and extends in the column direction, and in which a location of the memory cell is forbidden;

a first line, at least a portion of which is located in the shunt area, and which is connected to a first area on which the memory cell is formed;

a second line, at least a portion of which is located in the shunt area, which is located above the first line, and which is connected to a source line; and a connection section between the first line and the first areas, wherein at least one cell unit is connected between the bit line and the source line, a first voltage is supplied to the first area through the first line and the connection section, a second voltage is supplied to the source line through the second line, and the first area is a first conductive type well or a first conductive type substrate on which the memory cell is formed.

2. The nonvolatile semiconductor memory according to claim 1, wherein the cell unit is connected between the bit line and the source line.

3. The nonvolatile semiconductor memory according to claim 1, wherein a sheet resistance of the second line is lower than a sheet resistance of the first line.

4. The nonvolatile semiconductor memory according to claim 1, wherein a thickness of the second line is larger than a thickness of the first line.

5. The nonvolatile semiconductor memory according to claim 1, wherein the first area is a well on which the memory cell is formed.

6. The nonvolatile semiconductor memory according to claim 1, wherein the first area is a substrate on which the memory cell is formed.

7. The nonvolatile semiconductor memory according to claim 1, wherein a source and a drain of the memory cell have a second conductive type diffusion layer, and the second conductive type is different from the first conductive type.

8. A nonvolatile semiconductor memory comprising:

a memory cell array including a cell unit composed of at least one memory cell and at least one select gate transistor;

a word line which is connected to the memory cell and extends in a row direction on the memory cell array;

a select gate line which is connected to the at least one select gate transistor and extends in the row direction on the memory cell array;

a select gate bypass line which is formed above the select gate line and extends in the row direction on the memory cell array;

a bit line extending in a column direction on the memory cell array;

a shunt area which is located in the memory cell array and extends in the column direction, and in which a location of the memory cell is forbidden;

a contact section, which is located in the shunt area, for connecting the select gate bypass line to the select gate line;

a first line, at least a portion of which is located in the shunt area, and which is connected to a first area on which the memory cell is formed;

a second line, at least a portion of which is located in the shunt area, which is located above the first line, and which is connected to a source line; and a connection section between the first line and the first area, wherein a first voltage is supplied to the first area through the first line, a second voltage is supplied to the source line through the second line, and the first area is a first conductive type well or a first conductive type substrate on which the memory cell is formed.

9. The nonvolatile semiconductor memory according to claim 8, wherein a first terminal of the cell unit is connected to the bit line and a second terminal of the cell unit is connected to the source line.

10. The nonvolatile semiconductor memory according to claim 8, wherein a sheet resistance of the second line is lower than a sheet resistance of the first line.

11. The nonvolatile semiconductor memory according to claim 8, wherein a thickness of the second line is larger than a thickness of the first line.

12. The nonvolatile semiconductor memory according to claim 8, wherein the first area is a well on which the memory cell is formed.

13. The nonvolatile semiconductor memory according to claim 8, wherein the first area is a substrate on which the memory cell is formed.

14. The nonvolatile semiconductor memory according to claim 8, wherein the first voltage is supplied to the first area through the first line and the connection section.

15. The nonvolatile semiconductor memory according to claim 8, wherein a source and a drain of the memory cell have a second conductive type diffusion layer, and the second conductive type is different from the first conductive type.

* * * * *